(12) United States Patent
Kimura

(10) Patent No.: US 9,508,862 B2
(45) Date of Patent: Nov. 29, 2016

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/718,333

(22) Filed: May 21, 2015

(65) Prior Publication Data

US 2015/0280009 A1 Oct. 1, 2015

Related U.S. Application Data

(63) Continuation of application No. 14/221,753, filed on Mar. 21, 2014, now Pat. No. 9,040,995, which is a continuation of application No. 13/462,945, filed on May 3, 2012, now Pat. No. 8,680,529.

(30) Foreign Application Priority Data

May 5, 2011 (JP) ................. 2011-103344

(51) Int. Cl.
*H01L 29/78* (2006.01)
*H01L 29/786* (2006.01)
(Continued)

(52) U.S. Cl.
CPC ..... *H01L 29/78648* (2013.01); *H01L 27/1225* (2013.01); *H01L 27/1248* (2013.01); *H01L 29/045* (2013.01); *H01L 29/786* (2013.01); *H01L 29/7869* (2013.01)

(58) Field of Classification Search
CPC .................... H01L 29/78648; H01L 29/7869; H01L 27/1225; H01L 27/1248; H01L 29/786
See application file for complete search history.

(56) References Cited

U.S. PATENT DOCUMENTS

| 4,409,134 A | 10/1983 | Yamazaki |
| 5,731,856 A | 3/1998 | Kim et al. |

(Continued)

FOREIGN PATENT DOCUMENTS

| CN | 101997005 A | 3/2011 |
| EP | 1 737 044 A1 | 12/2006 |

(Continued)

OTHER PUBLICATIONS

Kamiya, T. et al., "Carrier Transport Properties and Electronic Structures of Amorphous Oxide Semiconductors: The Present Status," Solid State Physics, Sep. 1, 2009, vol. 44, No. 9, pp. 621-633, Agne Gijutsu Center.

(Continued)

*Primary Examiner* — Roy Potter
*Assistant Examiner* — Paul Patton
(74) *Attorney, Agent, or Firm* — Husch Blackwell LLP

(57) ABSTRACT

A semiconductor device includes a pixel electrode and a transistor which includes a first gate electrode, a first insulating layer over the first gate electrode, a semiconductor layer over the first insulating layer, a second insulating layer over the semiconductor layer, and a second gate electrode. The pixel electrode and the second gate electrode are provided over the second insulating layer. The first gate electrode has a region overlapping with the semiconductor layer with the first insulating layer provided therebetween. The second gate electrode has a region overlapping with the semiconductor layer with the second insulating layer provided therebetween. A first region is at least part of a region where the second gate electrode overlaps with the semiconductor layer. A second region is at least part of a region where the pixel electrode is provided. The second insulating layer is thinner in the first region than in the second region.

14 Claims, 72 Drawing Sheets

(51) Int. Cl.
*H01L 27/12* (2006.01)
*H01L 29/04* (2006.01)

(56) References Cited

U.S. PATENT DOCUMENTS

| | | | |
|---|---|---|---|
| 5,744,864 A | 4/1998 | Cillessen et al. |
| 6,281,552 B1 | 8/2001 | Kawasaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,038,239 B2 | 5/2006 | Murakami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,157,321 B2 | 1/2007 | Arao et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,410 B2 | 5/2009 | Arao et al. |
| 7,671,369 B2 | 3/2010 | Yamazaki et al. |
| 7,674,650 B2 | 3/2010 | Akimoto et al. |
| 7,732,819 B2 | 6/2010 | Akimoto et al. |
| 7,804,095 B2 | 9/2010 | Sato |
| 7,940,085 B2 | 5/2011 | Kim et al. |
| 8,067,775 B2 | 11/2011 | Miyairi et al. |
| 8,138,500 B2 | 3/2012 | Hosoya |
| 8,216,878 B2 | 7/2012 | Sasaki et al. |
| 8,217,680 B2 | 7/2012 | Kim et al. |
| 8,394,671 B2 | 3/2013 | Sasaki et al. |
| 8,395,157 B2 | 3/2013 | Park et al. |
| 8,441,425 B2 | 5/2013 | Ishitani et al. |
| 8,502,220 B2 | 8/2013 | Yamazaki et al. |
| 8,513,054 B2 | 8/2013 | Sasaki et al. |
| 8,518,740 B2 | 8/2013 | Yamazaki et al. |
| 8,552,423 B2 | 10/2013 | Yamazaki et al. |
| 8,648,343 B2 | 2/2014 | Yamazaki et al. |
| 8,680,529 B2 | 3/2014 | Kimura |
| 8,697,488 B2 | 4/2014 | Sasaki et al. |
| 8,912,541 B2 | 12/2014 | Yamazaki et al. |
| 9,293,566 B2 | 3/2016 | Sasaki et al. |
| 9,299,807 B2 | 3/2016 | Sasaki et al. |
| 9,412,768 B2 | 8/2016 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0027804 A1 | 2/2006 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0079425 A1 | 4/2010 | Yamazaki et al. |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0193785 A1 | 8/2010 | Kimura |
| 2011/0031497 A1 | 2/2011 | Yamazaki et al. |
| 2011/0062433 A1 | 3/2011 | Yamazaki |
| 2011/0109351 A1 | 5/2011 | Yamazaki et al. |
| 2011/0248261 A1 | 10/2011 | Yamazaki |
| 2011/0303913 A1 | 12/2011 | Yamazaki et al. |
| 2012/0061668 A1 | 3/2012 | Miyairi et al. |
| 2013/0242223 A1 | 9/2013 | Ishitani et al. |
| 2013/0302924 A1 | 11/2013 | Yamazaki et al. |
| 2013/0328044 A1 | 12/2013 | Yamazaki et al. |

FOREIGN PATENT DOCUMENTS

| | | |
|---|---|---|
| EP | 2 172 972 A2 | 4/2010 |
| EP | 2 192 437 A1 | 6/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-280567 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-123360 A | 5/2005 |
| JP | 2007-220820 A | 8/2007 |
| JP | 2007-256881 A | 10/2007 |
| JP | 2008-191518 A | 8/2008 |
| JP | 2009-047967 A | 3/2009 |
| JP | 2009-157156 A | 7/2009 |
| JP | 2009-265635 A | 11/2009 |
| JP | 2010-027851 A | 2/2010 |
| JP | 2010-087518 A | 4/2010 |
| JP | 2010-109342 A | 5/2010 |
| JP | 2010-123938 A | 6/2010 |
| JP | 2010-212284 A | 9/2010 |
| JP | 2011-029628 A | 2/2011 |
| JP | 2011-029629 A | 2/2011 |
| JP | 2011-044702 A | 3/2011 |
| JP | 2011-054957 A | 3/2011 |
| KR | 2011-0015374 A | 2/2011 |
| TW | 201037406 | 10/2010 |
| WO | WO 2004/114391 A1 | 12/2004 |
| WO | WO 2011/001880 A1 | 1/2011 |
| WO | WO 2011/010542 A1 | 1/2011 |

OTHER PUBLICATIONS

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Park, J.S. et al., "Improvements in the Device Characteristics of Amorphous Indium Gallium Oxide Thin-Film Transistors by Ar Plasma Treatment," Applied Physics Letters, Jun. 26, 2007, vol. 90, No. 26, pp. 26106-1-262106-3.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.

Prins, M. et al., "A Ferroelectric Transparent Thin-Film Transistor," Applied Physics Letters, Jun. 17, 1996, vol. 68, No. 25, pp. 3650-3652.

Nakamura, M. et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka, N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura, K. et al., "Thin-Film Transistor Fabricated in Single-Crystalline Transparent Oxide Semiconductor," Science, May 23, 2003, vol. 300, No. 5623, pp. 1269-1272.

Masuda, S. et al., "Transparent Thin Film Transistors Using ZnO as an Active Channel Layer and their Electrical Properties," Journal of Applied Physics, Feb. 1, 2003, vol. 93, No. 3, pp. 1624-1630.

Asakuma, N. et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura, K. et al., "Carrier Transport in Transparent Oxide Semiconductor with Intrinsic Structural Randomness Probed Usiing Single-Crystalline $InGaO_3(ZnO)_5$ Films," Applied Physics Letters, Sep. 13, 2004, vol. 85, No. 11, pp. 1993-1995.

Li, C. et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son, K. et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Kanno, H. et al., "White Stacked Electrophosphorecent Organic Light-Emitting Devices Employing $MoO_3$ as a Charge-Generation Layer," Advanced Materials, 2006, vol. 18, No. 3, pp. 339-342.

Tsuda, K. et al., "Ultra Low Power Consumption Technologies for Mobile TFT-LCDs," IDW '02: Proceedings of the 9th International Display Workshops, Dec. 4, 2002, pp. 295-298.

Van de Walle, C.G., "Hydrogen as a Cause of Doping in Zinc Oxide," Physical Review Letters, Jul. 31, 2000, vol. 85, No. 5, pp. 1012-1015.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J. et al., "3.1: Distinguished Paper: 12.1-Inch WXGA AMOLED Display Driven by Indium—Gallium—Zinc Oxide TFTs Array," SID Digest '08: SID Inernational Symposium Digest of Technical Papers, May 20, 2008, vol. 39, No. 1, pp. 1-4.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circuits, 2008, vol. 43, No. 2, pp. 292-299.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., Optical Studies of the Amorphous Liquid-Cholesteric Liquid Crystal Transition:The "Blue Phase," Physics Letters, Sep. 10, 1973, vol. 45A, No. 2, pp. 115-116.

Cho, D.H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M.H. et al., "15.4: Excellent Performance of Indium—Oxide-Based Thin-Film Transistors by DC Sputtering," SID Digest '09: SID International Symposium Digest of Technical Papers, May 31, 2009, pp. 191-193.

(56) References Cited

OTHER PUBLICATIONS

Jin, D.-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata, J. et al., "Development of 4.0-In. AMOLED Display With Driver Circuit Using Amorphous In—Ga—Zn—Oxide TFTS," IDW '09: Proceedings of the 16th International Display Workshops, 2009, pp. 689-692.
Park, J.-S. et al., "Amorphous Indium—Gallium—Zinc Oxide TFTS and Their Application for Large Size AMOLED," AM-FPD '08 Digest of Technical Papers, Jul. 2, 2008, pp. 275-278.
Park, S.-H. K. et al., "Challenge to Future Displays: Transparent AM-OLED Driven by Peald Grown ZnO TFT," IMID '07 Digest, 2007, pp. 1249-1252.
Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Osada, T. et al., "Development of Driver-Integrated Panel Using Amorphous In—Ga—Zn—Oxide TFT," AM-FPD '09 Digest of Technical Papers, Jul. 1, 2009, pp. 33-36.
Hirao, T. et al., "Novel Top-Gate Zinc Oxide Thin-Film Transistors (ZnO TFTS) for AMLCDS," Journal of the Society for Information Display, 2007, vol. 15, No. 1, pp. 17-22.
Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.
Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara, H. et al., "21.3: 4.0 in. QVGA AMOLED Display Using In—Ga—Zn—Oxide TFTS With a Novel Passivation Layer," SID Digest '09: SID International Symposium Digest of Technical Papers, May 31, 2009, pp. 284-287.
Miyasaka, M., "SUFTLA Flexible Microelectronics on Their Way to Business," SID Digest '07: SID International Symposium Digest of Technical Papers, 2007, vol. 38, pp. 1673-1676.
Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.
Lee, H.N. et al., "Current Status of, Challenges to, and Perspective View of AM-OLED," IDW '06: Proceedings of the 13th International Display Workshops, Dec. 7, 2006, pp. 663-666.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Nakamura, M., "Synthesis of Homologous Compound with New Long-Period Structure," NIRIM Newsletter, Mar. 1, 1995, vol. 150, pp. 1-4.
Kikuchi, H. et al., "Polymer-Stabilized Liquid Crystal Blue Phases," Nature Materials, Sep. 2, 2002, vol. 1, pp. 64-68.
Kimizuka, N. et al., "Spinel,YbFe2O4, and Yb2Fe3O7 Types of Structures for Compounds in the In2O3 and Sc2O3—A2O3—BO Systems [A; Fe, Ga, Or Al; B: Mg, Fe, Ni, Cu,or Zn] at Temperatures Over 1000° C.," Journal of Solid State Chemistry 1985, vol. 60, pp. 382-384.
Kitzerow, H.-S. et al., "Observation of Blue Phases in Chiral Networks," Liquid Crystals, 1993, vol. 14, No. 3, pp. 911-916.
Costello, M.J. et al., "Electron Microscopy of a Cholesteric Liquid Crystal and Its Blue Phase," Physical Review. A, May 1, 1984, vol. 29, No. 5, pp. 2957-2959.
Meiboom, S. et al., "Theory of the Blue Phase of Cholesteric Liquid Crystals," Physical Review Letters, May 4, 1981, vol. 46, No. 18, pp. 1216-1219.
Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita, M. et al., "Mechanism of Electrical Conductivity of Transparent InGaZnO4," Phyiscal Review. B, Jan. 15, 2000, vol. 61, No. 3, pp. 1811-1816.
Nomura, K. et al., "Amorphous Oxide Semiconductors for High-Performance Flexible Thin-Film Transistors," Japanese Journal of Applied Physics, 2006, vol. 45, No. 5B, pp. 4303-4308.
Janotti, A. et al., "Native Point Defects in ZnO," Physical Review. B, Oct. 4, 2007, vol. 76, No. 16, pp. 165202-1-165202-22.
Park, J.-S. et al., "Electronic Transport Properties of Amorphous Indium—Gallium—Zinc Oxide Semiconductor Upon Exposure to Water," Applied Physics Letters, 2008, vol. 92, pp. 072104-1-072104-3.
Hsieh, H.H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Janotti, A. et al., "Oxygen Vacancies in ZnO," Applied Physics Letters, 2005, vol. 87, pp. 122102-1-122102-3.
Oba, F. et al., "Defect Energetics in ZnO: A Hybrid Hartree-Fock Density Functional Study," Physical Review. B, 2008, vol. 77, pp. 245202-1-245202-6.
Orita, M. et al., "Amorphous Transparent Conductive Oxide InGaO3(ZnO)m (m<4): a Zn4s Conductor," Philosophical Magazine, 2001, vol. 81, No. 5, pp. 501-515.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Mo, Y.-G. et al., "Amorphous Oxide TFT Backplanes for Large Size AMOLED Displays," IDW '08: Proceedings of the 6th International Display Workshops, Dec. 3, 2008, pp. 581-584.
Kim, S. et al., "High-Performance Oxide Thin Film Transistors Passivated by Various Gas Plasmas," 214th ECS Meeting, 2008, No. 2317, ECS.
Clark, S. et al., "First Principles Methods Using CASTEP," Zeitschrift fur Kristallographie, 2005, vol. 220, pp. 567-570.
Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.
Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.
Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.
Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.
Taiwanese Office Action re Application No. TW 101113951, dated Jan. 15, 2016.

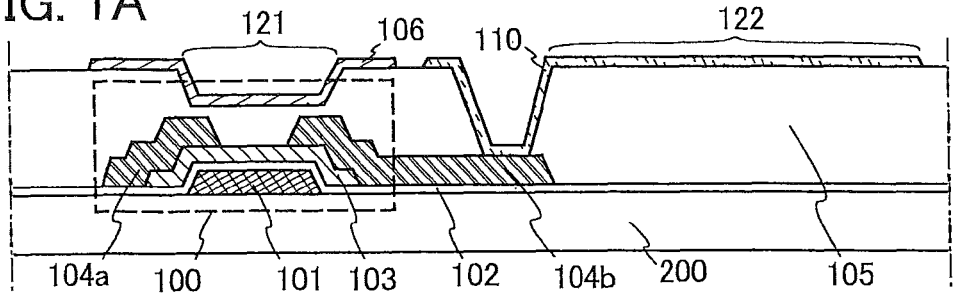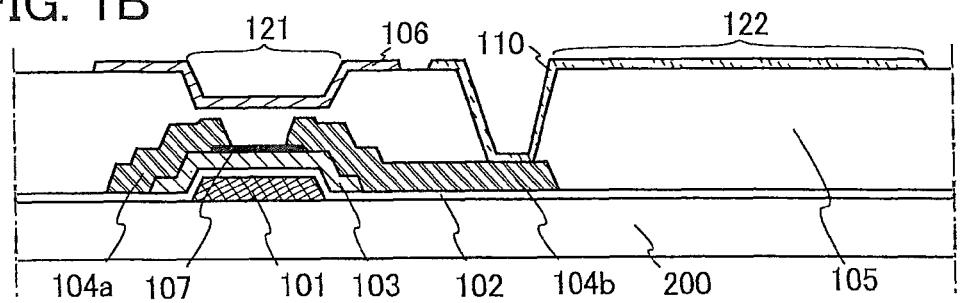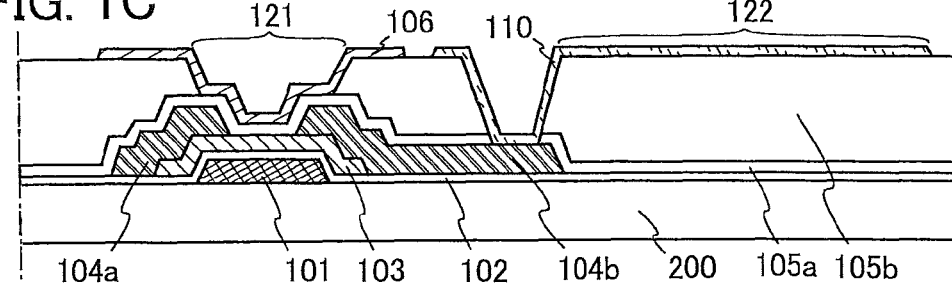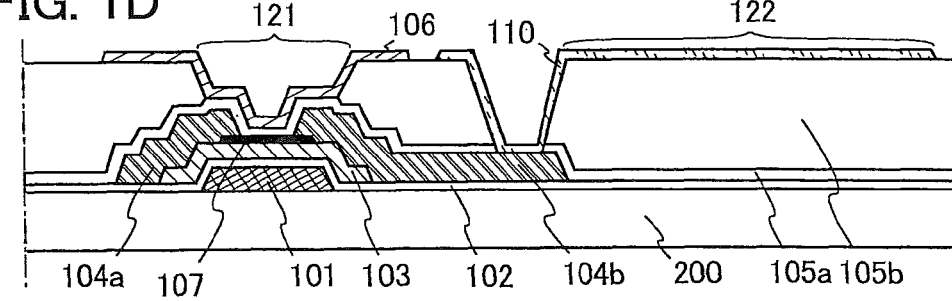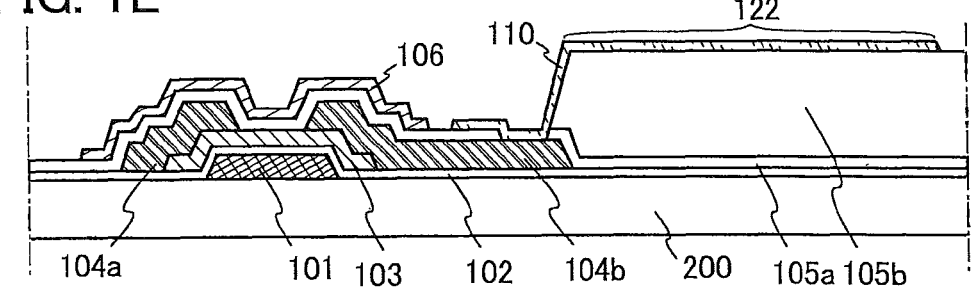

FIG. 55A  FIG. 55B  FIG. 55C
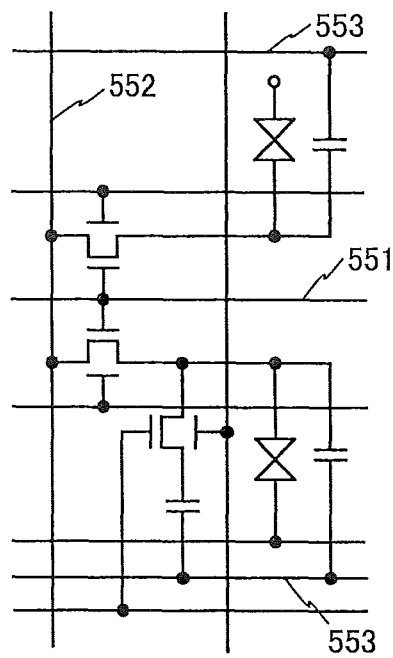
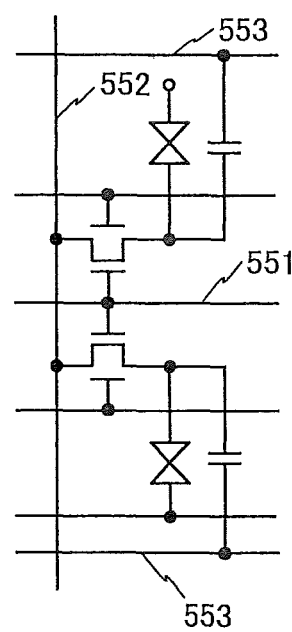
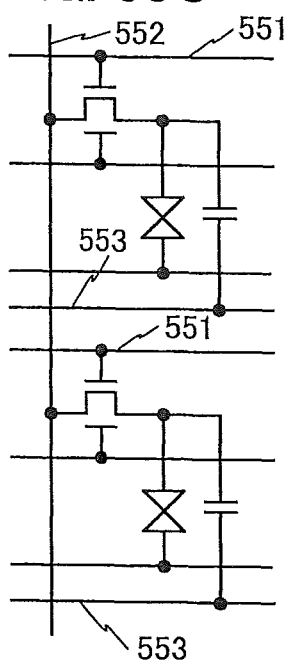
FIG. 55D  FIG. 55E  FIG. 55F
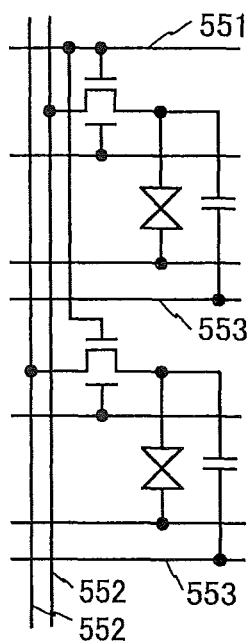
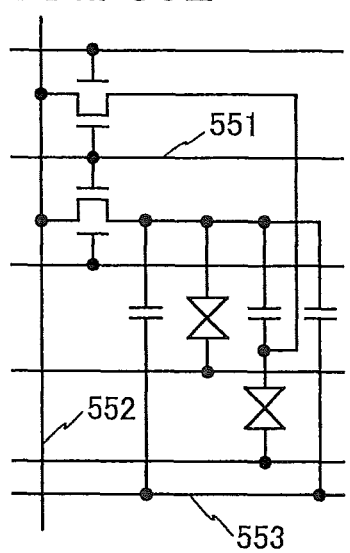
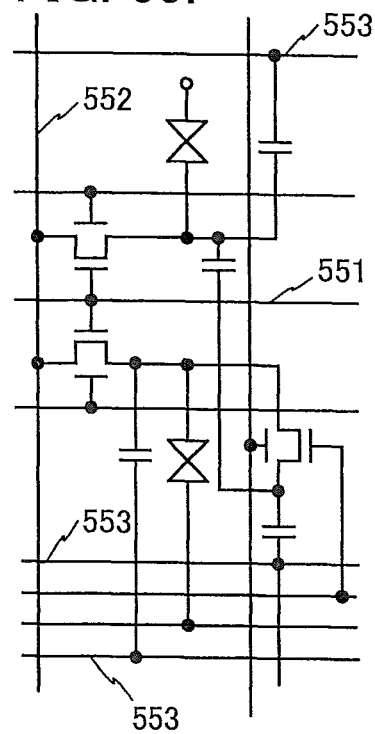
FIG. 55G  FIG. 55H
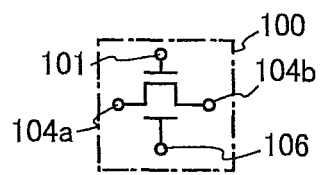
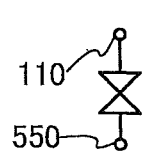

104a  101  103  102  104b  200  601a

105a

601b 121  122  105b 121  106  110  122

● In
☾ Sn
☽ Zn
● O

- In
- Ga
- Zn
- O

SEMICONDUCTOR DEVICE AND METHOD FOR MANUFACTURING THE SAME

This application is a continuation of copending U.S. application Ser. No. 14/221,753, filed on Mar. 21, 2014 which is a continuation of U.S. application Ser. No. 13/462,945, filed on May 3, 2012 (now U.S. Pat. No. 8,680,529 issued Mar. 25, 2014) which are incorporated herein by reference.

BACKGROUND OF THE INVENTION

1. Field of the Invention

The present invention relates to semiconductor devices, display devices, light-emitting devices, and methods for manufacturing these devices. In particular, the present invention relates to semiconductor devices, display devices, and light-emitting devices each including a transistor, and methods for manufacturing these devices. The present invention relates to electronic devices including the semiconductor devices, the display devices, or the light-emitting devices.

2. Description of the Related Art

It is known that the on-state current of a transistor including gate electrodes above and below with a semiconductor layer provided therebetween can be increased and that the off-state current of the transistor can be decreased by control of the threshold voltage. A transistor with such a structure is referred to as a double-gate transistor or a dual-gate transistor. In the following description, a transistor with such a structure is also referred to as a bottom-gate transistor with a back gate electrode.

A bottom-gate transistor with a back gate electrode can be used in, for example, a display device (see FIG. 7 in Patent Document 1).

REFERENCE

Patent Document 1: Japanese Published Patent Application No. 2010-109342.

SUMMARY OF THE INVENTION

In a display device disclosed in Patent Document 1, in order to increase the aperture ratio or to reduce noise to a pixel electrode, a planarization insulating layer is formed over a transistor and the pixel electrode is formed over the planarization insulating layer. Here, a back gate electrode of the transistor is formed in a position which is below the planarization insulating layer and is close to a semiconductor layer (a semiconductor layer in which a channel is formed) of the transistor.

In the display device disclosed in Patent Document 1, the back gate electrode is formed using a layer different from the layer of the pixel electrode. Thus, the display device disclosed in Patent Document 1 has a problem in that the number of manufacturing steps is increased as compared to a display device including a transistor which does not have a back gate electrode.

When the back gate electrode and the pixel electrode are formed using the same layer in order to inhibit an increase in the number of manufacturing steps, the planarization insulating layer exists between the back gate electrode and the semiconductor layer of the transistor. Since the planarization insulating layer is generally thick, there is a problem in that the back gate electrode cannot function well.

It is an object of one embodiment of the present invention to manufacture a semiconductor device including a bottom-gate transistor with a back gate electrode in fewer steps. Alternatively, it is an object of one embodiment of the present invention to provide a semiconductor device including a bottom-gate transistor with a back gate electrode that can be manufactured in fewer steps. Alternatively, it is an object of one embodiment of the present invention to provide a semiconductor device where a strong electric field can be applied to a semiconductor layer by a back gate electrode. Alternatively, it is an object of one embodiment of the present invention to provide a semiconductor device where the threshold voltage is controlled. Alternatively, it is an object of one embodiment of the present invention to provide a semiconductor device which is easily normally off. Alternatively, it is an object of one embodiment of the present invention to provide a semiconductor device including a transistor whose on-state current is high. Alternatively, it is an object of one embodiment of the present invention to provide a semiconductor device including a transistor capable of inhibiting the incidence of light on a channel or the like. Alternatively, it is an object of one embodiment of the present invention to provide a semiconductor device including a transistor which is not easily degraded. Alternatively, it is an object of one embodiment of the present invention to provide a semiconductor device where the thickness of an insulating layer provided over a channel of a transistor is varied using a half-tone mask or a gray-tone mask. Alternatively, it is an object of one embodiment of the present invention to provide a better semiconductor device while inhibiting an increase in the number of steps. Alternatively, it is an object of one embodiment of the present invention to provide a semiconductor device where an increase in cost is inhibited by inhibiting an increase in the number of steps. Alternatively, it is an object of one embodiment of the present invention to provide a display device capable of displaying an image accurately by using a transistor whose off-state current is low. Alternatively, it is an object of one embodiment of the present invention to provide a display device having a high aperture ratio. Alternatively, it is an object of one embodiment of the present invention to provide a semiconductor device in which noise to a pixel electrode is low. Alternatively, it is an object of one embodiment of the present invention to provide a semiconductor device in which an insulating layer is thicker in a portion below a pixel electrode than in a portion below a back gate electrode.

Note that the description of these objects does not impede the existence of other objects. Note that in one embodiment of the present invention, there is no need to achieve all the objects. Other objects will be apparent from and can be derived from the description of the specification, the drawings, the claims, and the like.

One embodiment of the present invention is a semiconductor device that includes a transistor and a pixel electrode. The transistor includes a first gate electrode, a first insulating layer over the first gate electrode, a semiconductor layer over the first insulating layer, a second insulating layer over the semiconductor layer, and a second gate electrode over the second insulating layer. The first gate electrode has a region overlapping with the semiconductor layer with the first insulating layer provided therebetween. The second gate electrode has a region overlapping with the semiconductor layer with the second insulating layer provided therebetween. The pixel electrode is provided over the second insulating layer. A first region is at least part of a region where the second gate electrode at least partly overlaps with at least part of the semiconductor layer. A second region is at least part of a region where the pixel electrode is provided. The second insulating layer is thinner in the first region than in the second region.

The transistor can further include a first electrode and a second electrode. One of the first electrode and the second electrode can be a source electrode, and the other of the first electrode and the second electrode can be a drain electrode. The pixel electrode may be electrically connected to the transistor through an opening in the second insulating layer.

The second insulating layer may include either one or both a color filter and a black matrix.

One embodiment of the present invention is a method for manufacturing a semiconductor device. The method includes a step of forming a first gate electrode over an insulating surface, a step of forming a first insulating layer over the first gate electrode, a step of forming a semiconductor layer over the first insulating layer so that the semiconductor layer at least partly overlaps with at least part of the first gate electrode with the first insulating layer provided therebetween, a step of forming a second insulating layer including a first region and a second region, over the semiconductor layer, and a step of forming a second gate electrode and a pixel electrode over the second insulating layer so that the second gate electrode at least partly overlaps with at least part of the semiconductor layer with the first region of the second insulating layer provided therebetween and at least part of the pixel electrode is provided over at least part of the second region of the second insulating layer. The first region of the second insulating layer is thinner than the second region of the second insulating layer.

One embodiment of the present invention is a method for manufacturing a semiconductor device. The method includes a step of forming a first gate electrode over an insulating surface, a step of forming a first insulating layer over the first gate electrode, a step of forming a semiconductor layer over the first insulating layer so that the semiconductor layer at least partly overlaps with at least part of the first gate electrode with the first insulating layer provided therebetween, a step of forming a second insulating layer including a first region, a second region, and a through hole, over the semiconductor layer, and a step of forming a second gate electrode and a pixel electrode over the second insulating layer so that the second gate electrode at least partly overlaps with at least part of the semiconductor layer with the first region of the second insulating layer provided therebetween and the pixel electrode at least partly overlaps with at least part of the second region of the second insulating layer and is in contact with a lower wiring or a lower electrode through the through hole. The first region of the second insulating layer is thinner than the second region of the second insulating layer.

The second insulating layer may be formed using a half-tone mask, a gray-tone mask, a phase shift mask, or a multi-tone mask.

According to one embodiment of the present invention, it is possible to manufacture a semiconductor device including a bottom-gate transistor with a back gate electrode in fewer steps. Alternatively, it is possible to provide a semiconductor device including a bottom-gate transistor with a back gate electrode that can be manufactured in fewer steps. Alternatively, it is possible to provide a semiconductor device where a strong electric field can be applied to a semiconductor layer by a back gate electrode. Alternatively, it is possible to provide a semiconductor device where the threshold voltage is controlled. Alternatively, it is possible to provide a semiconductor device which is easily normally off. Alternatively, it is possible to provide a semiconductor device including a transistor whose on-state current is high. Alternatively, it is possible to provide a semiconductor device where the thickness of an insulating layer provided over a channel of a transistor is varied using a half-tone mask, a gray-tone mask, a phase shift mask, or a multi-tone mask. Alternatively, it is possible to provide a better semiconductor device while inhibiting an increase in the number of steps. Alternatively, it is possible to provide a semiconductor device where an increase in cost is inhibited by inhibiting an increase in the number of steps. Alternatively, it is possible to provide a display device capable of displaying an image accurately by using a transistor whose off-state current is low. Alternatively, it is possible to provide a display device having a high aperture ratio. Alternatively, it is possible to provide a display device in which noise to a pixel electrode is low. Alternatively, it is possible to provide a display device in which an insulating layer is made thicker in a portion below a pixel electrode than in a portion below a back gate electrode.

BRIEF DESCRIPTION OF THE DRAWINGS

In the accompanying drawings:

FIGS. 1A to 1E are cross-sectional views each illustrating the structure of a semiconductor device;

FIGS. 55A to 55H are circuit diagrams each illustrating the structure of a semiconductor device;

DETAILED DESCRIPTION OF THE INVENTION

Figure 2A:
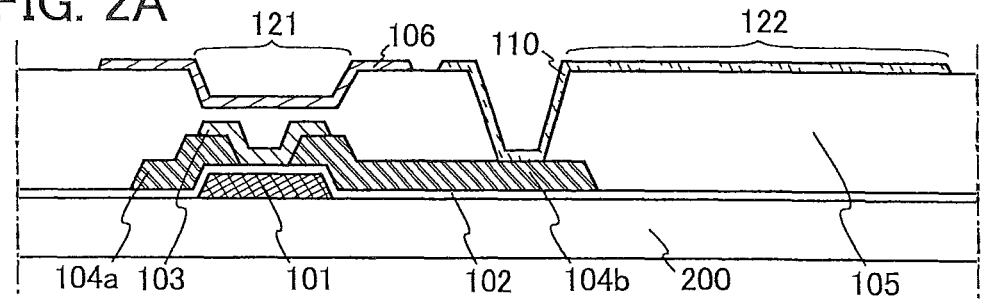
FIGS. 2A to 2E are cross-sectional views each illustrating the structure of a semiconductor device.
Figure 2B:
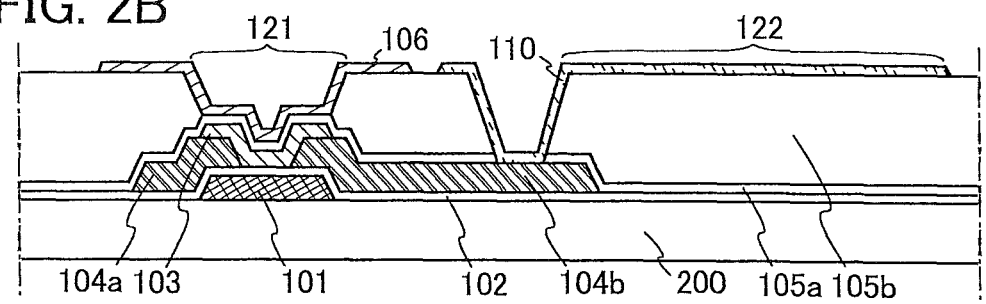
Figure 2C:
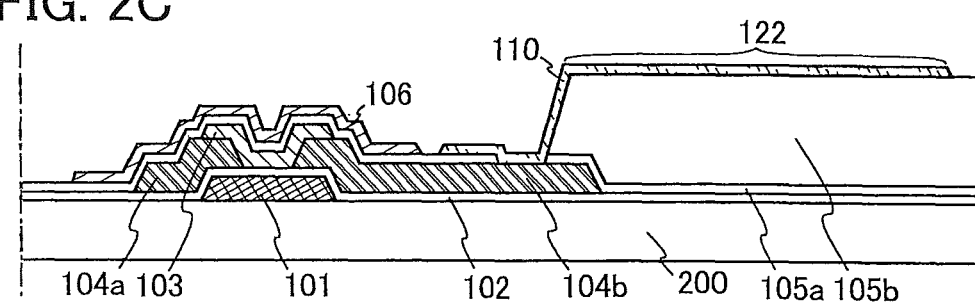
Figure 2D:
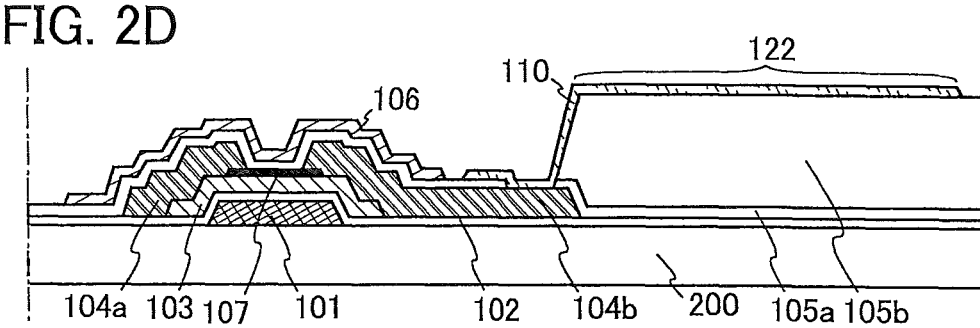
Figure 2E:
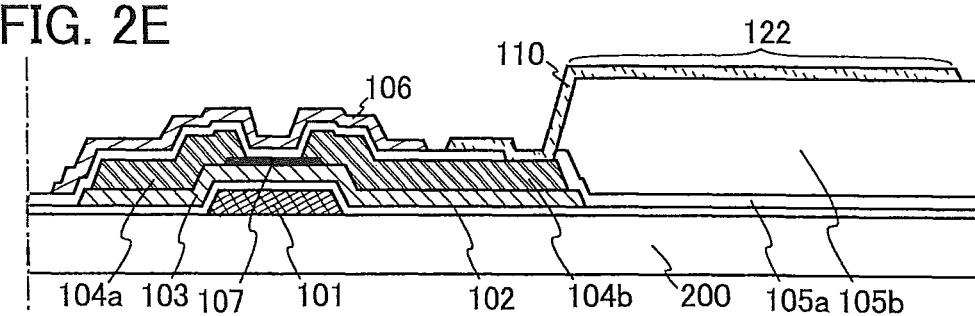

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures described below, the same portions or portions having similar functions are denoted by the same reference numerals in different drawings, and the description thereof is omitted.

Note that content (or may be part of the content) described in one embodiment may be applied to, combined with, or replaced by different content (or may be part of the different content) described in the embodiment and/or content (or may be part of the content) described in one or more different embodiments.

Note that the structure of a diagram (or may be part of the diagram) illustrated in one embodiment can be combined with the structure of another part of the diagram, the structure of a different diagram (or may be part of the different diagram) illustrated in the embodiment, and/or the structure of a diagram (or may be part of the diagram) illustrated in one or more different embodiments.

Note that size, thickness, or regions in the drawings are exaggerated for clarity in some cases. Thus, one aspect of an embodiment of the present invention is not limited to such scales. Alternatively, the drawings are perspective views of ideal examples. Thus, one aspect of an embodiment of the present invention is not limited to shapes and the like illustrated in the drawings. For example, a variation in shape due to a manufacturing technique or dimensional deviation can be included.

Note that an explicit expression "X and Y are connected" means that X and Y are electrically connected, X and Y are functionally connected, and where X and Y are directly connected. Here, each of X and Y is an object (e.g., a device, an element, a circuit, a wiring, an electrode, a terminal, a conductive film, or a layer). Accordingly, a connection relation other than those illustrated in drawings and texts is also included, without limitation to a predetermined connection relation, for example, the connection relation illustrated in the drawings and the texts.

For example, in the case where X and Y are electrically connected, one or more elements which enable an electrical connection between X and Y (e.g., a switch, a transistor, a capacitor, an inductor, a resistor, and/or a diode) can be connected between X and Y.

For example, in the case where X and Y are functionally connected, one or more circuits which enable a functional connection between X and Y can be connected between X and Y. Note that for example, in the case where a signal output from X is transmitted to Y even when another circuit is provided between X and Y, X and Y are functionally connected.

Note that an explicit expression "X and Y are electrically connected" means that X and Y are electrically connected, X and Y are functionally connected, and X and Y are directly connected. That is, the explicit expression "X and Y are electrically connected" is the same as an explicit simple expression "X and Y are connected".

Note that even when independent components are electrically connected to each other in a circuit diagram, there is the case where one conductive layer has functions of a plurality of components (e.g., a wiring and an electrode), such as the case where part of a wiring functions as an electrode. The expression "electrically connected" in this specification also means that one conductive layer has functions of a plurality of components.

(Embodiment 1)

In this embodiment, one aspect of a semiconductor device or the like (e.g., a display device or a light-emitting device) in the present invention is described with reference to drawings.

FIG. 1A is a cross-sectional view of a semiconductor device in one embodiment of the present invention. The semiconductor device includes a transistor 100 and an electrode 110 over an insulating surface (or an insulating substrate) 200. The transistor 100 includes an electrode 101, an insulating layer 102 over the electrode 101, a semiconductor layer 103 over the insulating layer 102, an insulating layer 105 over the semiconductor layer 103, and an electrode 106 over the insulating layer 105. The electrode 101 has a region overlapping with the semiconductor layer 103 with the insulating layer 102 provided therebetween. The electrode 106 has a region overlapping with the semiconductor layer 103 with the insulating layer 105 provided therebetween. The electrode 110 is provided over the insulating layer 105. A region 121 is at least part of a region where the electrode 106 at least partly overlaps with at least part of the semiconductor layer 103. A region 122 is at least part of a region where the electrode 110 is provided. The insulating layer 105 is thinner in the region 121 than in the region 122. It can also be said that the insulating layer 105 includes the region 121 and the region 122 thicker than the thin region 121, the region 121 is at least part of a region where the electrode 106 overlaps with part of the semiconductor layer 103, and that the region 122 at least partly overlaps with the electrode 110.

Here, the electrode 101 and the electrode 106 can function as a first gate electrode and a second gate electrode (a back gate electrode) of the transistor 100, respectively. The electrode 110 can function as a pixel electrode. The electrode 106 overlaps with the semiconductor layer 103 with the thin region of the insulating layer 105 (the region 121) provided therebetween; thus, the electrode 106 can function well as a back gate electrode. The electrodes 110 and 106 may be formed by etching of one conductive film. In that case, the electrodes 110 and 106 have the same material and substantially the same thickness. Alternatively, the electrodes 110 and 106 may be formed by etching of different conductive films. In the case where one conductive film is etched, the number of processes can be reduced.

Figure 66A:
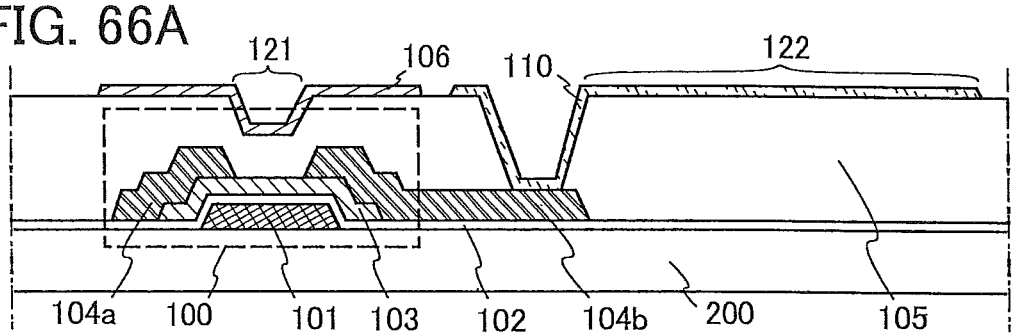
FIGS. 66A to 66C are cross-sectional views each illustrating the structure of a semiconductor device.
Figure 66B:
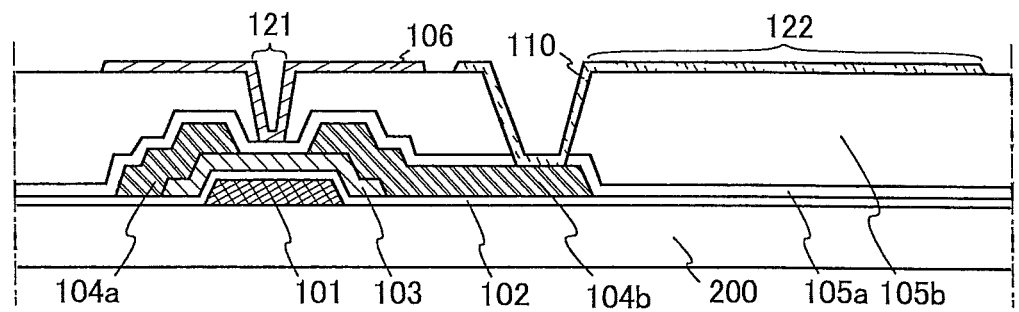
Figure 66C:
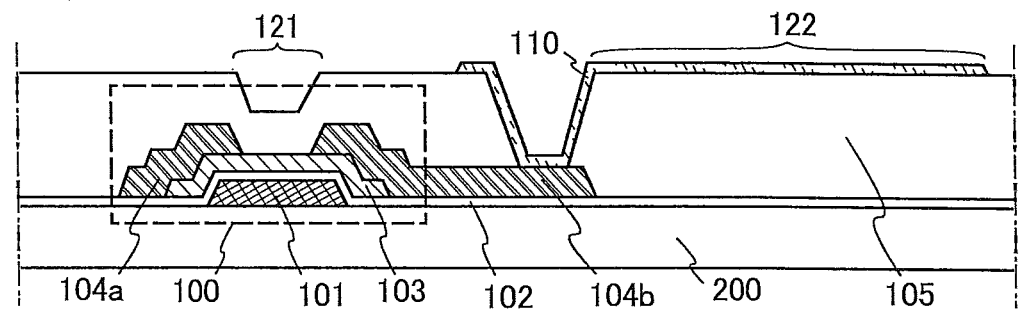

Note that the transistor preferably includes both the first gate electrode and the second gate electrode (the back gate electrode). However, one aspect of an embodiment of the present invention is not limited thereto. It is possible for the transistor to have one of the first gate electrode and the second gate electrode (the back gate electrode) but not to have the other electrode. For example, as illustrated in FIG. 66C, a structure where the transistor does not include the electrode 106 may be employed. Even in such a case, the transistor can operate correctly.

In FIG. 1A, the transistor 100 further includes electrodes 104a and 104b. One of the electrodes 104a and 104b can be a source electrode, and the other electrode can be a drain electrode. In FIG. 1A, the electrodes 104a and 104b are provided over the semiconductor layer 103 (for example, the electrodes 104a and 104b are provided to be in contact with an upper surface and a side surface of the semiconductor layer 103). A lower surface of the semiconductor layer 103 is not in contact with the electrodes 104a and 104b.

Note that the transistor preferably includes both the source electrode and the drain electrode. However, one aspect of an embodiment of the present invention is not limited thereto. It is possible for the transistor to have one of the source electrode and the drain electrode but not to have the other electrode, or to have neither of the electrodes. Even in such a case, the transistor whose channel is formed in the semiconductor layer 103 can operate correctly when the transistor is connected to a different element (e.g., a different transistor) through the semiconductor layer 103.

Note that a transistor is an element having at least three terminals: a gate, a drain, and a source. The transistor has a channel region between the drain (a drain terminal, a drain region, or a drain electrode) and the source (a source terminal, a source region, or a source electrode) and current can flow through the drain, the channel region, and the source. Here, since the source and the drain of the transistor change depending on the structure, the operating condition, and the like of the transistor, it is difficult to define which is a source or a drain. Thus, a region which serves as a source or a region which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

The electrode 110 can be electrically connected to the transistor 100 through an opening provided in the insulating layer 105.

Note that an explicit expression "Y on X" or "Y over X" does not necessarily mean that Y is on and in direct contact with X. The expression also means that X and Y are not in direct contact with each other, i.e., another object is provided between X and Y. Here, each of X and Y is an object (e.g., a device, an element, a circuit, a wiring, an electrode, a terminal, a conductive film, or a layer).

Thus, for example, an explicit expression "a layer Y on (or over) a layer X" means that the layer Y is on and in direct contact with the layer X, and another layer (e.g., a layer Z) is on and in direct contact with the layer X and the layer Y is on and in direct contact with the other layer. Note that another layer (e.g., a layer Z) may be a single layer or a plurality of layers (a stack of layers).

Similarly, an explicit expression "Y above X" does not necessarily mean that Y is on and in direct contact with X, and another object may be provided therebetween. Thus, for example, an expression "a layer Y above a layer X" means that the layer Y is on and in direct contact with the layer X, and another layer (e.g., a layer Z) is on and in direct contact with the layer X and the layer Y is on and in direct contact with the other layer. Note that another layer (e.g., a layer Z) may be a single layer or a plurality of layers (a stack of layers).

Note that the same can be said for an expression "Y under X" or "Y below X".

Figure 9A:
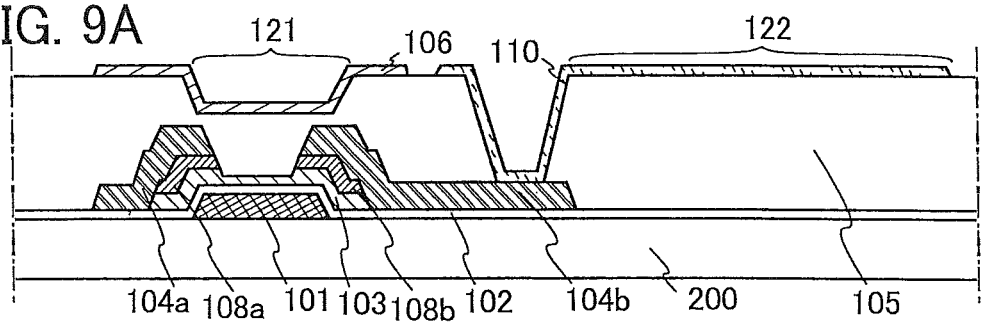
FIGS. 9A to 9E are cross-sectional views each illustrating the structure of a semiconductor device.
Figure 9B:
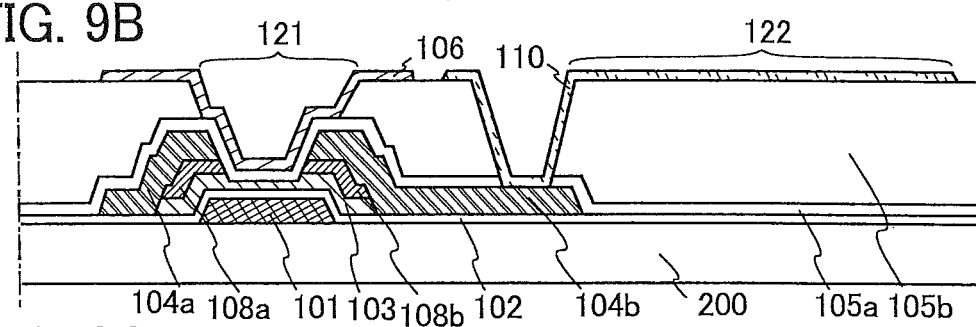
Figure 9C:
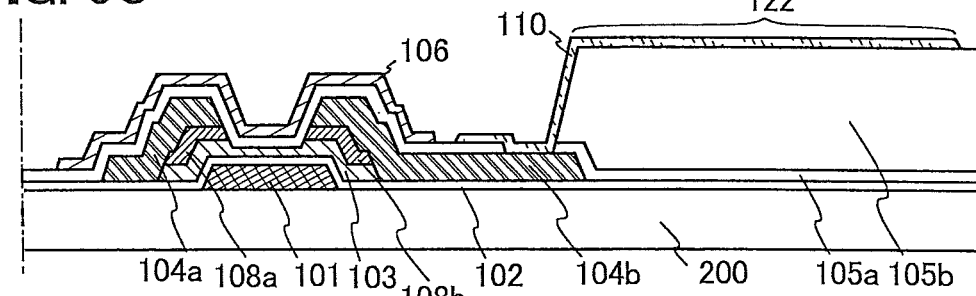
Figure 9D:
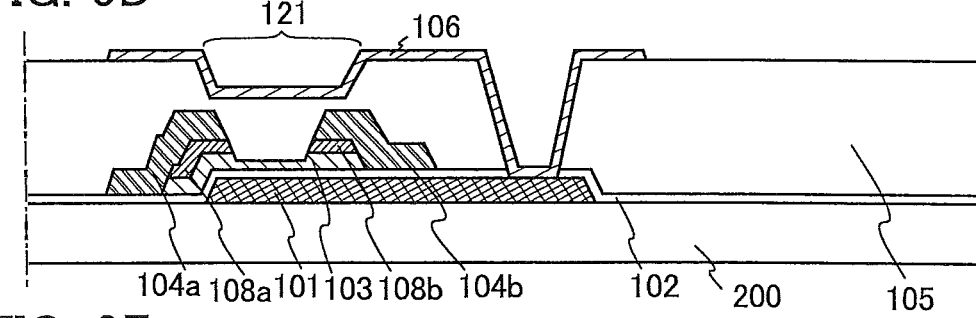
Figure 9E:
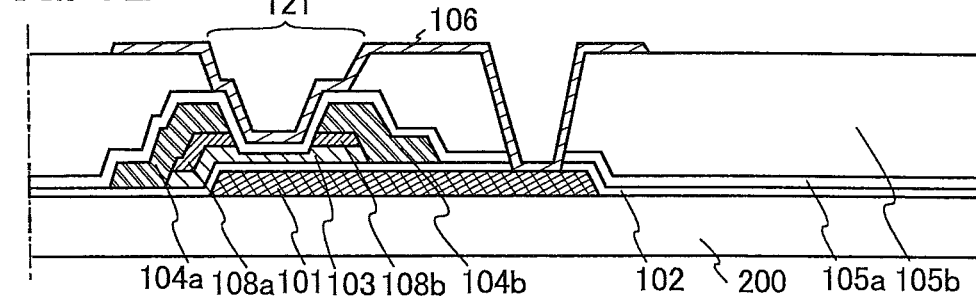
Figure 10A:
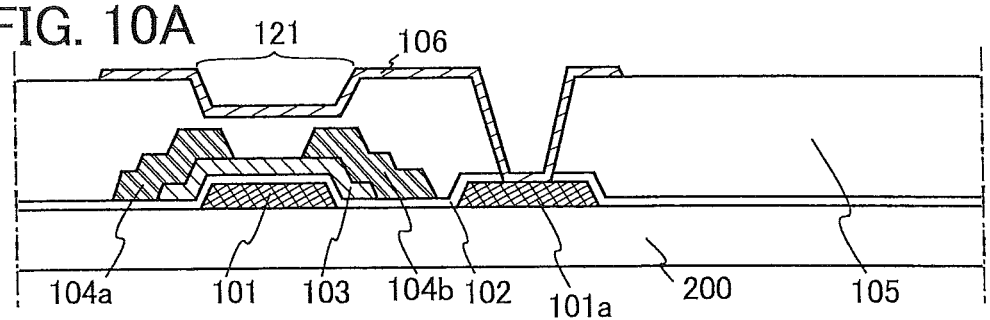
FIGS. 10A to 10E are cross-sectional views each illustrating the structure of a semiconductor device.
Figure 10B:
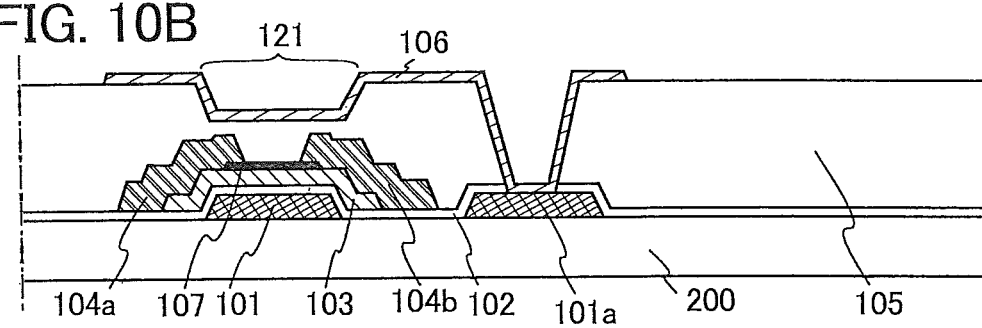
Figure 10C:
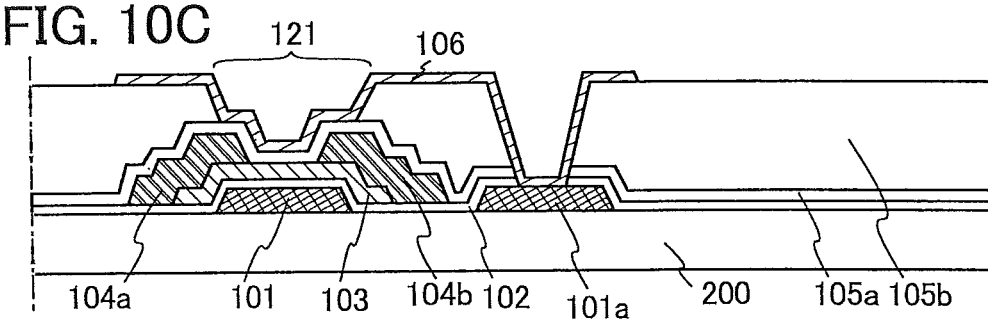
Figure 10D:
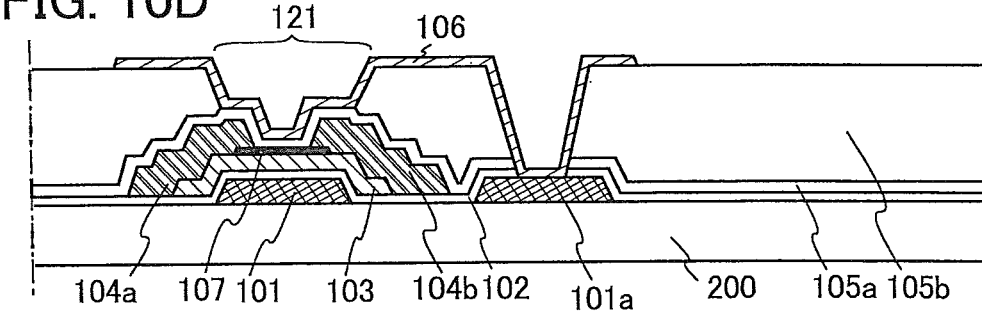
Figure 10E:
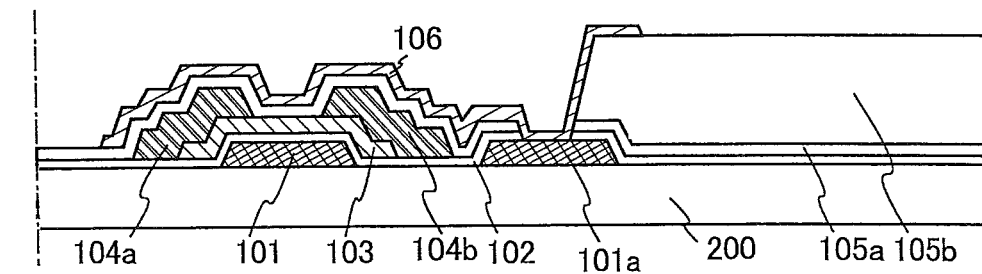
Figure 11A:
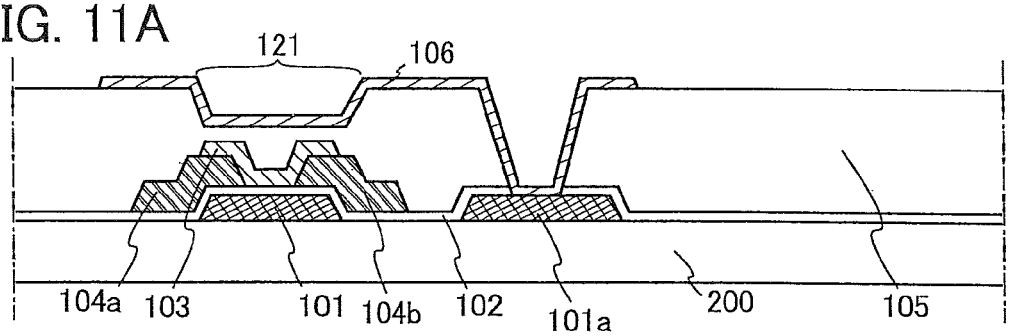
FIGS. 11A to 11E are cross-sectional views each illustrating the structure of a semiconductor device.
Figure 11B:
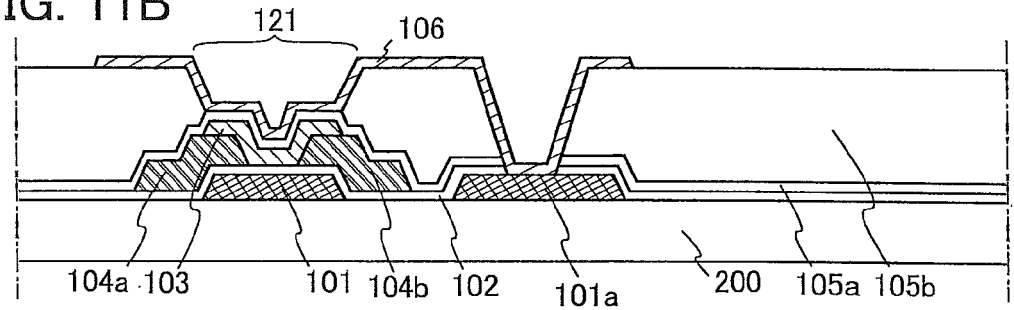
Figure 11C:
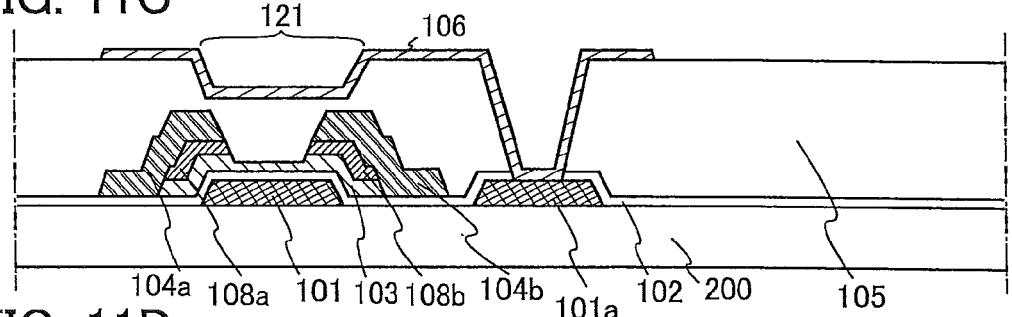
Figure 11D:
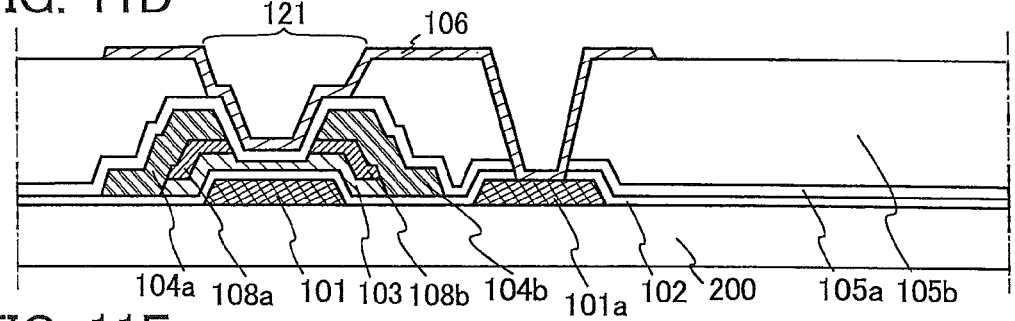
Figure 11E:
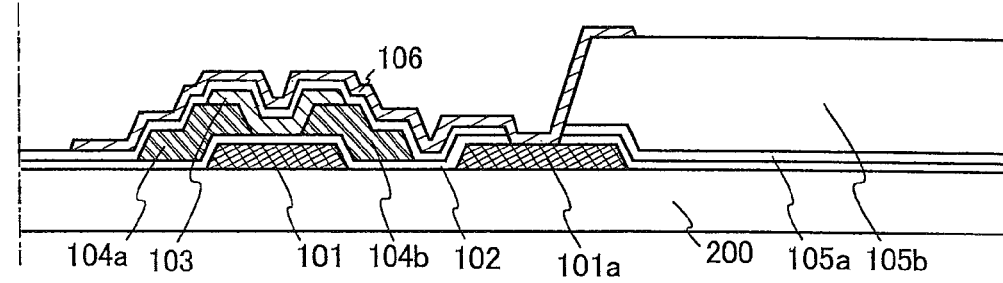
Figure 12A:
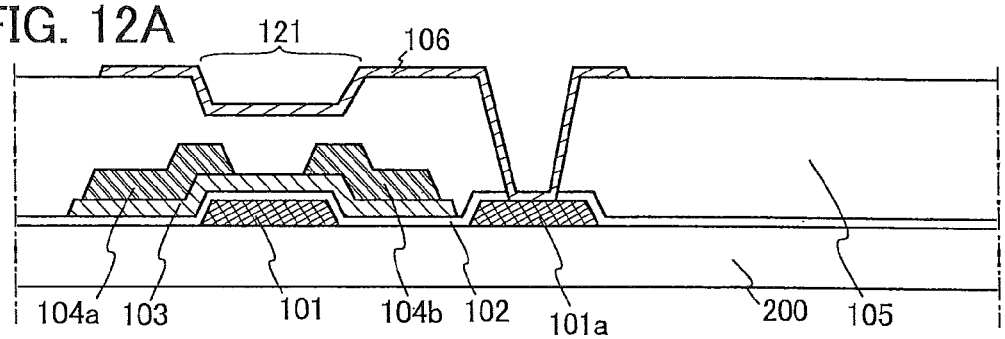
FIGS. 12A to 12E are cross-sectional views each illustrating the structure of a semiconductor device.
Figure 12B:
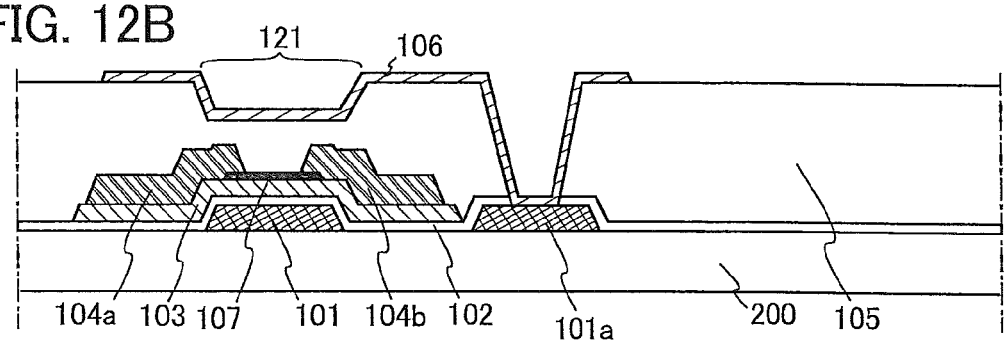
Figure 12C:
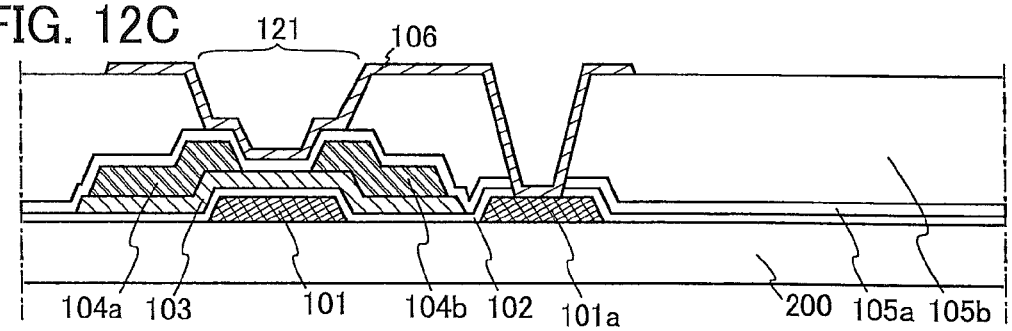
Figure 12D:
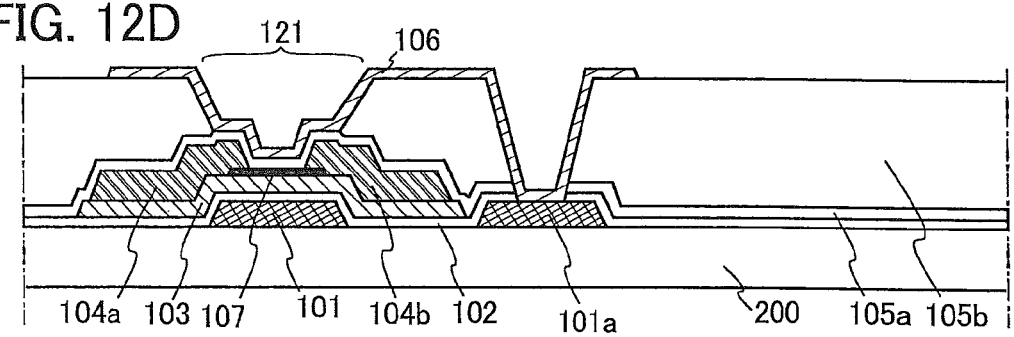
Figure 12E:
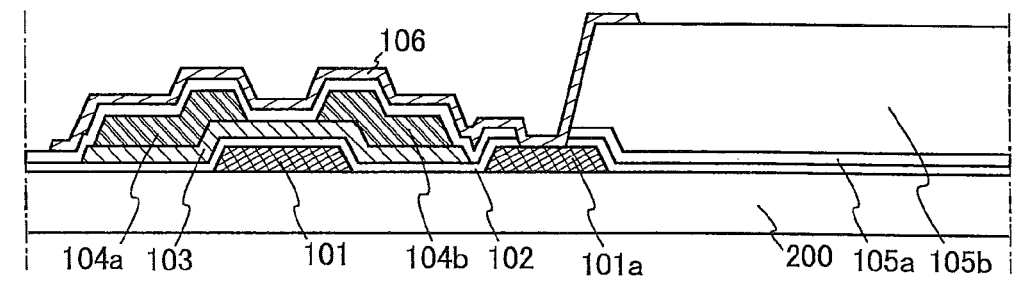
Figure 13A:
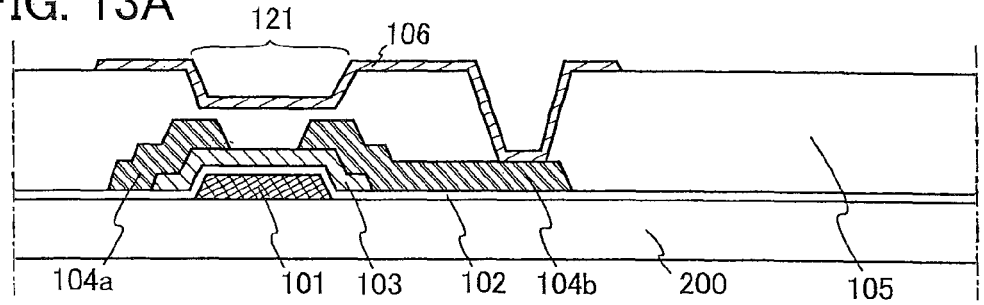
FIGS. 13A to 13E are cross-sectional views each illustrating the structure of a semiconductor device.
Figure 13B:
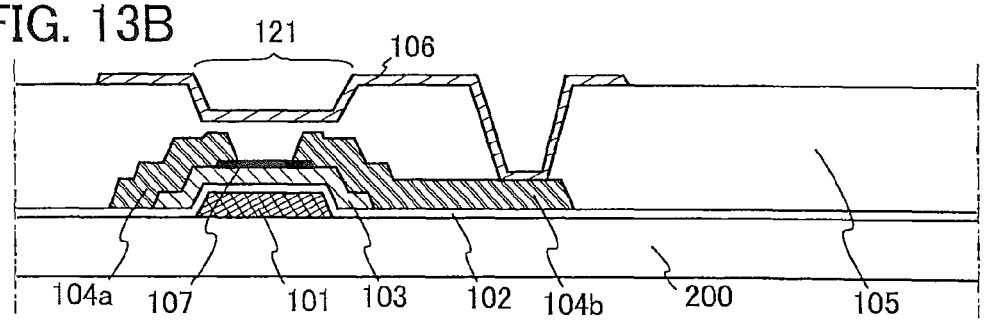
Figure 13C:
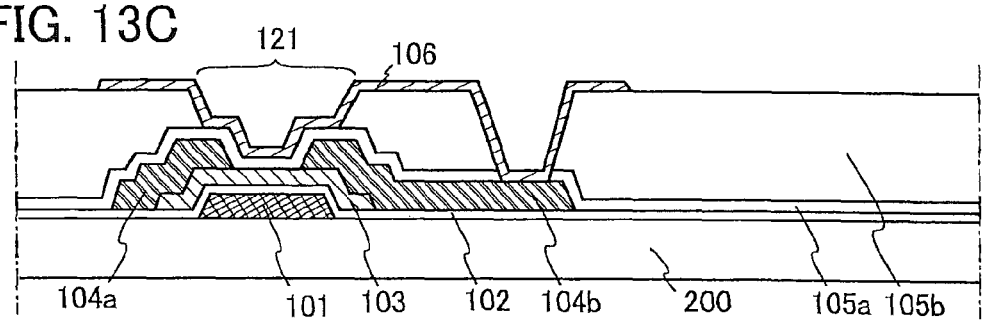
Figure 13D:
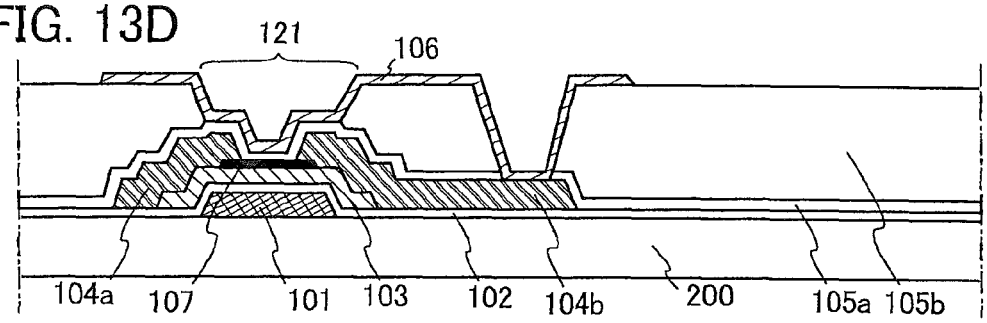
Figure 13E:
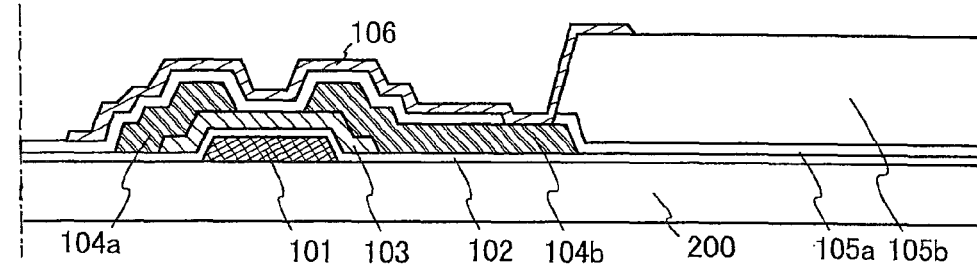
Figure 14A:
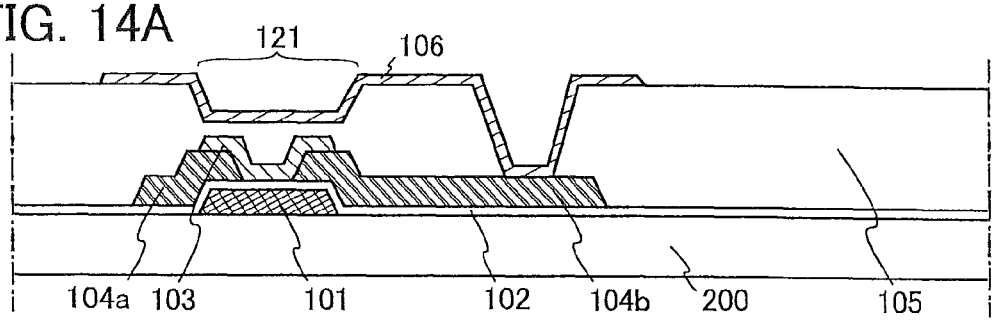
FIGS. 14A to 14E are cross-sectional views each illustrating the structure of a semiconductor device.
Figure 14B:
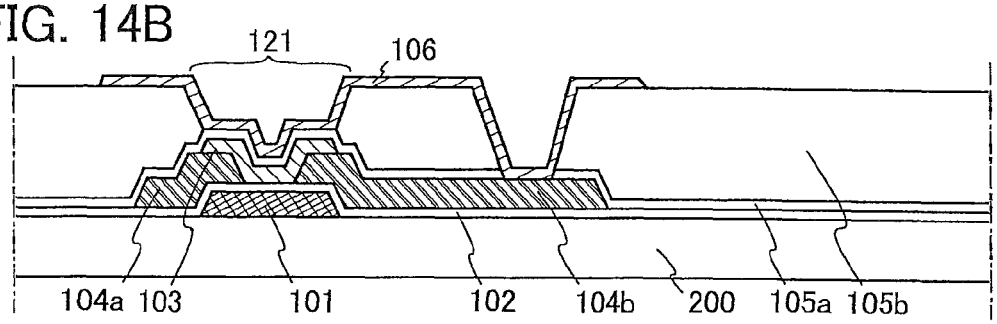
Figure 14C:
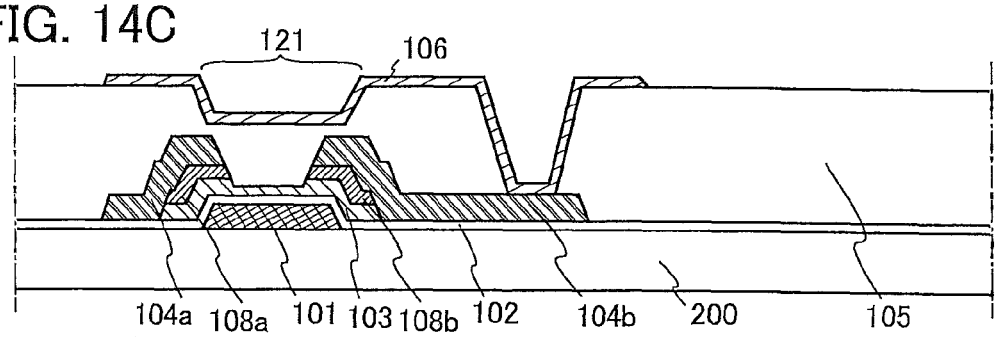
Figure 14D:
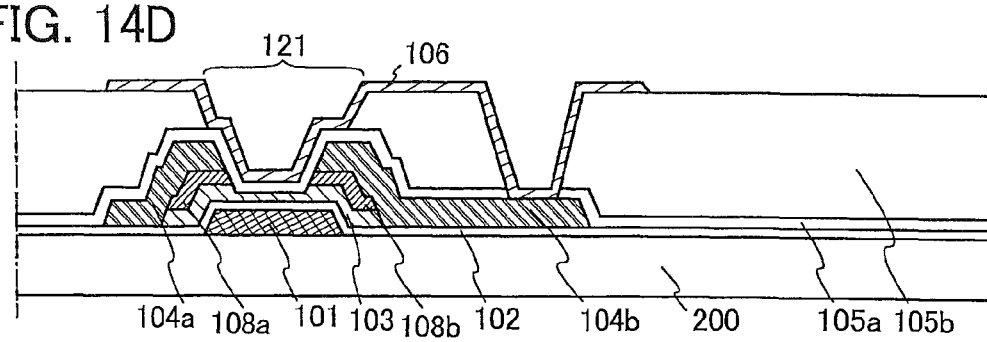
Figure 14E:
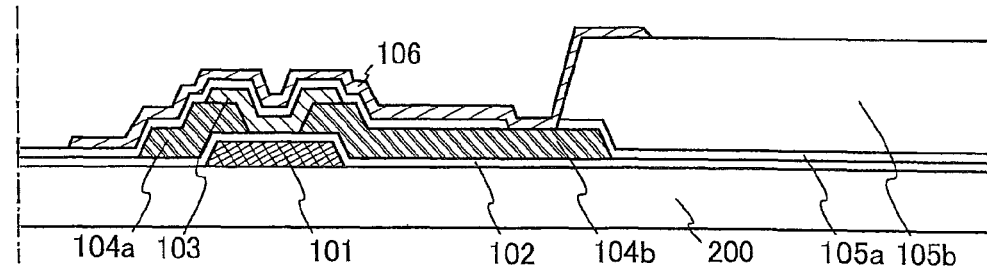
Figure 15A:
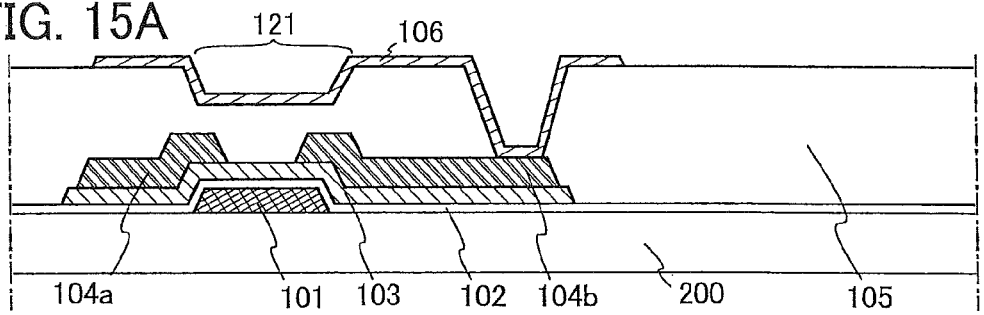
FIGS. 15A to 15E are cross-sectional views each illustrating the structure of a semiconductor device.
Figure 15B:
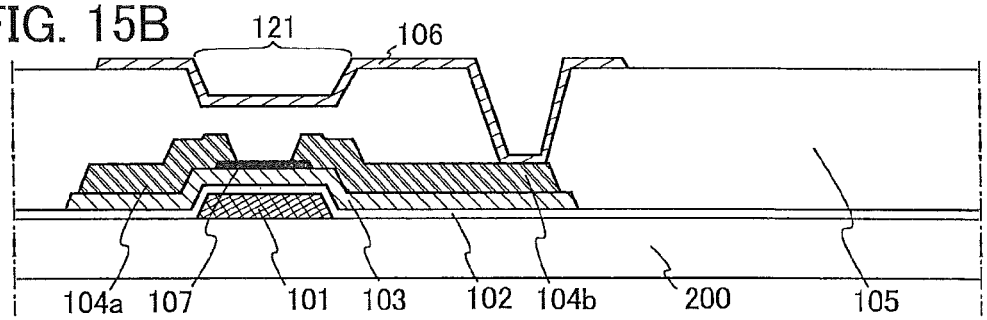
Figure 15C:
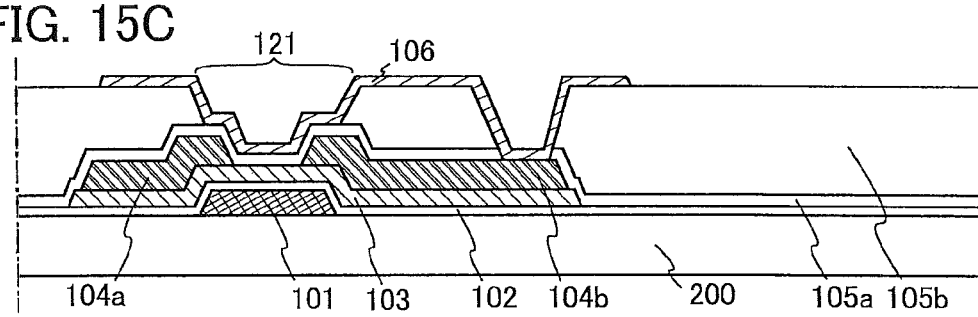
Figure 15D:
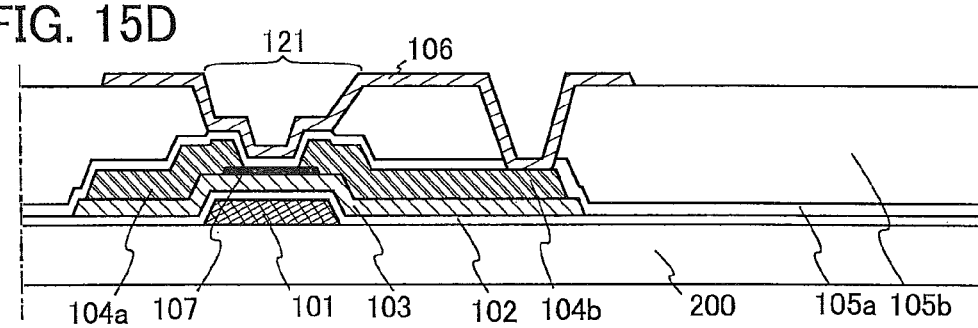
Figure 15E:
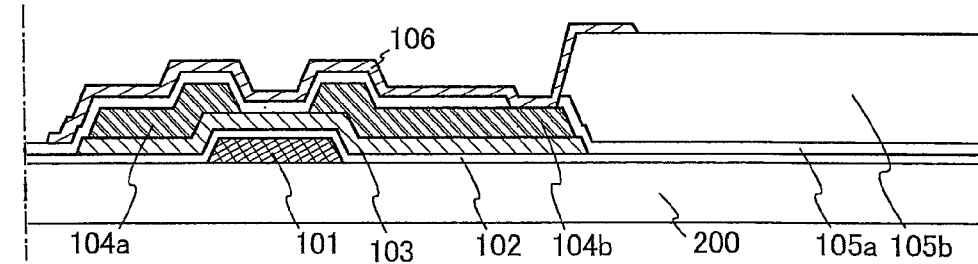
Figure 16A:
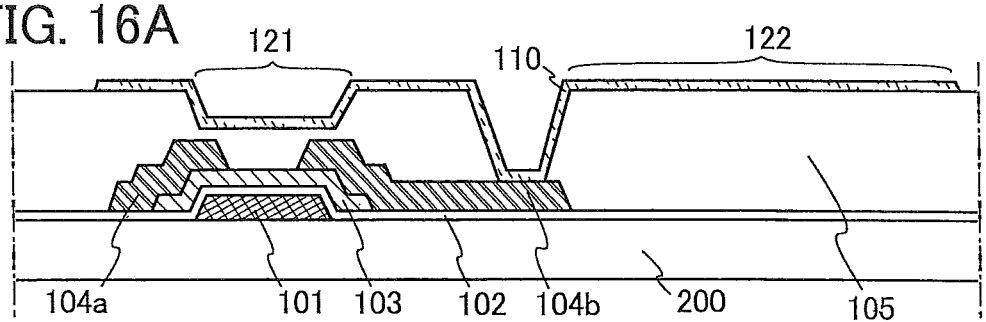
FIGS. 16A to 16E are cross-sectional views each illustrating the structure of a semiconductor device.
Figure 16B:
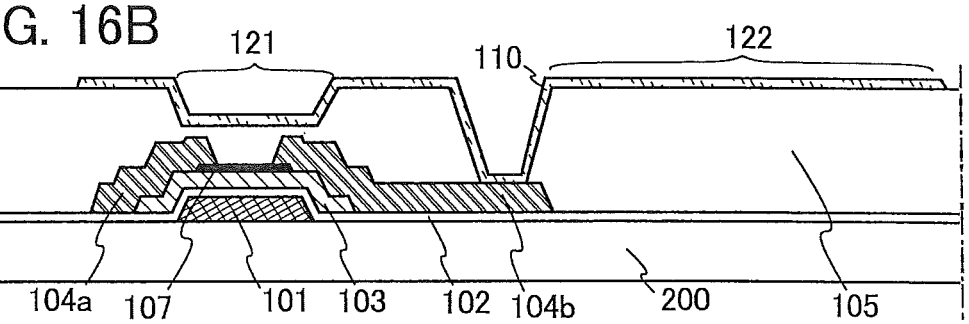
Figure 16C:
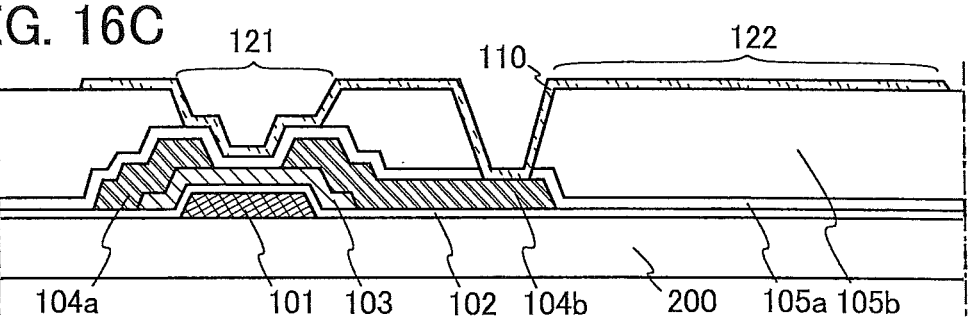
Figure 16D:
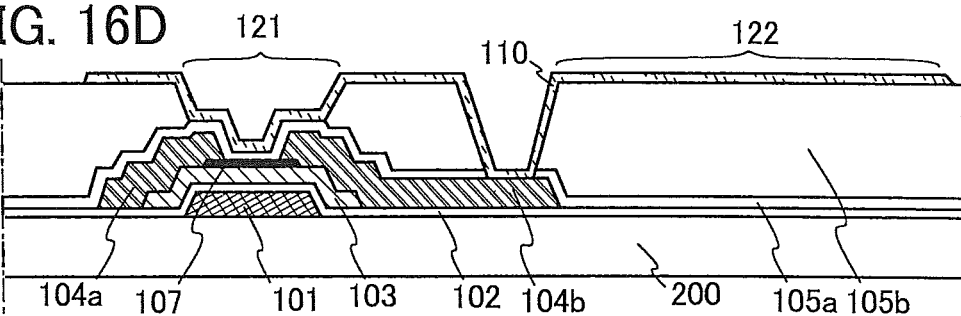
Figure 16E:
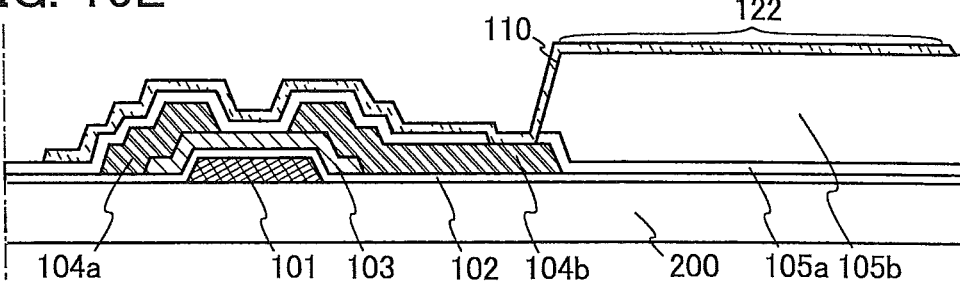
Figure 17A:
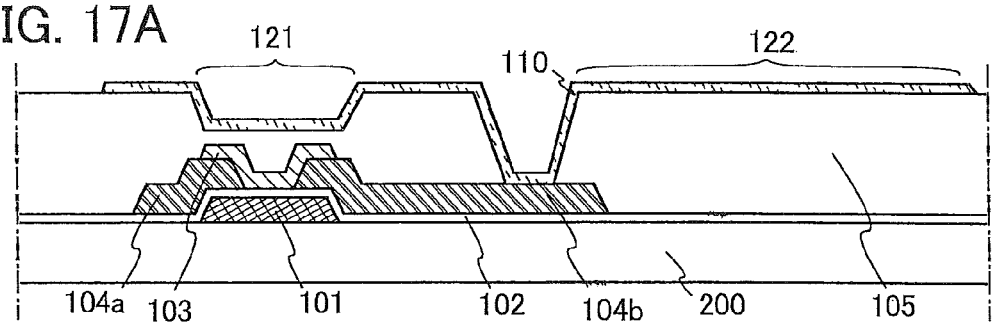
FIGS. 17A to 17E are cross-sectional views each illustrating the structure of a semiconductor device.
Figure 17B:
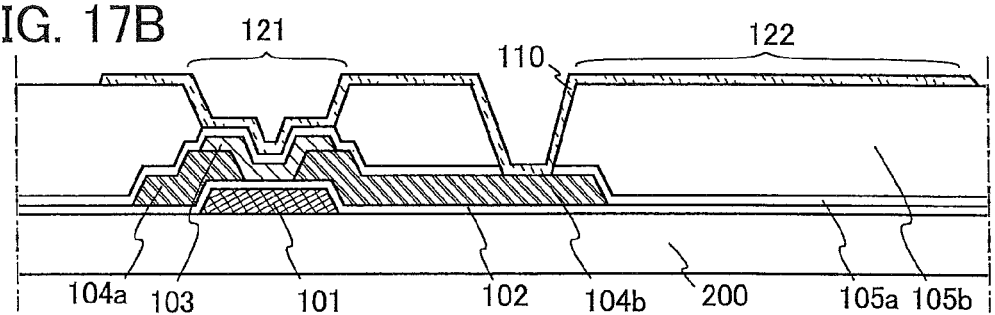
Figure 17C:
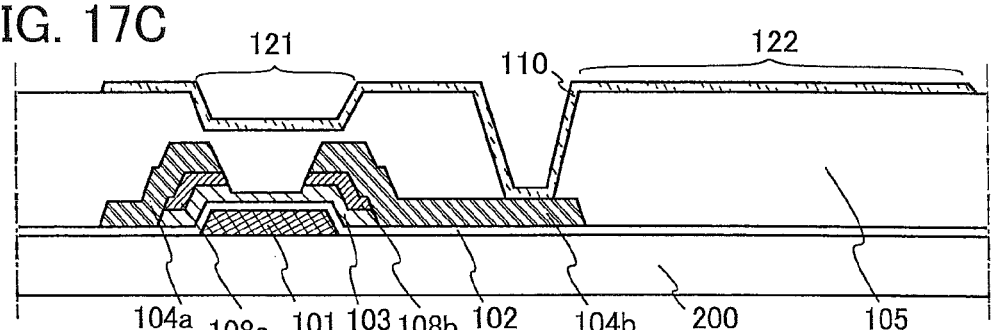
Figure 17D:
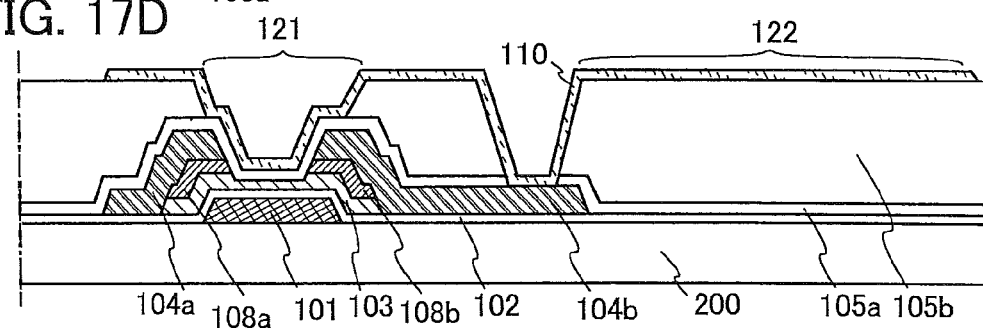
Figure 17E:
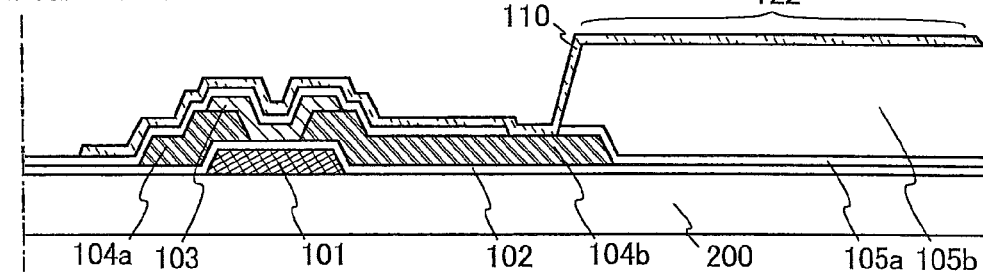
Figure 18A:
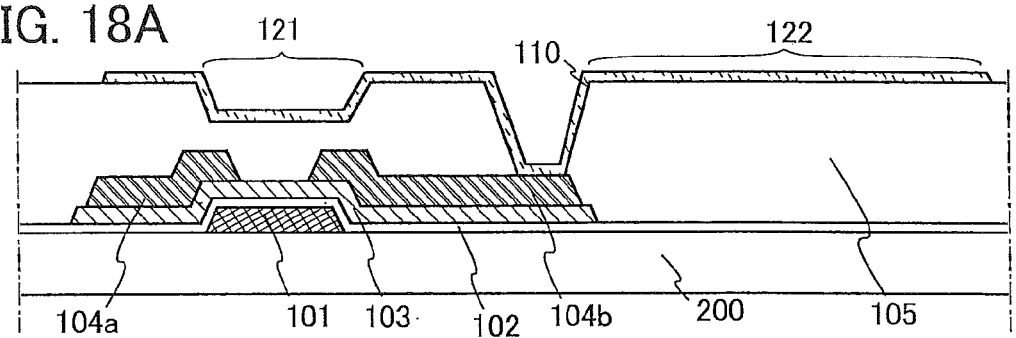
FIGS. 18A to 18E are cross-sectional views each illustrating the structure of a semiconductor device.
Figure 18B:
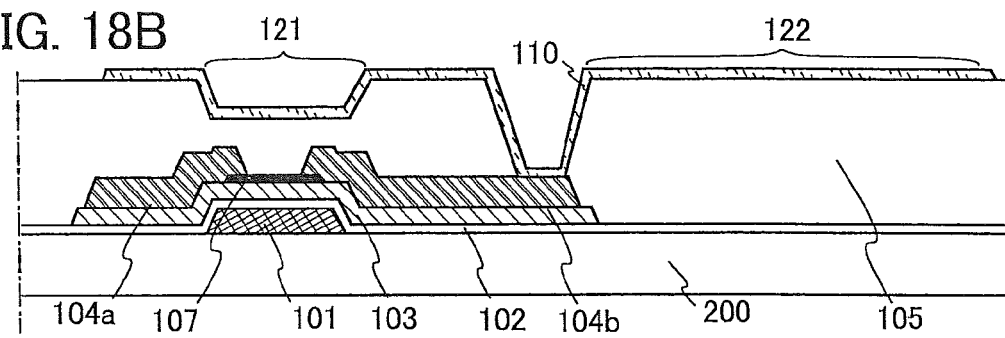
Figure 18C:
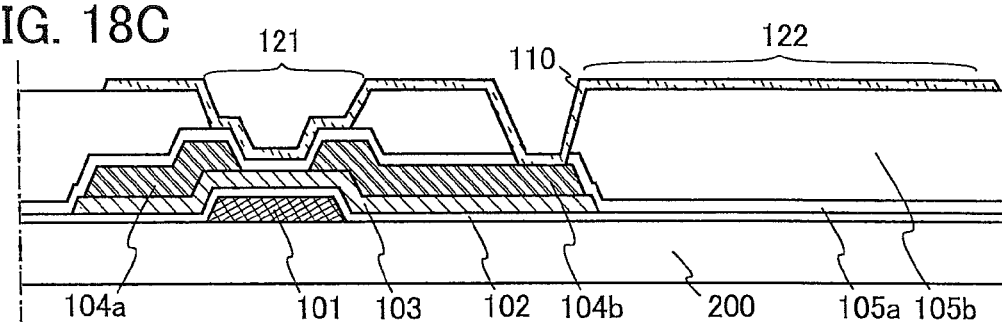
Figure 18D:
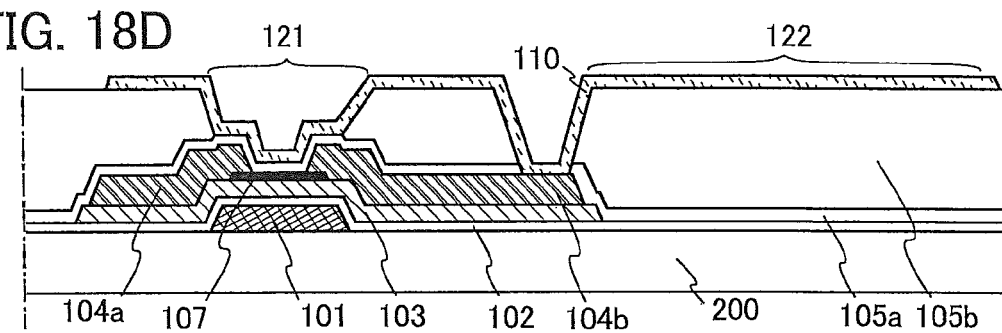
Figure 18E:
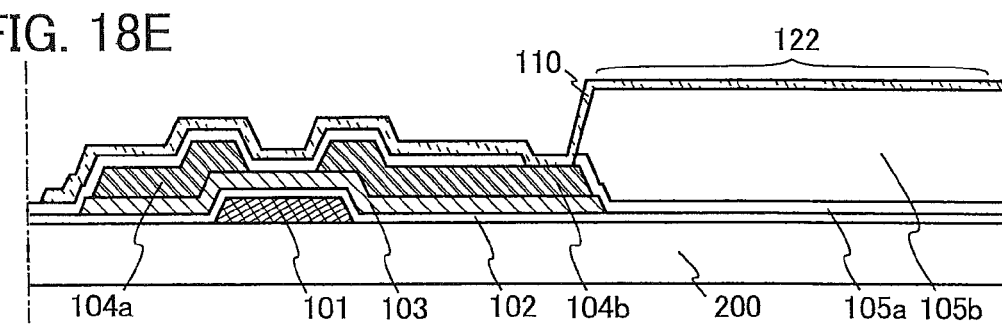

Note that as illustrated in FIG. 9A, a region of the semiconductor layer 103 that does not overlap with the electrodes 104a and 104b may be made thin. For example, when etching is performed so that the electrodes 104a and 104b are formed, part of a surface of the semiconductor layer 103 positioned below a layer to be the electrodes 104a and 104b may be etched. The transistor in which at least part of a region of the semiconductor layer 103 that serves as a channel is made thin in this manner (or the transistor in which a channel protective film is not provided between an upper portion of the channel and the electrodes 104a and 104b) might also be referred to as a channel etched transistor.

One aspect of the semiconductor device in the present invention is not limited to the structure in FIG. 1A. Different structure examples of the semiconductor device in the present invention are described below. Note that the same portions as those in FIG. 1A are denoted by the same reference numerals, and the description thereof is omitted.

For example, as illustrated in FIG. 1B, an insulating layer 107 can be provided between the semiconductor layer 103 and the electrodes 104a and 104b. The insulating layer 107 functions as a protective film (a channel protective film) for preventing the semiconductor layer 103 (especially, the region of the semiconductor layer 103 that serves as a channel) from being etched when etching is performed so that the electrodes 104a and 104b are formed. The transistor having a channel protective film might be referred to as a channel protective transistor. In that case, the semiconductor layer 103 can be made thin; thus, the subthreshold swing (the S value) of the transistor 100 can be improved (decreased).

Figure 65A:
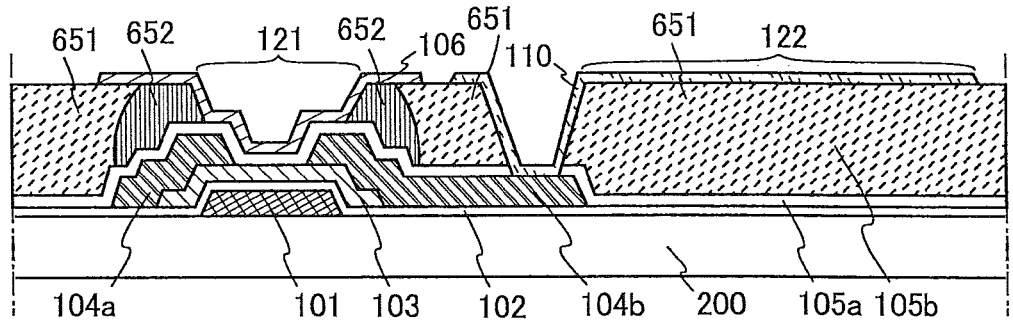
FIGS. 65A to 65D are cross-sectional views each illustrating the structure of a semiconductor device.
Figure 65B:
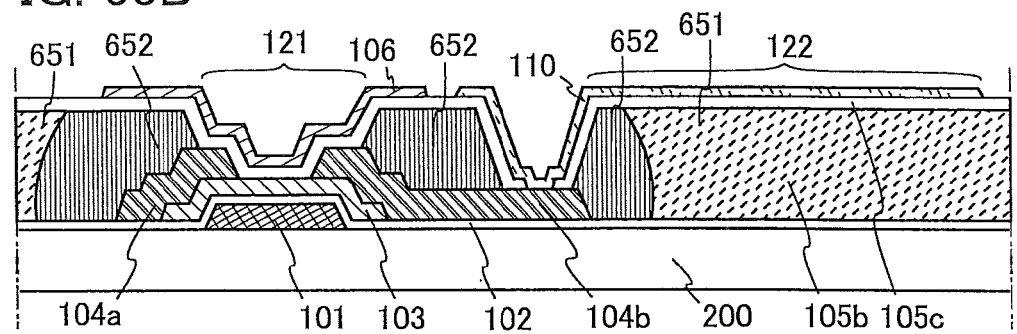
Figure 65C:
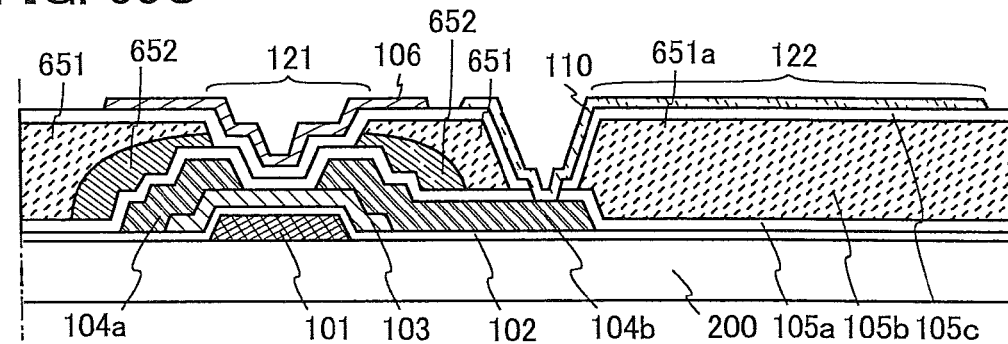
Figure 65D:
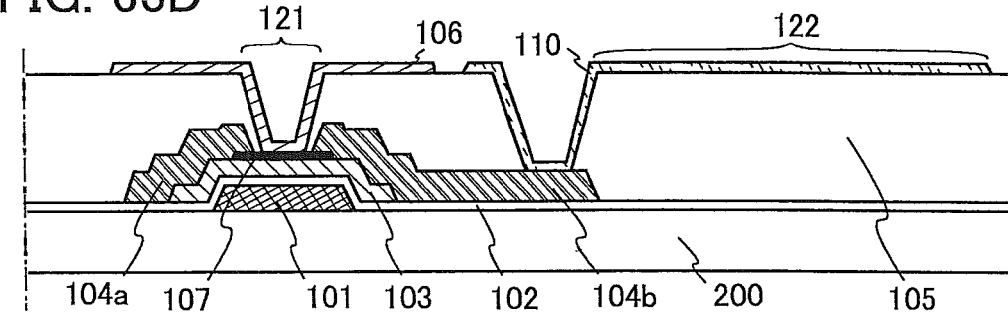

Note that in the case where the transistor is a channel protective transistor, as illustrated in FIG. 65D, the insulating layer 105 can be removed from the region 121. In that case, the electrode 106 and the insulating layer 107 are partly in direct contact with each other. Consequently, the electrode 106 functioning as a back gate electrode can apply a stronger electric field to the semiconductor layer 103.

Alternatively, for example, as illustrated in FIG. 2A, the electrodes 104a and 104b may be formed below the semiconductor layer 103 (for example, some of upper surfaces and end surfaces of the electrodes 104a and 104b may be formed to be in contact with the lower surface of the semiconductor layer 103). Consequently, the semiconductor layer 103 can be prevented from being damaged during etching for the electrodes 104a and 104b. Alternatively, the semiconductor layer 103 can be made thin, so that the subthreshold swing (the S value) can be improved (decreased).

Figure 3A:
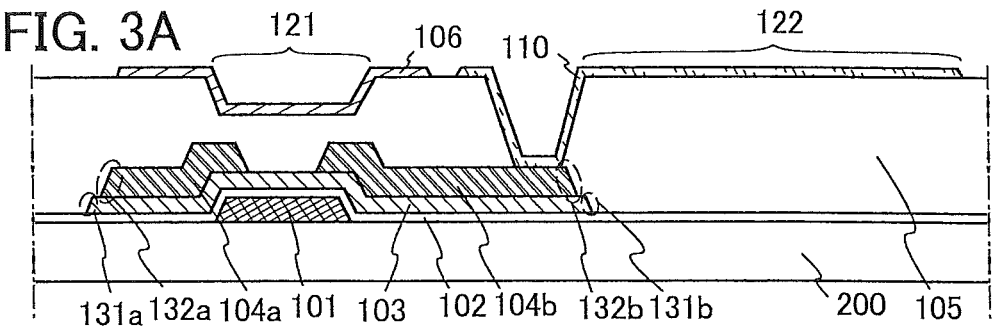
FIGS. 3A to 3E are cross-sectional views each illustrating the structure of a semiconductor device.

Alternatively, for example, as illustrated in FIG. 3A, ends 131a and 131b of the semiconductor layer 103 can be substantially aligned with ends 132a and 132b of the electrodes 104a and 104b. The semiconductor layer 103 and the electrodes 104a and 104b can be formed by etching of a stack of a semiconductor film and a conductive film over the semiconductor film with the use of one mask. A photomask having three or more regions with different transmittances of light used for exposure (hereinafter such a photomask is referred to as a half-tone mask, a gray-tone mask, a phase shift mask, or a multi-tone mask) can be used as the mask. With the use of the half-tone mask, a region in which the semiconductor layer 103 is exposed and a region from which the semiconductor layer 103 is removed can be formed by etching using one mask. Thus, the number of processes of forming the transistor 100 can be further reduced, and the cost of the semiconductor device can be further reduced. Note that in the case where the semiconductor layer 103 and the electrodes 104a and 104b are formed using the half-tone mask, the semiconductor layer 103 always exists below the electrodes 104a and 104b. The end 132a and/or the end 132b might be step-like ends.

Figure 3B:
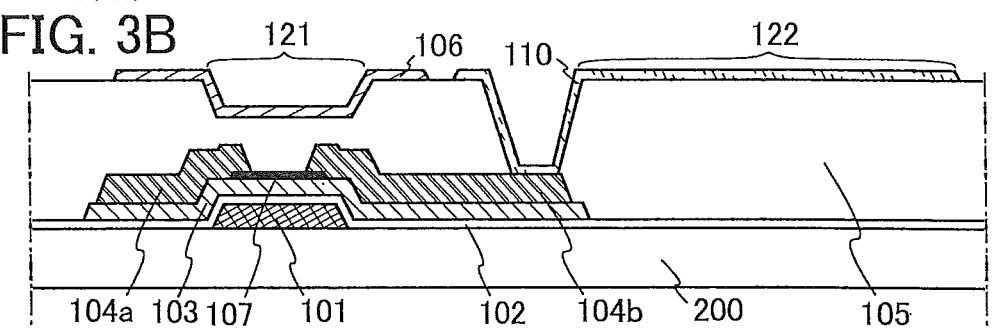
Figure 3C:
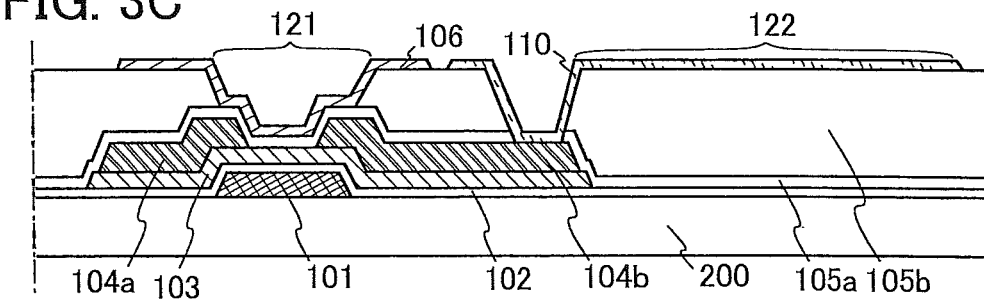
Figure 3D:
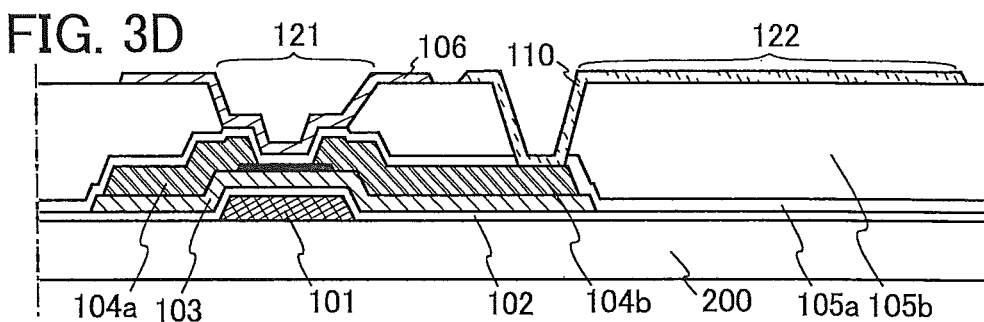
Figure 3E:
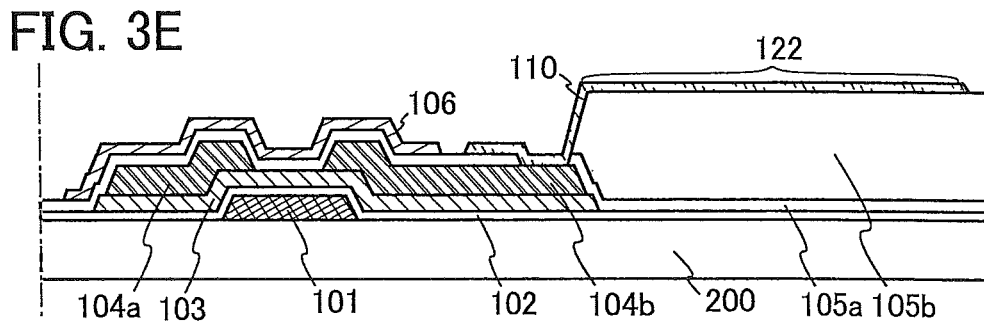

Alternatively, as illustrated in FIG. 3B, the insulating layer 107 functioning as a channel protective film can be provided in the structure illustrated in FIG. 3A. In this manner, channel protective films can be additionally provided in a variety of transistors which do not have channel protective films in drawings other than FIG. 3B.

Alternatively, for example, as illustrated in FIG. 9A, conductive layers 108a and 108b can be provided between the semiconductor layer 103 and the electrodes 104a and 104b. The conductive layers 108a and 108b can be formed using, for example, a semiconductor layer to which an impurity element imparting conductivity is added. Alternatively, for example, the conductive layers 108a and 108b can be formed using a conductive metal oxide. Alternatively, for example, the conductive layers 108a and 108b can be formed using a conductive metal oxide to which an impurity element imparting conductivity is added. Note that in FIG. 1A or the like, an impurity element imparting conductivity may be added to part of the semiconductor layer 103. Examples of an impurity element imparting conductivity include phosphorus, arsenic, boron, hydrogen, and tin.

Here, in FIG. 9A, a region of the semiconductor layer 103 that does not overlap with the electrodes 104a and 104b and the conductive layers 108a and 108b is made thin. This is because part of a surface of the semiconductor layer 103 positioned below a layer to be the electrodes 104a and 104b and a layer to be the conductive layers 108a and 108b is etched (the transistor in FIG. 9A is a channel etched transistor) when etching is performed so that the electrodes 104a and 104b and the conductive layers 108a and 108b are formed. Note that a channel protective film may be provided between the semiconductor layer 103 and the conductive layers 108a and 108b (the transistor in FIG. 9A may be a channel protective transistor) so that the semiconductor layer 103 can be prevented from being etched.

Note that although the electrodes 110 and 106 are formed using the same layer in the above structures, this embodiment is not limited thereto. The electrodes 110 and 106 may be formed using different layers.

Alternatively, an insulating layer can be provided between the electrodes 104a and 104b and the semiconductor layer 103 or between the electrodes 104a and 104b and the conductive layers 108a and 108b. Further, an opening may be provided in the insulating layer so that the electrodes 104a and 104b can be connected to the semiconductor layer 103 or the electrodes 104a and 104b can be connected to the conductive layers 108a and 108b.

Note that a variety of substrates can be used as a substrate having an insulating surface 200, without limitation to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Note that the transistor 100 may be formed over a substrate, and then, transferred to a different substrate so that the transistor 100 can be disposed over the different substrate.

As described above, the threshold voltage can be effectively controlled by the back gate electrode of the transistor 100 in FIG. 1A, FIG. 1B, FIG. 2A, FIG. 3A, FIG. 3B, FIG. 9A, or the like. Thus, the transistor 100 can be easily normally off. Alternatively, on-state current can be effectively increased by the back gate electrode. Alternatively, off-state current can be effectively decreased by the back gate electrode. Alternatively, an on/off ratio can be increased by the back gate electrode. Thus, when a display device has the above structure, the display device can display an image accurately. Alternatively, when a display device or a light-emitting device has the above structure and the insulating layer 105 functions as a planarization film, the aperture ratio can be increased.

This embodiment is one of basic structure examples according to one embodiment of the present invention. Thus, this embodiment can be freely combined with another embodiment obtained by performing change, addition, modification, removal, application, superordinate conceptualization, or subordinate conceptualization on part or all of this embodiment.

(Embodiment 2)

In this embodiment, one aspect of a semiconductor device or the like (e.g., a display device or a light-emitting device) in the present invention is described with reference to drawings.

In the structure described in Embodiment 1 with reference to FIG. 1A, FIG. 1B, FIG. 2A, FIG. 3A, FIG. 3B, FIG. 9A, or the like, the insulating layer 105 in the region 122 or part of the region 122 can include a stack of a plurality of layers. The insulating layer 105 in the region 122 or part of the region 122 includes a stack of in (in is a natural number of 2 or more) layers. The insulating layer 105 in the region 121 or part of the region 121 may include a stack of m or less layers or a single layer. The insulating layer 105 may include an organic insulating layer or a stack of an organic insulating layer and an inorganic insulating layer.

For example, in the structure illustrated in FIG. 1A, FIG. 1B, FIG. 2A, FIG. 3A, FIG. 3B, FIG. 9A, or the like, the insulating layer 105 in the region 122 may include a stack of layers 105a and 105b, and the insulating layer 105 in the region 121 may include a single layer of the layer 105a. The layer 105b is formed over the layer 105a. FIG. 1C, FIG. 1D, FIG. 2B, FIG. 3C, FIG. 3D, and FIG. 9B each illustrate such a structure. With such a structure, when only a necessary portion is etched utilizing a difference in sensitivity to etching (etching selectivity), a stack of the layers 105a and 105b can be obtained. Accordingly, the thickness of the insulating layer 105 in each region can be easily controlled. Alternatively, the regions can adequately have different functions (e.g., a planarization function, an impurity blocking function, and a light blocking function) depending on film quality. Alternatively, the number of processes can be reduced when part of the layer is formed using a photosensitive material.

Here, the layer 105a may be an inorganic insulating layer, and the layer 105b may be an organic insulating layer. In that case, since an organic material is used, the layer 105b can be thicker than the layer 105a. When the layer 105a is an inorganic insulating layer (preferably a silicon nitride film), for example, an impurity in the layer 105b can be prevented from entering the transistor 100. Alternatively, when the layer 105b is an organic insulating layer, the organic insulating layer can function as a planarization layer; thus, unevenness due to the transistor 100 or the like can be reduced.

In this manner, a surface on which the electrode 110 is formed can be planarized. Thus, for example, in the case where the electrode 110 is used as a pixel electrode, a display defect can be reduced. Alternatively, since the thickness of the layer 105b can be increased, noise to the pixel electrode can be reduced. Alternatively, since etching selectivity changes depending on film quality, only a necessary portion is selectively etched, so that a stack of the layers 105a and 105b with a predetermined shape can be obtained.

Alternatively, the layer 105a and/or the layer 105b (or part thereof, preferably the layer 105b) may be a color filter and/or a black matrix. When the layer 105a and/or the layer 105b is a color filter and/or a black matrix, an attachment margin for the substrate provided with the transistor 100 (the substrate having the insulating surface 200) and another substrate (e.g., a counter substrate or the like in the display device) can be increased. Alternatively, when a black matrix is provided in the layer 105a and/or the layer 105b (or part thereof) near the transistor 100, light cannot be easily incident on the transistor 100. When light is not easily incident on the transistor 100, the off-state current of the transistor 100 or degradation of the transistor 100 can be reduced. For example, as illustrated in FIG. 65A, a black matrix 652 can be provided in part of the layer 105b. Note that a plurality of color filters with different colors that overlap with each other can be used as a black matrix.

Note that a color filter and/or a black matrix is preferably formed using an organic material; thus, the color filter and/or the black matrix is preferably formed in the layer 105b. Note that this embodiment is not limited thereto, and a light-blocking conductive film can be used as the black matrix.

Alternatively, the thickness of the layer 105a may be smaller than the thickness of the layer 105b. When the thickness of the layer 105a is made smaller, an electric field caused by the electrode 106 can be adequately applied to the channel. Alternatively, when the thickness of the layer 105b is made larger, unevenness due to the transistor 100 or the like can be adequately reduced.

Alternatively, for example, in the structure illustrated in FIG. 1A, FIG. 1B, FIG. 2A, FIG. 3A, FIG. 3B, FIG. 9A, or the like, the insulating layer 105 in the region 122 may include a stack of the layer 105b and a layer 105c, and the insulating layer 105 in the region 121 may include a single layer of the layer 105c. The layer 105c is formed over the layer 105b. FIG. 26A, FIG. 26B, FIG. 27A, FIG. 28A, FIG. 28B, and FIG. 34A each illustrate such a structure. With such a structure, when only a necessary portion is etched utilizing a difference in sensitivity to etching (etching selectivity), a stack of the layers 105b and 105c can be obtained. Accordingly, the thickness of the insulating layer 105 in each region can be easily controlled. Alternatively, the regions can adequately have different functions (e.g., a planarization function, an impurity blocking function, and a light blocking function) depending on film quality. Alternatively, the number of processes can be reduced because part of the layer can be formed using a photosensitive material.

Here, the layer 105b may be an organic insulating layer, and the layer 105c may be an inorganic insulating layer. In that case, since an organic material is used, the layer 105b can be thicker than the layer 105c. When the layer 105c is an inorganic insulating layer (preferably a silicon nitride film), an impurity in the layer 105b can be prevented from entering the electrode 106 or a layer over the electrode 106 (e.g., a liquid crystal layer, an alignment film, or an organic EL layer). Alternatively, when the layer 105b is an organic insulating layer, the organic insulating layer can be used as a planarization layer, and unevenness due to the transistor 100 or the like can be reduced. In this manner, a surface on which the electrode 110 is formed can be planarized. Thus, for example, in the case where the electrode 110 is used as a pixel electrode, a display defect can be reduced. Alternatively, since the thickness of the layer 105b can be increased, noise to the pixel electrode can be reduced. Alternatively, since etching selectivity changes depending on film quality, only a necessary portion is selectively etched, so that a stack of the layers 105b and 105c with a predetermined shape can be obtained.

Alternatively, the layer 105b and/or the layer 105c (or part thereof, preferably the layer 105b) may be a color filter and/or a black matrix. When the layer 105b and/or the layer 105c is a color filter and/or a black matrix, an attachment margin for the substrate provided with the transistor 100 (the substrate having the insulating surface 200) and another substrate (e.g., a counter substrate or the like in the display device) can be increased. Alternatively, when a black matrix is provided in the layer 105b and/or the layer 105c (or part thereof) near the transistor 100, light cannot be easily incident on the transistor 100. When light is not easily incident on the transistor 100, the off-state current of the transistor 100 can be reduced and/or degradation of the transistor 100 can be reduced. For example, as illustrated in FIG. 65B, the black matrix 652 can be provided in part of the layer 105b. Note that a plurality of color filters with different colors that overlap with each other can be used as a black matrix.

Note that a color filter and/or a black matrix is preferably formed using an organic material; thus, the color filter and/or the black matrix is preferably formed in the layer 105b. Note that this embodiment is not limited thereto, and a light-blocking conductive film can be used as the black matrix.

Alternatively, the thickness of the layer 105c may be smaller than the thickness of the layer 105b. When the thickness of the layer 105c is made smaller, an electric field caused by the electrode 106 can be adequately applied to the channel. Alternatively, when the thickness of the layer 105b is made larger, unevenness due to the transistor 100 or the like can be adequately reduced.

Alternatively, for example, in the structure illustrated in FIG. 1A, FIG. 1B, FIG. 2A, FIG. 3A, FIG. 3B, FIG. 9A, or the like, the insulating layer 105 in the region 122 may include a stack of the layers 105a, 105b, and 105c, and the insulating layer 105 in the region 121 may include a stack of the layers 105a and 105c. FIG. 26C, FIG. 26D, FIG. 27B, FIG. 28C, FIG. 28D, and FIG. 34B each illustrate such a structure. With such a structure, when only a necessary portion is etched utilizing a difference in sensitivity to etching (etching selectivity), a stack of the layers 105a, 105b, and 105c can be obtained. Accordingly, the thickness of the insulating layer 105 in each region can be easily controlled. Alternatively, the regions can adequately have different functions (e.g., a planarization function, an impurity blocking function, and a shielding function) depending on film quality. Alternatively, the number of processes can be reduced because part of the layer can be formed using a photosensitive material.

Here, the layer 105a may be an inorganic insulating layer, the layer 105b may be an organic insulating layer, and the layer 105c may be an inorganic insulating layer. In that case, since an organic material is used, the layer 105b can be thicker than each of the layers 105a and 105c. When the layer 105a is an inorganic insulating layer (preferably a silicon nitride film), for example, an impurity in the layer 105b can be prevented from entering the transistor 100. Alternatively, when the layer 105c is an inorganic insulating layer (preferably a silicon nitride film), an impurity in the layer 105b can be prevented from entering the electrode 106 or the layer over the electrode 106. When the layer 105b is an organic insulating layer, the organic insulating layer can be used as a planarization layer, and unevenness due to the transistor 100 or the like can be reduced. In this manner, a surface on which the electrode 110 is formed can be planarized. Thus, for example, in the case where the electrode 110 is used as a pixel electrode, a display defect can be reduced. Alternatively, since the thickness of the layer 105b can be increased, noise to the pixel electrode can be reduced. Alternatively, the layer 105a and the layer 105b can have different film qualities or the layer 105b and the layer 105c can have different film qualities. Then, since etching selectivity changes depending on film quality, only a necessary portion is selectively etched, so that a stack of the layers 105a, 105b, and 105c with a predetermined shape can be obtained.

Alternatively, the layer 105a, the layer 105b, and/or the layer 105c (or part thereof, preferably the layer 105b) may be a color filter and/or a black matrix. When the layer 105a, the layer 105b, and/or the layer 105c is a color filter and/or a black matrix, an attachment margin for the substrate provided with the transistor 100 (the substrate having the insulating surface 200) and another substrate (e.g., a counter substrate or the like in the display device) can be increased. Alternatively, when a black matrix is provided in the layer 105a, the layer 105b, and/or the layer 105c (or part thereof) near the transistor 100, light cannot be easily incident on the transistor 100. When light is not easily incident on the transistor 100, the off-state current of the transistor 100 can be reduced and/or degradation of the transistor 100 can be reduced. For example, as illustrated in FIG. 65C, the black matrix 652 can be provided in part of the layer 105b. Note that a plurality of color filters with different colors that overlap with each other can be used as a black matrix.

Note that a color filter and/or a black matrix is preferably formed using an organic material; thus, the color filter and/or the black matrix is preferably formed in the layer 105b. Note that this embodiment is not limited thereto, and a light-blocking conductive film can be used as the black matrix.

Note that each of the layers 105*a*, 105*b*, and 105*c* may be a single layer or a stack of a plurality of layers.

This embodiment is obtained by performing change, addition, modification, removal, application, superordinate conceptualization, or subordinate conceptualization on part or all of Embodiment 1. Thus, this embodiment can be freely combined or replaced with another embodiment (e.g., Embodiment 1).

(Embodiment 3)

In this embodiment, one aspect of a semiconductor device or the like (e.g., a display device or a light-emitting device) in the present invention is described with reference to drawings.

In the structure described in Embodiment 1 with reference to FIG. 1A, FIG. 1B, FIG. 2A, FIG. 3A, FIG. 3B, FIG. 9A, or the like, the insulating layer 105 is made thin in the vicinity of the channel of the transistor 100. However, the range of the region (the region 121) where the insulating layer 105 is made thin is not limited thereto. The range of the region 121 may be part of the vicinity of the channel For example, the structure illustrated in FIG. 1A can be changed into a structure illustrated in FIG. 66A. In FIG. 66A, the range of the region 121 is part of the vicinity of the channel (the range of the region 121 in FIG. 66A is smaller than the range of the region 121 in FIG. 1A). The structures illustrated in other than FIG. 1A can be changed similarly. Alternatively, the range of the region 121 may be the vicinity of the entire transistor 100 or larger than the vicinity of the entire transistor 100. For example, the insulating layer 105 may be made thin in the vicinity of the transistor 100 (e.g., a region where the electrode 106 overlaps with the electrode 104*a* and/or the electrode 104*b*).

In the structure described in Embodiment 2 with reference to FIG. 1C, FIG. 1D, FIG. 2B, FIG. 3C, FIG. 3D, FIG. 9B, FIG. 26A, FIG. 26B, FIG. 27A, FIG. 28A, FIG. 28B, FIG. 34A, FIG. 26C, FIG. 26D, FIG. 27B, FIG. 28C, FIG. 28D, FIG. 34B, FIG. 65A, FIG. 65B, FIG. 65C, or the like, the layer 105*b* in the vicinity of the channel of the transistor 100 is removed and the insulating layer 105 is made thin. However, the region from which the layer 105*b* is removed is not limited thereto. The region from which the layer 105*b* is removed may be part of the vicinity of the channel. For example, the structure illustrated in FIG. 1C can be changed into a structure illustrated in FIG. 66B. In FIG. 66B, the range of the region 121 is part of the vicinity of the channel (the range of the region 121 in FIG. 66B is smaller than the range of the region 121 in FIG. 1C). The structures illustrated in other than FIG. 1C can be changed similarly. Alternatively, the range of the region 121 may be the vicinity of the entire transistor 100 or larger than the vicinity of the entire transistor 100. For example, in the structure illustrated in FIG. 1C, FIG. 1D, FIG. 2B, FIG. 3C, FIG. 3D, FIG. 9B, FIG. 26C, FIG. 26D, FIG. 27B, FIG. 28C, FIG. 28D, or FIG. 34B, the layer 105*b* in the vicinity of the channel of the transistor 100 may be removed and the insulating layer 105 may be made thin. For example, the layer 105*b* may be removed from a region where the electrode 106 overlaps with the electrode 104*a* and/or the electrode 104*b*. FIG. 1E, FIG. 2D, FIG. 2C, FIG. 3E, FIG. 2E, FIG. 9C, FIG. 26E, FIG. 27D, FIG. 27C, FIG. 28E, FIG. 27E, and FIG. 34C each illustrate this structure.

Note that in the structures illustrated in FIG. 26E, FIG. 27D, FIG. 27C, FIG. 28E, FIG. 27E, and FIG. 34C, one of the layers 105*a* and 105*c* may be further removed from part or all of the region from which the layer 105*b* is removed.

In the structure where the insulating layer 105 is made thin in the vicinity of the transistor 100 (e.g., the region where the electrode 106 overlaps with the electrode 104*a* and/or the electrode 104*b*), the capacitance value of parasitic capacitance generated by overlapping of the electrode 106 with the electrode 104*a* and/or the electrode 104*b* can be increased. Thus, the parasitic capacitance can be actively used as a storage capacitor. For example, the storage capacitor can be used as a storage capacitor in a pixel. Even when the insulating layer 105 is made thin in the vicinity of the transistor 100 as described above, in the case where a fixed potential is applied to the electrode 106, the potential does not influence the potential of the electrode 104*a* and/or the potential of the electrode 104*b*. Note that one aspect of an embodiment of the present invention is not limited thereto.

In contrast, when a variation potential (e.g., a pulse potential) is applied to the electrode 106 (for example, a signal which is similar to a signal input to the electrode 101 is input to the electrode 106), in order to reduce the influence of a change in potential applied to the electrode 106 on the potential of the electrode 104*a* and/or the potential of the electrode 104*b*, it is preferable that the insulating layer 105 be made thick between the electrode 106 and the electrode 104*a* and/or the electrode 104*b*. For example, it is preferable that the layer 105*b* be provided between the electrode 106 and the electrode 104*a* and/or the electrode 104*b*. In this manner, the influence of a change in potential applied to the electrode 106 on the potential of the electrode 104*a* and/or the potential of the electrode 104*b* can be reduced and, for example, noise to a signal input to the electrode 110 connected to the electrode 104*b* can be prevented. Thus, in the case where the electrode 110 is used as a pixel electrode, the display quality of the display device can be improved. Note that one aspect of an embodiment of the present invention is not limited thereto.

Note that the electrode 106 may be formed in the entire region 121 or at least part of the region 121. In the case where the electrode 106 is small, the degree of overlapping of the electrode 104*a* and/or electrode 104*b* with the electrode 106 is small. Thus, the influence of a change in potential applied to the electrode 106 on the potential of the electrode 104*a* and/or the potential of the electrode 104*b* can be reduced.

Alternatively, in the case where a driver circuit (e.g., a scan line driver circuit or a signal line driver circuit for inputting a signal to a pixel) is formed using the transistors 100, the entire region over the driver circuit may be the region 121. For example, the entire layer 105*b* over the driver circuit may be removed. This is because it is not necessary to provide a display element used for displaying an image over the driver circuit and it is not necessary to perform planarization with the use of the layer 105*b*. Alternatively, when the entire layer 105*b* over the driver circuit is removed, a capacitor (parasitic capacitance) formed by electrodes or wirings can be increased. In this manner, a capacitor (parasitic capacitance) used for bootstrap operation or a capacitor (parasitic capacitance) for a dynamic circuit can be increased. Alternatively, when the entire layer 105*b* over the driver circuit is removed, a margin for part of the layer 105*b* is not necessary; thus, the layout area of the entire driver circuit can be decreased. In that case, the electrodes 106 of the plurality of transistors 100 included in the driver circuit may be electrically connected to each other. Alternatively, the electrodes 106 of the plurality of transistors 100 included in the driver circuit may or may not be isolated from each other.

This embodiment is obtained by performing change, addition, modification, removal, application, superordinate conceptualization, or subordinate conceptualization on part or all of Embodiment 1 or part or all of Embodiment 2. Thus, this embodiment can be freely combined or replaced with another embodiment (e.g., Embodiment 1 or 2).

(Embodiment 4)

In this embodiment, one aspect of a semiconductor device or the like (e.g., a display device or a light-emitting device) in the present invention is described with reference to drawings.

Structure examples of a portion where the electrode 110 and the electrode 104b are connected to each other in the semiconductor devices and the like in Embodiments 1 to 3 are described.

Structure examples of a portion where the electrodes 110 and 104b are connected to each other in the case of the insulating layer 105 including a stack of the layers 105a and 105b are described with reference to FIGS. 4A and 4B and FIGS. 5A and 5B.

Figure 4A:
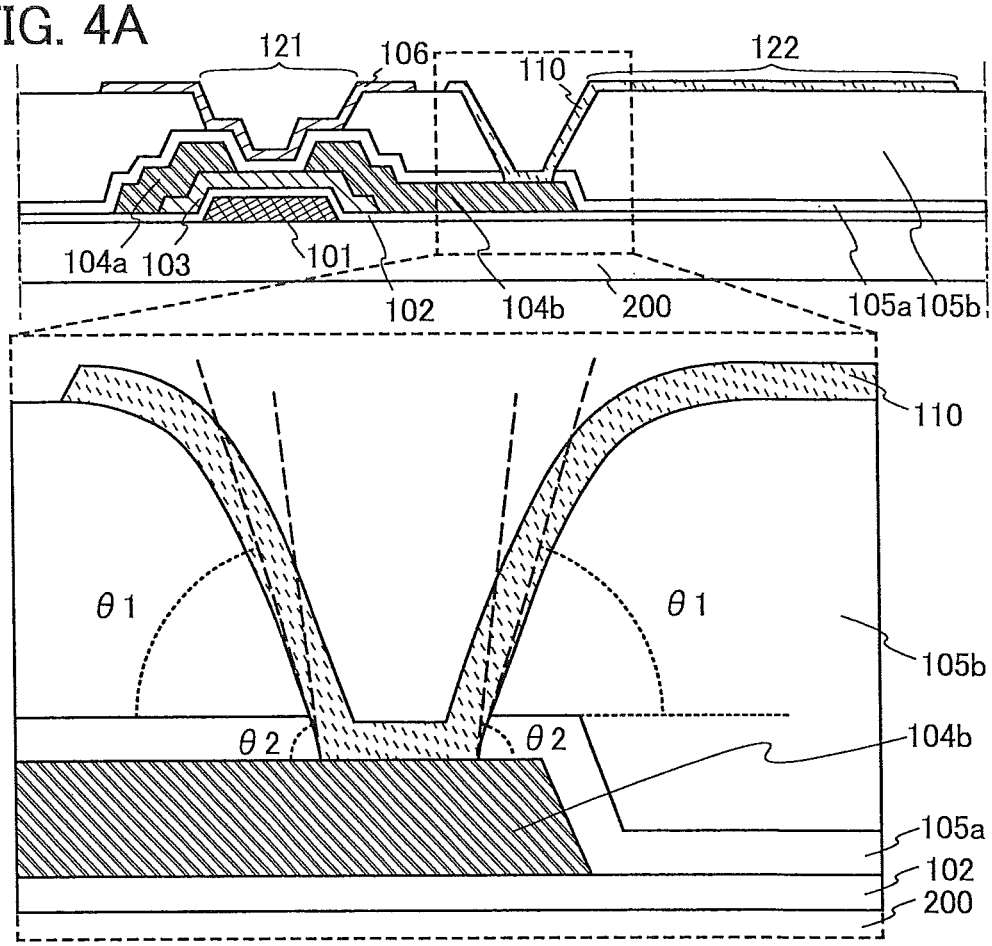
FIGS. 4A and 4B are cross-sectional views each illustrating the structure of a semiconductor device.

FIG. 4A illustrates the structure in FIG. 1C and an enlarged view of the portion where the electrodes 110 and 104b are connected to each other in the structure. In the enlarged view in FIG. 4A, an end of an opening in the layer 105a and an end of an opening in the layer 105b are substantially aligned with each other. Such openings can be formed, for example, in such a manner that a stack of a film A to be the layer 105a and a film B to be the layer 105b is formed, and then, the film A and the film B are etched using one photomask.

Figure 4B:
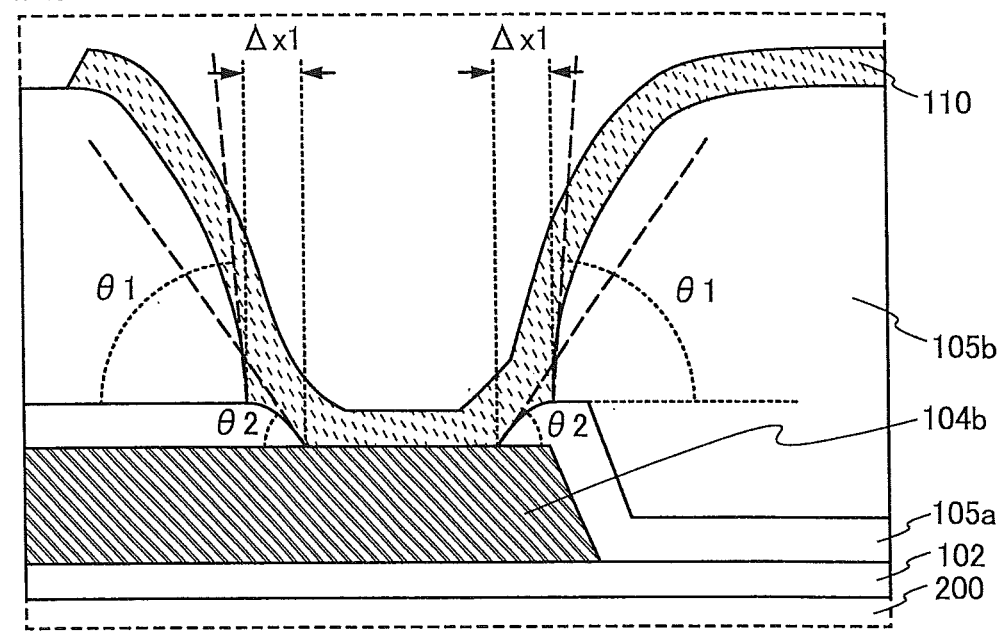
Figure 5A:
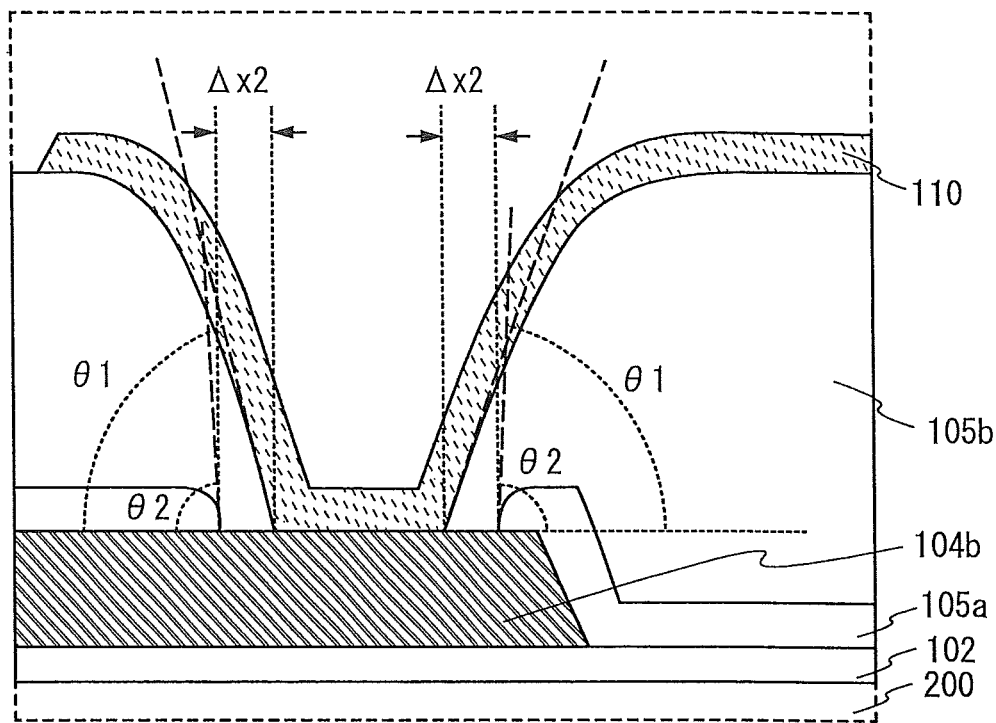
FIGS. 5A and 5B are cross-sectional views each illustrating the structure of a semiconductor device.
Figure 5B:
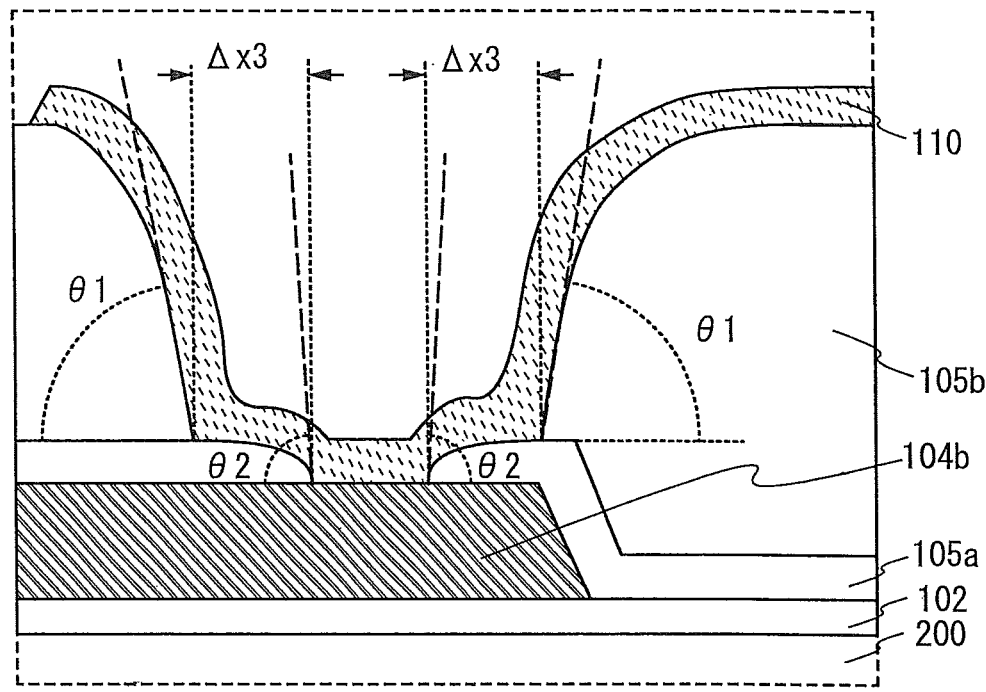
Figure 6A:
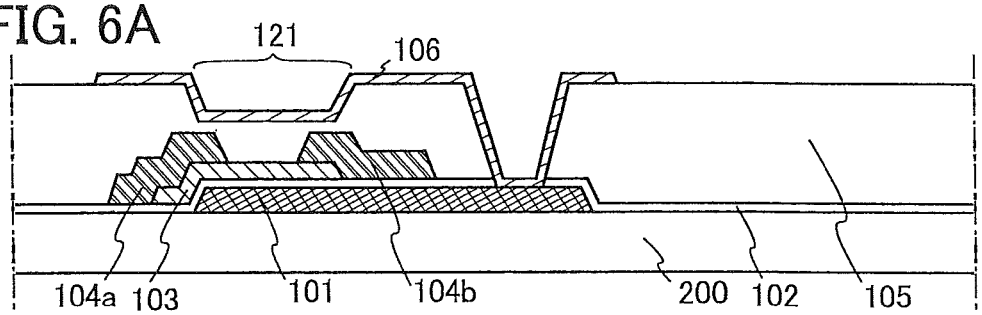
FIGS. 6A to 6E are cross-sectional views each illustrating the structure of a semiconductor device.
Figure 6B:
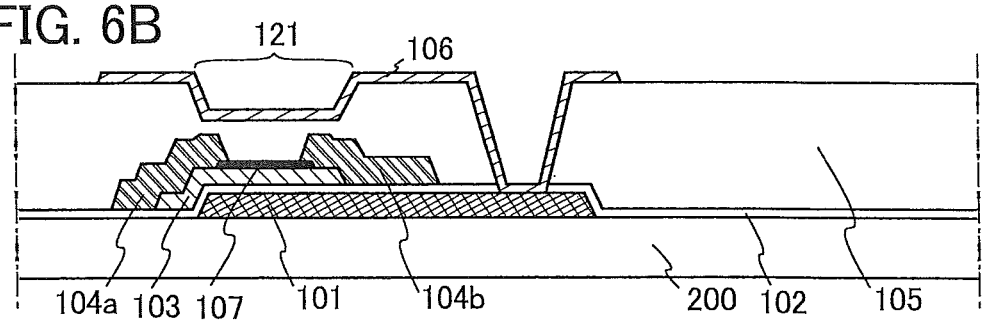
Figure 6C:
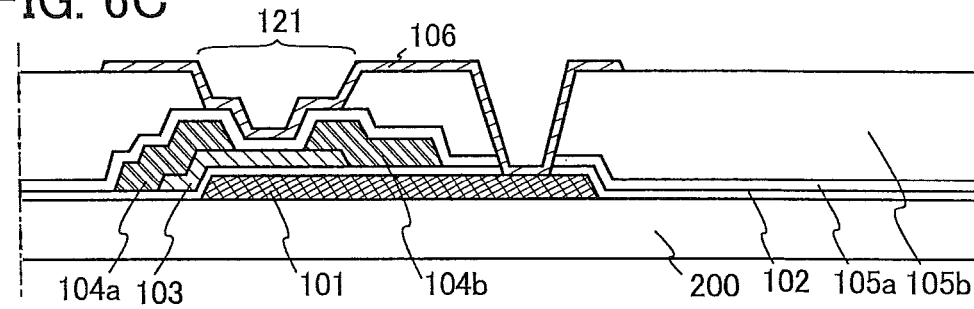
Figure 6D:
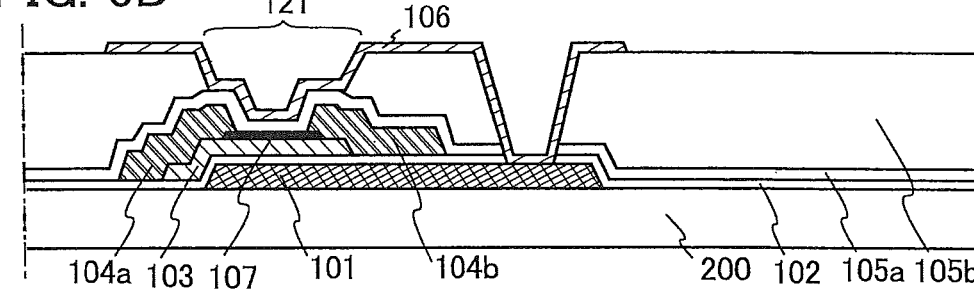
Figure 6E:
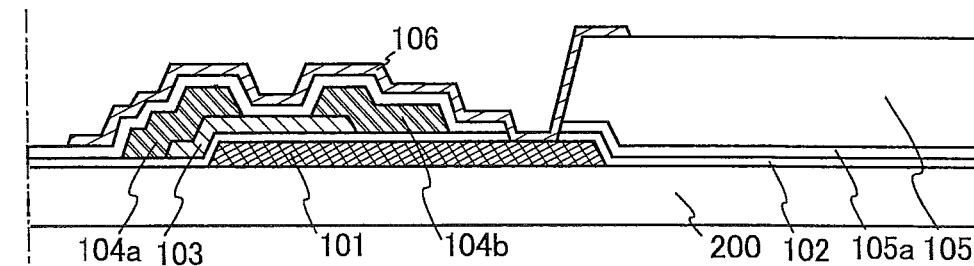
Figure 7A:
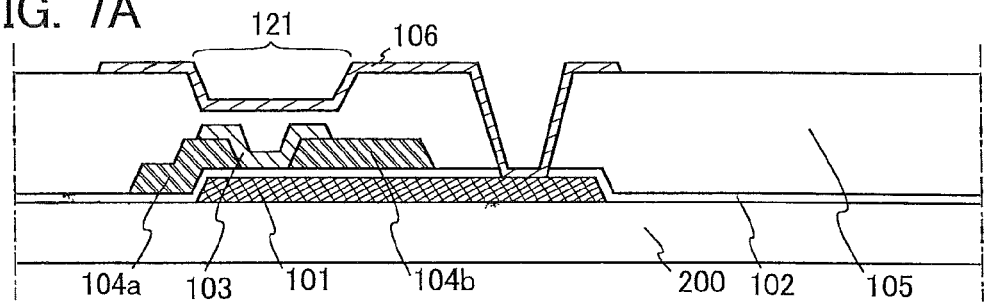
FIGS. 7A to 7E are cross-sectional views each illustrating the structure of a semiconductor device.
Figure 7B:
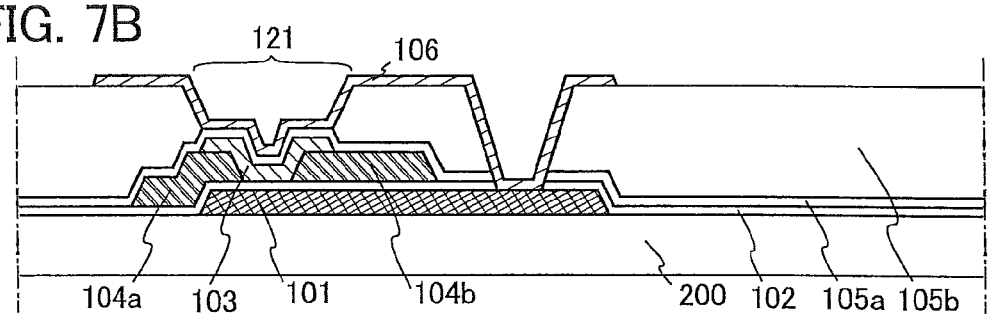
Figure 7C:
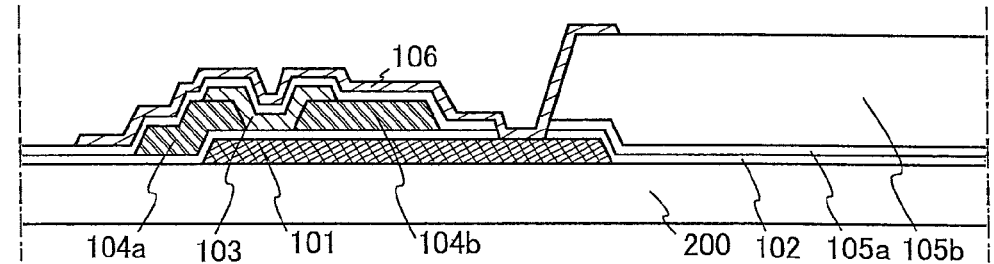
Figure 7D:
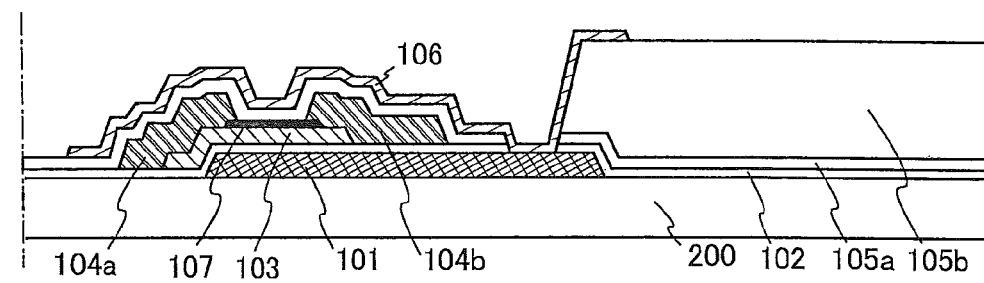
Figure 7E:
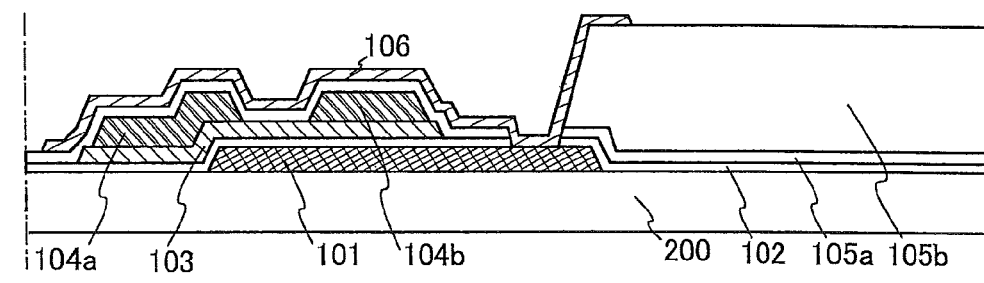
Figure 8A:
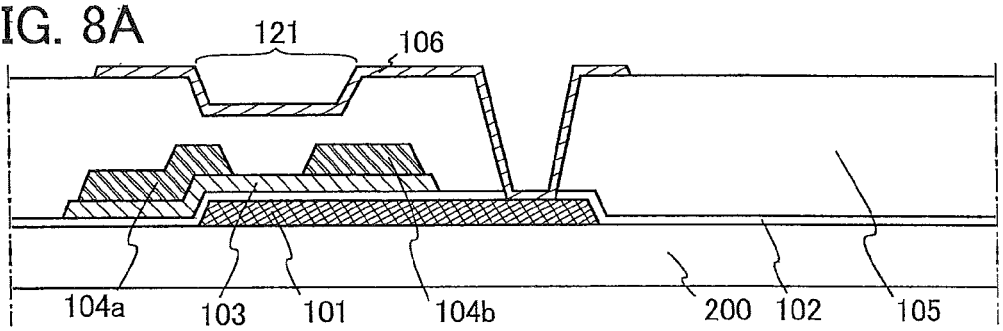
FIGS. 8A to 8E are cross-sectional views each illustrating the structure of a semiconductor device.
Figure 8B:
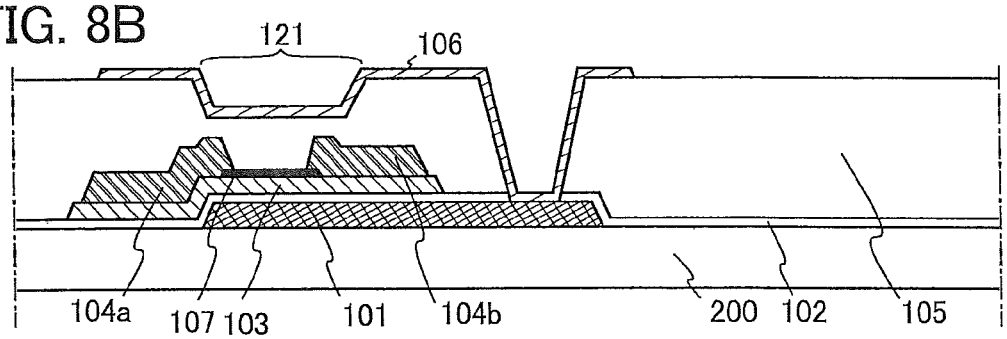
Figure 8C:
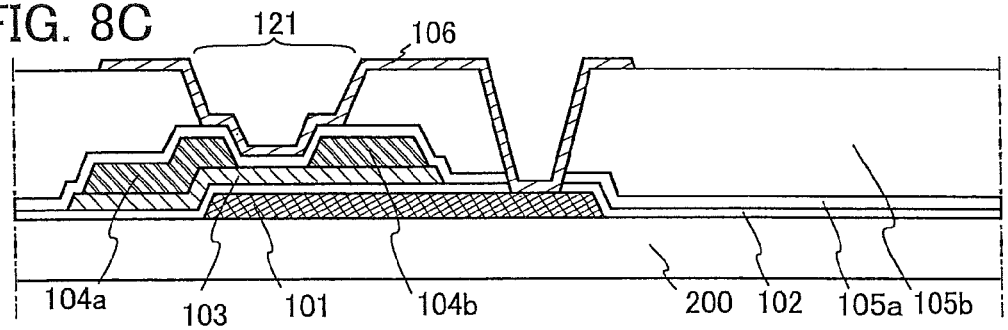
Figure 8D:
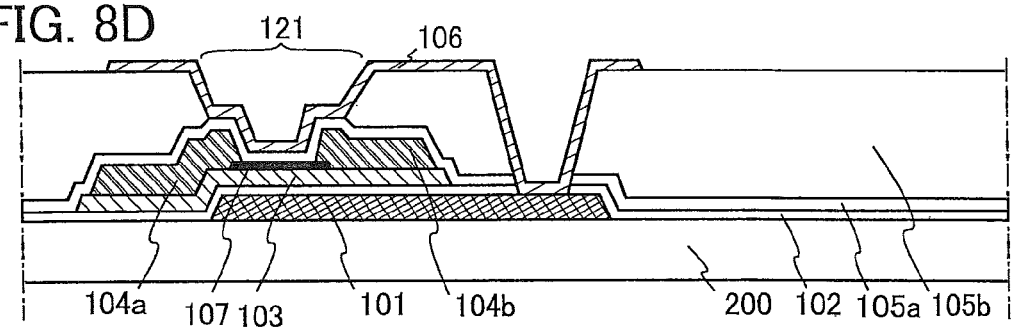
Figure 8E:
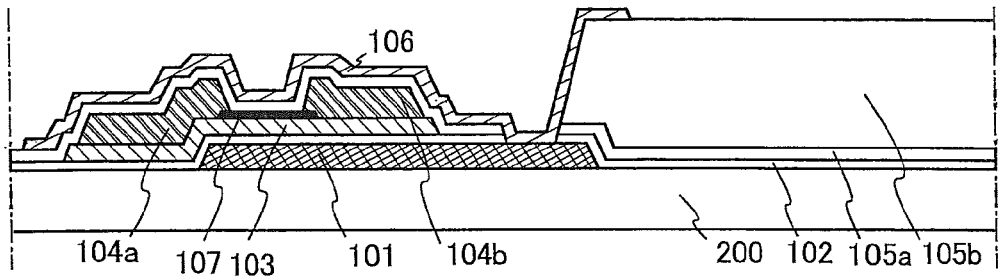

The shape of the portion where the electrodes 110 and 104b are connected to each other is not limited to the shape illustrated in the enlarged view in FIG. 4A. For example, a shape illustrated in FIG. 4B may be used. In FIG. 4B, the end of the opening in the layer 105a and the end of the opening in the layer 105b are not aligned with each other, and the diameter of the opening in the layer 105b is larger than the diameter of the opening in the layer 105a (the difference in diameter between the openings is indicated by Δx1 in FIG. 4B). Openings with such shapes can be formed, for example, in such a manner that the structure illustrated in the enlarged view in FIG. 4A is formed, and then, ashing is performed on the layer 105b. In the case where ashing is performed on the layer 105b, the layer 105b is formed using an organic insulating layer. Note that ashing means that part of a layer is removed in such a manner that an active oxygen molecule, an ozone molecule, an oxygen atom, or the like generated by discharge or the like chemically acts on a layer which is an organic substance to ash the layer. Alternatively, openings with such shapes can be formed in such a manner that a stack of the film A to be the layer 105a and the film B to be the layer 105b is formed, the film A and the film B are etched using a photomask, and then, the film B which is etched is further etched using a different photomask. Alternatively, openings with such shapes can be formed in such a manner that a stack of the film A to be the layer 105a and the film B to be the layer 105b is formed, the film B is etched using a photomask, and then, the film A is etched using a different photomask. In the case where the film A and the film B are etched using different photomasks, for example, as illustrated in FIG. 5B, the diameter of the opening in the layer 105b can be much larger than the diameter of the opening in the layer 105a as compared to the structure in FIG. 4B (the difference in diameter between the openings is indicated by Δx3 in FIG. 5B). Alternatively, in the case where the film A and the film B are etched using different photomasks, for example, as illustrated in FIG. 5A, the diameter of the opening in the layer 105a can be larger than the diameter of the opening in the layer 105b (the difference in diameter between the openings is indicated by Δx2 in FIG. 5A).

FIGS. 4A and 4B and FIGS. 5A and 5B each illustrate a structure example of the portion where the electrodes 110 and 104b are connected to each other in the case of the insulating layer 105 including a stack of the layers 105a and 105b. However, the layered structure of the insulating layer 105 is not limited thereto. The shape of the portion where the electrodes 110 and 104b are connected to each other can be varied depending on the layered structure.

Figure 29A:
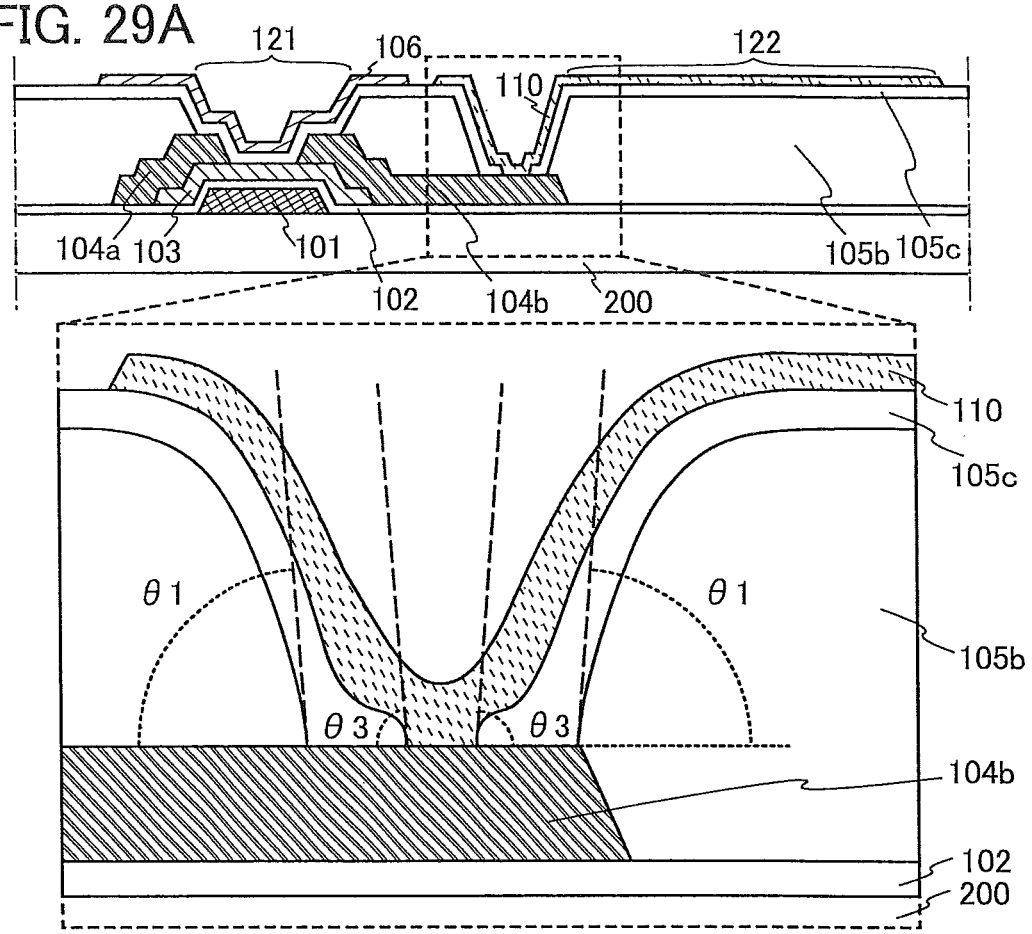
FIGS. 29A and 29B are cross-sectional views each illustrating the structure of a semiconductor device.
Figure 29B:
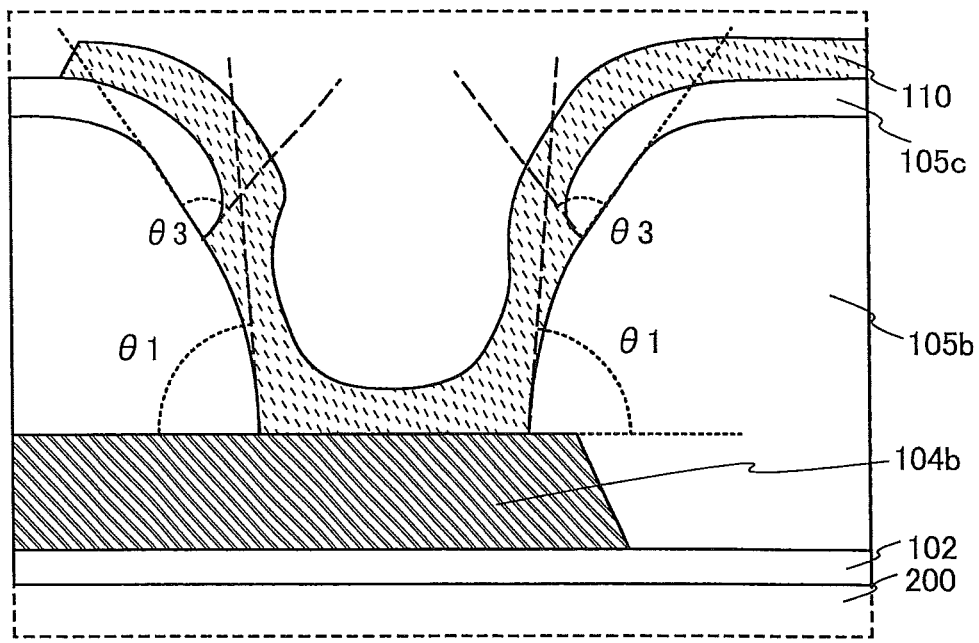

For example, FIGS. 29A and 29B each illustrate a structure example of the portion where the electrodes 110 and 104b are connected to each other in the case of the insulating layer 105 including a stack of the layers 105b and 105c. FIG. 29A illustrates the structure in FIG. 26A and an enlarged view of the portion where the electrodes 110 and 104b are connected to each other in the structure. In FIG. 29A, the end of the opening in the layer 105b and an end of an opening in the layer 105c are not aligned with each other, and the diameter of the opening in the layer 105b is larger than the diameter of the opening in the layer 105c. In FIG. 29B, the end of the opening in the layer 105b and the end of the opening in the layer 105c are not aligned with each other, and the diameter of the opening in the layer 105c is larger than the diameter of the opening in the layer 105b.

Openings with the shapes in FIG. 29A or FIG. 29B can be formed, for example, in such a manner that the film B to be the layer 105b is formed, the film B is etched using a photomask, a film C to be the layer 105c is formed, and then, the film C is etched using a different photomask. Openings with the shapes in FIG. 29B can be formed, for example, in such a manner that a stack of the film B to be the layer 105b and the film C to be the layer 105c is formed, the film B and the film C are etched using a photomask, and then, the film C which is etched is further etched using a different photomask.

Note that although not illustrated in FIGS. 29A and 29B, the end of the opening in the layer 105b and the end of the opening in the layer 105c may be substantially aligned with each other.

Figure 30A:
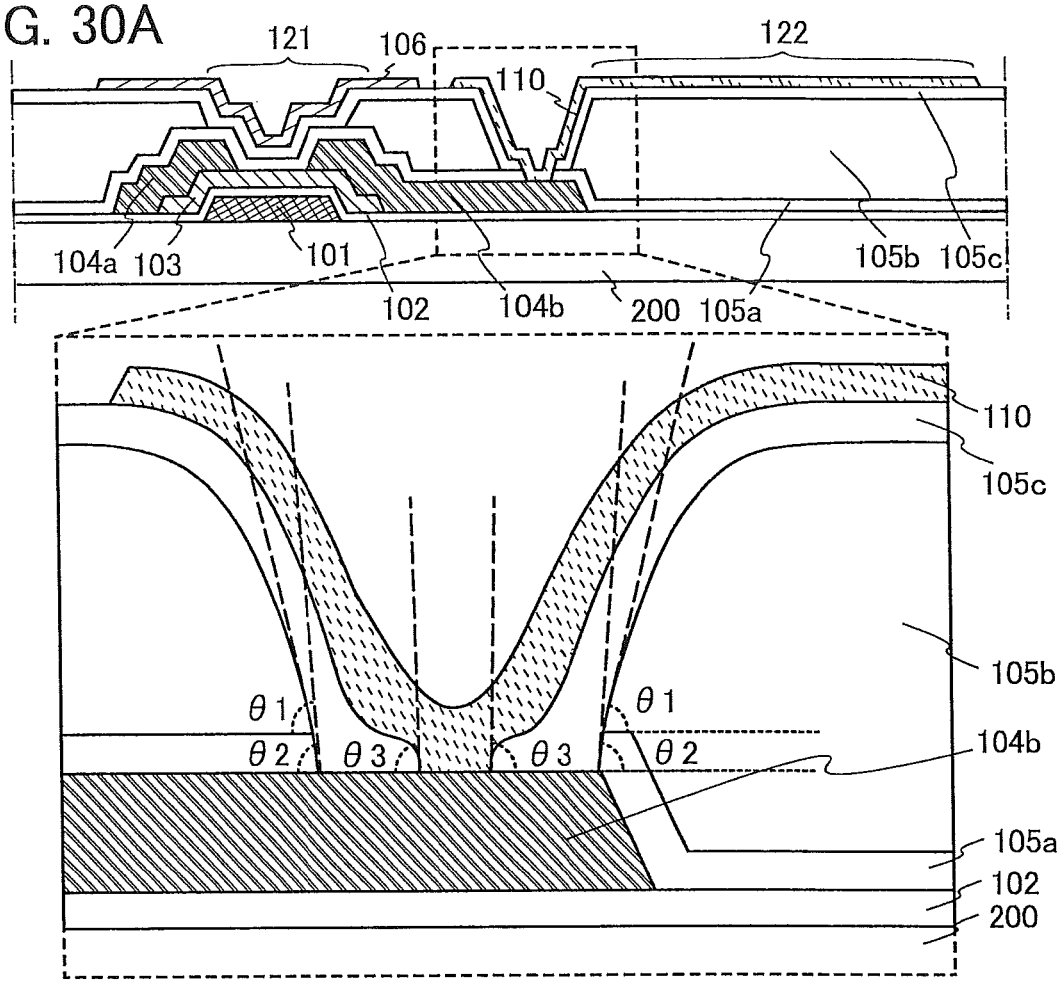
FIGS. 30A and 30B are cross-sectional views each illustrating the structure of a semiconductor device.
Figure 30B:
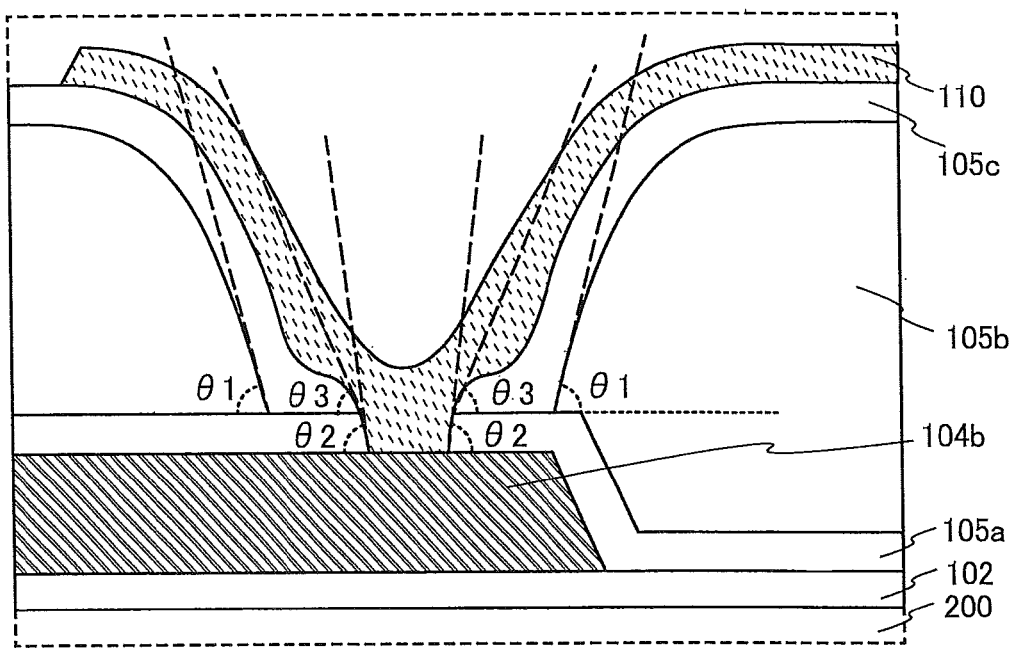
Figure 31A:
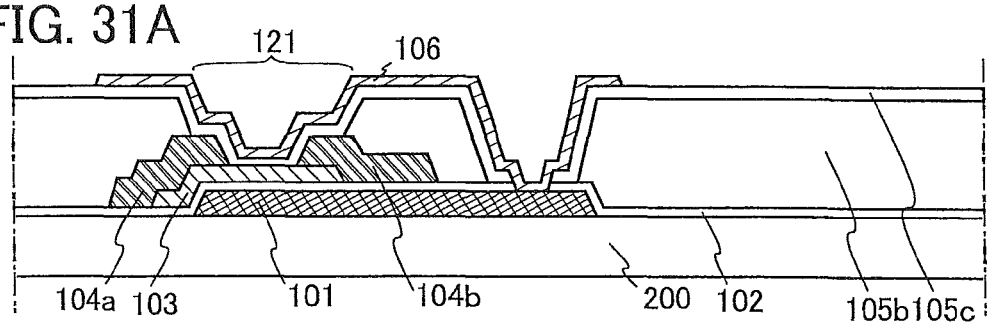
FIGS. 31A to 31E are cross-sectional views each illustrating the structure of a semiconductor device.
Figure 31B:
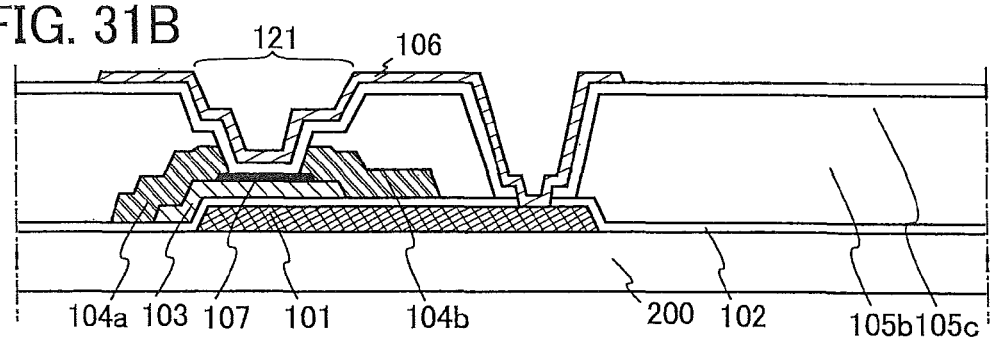
Figure 31C:
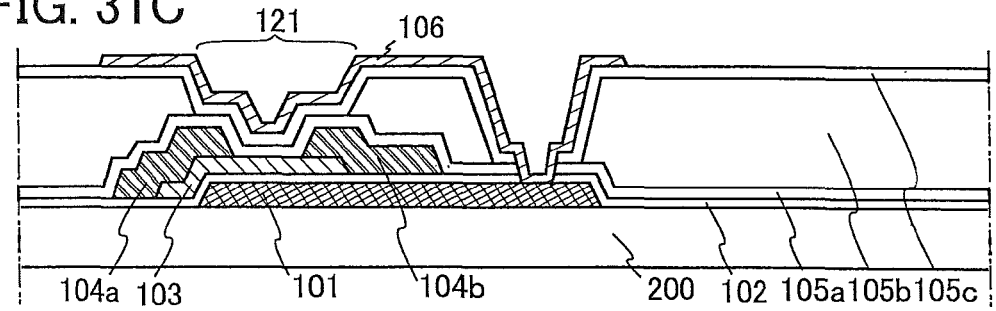
Figure 31D:
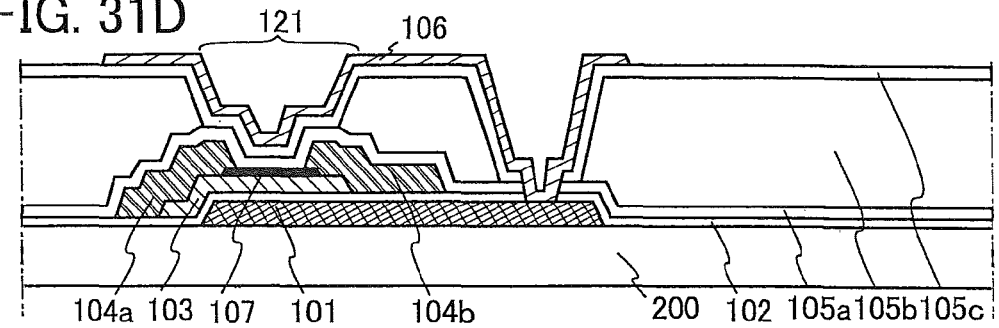
Figure 31E:
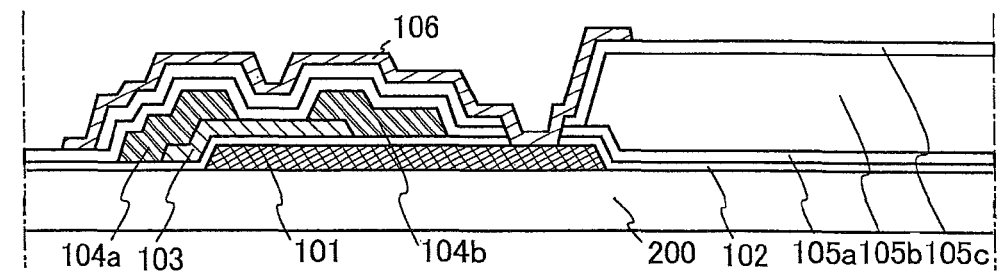
Figure 32A:
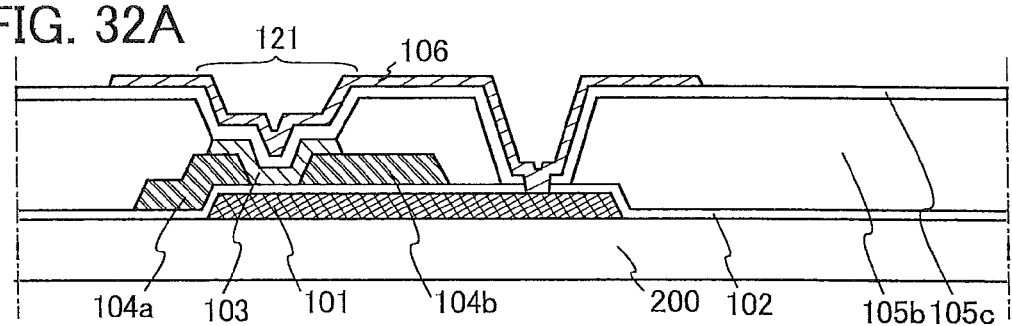
FIGS. 32A to 32E are cross-sectional views each illustrating the structure of a semiconductor device.
Figure 32B:
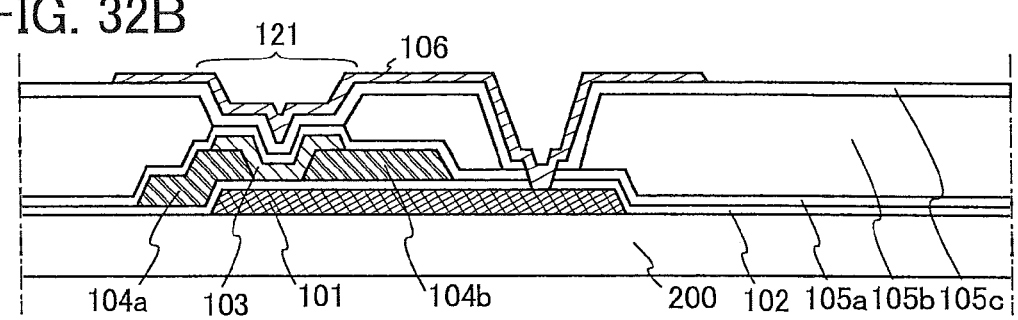
Figure 32C:
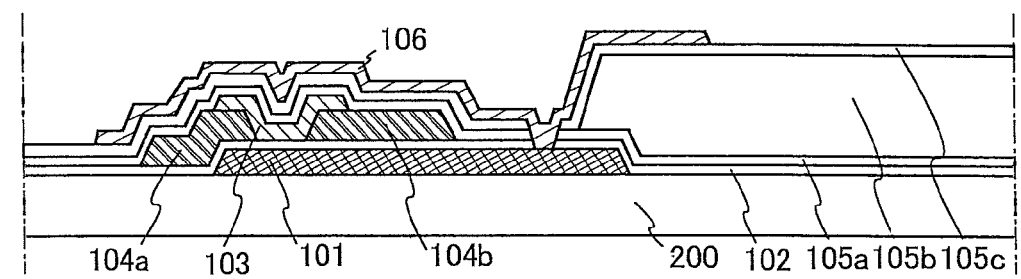
Figure 32D:
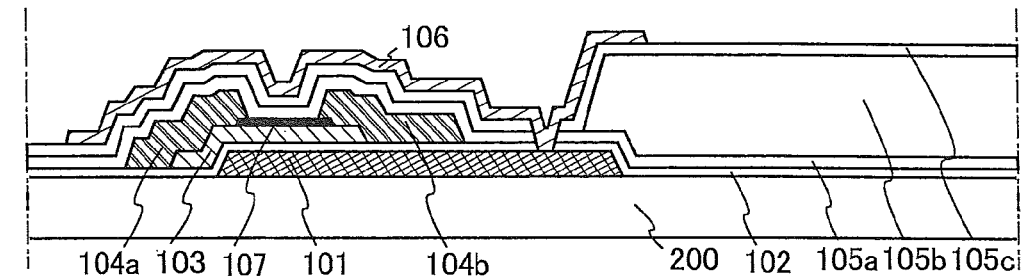
Figure 32E:
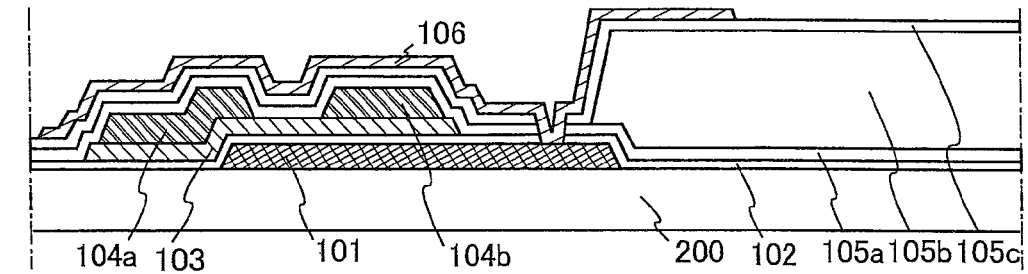
Figure 33A:
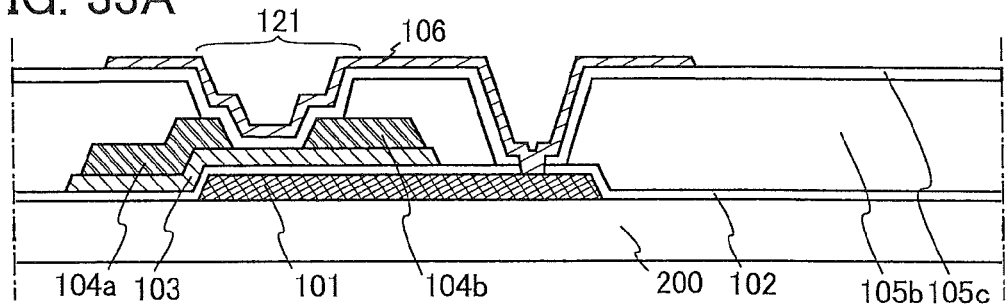
FIGS. 33A to 33E are cross-sectional views each illustrating the structure of a semiconductor device.
Figure 33B:
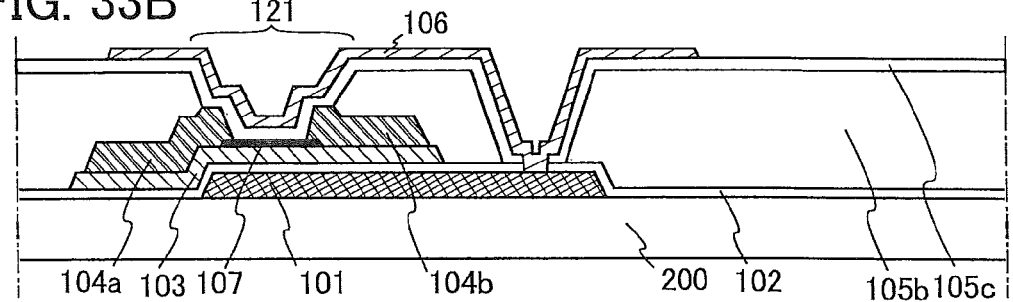
Figure 33C:
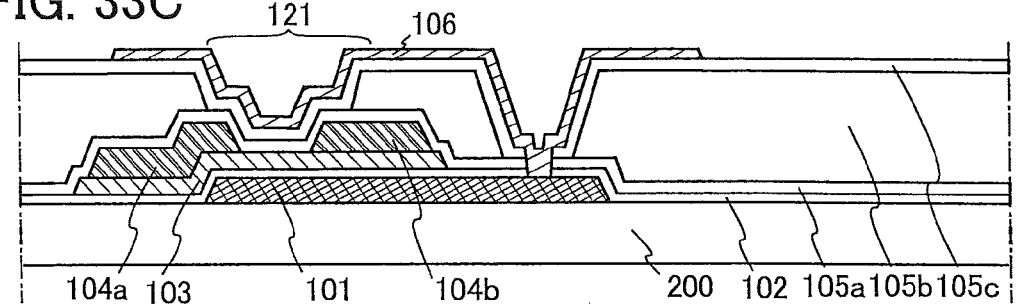
Figure 33D:
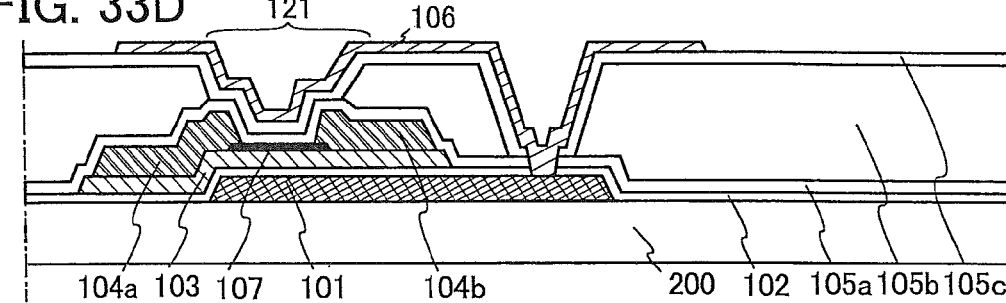
Figure 33E:
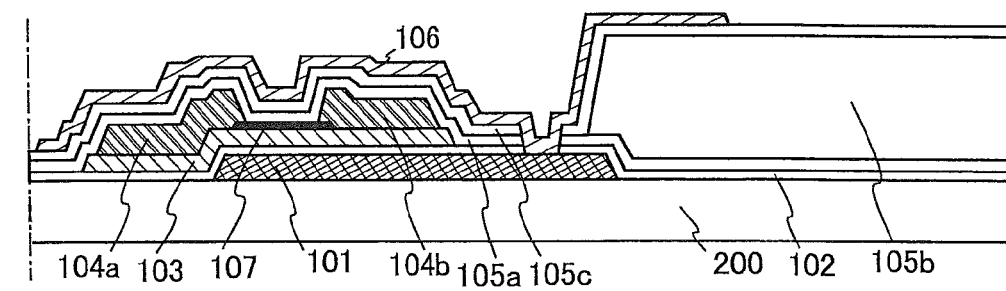
Figure 34A:
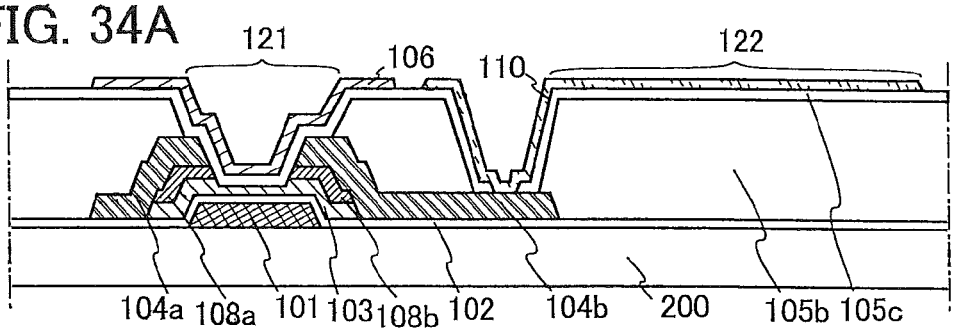
FIGS. 34A to 34E are cross-sectional views each illustrating the structure of a semiconductor device.
Figure 34B:
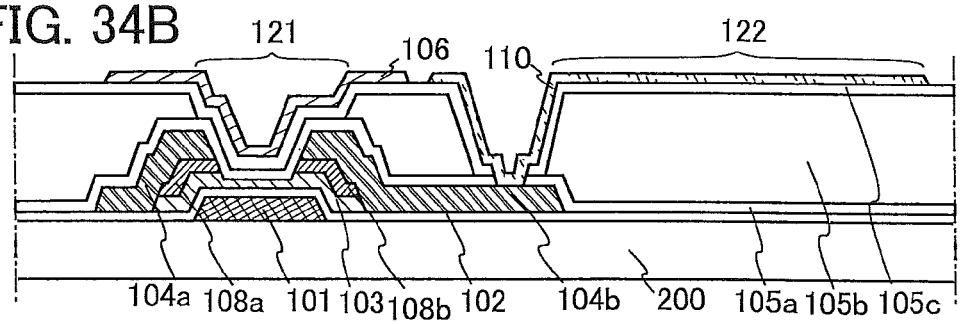
Figure 34C:
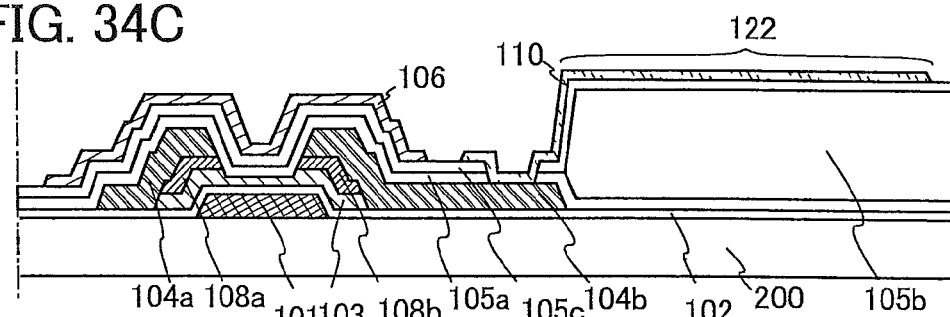
Figure 34D:
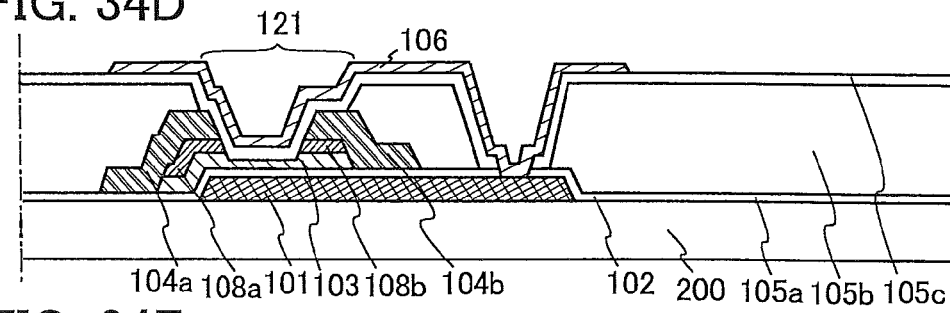
Figure 34E:
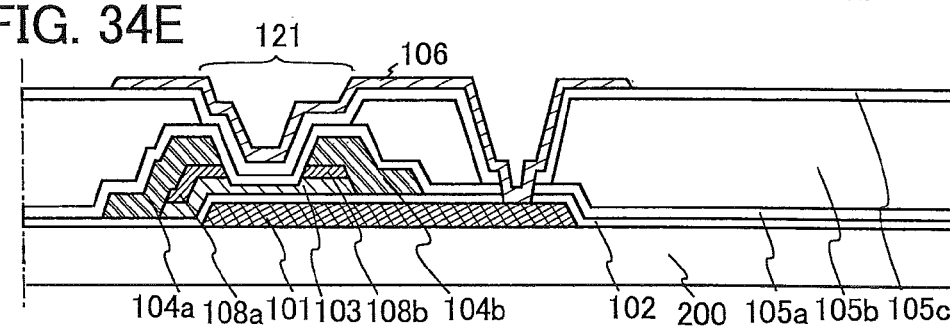
Figure 35A:
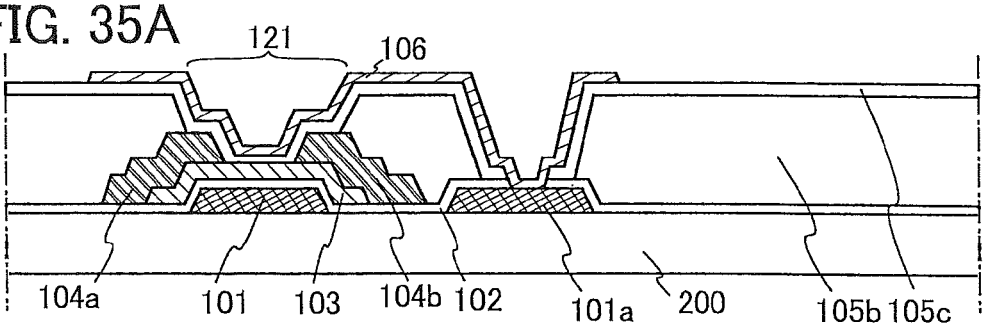
FIGS. 35A to 35E are cross-sectional views each illustrating the structure of a semiconductor device.
Figure 35B:
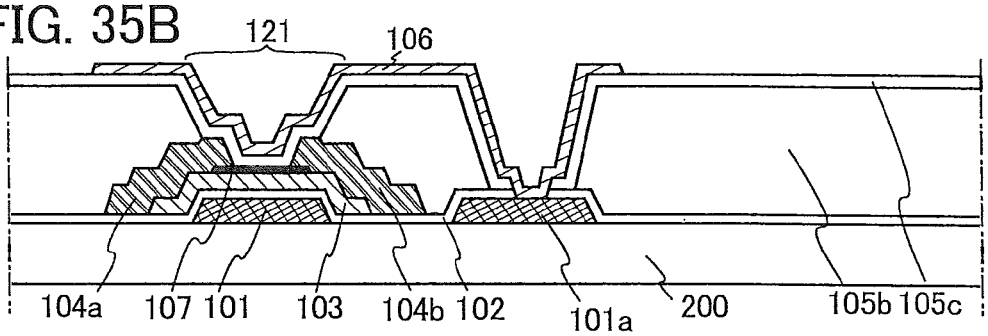
Figure 35C:
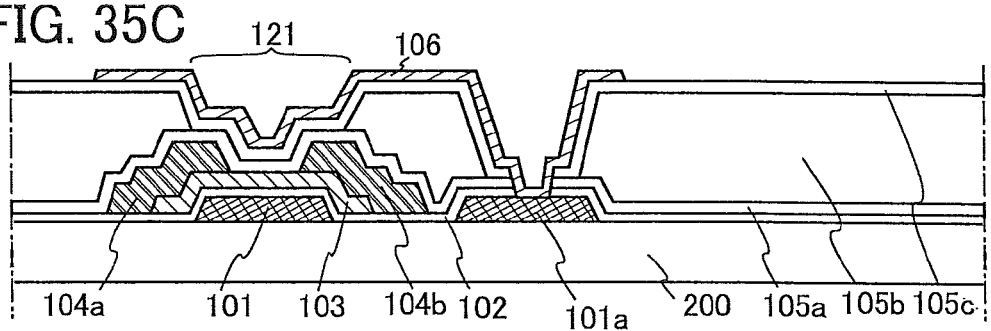
Figure 35D:
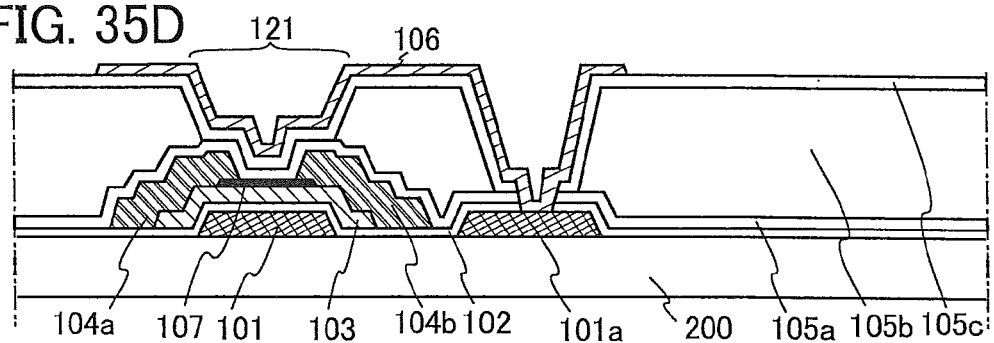
Figure 35E:
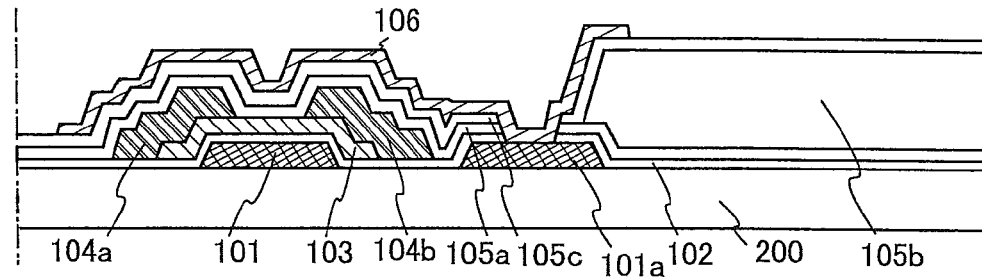
Figure 36A:
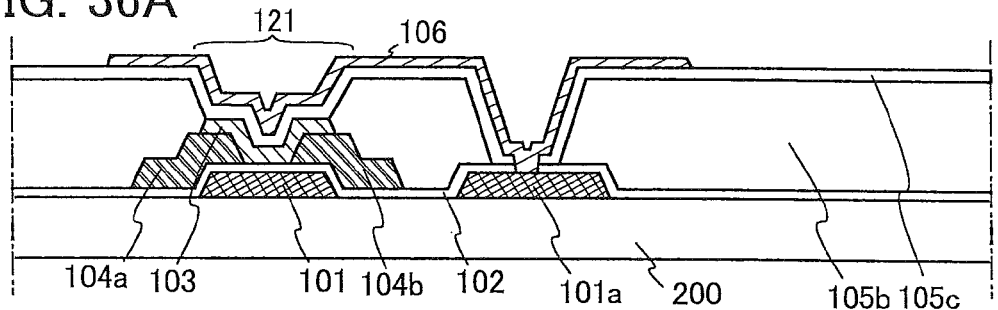
FIGS. 36A to 36E are cross-sectional views each illustrating the structure of a semiconductor device.
Figure 36B:
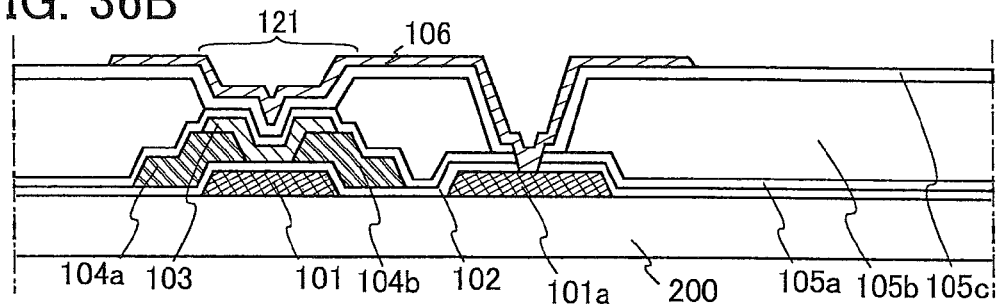
Figure 36C:
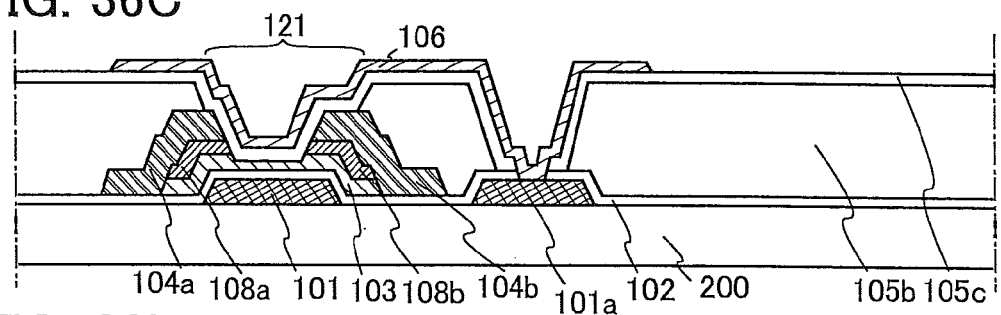
Figure 36D:
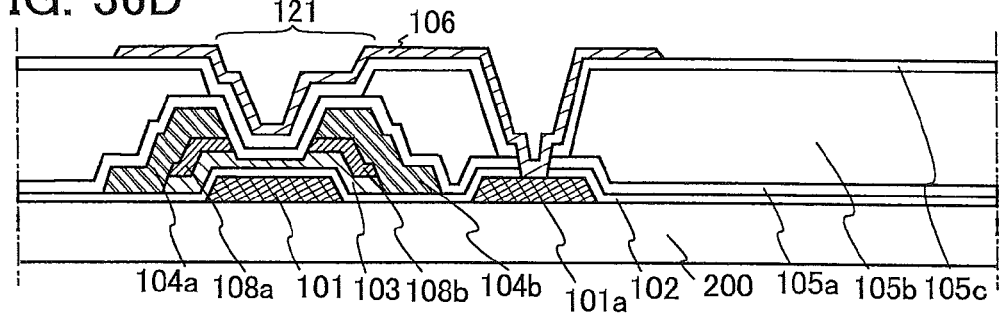
Figure 36E:
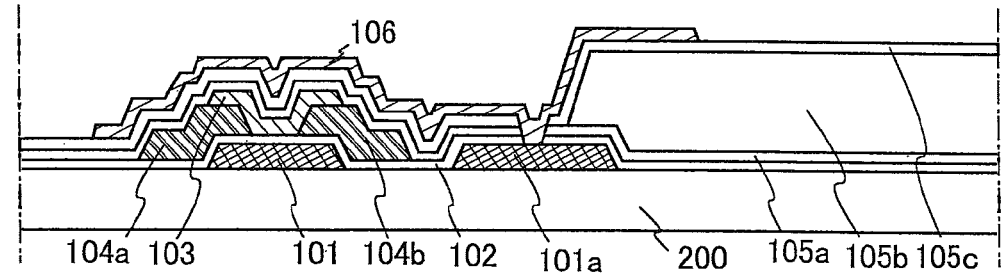
Figure 37A:
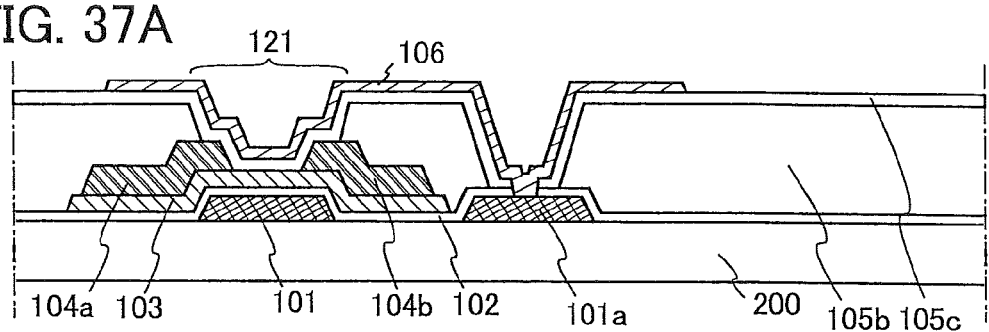
FIGS. 37A to 37E are cross-sectional views each illustrating the structure of a semiconductor device.
Figure 37B:
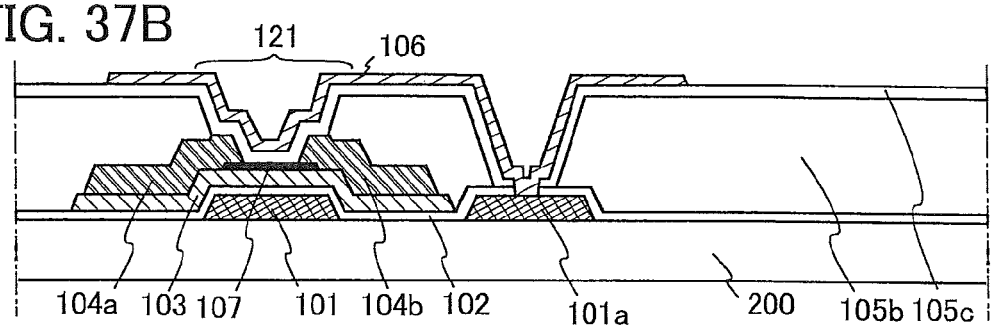
Figure 37C:
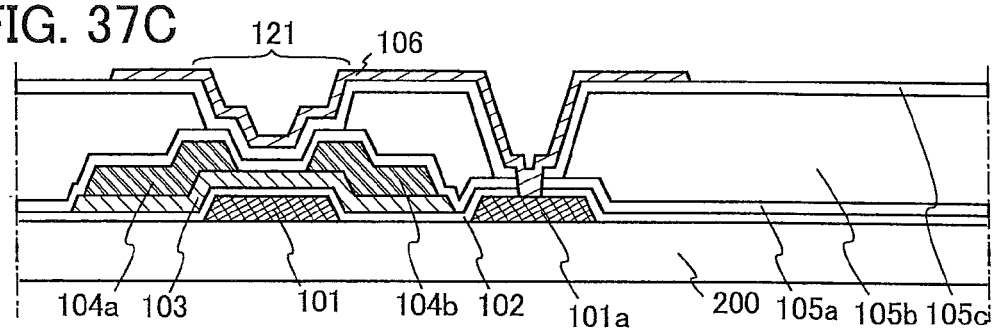
Figure 37D:
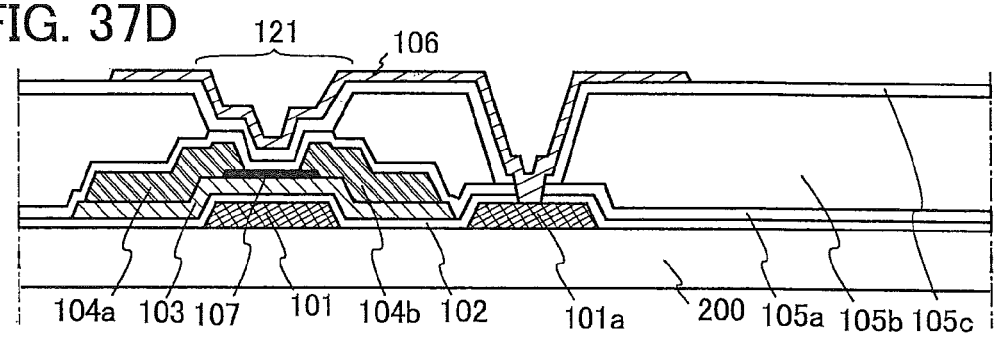
Figure 37E:
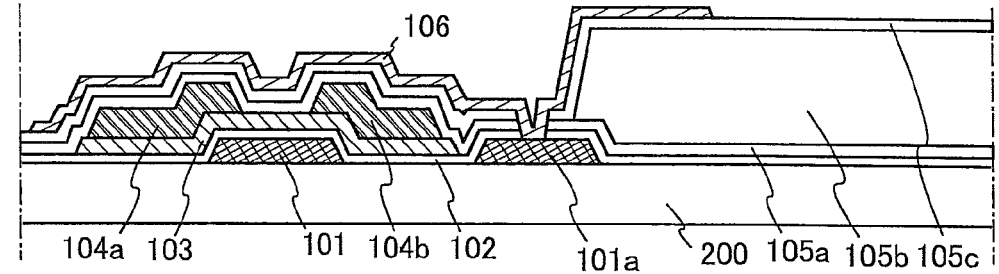
Figure 38A:
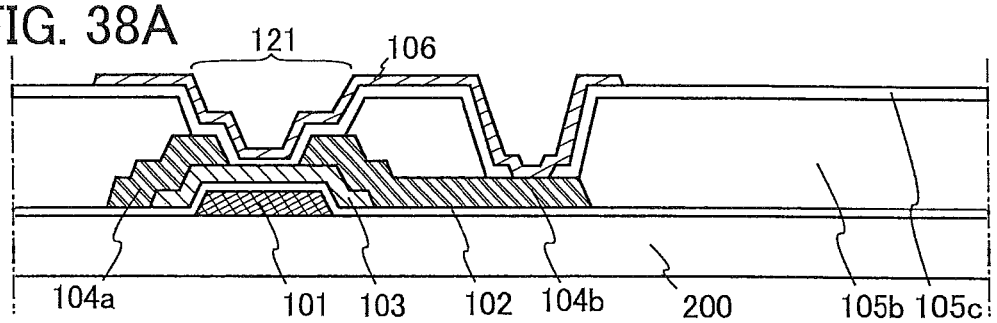
FIGS. 38A to 38E are cross-sectional views each illustrating the structure of a semiconductor device.
Figure 38B:
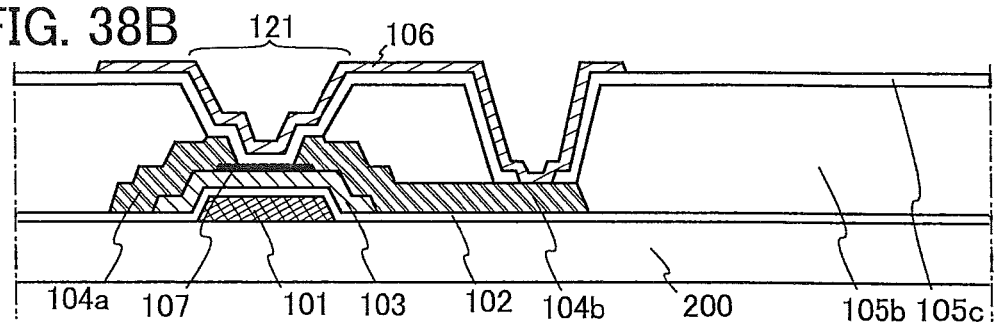
Figure 38C:
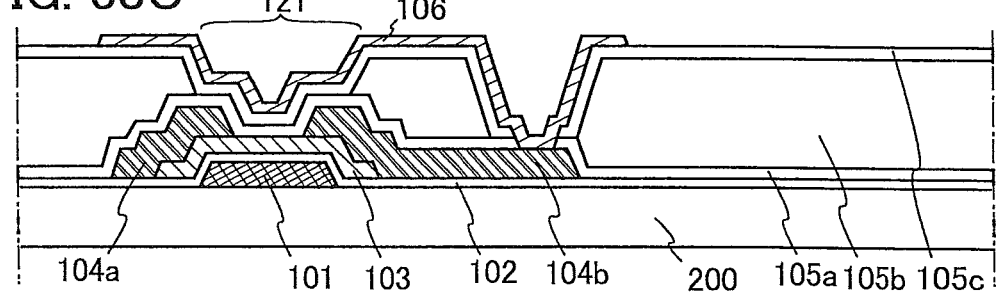
Figure 38D:
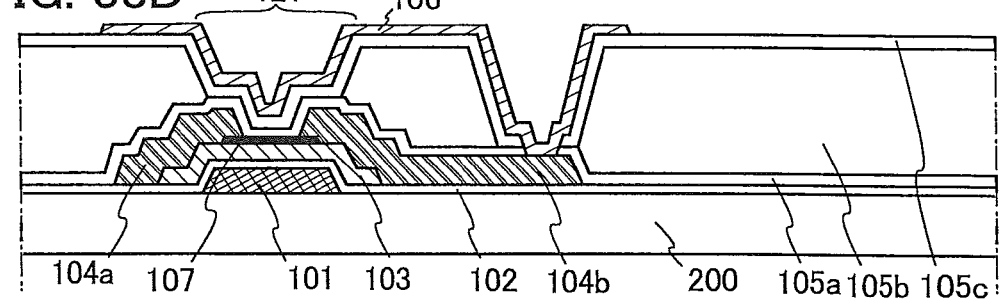
Figure 38E:
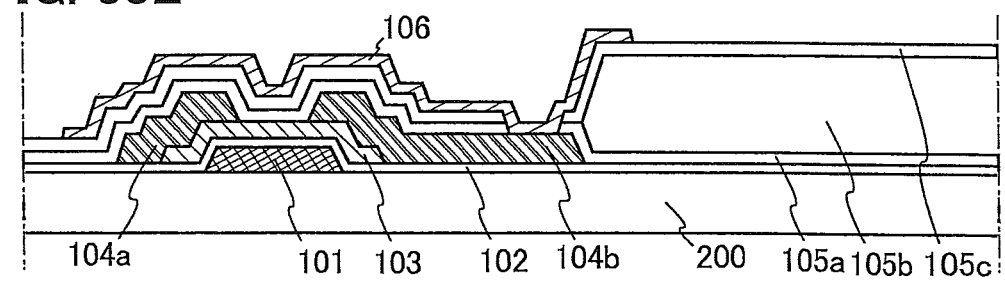
Figure 39A:
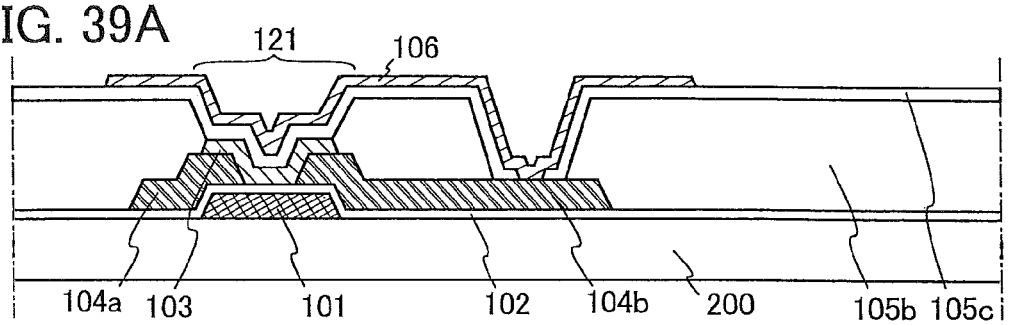
FIGS. 39A to 39E are cross-sectional views each illustrating the structure of a semiconductor device.
Figure 39B:
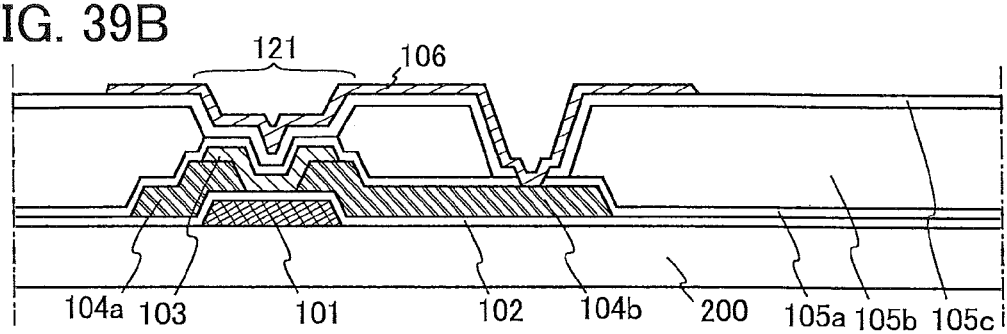
Figure 39C:
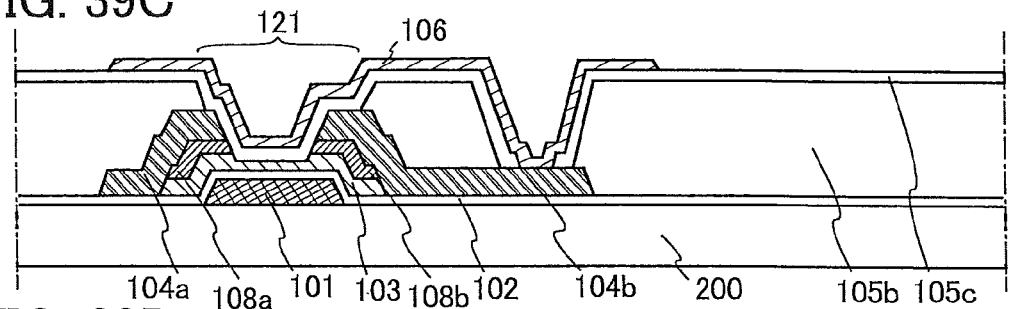
Figure 39D:
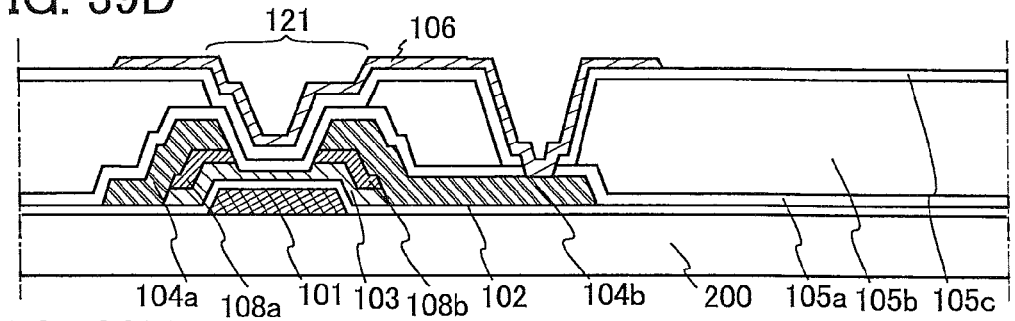
Figure 39E:
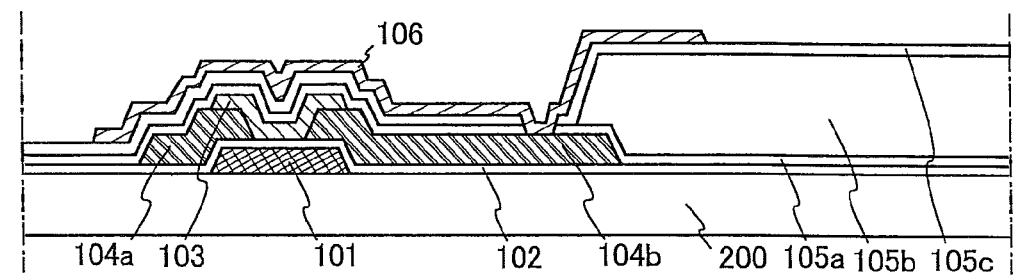
Figure 40A:
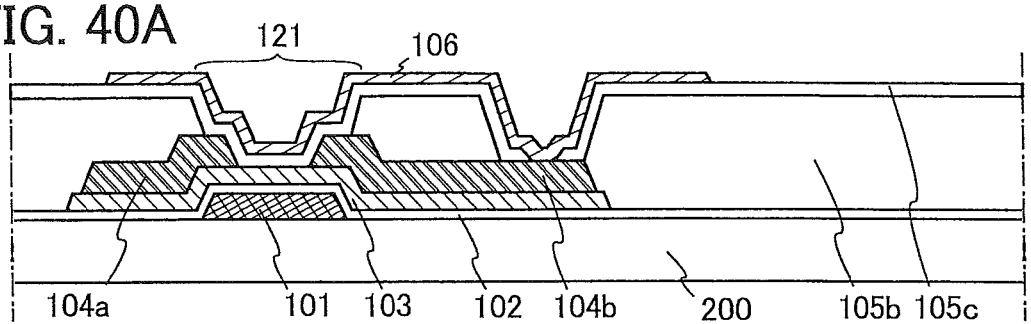
FIGS. 40A to 40E are cross-sectional views each illustrating the structure of a semiconductor device.
Figure 40B:
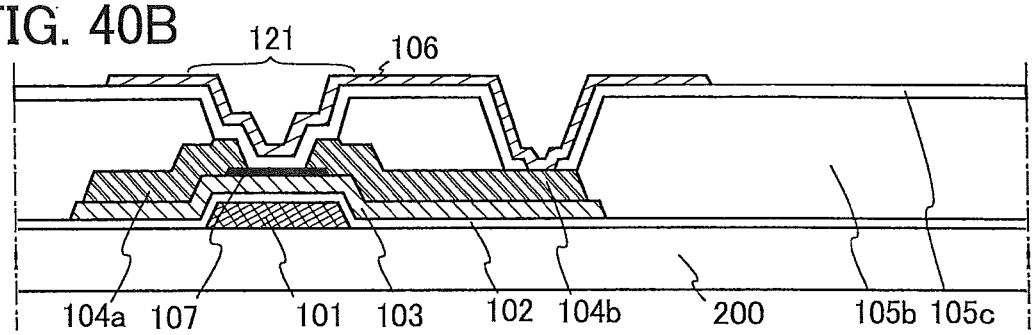
Figure 40C:
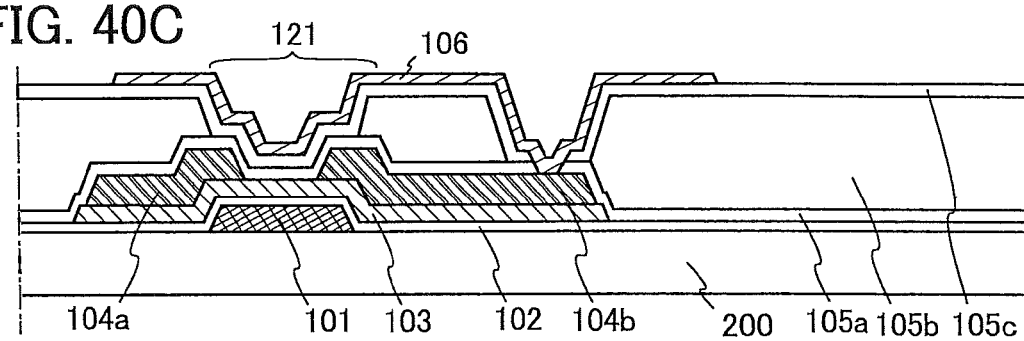
Figure 40D:
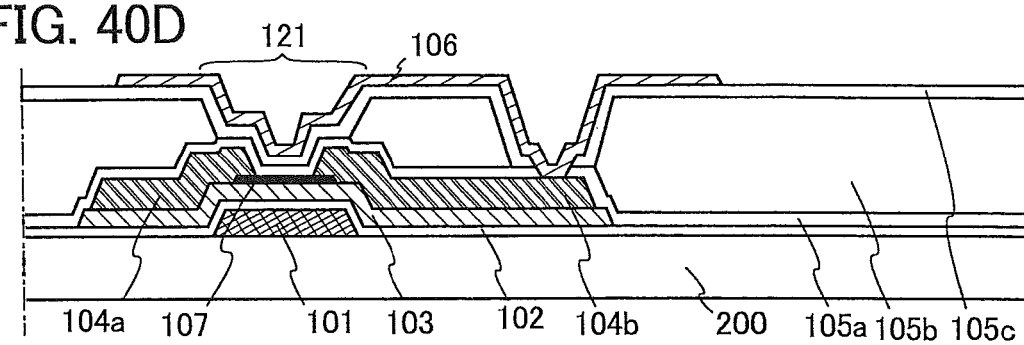
Figure 40E:
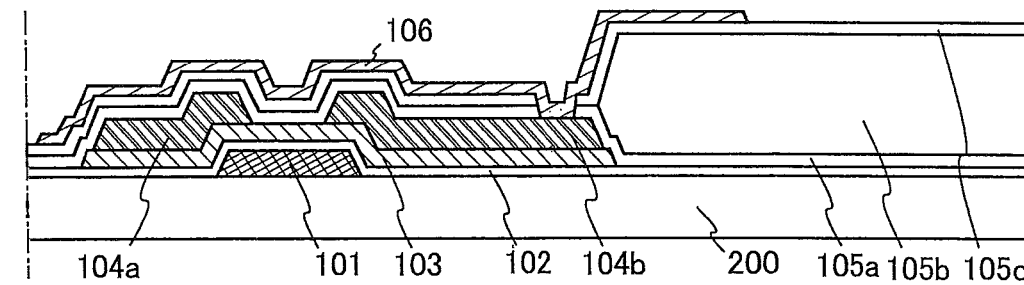
Figure 41A:
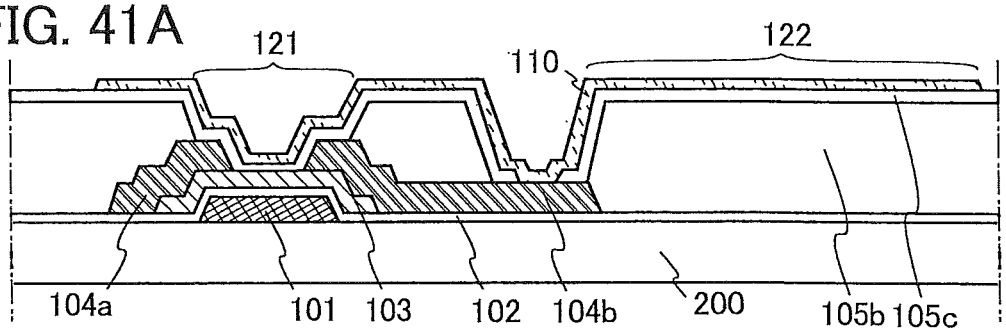
FIGS. 41A to 41E are cross-sectional views each illustrating the structure of a semiconductor device.
Figure 41B:
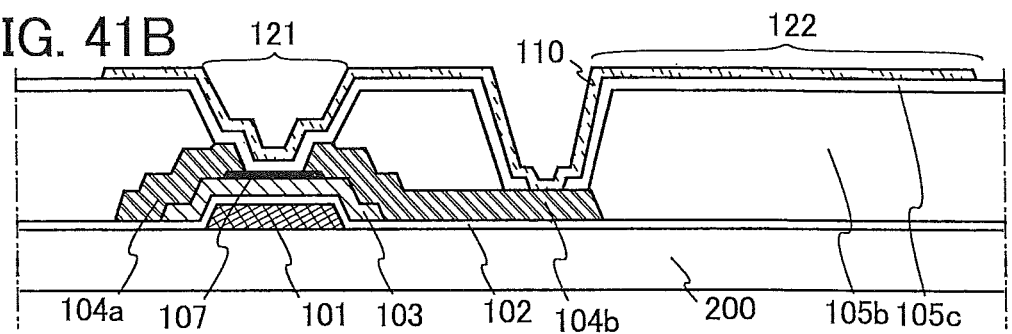
Figure 41C:
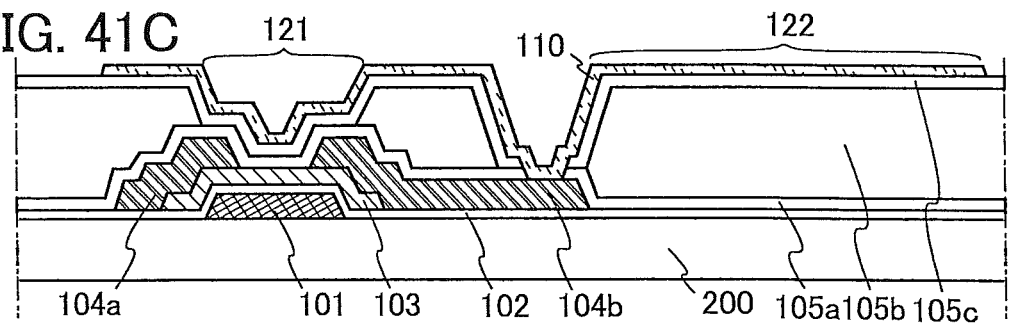
Figure 41D:
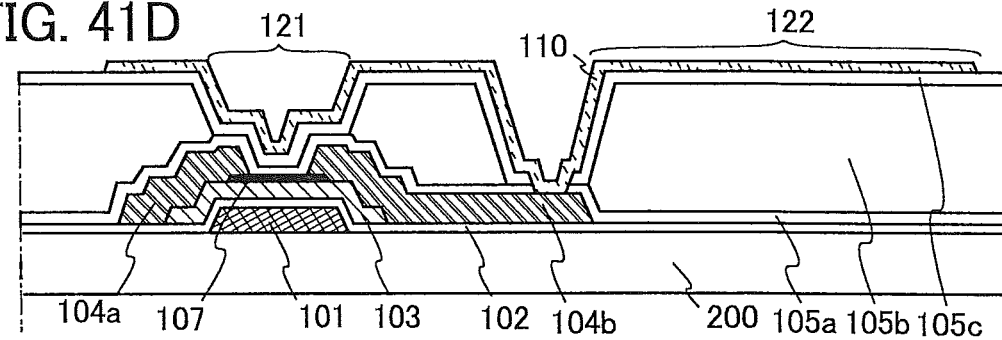
Figure 41E:
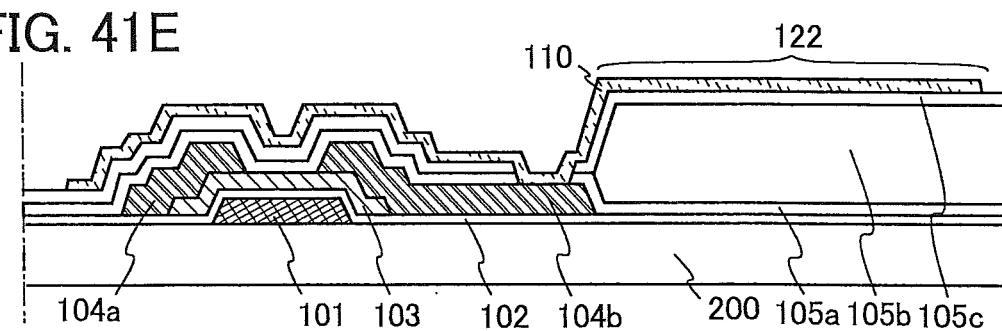
Figure 42A:
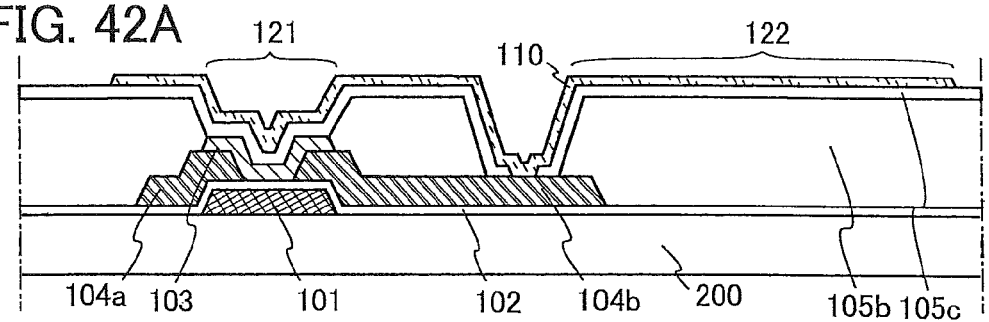
FIGS. 42A to 42E are cross-sectional views each illustrating the structure of a semiconductor device.
Figure 42B:
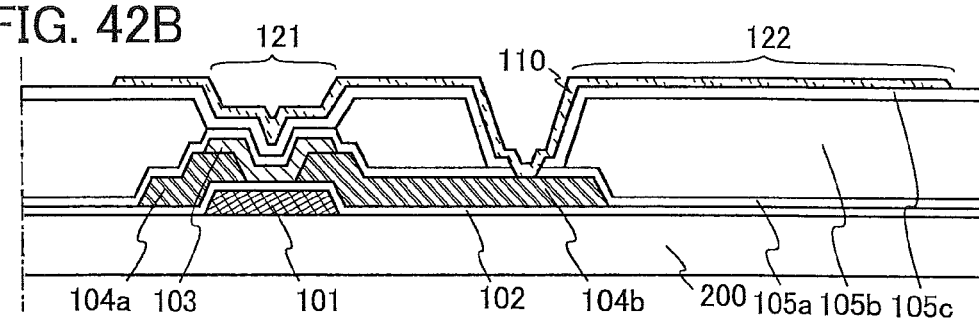
Figure 42C:
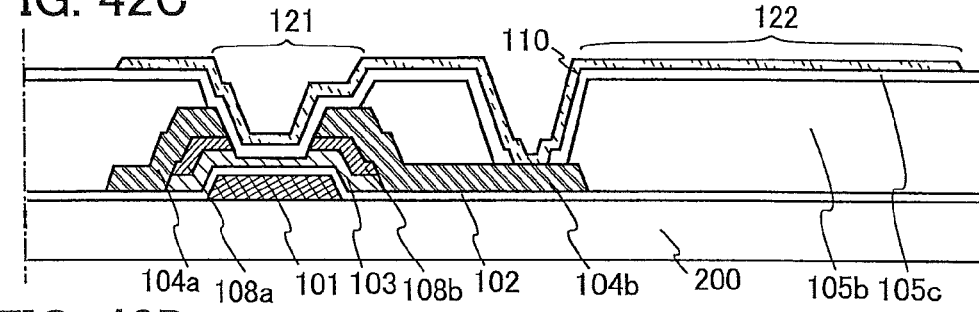
Figure 42D:
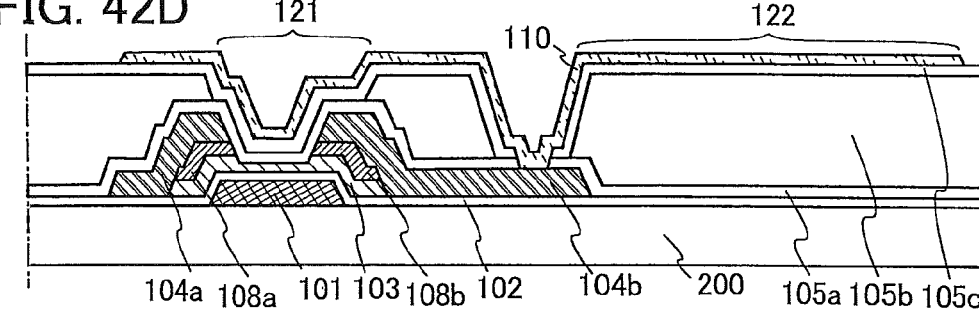
Figure 42E:
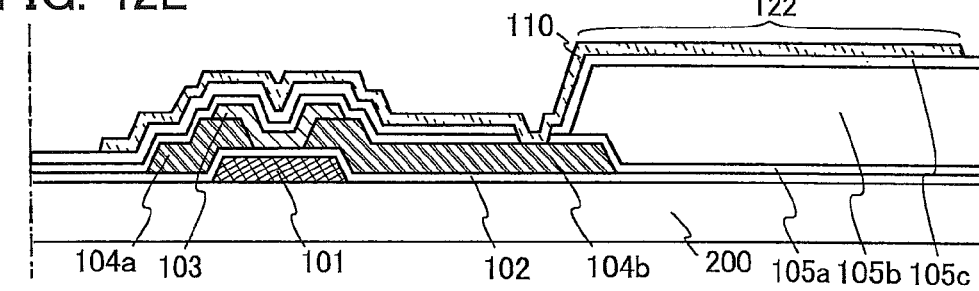
Figure 43A:
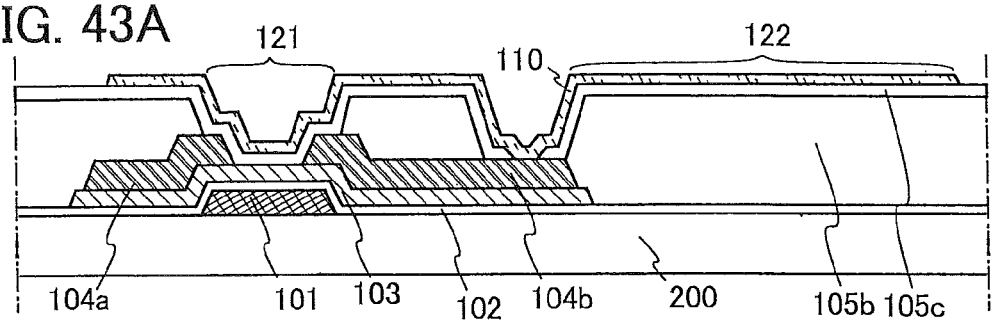
FIGS. 43A to 43E are cross-sectional views each illustrating the structure of a semiconductor device.
Figure 43B:
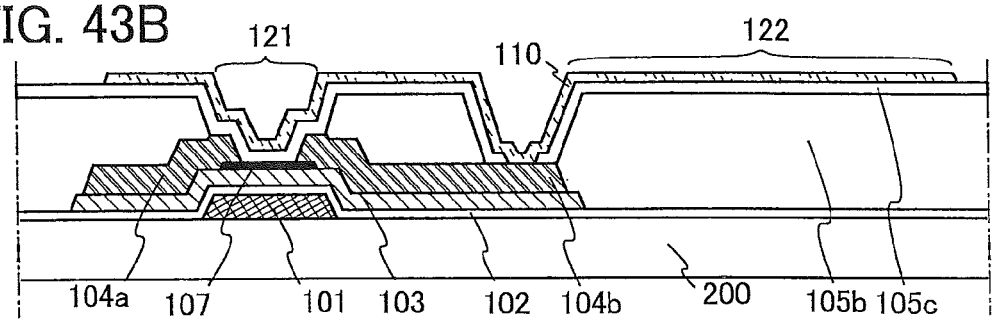
Figure 43C:
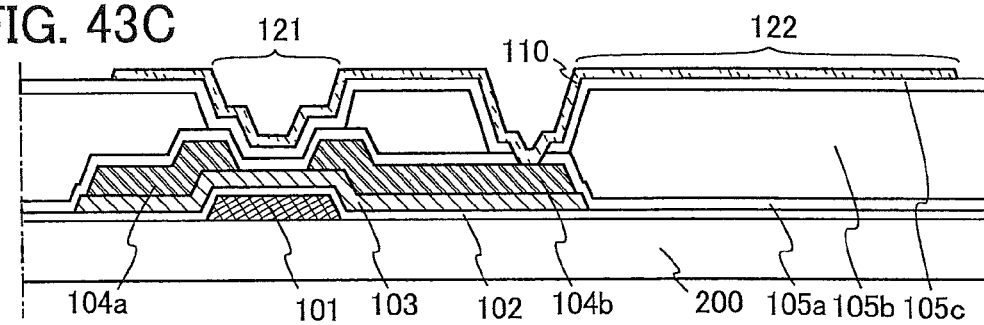
Figure 43D:
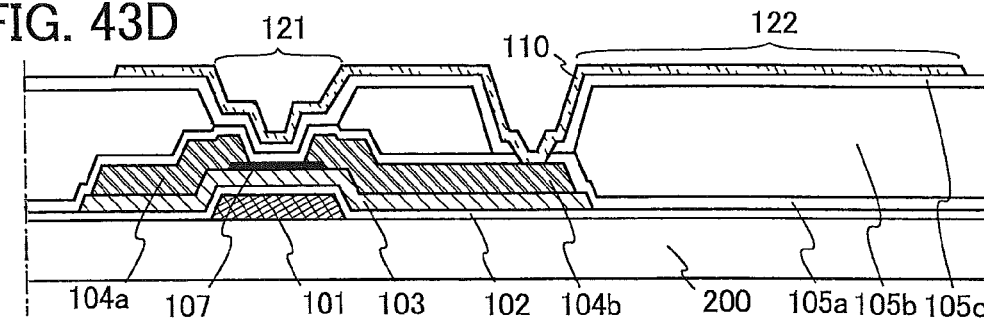
Figure 43E:
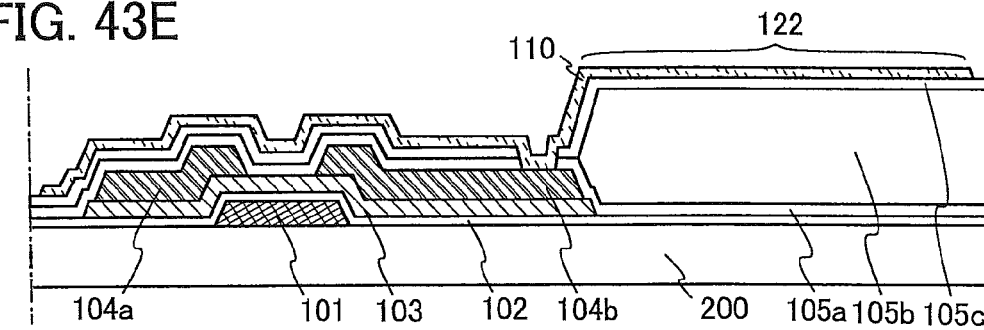

For example, FIGS. 30A and 30B each illustrate a structure example of the portion where the electrodes 110 and 104b are connected to each other in the case of the insulating layer 105 including a stack of the layers 105a, 105b, and 105c. FIG. 30A illustrates the structure in FIG. 26C and an enlarged view of the portion where the electrodes 110 and 104b are connected to each other in the structure. In FIG. 30A, the end of the opening in the layer 105a and the end of the opening in the layer 105b are substantially aligned with each other. The end of the opening in the layer 105a and the end of the opening in the layer 105b are not aligned with each other, and the diameter of each of the openings in the layers 105a and 105b is larger than the diameter of the opening in the layer 105c. In FIG. 30B, the end of the opening in the layer 105a and the end of the opening in the layer 105b are substantially aligned with each other. The end of the opening in the layer 105a and the end of the opening in the layer 105c are not aligned with each other, and the diameter of the opening in the layer 105b is larger than the diameter of each of the openings in the layers 105a and 105c.

Openings with the shapes in FIG. 30A can be formed, for example, in such a manner that a stack of the film A to be the layer 105a and the film B to be the layer 105b is formed, the film B and the film A are etched using a photomask, the film C to be the layer 105c is formed, and then, the film C is etched using a different photomask.

Openings with the shapes in FIG. 30B can be formed, for example, in such a manner that a stack of the film A to be the layer 105a and the film B to be the layer 105b is formed, the film B is etched using a photomask, the film C to be the layer 105c is formed, and then, the film C and the film A are etched using a different photomask.

Note that although not illustrated in FIGS. 30A and 30B, the end of the opening in the layer 105a, the end of the opening in the layer 105b, and the end of the opening in the layer 105c may be aligned with each other.

Alternatively, a structure may be employed in which the end of the opening in the layer 105a, the end of the opening in the layer 105b, and the end of the opening in the layer 105c are not aligned with each other. In that case, an end of the layer 105a may be covered with the layer 105b. An end of the layer 105b may or may not be covered with the layer 105c.

Note that in each of the structures illustrated in FIGS. 4A and 4B and FIGS. 5A and 5B, the taper angle of the end of the opening in the layer 105a (indicated by θ2 in FIGS. 4A and 4B and FIGS. 5A and 5B) may be substantially the same as or different from the taper angle of the end of the opening in the layer 105b (indicated by θ1 in FIGS. 4A and 4B and FIGS. 5A and 5B). In the structures illustrated in FIGS. 29A and 29B, the taper angle of the end of the opening in the layer 105b (indicated by θ1 in FIGS. 29A and 29B) may be substantially the same as or different from the taper angle of the end of the opening in the layer 105c (indicated by θ3 in FIGS. 29A and 29B). In the structures illustrated in FIGS. 30A and 30B, all the taper angle of the end of the opening in the layer 105a (indicated by θ2 in FIGS. 30A and 30B), the taper angle of the end of the opening in the layer 105b (indicated by θ1 in FIGS. 30A and 30B), and the taper angle of the end of the opening in the layer 105c (indicated by θ3 in FIGS. 30A and 30B) may be substantially the same, two of the taper angles may be substantially the same, or all the taper angles may be different from each other.

For example, in the case where the thickness of the layer 105b is large, θ1 is preferably small in order that the end of the layer 105b can be smooth as much as possible. For example, θ2 is preferably larger than θ1. Further, θ3 is preferably larger than θ1. Note that one aspect of an embodiment of the present invention is not limited thereto.

Here, the taper angle of an end of a layer is an angle formed by a side surface of the end of the layer (a tangent at a lower end) and a bottom surface of the layer when the layer is seen from a cross-sectional direction. The taper angle of each layer can be controlled by control of the thickness and material of each layer, etching conditions for forming an opening in each layer, and the like.

Figure 26A:
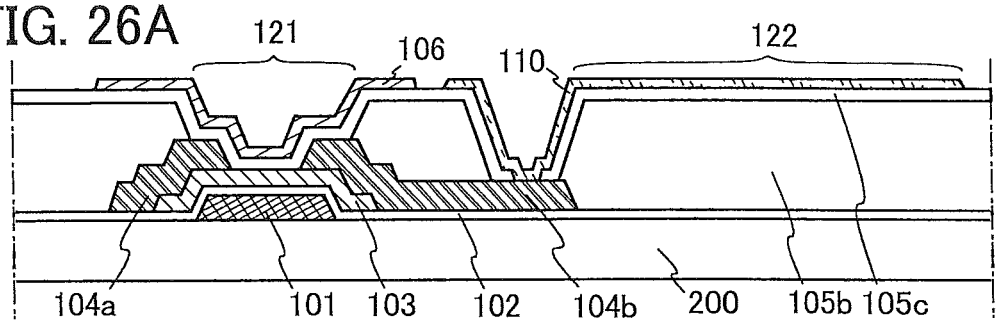
FIGS. 26A to 26E are cross-sectional views each illustrating the structure of a semiconductor device.
Figure 26B:
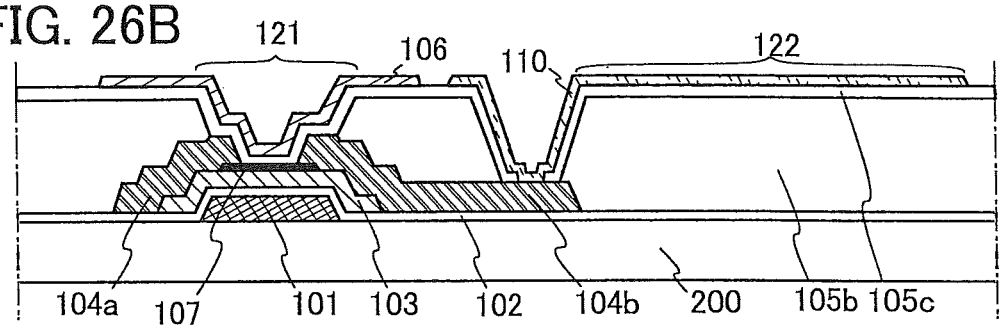
Figure 26C:
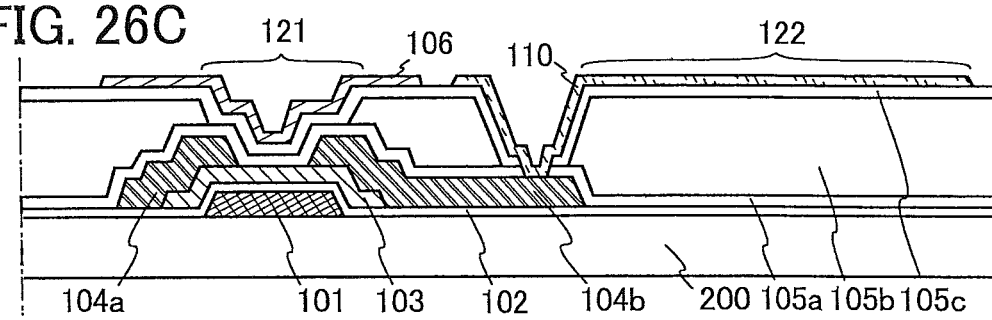
Figure 26D:
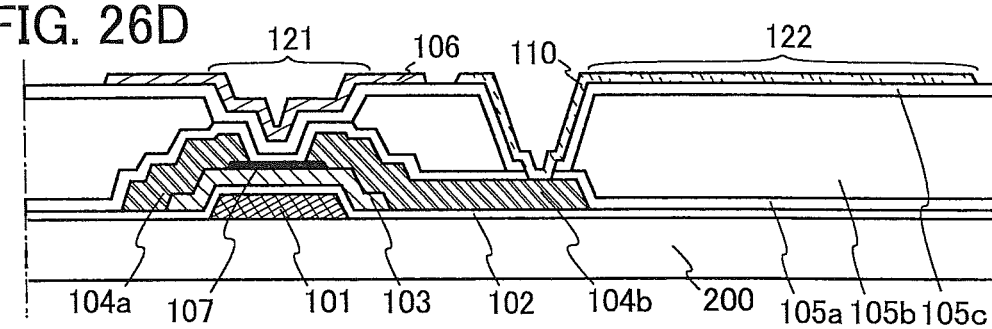
Figure 26E:
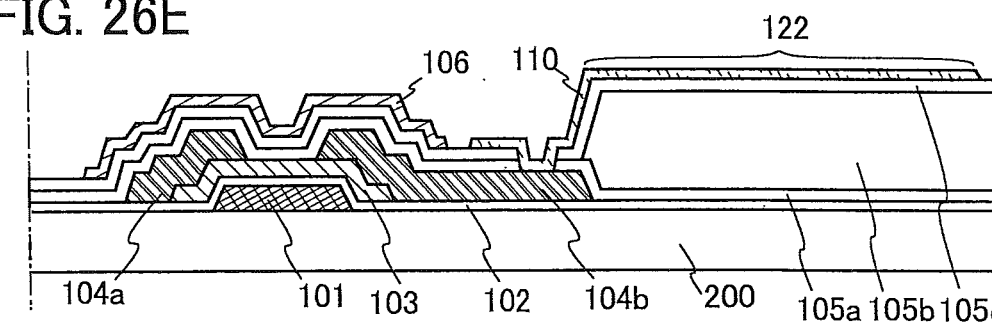
Figure 27A:
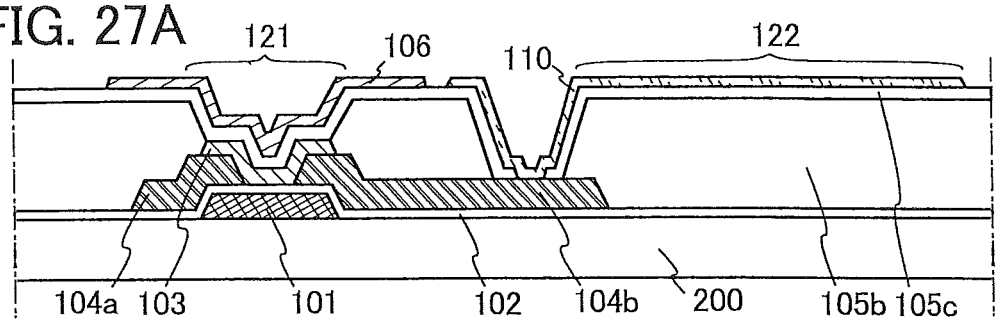
FIGS. 27A to 27E are cross-sectional views each illustrating the structure of a semiconductor device.
Figure 27B:
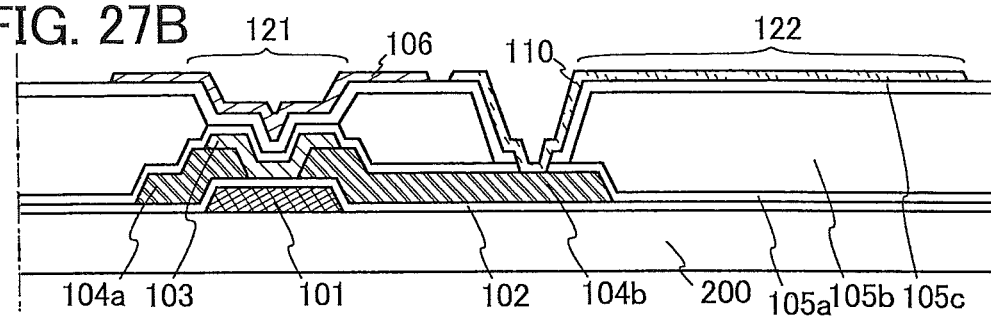
Figure 27C:
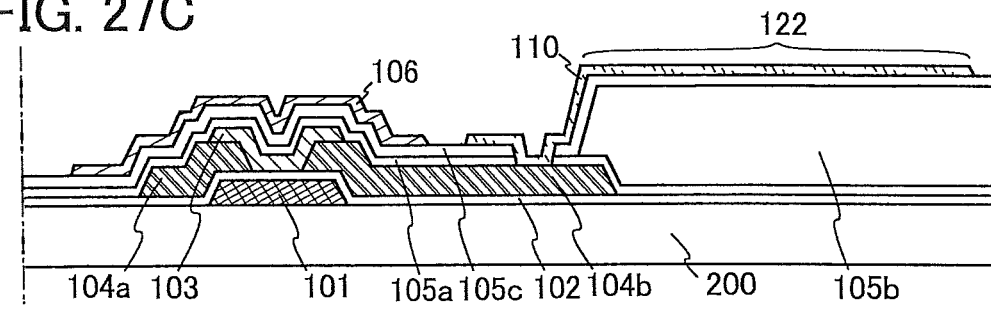
Figure 27D:
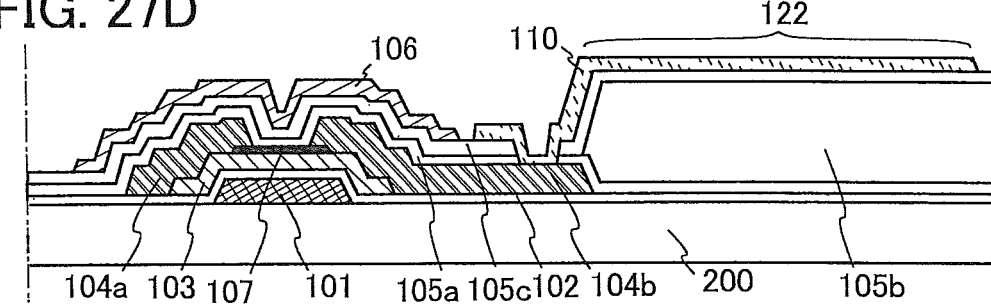
Figure 27E:
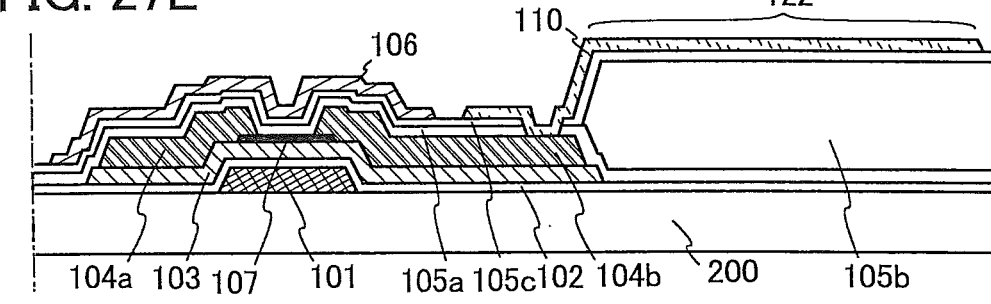
Figure 28A:
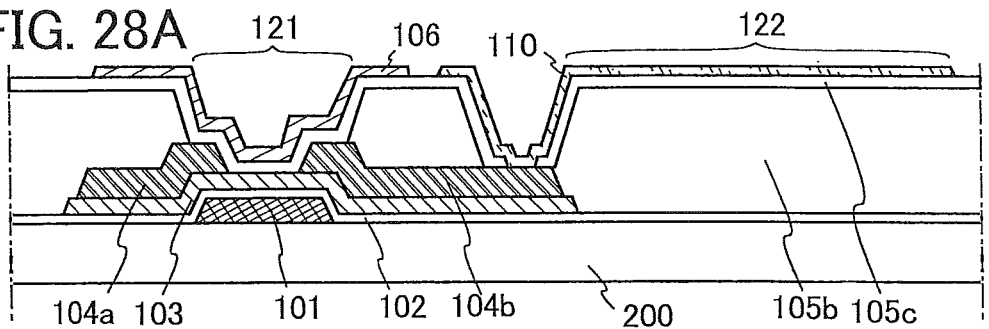
FIGS. 28A to 28E are cross-sectional views each illustrating the structure of a semiconductor device.
Figure 28B:
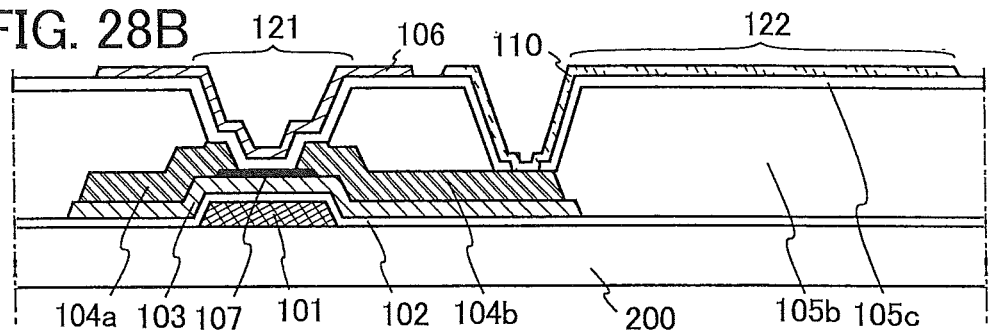
Figure 28C:
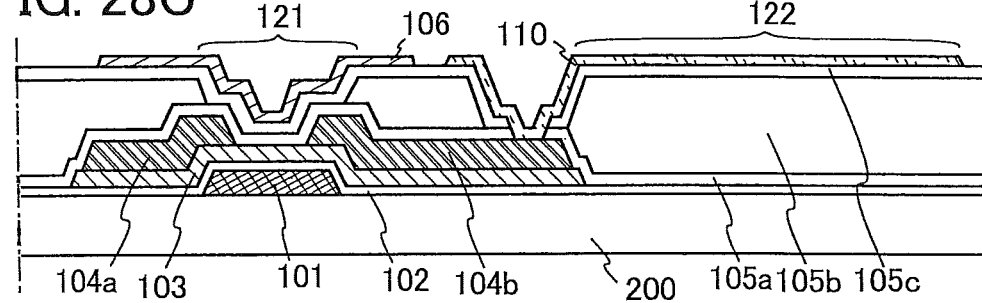
Figure 28D:
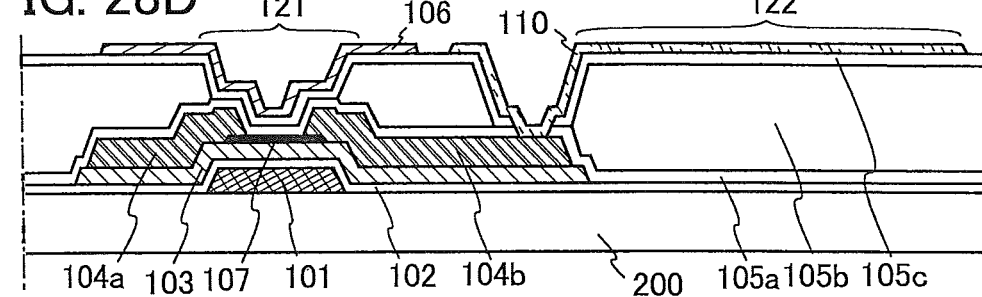
Figure 28E:
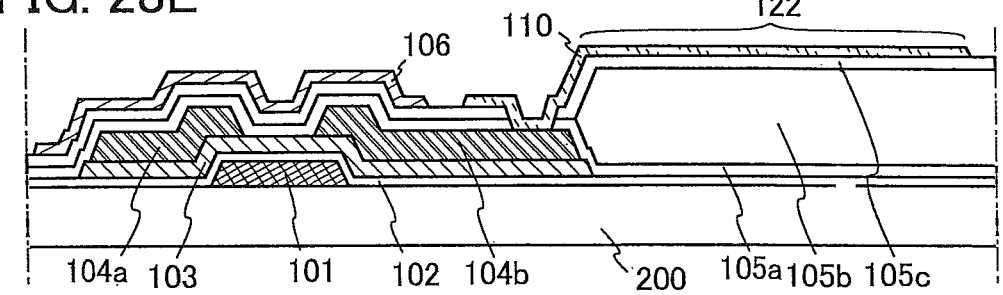

Note that FIGS. 4A and 4B, FIGS. 5A and 5B, FIGS. 29A and 29B, and FIGS. 30A and 30B illustrate structure examples of the portion where the electrodes 110 and 104b are connected to each other in the structures illustrated in FIG. 1C, FIG. 26A, and FIG. 26C. However, a similar structure can be employed in the portion where the electrodes 110 and 104b are connected to each other in the semiconductor devices in Embodiments 1 to 3 with the other structures.

Each of the structure examples of the portion where the electrodes 110 and 104b are connected to each other in FIGS. 4A and 4B, FIGS. 5A and 5B, FIGS. 29A and 29B, and FIGS. 30A and 30B can be employed as the structure of a portion where a given electrode provided below the insulating layer 105 is electrically connected to a given electrode provided over the insulating layer 105 through an opening formed in the insulating layer 105. For example, each of the structure examples of the portion where the electrodes 110 and 104b are connected to each other in FIGS. 4A and 4B, FIGS. 5A and 5B, FIGS. 29A and 29B, and FIGS. 30A and 30B can also be employed as the structure of a portion where an electrode formed using the same layer as the electrode 110 is connected to an electrode formed using the same layer as the electrode 104b. For example, each of the structure examples of the portion where the electrodes 110 and 104b are connected to each other in FIGS. 4A and 4B, FIGS. 5A and 5B, FIGS. 29A and 29B, and FIGS. 30A and 30B can also be employed as the structure of a portion where the electrode 110 or an electrode formed using the same layer as the electrode 110 is connected to the electrode 101 or an electrode formed using the same layer as the electrode 101. For example, each of the structure examples of the portion where the electrodes 110 and 104b are connected to each other in FIGS. 4A and 4B, FIGS. 5A and 5B, FIGS. 29A and 29B, and FIGS. 30A and 30B can also be employed as the structure of a portion where the electrode 106 or an electrode formed using the same layer as the electrode 106 is connected to the electrode 101 or an electrode formed using the same layer as the electrode 101. For example, each of the structure examples of the portion where the electrodes 110 and 104b are connected to each other in FIGS. 4A and 4B, FIGS. 5A and 5B, FIGS. 29A and 29B, and FIGS. 30A and 30B can also be employed as the structure of a portion where the electrode 106 or an electrode formed using the same layer as the electrode 106 is connected to the electrode 104b or an electrode formed using the same layer as the electrode 104b.

This embodiment is obtained by performing change, addition, modification, removal, application, superordinate conceptualization, or subordinate conceptualization on part or all of Embodiment 1, part or all of Embodiment 2, or part or all of Embodiment 3. Thus, this embodiment can be freely combined or replaced with another embodiment (e.g., any one of Embodiments 1 to 3).

(Embodiment 5)

In this embodiment, examples of an electrical connection between the electrode 106 of the transistor 100 and a different electrode or a wiring are described. Note that in drawings, the same portions as those in the drawings in any of the above embodiments are denoted by the same reference numerals, and the description thereof is omitted.

For example, the electrode 106 can be electrically connected to the electrode 101. With such a connection, the same potential as the electrode 101 can be supplied to the electrode 106. Thus, the on-state current of the transistor 100 can be increased. FIGS. 6A to 6E, FIGS. 7A to 7E, FIGS. 8A to 8E, FIGS. 9D and 9E, FIGS. 31A to 31E, FIGS. 32A to 32E, FIGS. 33A to 33E, and FIGS. 34D and 34E each illustrate an example in which the electrode 106 is electrically connected to the electrode 101. Note that the electrical connections between the electrodes 106 and 101 in these drawings can be similar to those in the variety of drawings in Embodiments 1 to 4.

Note that in the case where the transistors 100 are provided in pixels and a pixel matrix constituted of a plurality of pixels is formed, an opening may be formed for each pixel so that the electrode 106 may be electrically connected to the electrode 101. Accordingly, contact resistance or wiring resistance can be lowered. Alternatively, an opening may be formed for each plurality of pixels so that the electrode 106 may be electrically connected to the electrode 101. Accordingly, the layout area can be reduced. Alternatively, the electrode 106 may be electrically connected to the electrode 101 in a pixel matrix region or outside the pixel matrix region. When the electrode 106 is electrically connected to the electrode 101 outside the pixel matrix region, the layout area in the pixel matrix region can be reduced. Accordingly, the aperture ratio can be increased. Note that in the case where a driver circuit is provided outside the pixel matrix region, it is preferable that the electrode 106 be electrically connected to the electrode 101 in a region between the driver circuit and the pixel matrix region.

Alternatively, for example, the electrode 106 can be electrically connected to the electrode 104a or the electrode 104b. With such a connection, the same potential as the electrode 104a or the electrode 104b can be supplied to the electrode 106. FIGS. 13A to 13E, FIGS. 14A to 14E, FIGS. 15A to 15E, FIGS. 38A to 38E, FIGS. 39A to 39E, and FIGS. 40A to 40E each illustrate an example in which the electrode 106 is connected to the electrode 104b. Note that the electrical connections between the electrode 106 and the electrode 104a or the electrode 104b in these drawings can be similar to those in the variety of drawings in Embodiments 1 to 4.

Note that in the case where the transistors 100 are provided in pixels and a pixel matrix constituted of a plurality of pixels is formed, an opening may be formed for each pixel so that the electrode 106 may be electrically connected to the electrode 104b. Alternatively, an opening may be formed for each plurality of pixels so that the electrode 106 may be electrically connected to the electrode 104b. Alternatively, the electrode 106 may be electrically connected to the electrode 104b in a pixel matrix region or outside the pixel matrix region. Thus, as in the above case, contact resistance or wiring resistance can be reduced and/or the layout area can be reduced.

Alternatively, for example, the electrode 106 can be electrically connected to the electrodes 104b and 110. With such a connection, the same potential as the electrodes 104b and 110 can be supplied to the electrode 106. FIGS. 16A to 16E, FIGS. 17A to 17E, FIGS. 18A to 18E, FIGS. 41A to 41E, FIGS. 42A to 42E, and FIGS. 43A to 43E each illustrate an example in which the electrode 106 is connected to the electrodes 104b and 110. Note that in the structures in these drawings, the electrodes 110 and 106 are formed using one conductive film, and the electrodes 110 and 106 are collectively referred to as the electrode 110. Although the example in which the electrodes 110 and 106 are formed using one conductive film is described, this embodiment is not limited thereto. The electrodes 110 and 106 may be formed by etching of different conductive films. Alternatively, the electrodes 110 and 106 may be in contact with each other to be electrically connected to each other. Note that the electrical connections between the electrode 106 and the electrodes 104b and 110 in these drawings can be similar to those in the variety of drawings in Embodiments 1 to 4.

Alternatively, for example, the electrode 106 can be electrically connected to an electrode 101a which is formed using the same layer as the electrode 101. Here, the electrodes 101 and 101a can be formed by etching of one conductive film with the use of one mask (reticle). That is, the electrodes 101 and 101a are patterned concurrently. Thus, the electrodes 101 and 101a have substantially the same material and thickness, for example. FIGS. 10A to 10E, FIGS. 11A to 11E, FIGS. 12A to 12E, FIGS. 35A to 35E, FIGS. 36A to 36E, and FIGS. 37A to 37E each illustrate an example in which the electrode 106 is connected to the electrode 101a. Note that the electrical connections between the electrode 106 and the electrode which is formed using the same layer as the electrode 101 in these drawings can be similar to those in the variety of drawings in Embodiments 1 to 4.

Note that in the case where the transistors 100 are provided in pixels and a pixel matrix constituted of a plurality of pixels is formed, an opening may be formed for each pixel so that the electrode 106 may be electrically connected to the electrode 101a. Alternatively, an opening may be formed for plurality of pixels so that the electrode 106 may be electrically connected to the electrode 101a. Alternatively, the electrode 106 may be electrically connected to the electrode 101a in a pixel matrix region or outside the pixel matrix region. For example, the electrode 101a can be a capacitor line provided in the pixel matrix. The capacitor line forms capacitance such as storage capacitance by overlapping with a different wiring, an electrode, a conductive layer, or the like with an insulating layer provided therebetween. Alternatively, the electrode 101a can be a gate signal line provided in a different pixel or a different gate signal line in the same pixel.

Alternatively, for example, the electrode 106 can be electrically connected to an electrode 104c which is formed using the same layer as the electrode 104a or the electrode 104b. Here, the electrodes 104a, 104b, and 104c can be formed by etching of one conductive film with the use of one mask (reticle). That is, the electrodes 104a, 104b, and 104c are patterned concurrently. Thus, the electrodes 104a, 104b, and 104c have substantially the same material and thickness, for example. FIGS. 23A to 23E, FIGS. 24A to 24E, FIGS. 25A to 25E, FIGS. 49A to 49E, FIGS. 50A to 50E, and FIGS. 51A to 51E each illustrate an example in which the electrode 106 is connected to the electrode 104c. Note that in FIGS. 25A to 25E and FIGS. 51A to 51E, a semiconductor layer 103a which is formed using the same layer as the semiconductor layer 103 is provided below the electrode 104c. Note that the electrical connections between the electrode 106 and the electrode which is formed using the same layer as the electrode 104a or the electrode 104b in these drawings can be similar to those in the variety of drawings in Embodiments 1 to 4.

Note that in the case where the transistors 100 are provided in pixels and a pixel matrix constituted of a plurality of pixels is formed, an opening may be formed for each pixel so that the electrode 106 may be electrically connected to the electrode 104c. Alternatively, an opening may be formed for each plurality of pixels so that the electrode 106 may be electrically connected to the electrode 104c. Alternatively, the electrode 106 may be electrically connected to the electrode 104c in a pixel matrix region or outside the pixel matrix region. For example, the electrode 104c can be a capacitor line provided in the pixel matrix. The capacitor line forms capacitance such as storage capacitance by overlapping with a different wiring, an electrode, a conductive layer, or the like with an insulating layer provided therebetween. Alternatively, the electrode 104c can be a signal line or a power supply line provided in a different pixel or a different signal line or a different power supply line in the same pixel.

Here, in the case where the electrode 101a or the electrode 104c is a capacitor line, the following structures can be employed.

A structure may be employed in which a capacitor line is provided in each pixel row (or each pixel column) of the pixel matrix and the electrode 106 of the transistor 100 in each pixel row (or each pixel column) is electrically connected to the capacitor line provided in the pixel row (or the pixel column). Alternatively, a structure may be employed in which a capacitor line is provided in each pixel row (or each pixel column) of the pixel matrix and the electrode 106 of the transistor 100 in each pixel row (or each pixel column)

is electrically connected to a capacitor line provided in a pixel row (or a pixel column) adjacent to the pixel row (or the pixel column).

Note that in the case where one pixel of the pixel matrix includes a plurality of subpixels, a structure may be employed in which a capacitor line is provided in each subpixel row (or each subpixel column) and the electrode 106 of the transistor 100 in each subpixel row (or each subpixel column) is electrically connected to the capacitor line provided in the subpixel row (or the subpixel column). Alternatively, in the case where one pixel of the pixel matrix includes a plurality of subpixels, a structure may be employed in which a capacitor line is provided in each pixel row (or each pixel column) and the electrode 106 of the transistor 100 in each subpixel row (or each subpixel column) is electrically connected to the capacitor line provided in the pixel row (or the pixel column). Alternatively, in the case where one pixel of the pixel matrix includes a plurality of subpixels, a structure may be employed in which a capacitor line is provided in each subpixel row (or each subpixel column) and the electrode 106 of the transistor 100 in each subpixel row (or each subpixel column) is electrically connected to a capacitor line provided in a subpixel row (or a subpixel column) adjacent to the subpixel row (or the subpixel column).

A plurality of capacitor lines can be merged into a single capacitor line. For example, a capacitor line can be used in common between adjacent pixels (or subpixels). Accordingly, the number of capacitor lines can be reduced.

Note that in the case where the electrode 106 of the transistor 100 is electrically connected to a capacitor line, a fixed potential (preferably a potential equal to or lower than the lowest potential applied to the electrode 101) can be applied to the capacitor line. Thus, the threshold voltage of the transistor 100 can be controlled so that the transistor 100 can be normally off. Further, noise due to capacitive coupling with the electrode 101, the electrode 104a, or the like can be prevented from being input to the electrode 110.

Note that in the case where the electrode 106 of the transistor 100 is electrically connected to the capacitor line, a pulse signal can be supplied to the capacitor line. For example, in the case where common inversion driving is performed, the potential of a counter electrode and the potential of the capacitor line are changed with the same amplitude value in some cases. Even in such a case, when a low potential at which the transistor 100 is turned off is supplied to the electrode 106, the threshold voltage of the transistor 100 can be controlled so that the transistor 100 can be normally off.

Note that in the case where the electrode 106 of the transistor 100 is electrically connected to the capacitor line, it is preferable that the semiconductor layer 103 be not provided between a pair of electrodes (one of which is the capacitor line) of a capacitor. Note that one aspect of an embodiment of the present invention is not limited thereto.

Note that the electrode 101a or the electrode 104c is not limited to a capacitor line, and can be a different wiring. For example, the electrode 101a or the electrode 104 may be a power supply line, an initialization wiring, or the like. For example, the electrode 101a or the electrode 104 may be a wiring provided in a pixel circuit in a display device including an EL element (e.g., an organic light-emitting element). Alternatively, the electrode 101a or the electrode 104 may be a wiring provided in a driver circuit (e.g., a scan line driver circuit or a signal line driver circuit in a display device).

This embodiment is obtained by performing change, addition, modification, removal, application, superordinate conceptualization, or subordinate conceptualization on part or all of Embodiment 1, part or all of Embodiment 2, part or all of Embodiment 3, or part or all of Embodiment 4. Thus, this embodiment can be freely combined or replaced with another embodiment (e.g., any one of Embodiments 1 to 4).

(Embodiment 6)

In this embodiment, examples of an electrical connection between the electrode 101 of the transistor 100 (or an electrode formed using the same layer as the electrode 101) and the electrode 104a or the electrode 104b of the transistor 100 (or an electrode formed using the same layer as the electrode 104a or the electrode 104b) are described with reference to FIGS. 19A to 19D, FIGS. 44A to 44D, and FIGS. 45A to 45D. Note that in drawings, the same portions as those in the drawings in any of the above embodiments are denoted by the same reference numerals, and the description thereof is omitted.

FIGS. 19A to 19D each illustrate an example of an electrical connection between the electrode 101a formed using the same layer as the electrode 101 of the transistor 100 and the electrode 104c formed using the same layer as the electrode 104a or the electrode 104b in the case of the insulating layer 105 including the layers 105a and 105b.

Figure 19A:
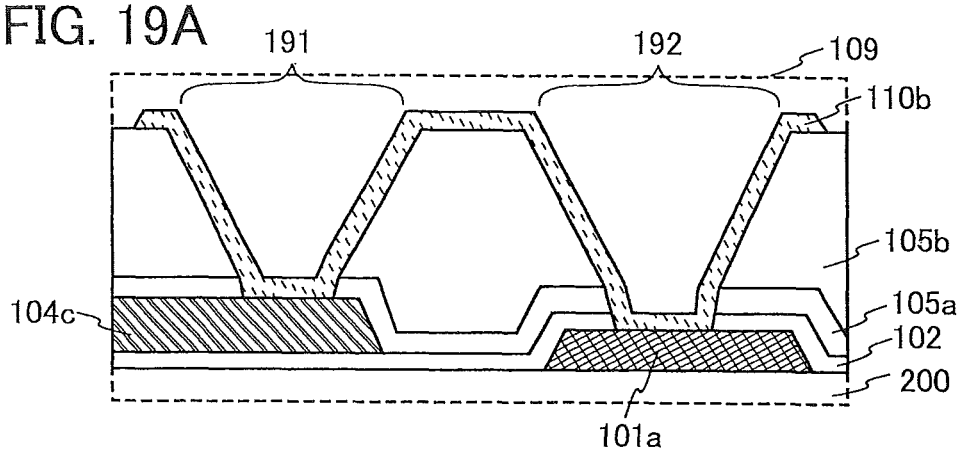
FIGS. 19A to 19D are cross-sectional views each illustrating the structure of a semiconductor device.

In the structure illustrated in FIG. 19A, the electrode 104c and the electrode 101a are electrically connected to each other through an electrode 110b in an opening 191 formed in the layers 105a and 105b and an opening 192 formed in the insulating layer 102 and the layers 105a and 105b.

Figure 19B:
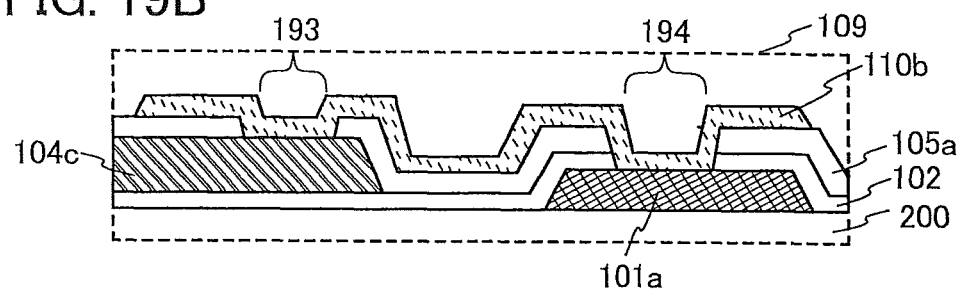

In the structure illustrated in FIG. 19B, the electrode 104c and the electrode 101a are electrically connected to each other through the electrode 110b in an opening 193 formed in the layer 105a and an opening 194 formed in the insulating layer 102 and the layer 105a. That is, the layer 105b is not provided in the portion g 109 where the electrodes 104c and 101a are connected to each other.

Note that the layer 105b is not necessarily omitted from the entire portion where the electrodes 104c and 101a are connected to each other. For example, as in the structure illustrated in FIG. 19C or FIG. 19D, the layer 105b may be provided in part of the portion 109 where the electrodes 104c and 101a are connected to each other.

Figure 19C:
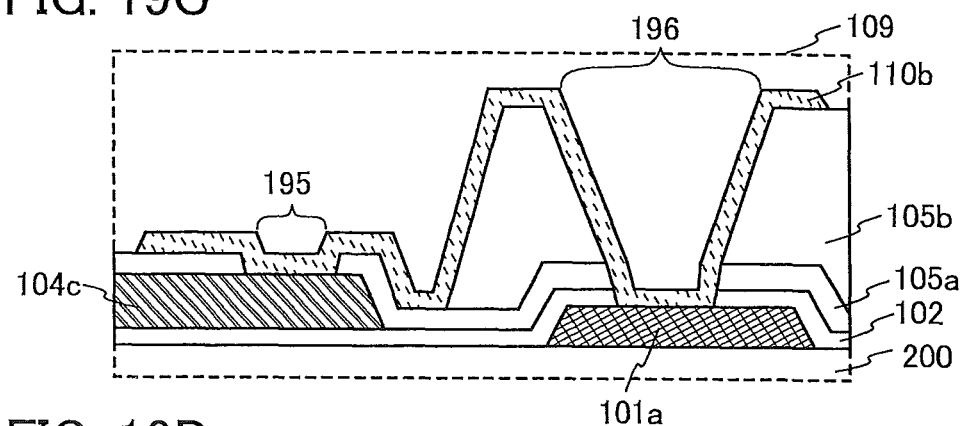

In the structure illustrated in FIG. 19C, the electrodes 104c and 101a are electrically connected to each other through the electrode 110b in an opening 195 formed in the layer 105a and an opening 196 formed in the insulating layer 102 and the layers 105a and 105b.

Figure 19D:
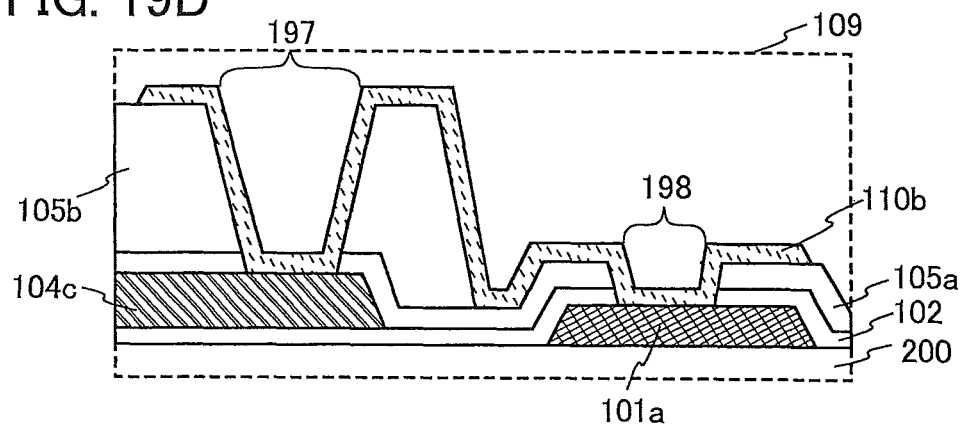
Figure 20A:
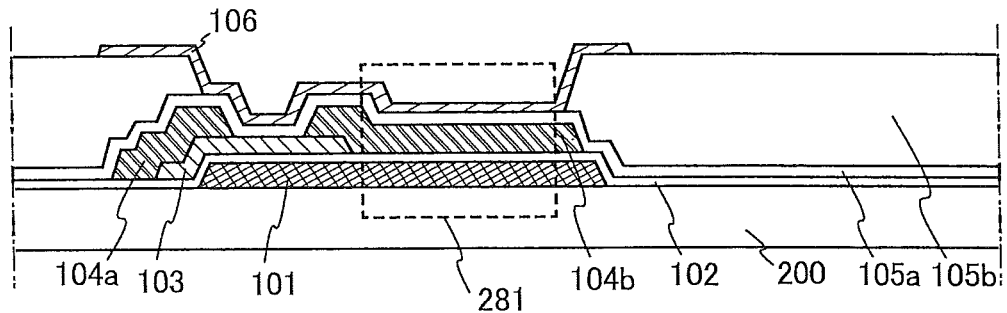
FIGS. 20A to 20D are cross-sectional views each illustrating the structure of a semiconductor device.
Figure 20B:
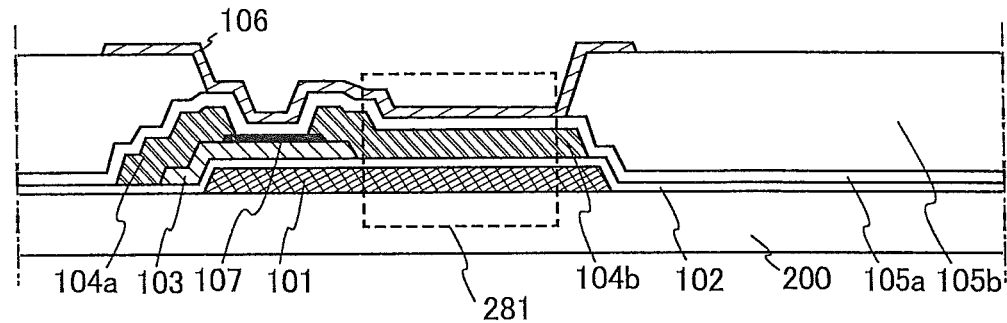
Figure 20C:
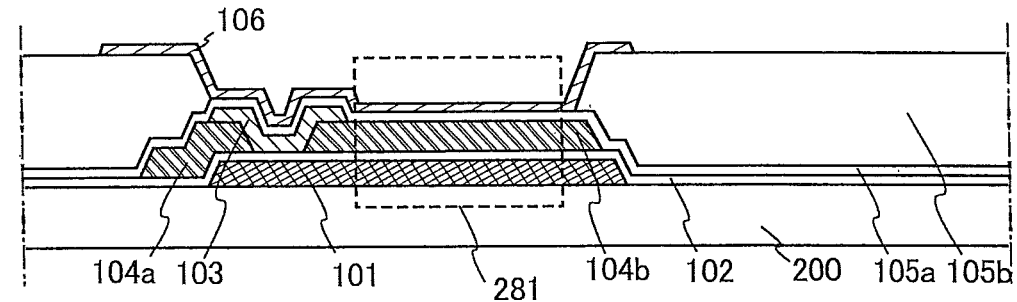
Figure 20D:
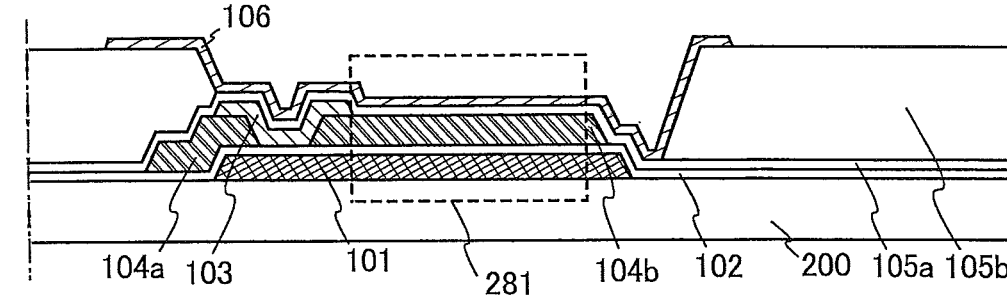
Figure 21A:
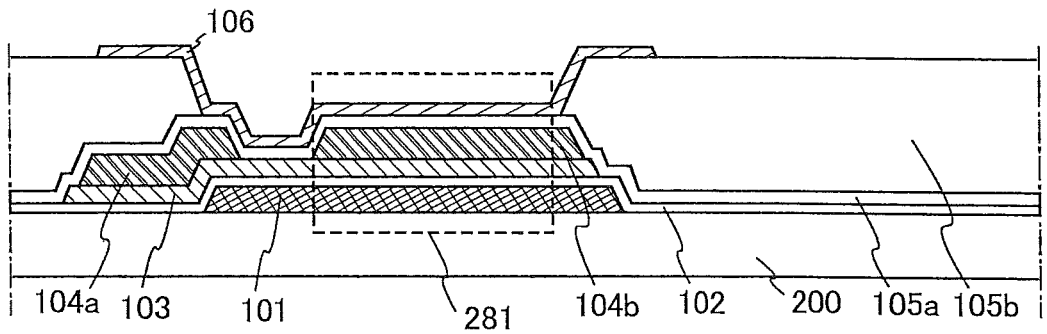
FIGS. 21A to 21D are cross-sectional views each illustrating the structure of a semiconductor device.
Figure 21B:
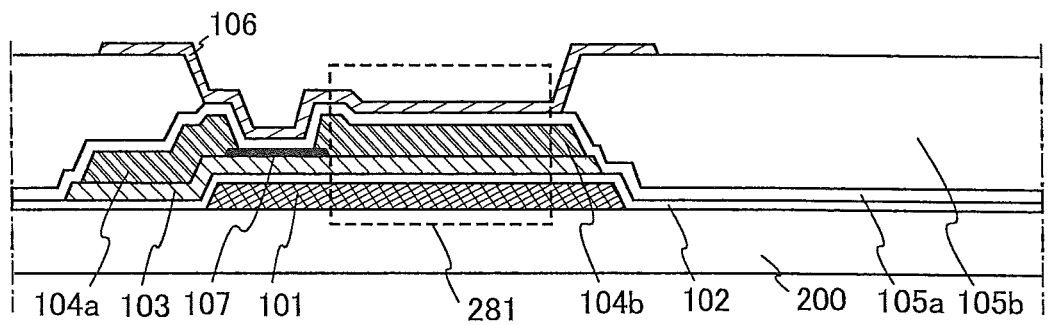
Figure 21C:
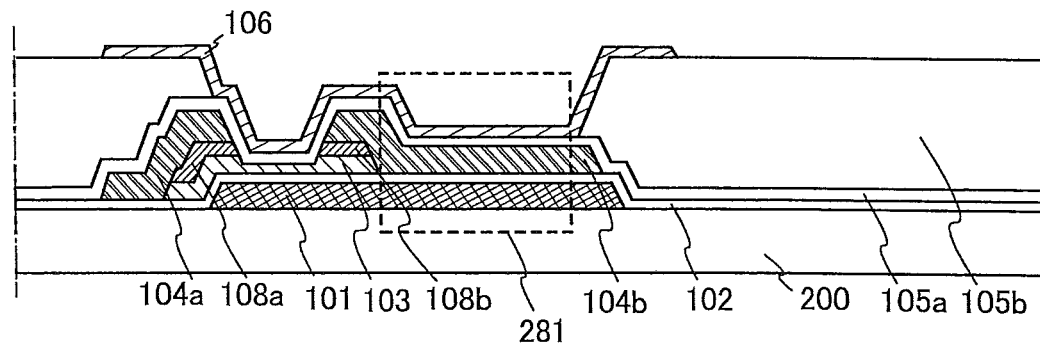
Figure 21D:
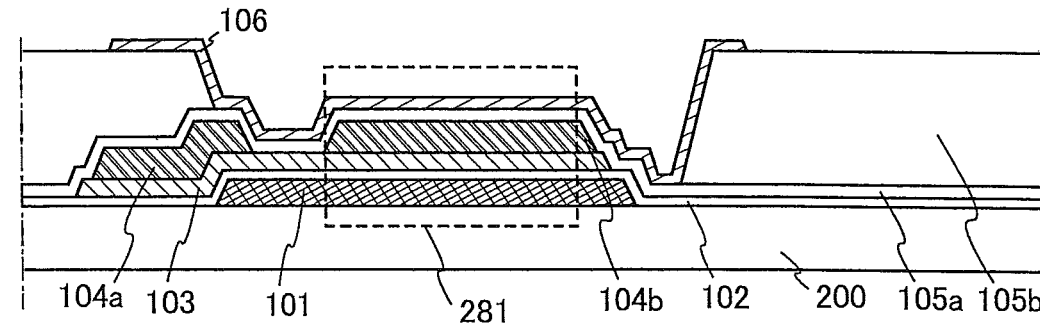

In the structure illustrated in FIG. 19D, the electrodes 104c and 101a are electrically connected to each other through the electrode 110b in an opening 197 formed in the layers 105a and 105b and an opening 198 formed in the insulating layer 102 and the layer 105a.

Next, FIGS. 44A to 44D each illustrate an example of an electrical connection between the electrode 101a formed using the same layer as the electrode 101 of the transistor 100 and the electrode 104c formed using the same layer as the electrode 104a or the electrode 104b in the case of the insulating layer 105 including the layers 105b and 105c.

Figure 44A:
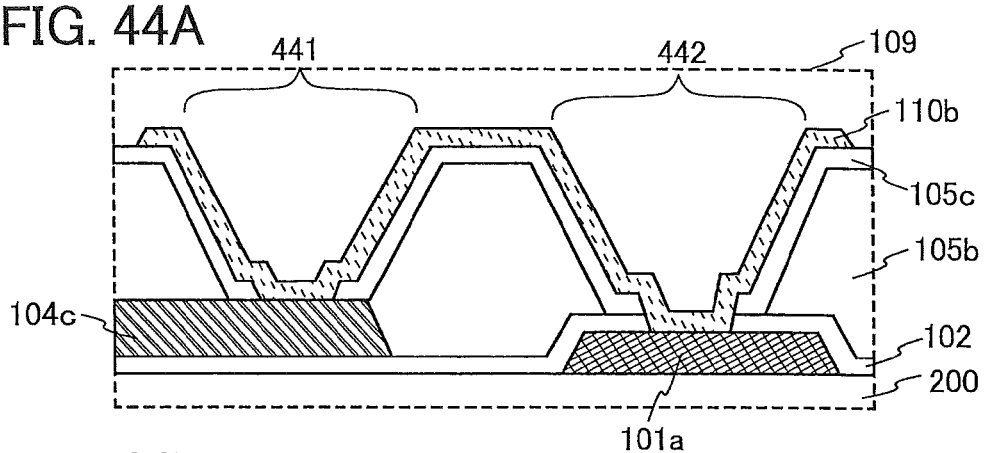
FIGS. 44A to 44D are cross-sectional views each illustrating the structure of a semiconductor device.

In the structure illustrated in FIG. 44A, the electrode 104c and the electrode 101a are electrically connected to each other through the electrode 110b in an opening 441 formed in the layers 105b and 105c and an opening 442 formed in the insulating layer 102 and the layers 105b and 105c.

Figure 44B:
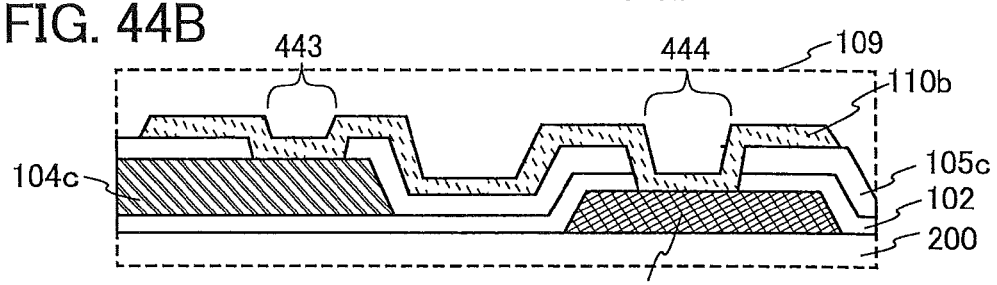

In the structure illustrated in FIG. 44B, the electrode 104c and the electrode 101a are electrically connected to each other through the electrode 110b in an opening 443 formed in the layer 105c and an opening 444 formed in the insulating layer 102 and the layer 105c. That is, the layer 105b is not provided in the portion 109 where the electrodes 104c and 101a are connected to each other.

Note that the layer 105b is not necessarily omitted from the entire portion where the electrodes 104c and 101a are connected to each other. For example, as in the structure illustrated in FIG. 44C or FIG. 44D, the layer 105b may be provided in part of the portion 109 where the electrodes 104c and 101a are connected to each other.

Figure 44C:
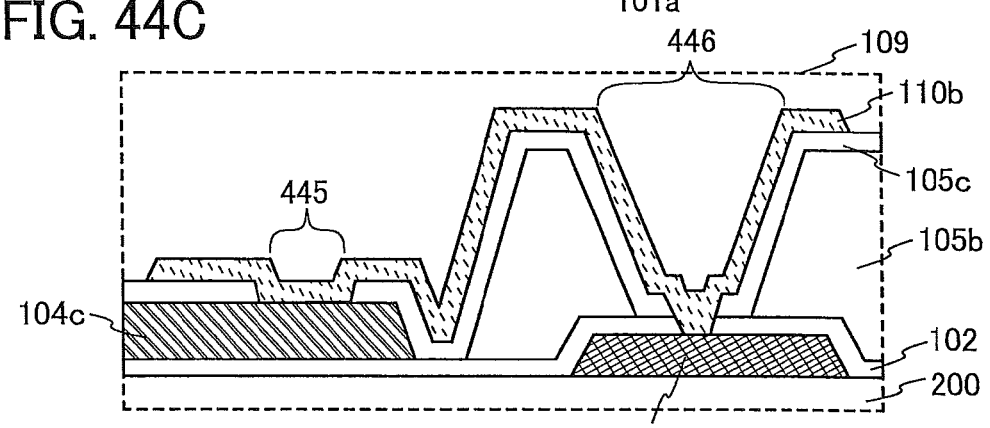

In the structure illustrated in FIG. 44C, the electrodes 104c and 101a are electrically connected to each other through the electrode 110b in an opening 445 formed in the layer 105c and an opening 446 formed in the insulating layer 102 and the layers 105b and 105c.

Figure 44D:
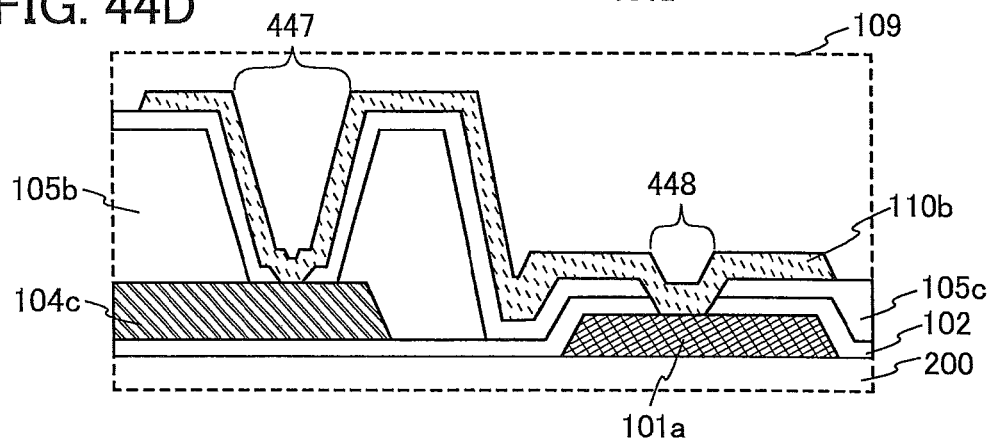

In the structure illustrated in FIG. 44D, the electrodes 104c and 101a are electrically connected to each other through the electrode 110b in an opening 447 formed in the layers 105b and 105c and an opening 448 formed in the insulating layer 102 and the layer 105c.

Next, FIGS. 45A to 45D each illustrate an example of an electrical connection between the electrode 101a formed using the same layer as the electrode 101 of the transistor 100 and the electrode 104c formed using the same layer as the electrode 104a or the electrode 104b in the case of the insulating layer 105 including the layers 105a, 105b, and 105c.

Figure 45A:
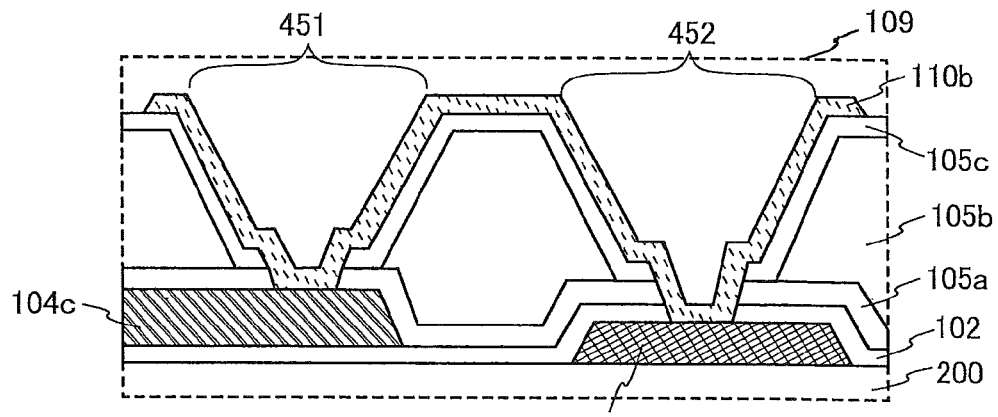
FIGS. 45A to 45D are cross-sectional views each illustrating the structure of a semiconductor device.

In the structure illustrated in FIG. 45A, the electrodes 104c and 101a are electrically connected to each other through the electrode 110b in an opening 451 formed in the layers 105a, 105b, and 105c and an opening 452 formed in the insulating layer 102 and the layers 105a, 105b, and 105c.

Figure 45B:
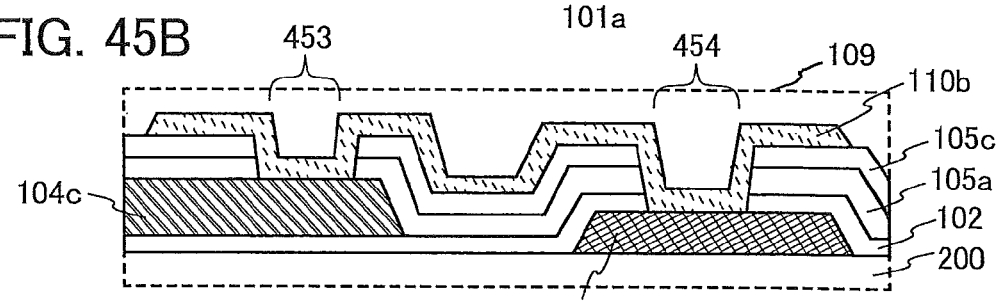

In the structure illustrated in FIG. 45B, the electrodes 104c and 101a are electrically connected to each other through the electrode 110b in an opening 453 formed in the layers 105a and 105c and an opening 454 formed in the insulating layer 102 and the layers 105a and 105c. That is, the layer 105b is not provided in the portion 109 where the electrodes 104c and 101a are connected to each other.

Note that the layer 105b is not necessarily omitted from the entire portion where the electrodes 104c and 101a are connected to each other. For example, as in the structure illustrated in FIG. 45C or FIG. 45D, the layer 105b may be provided in part of the portion 109 where the electrodes 104c and 101a are connected to each other.

Figure 45C:
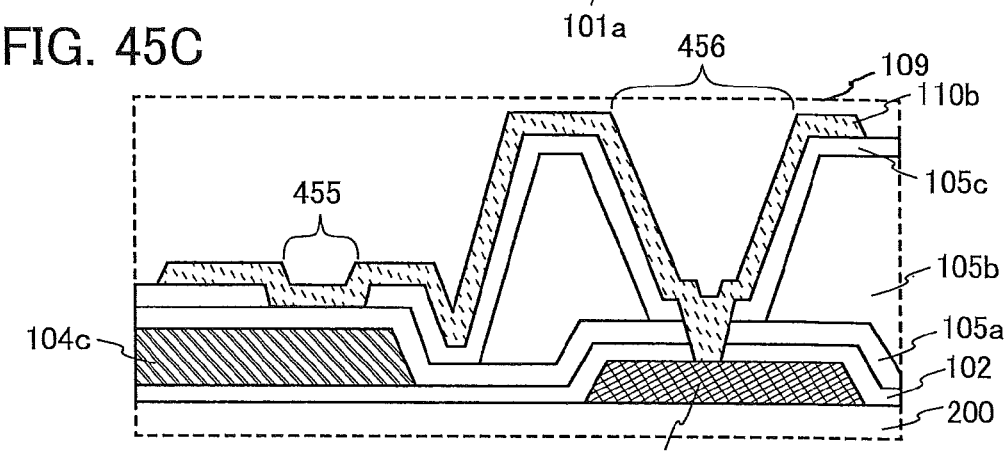

In the structure illustrated in FIG. 45C, the electrodes 104c and 101a are electrically connected to each other through the electrode 110b in an opening 455 formed in the layers 105a and 105c and an opening 456 formed in the insulating layer 102 and the layers 105a, 105b, and 105c.

Figure 45D:
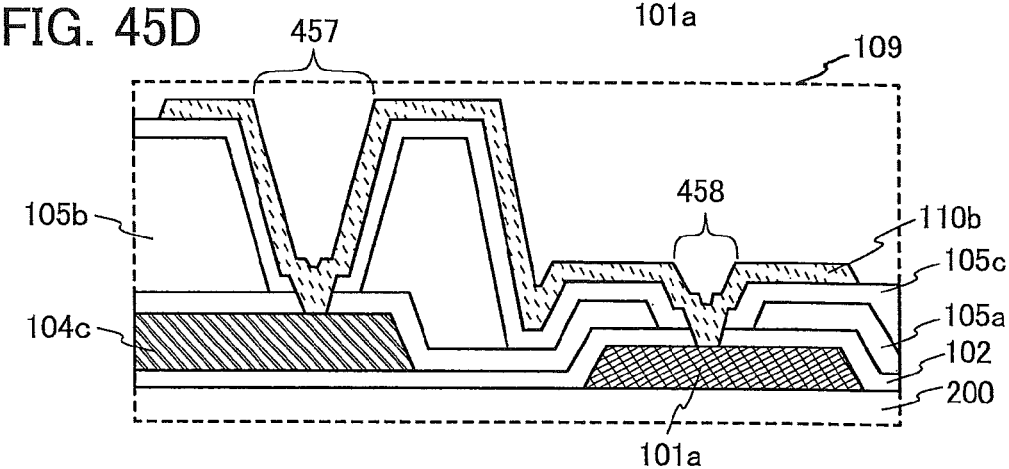
Figure 46A:
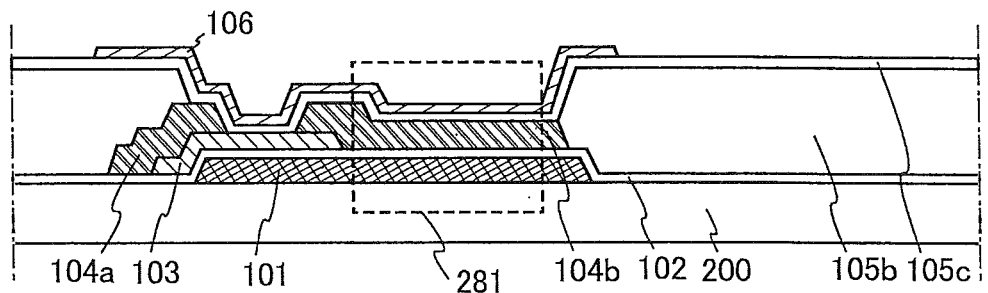
FIGS. 46A to 46D are cross-sectional views each illustrating the structure of a semiconductor device.
Figure 46B:
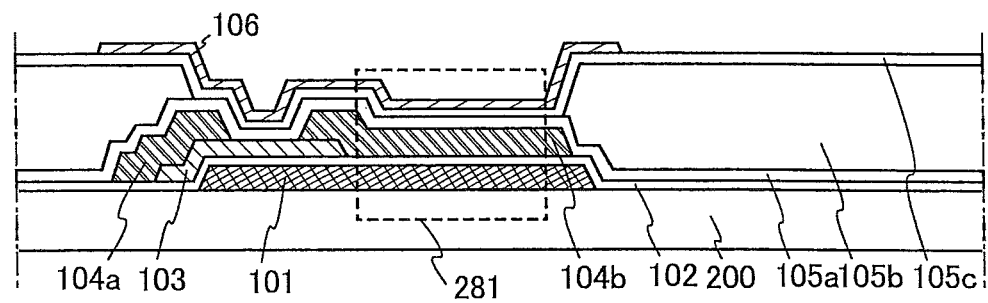
Figure 46C:
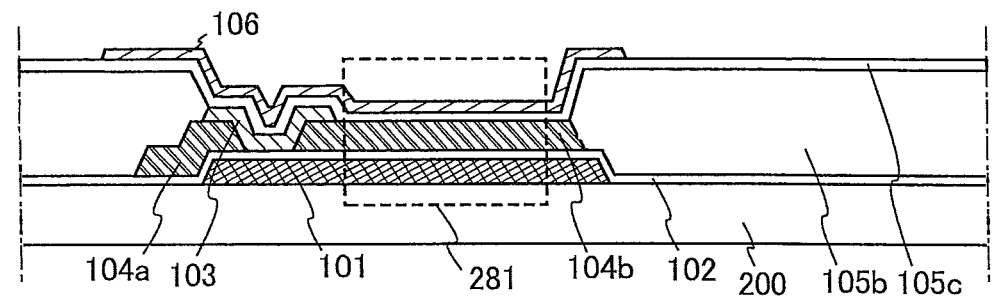
Figure 46D:
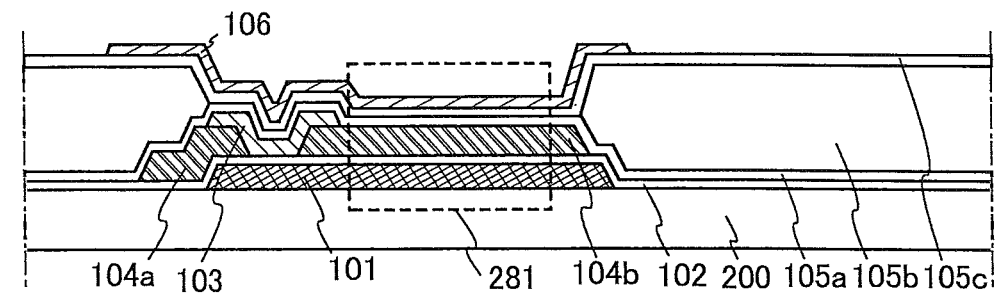
Figure 47A:
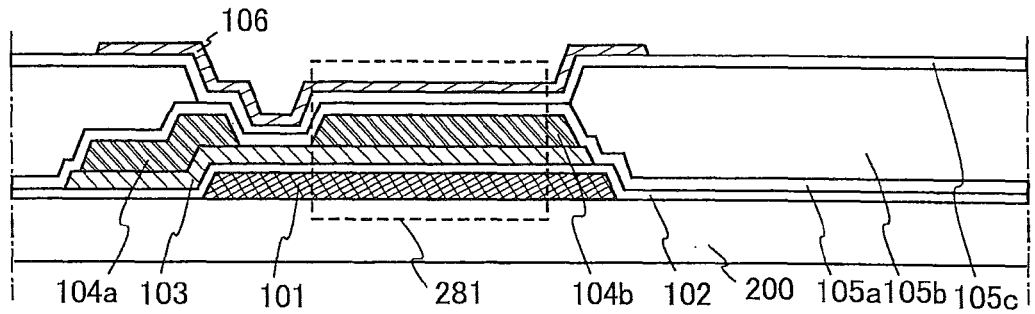
FIGS. 47A to 47D are cross-sectional views each illustrating the structure of a semiconductor device.
Figure 47B:
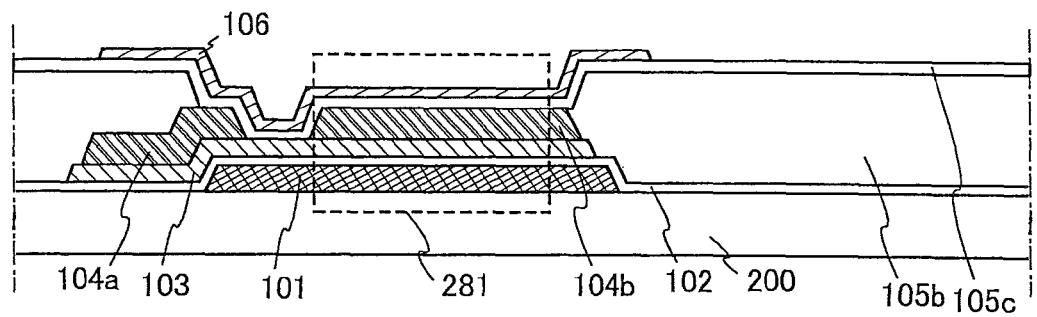
Figure 47C:
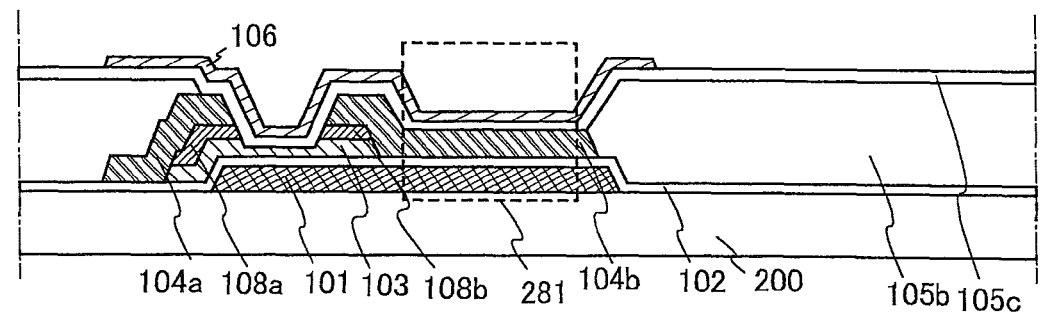
Figure 47D:
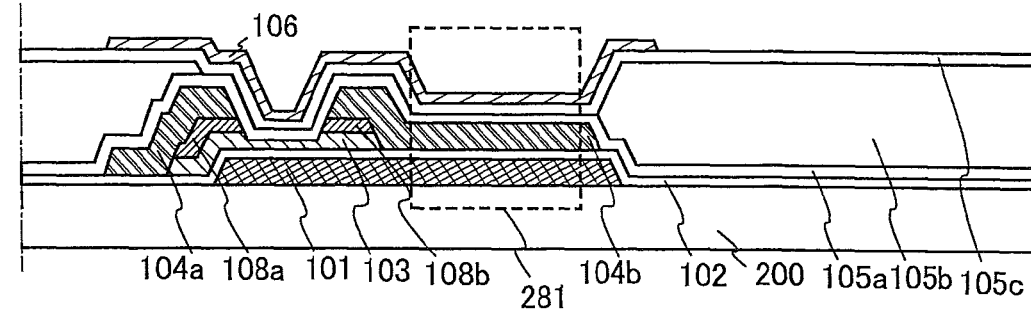

In the structure illustrated in FIG. 45D, the electrode 104c and the electrode 101a are electrically connected to each other through the electrode 110b in an opening 457 formed in the layers 105a, 105b, and 105c and an opening 458 formed in the insulating layer 102 and the layers 105a and 105c.

Each of the connections between the electrodes 104c and 101a in this embodiment can be used, for example, as a connection between the electrode 104b and the electrode 101 in the case of the diode-connected transistor 100. The diode-connected transistor can be used, for example, in a protection circuit, a driver circuit, or the like. Alternatively, the connection between the electrodes 104c and 101a can also be used when a gate electrode is connected to a source electrode or a drain electrode. For example, the connection between the electrodes 104c and 101a is used when a gate electrode is connected to a source electrode or a drain electrode in a pixel circuit in which one pixel includes a plurality of transistors or a driver circuit. For example, in a pixel circuit in which a pixel includes an EL element (e.g., an organic light-emitting element), a plurality of transistors are provided and a gate electrode is connected to a source electrode or a drain electrode in some cases. Alternatively, also in a circuit for driving a gate line, a plurality of transistors are provided.

Further, the openings 191 to 198 in FIGS. 19A to 19D, the openings 441 to 448 in FIGS. 44A to 44D, and the openings 451 to 458 in FIGS. 45A to 45D can have shapes which are similar to the shapes of the openings described in Embodiment 4 with reference to FIGS. 4A and 4B, FIGS. 5A and 5B, FIGS. 29A and 29B, and FIGS. 30A and 30B.

Note that the electrodes 104c and 101a can be connected to each other without the use of the electrode 110b. For example, the electrodes 104c and 101a can be directly connected to each other in a contact hole formed in the insulating layer 102.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, or part or all of Embodiment 5. Thus, this embodiment can be freely combined or replaced with another embodiment (e.g., any one of Embodiments 1 to 5).

(Embodiment 7)

In this embodiment, examples of a structure in which the parasitic capacitance of the transistor 100 is increased or a structure in which the capacitance value of a capacitor electrically connected to the transistor 100 is increased are described with reference to FIGS. 20A to 20D, FIGS. 21A to 21D, FIGS. 46A to 46D, and FIGS. 47A to 47D. Note that in drawings, the same portions as those in the drawings in any of the above embodiments are denoted by the same reference numerals, and the description thereof is omitted.

Note that FIGS. 20A to 20D and FIGS. 21A to 21D each illustrate an example in which a stack of the layers 105a and 105b is used as the insulating layer 105. FIGS. 46A and 46C and FIGS. 47B and 47C each illustrate an example in which a stack of the layers 105b and 105c is used as the insulating layer 105. FIGS. 46B and 46D and FIGS. 47A and 47D each illustrate an example in which a stack of the layers 105a, 105b, and 105c is used as the insulating layer 105.

In FIGS. 20A to 20D, FIGS. 21A to 21D, FIGS. 46A to 46D, and FIGS. 47A to 47D, the entire layer 105b over the electrode 104b or most of the layer 105b over the electrode 104b is removed, and the capacitance value of parasitic capacitance (or the capacitance value of a capacitor including the electrode 104b and the electrode 106) is large. In FIGS. 20A to 20D, FIGS. 21A to 21D, FIGS. 46A to 46D, and FIGS. 47A to 47D, for example, parasitic capacitance is generated and/or a capacitor is formed in a portion 281 surrounded by a dashed line. The capacitance value can be adjusted when the shapes of the electrodes 104b and 106, a range where the layer 105b over electrode 104b is removed, and the like are determined as appropriate.

Note that in FIGS. 20A to 20D, FIGS. 21A to 21D, FIGS. 46A to 46D, and FIGS. 47A to 47D, parasitic capacitance might also be generated between the electrodes 104b and 101 and/or a capacitor including the electrodes 104b and 101 might be formed. The capacitance value can be adjusted when the shapes of the electrodes 104b and 101 are determined as appropriate.

In this manner, capacitance between a gate and a source of the transistor 100 can be increased. Alternatively, a capacitor whose capacitance value is large can be formed. For example, in the case where the transistor 100 is used in a circuit for performing bootstrap operation, the capacitance between the gate and the source is preferably increased. Alternatively, when a signal is held in a capacitor in a dynamic circuit, the capacitor is preferably large. Thus, the transistor 100 with the structure illustrated in FIGS. 20A to 20D, FIGS. 21A to 21D, FIGS. 46A to 46D, FIGS. 47A to 47D, or the like is preferably used.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, or part or all of Embodiment 6. Thus, this embodiment can be freely combined or replaced with another embodiment (e.g., any one of Embodiments 1 to 6).

(Embodiment 8)

In this embodiment, structure examples of a capacitor included in a semiconductor device or the like (e.g., a display device or a light-emitting device) are described with reference to FIGS. 22A to 22E and FIGS. 48A to 48E. Note that in drawings, the same portions as those in the drawings in any of the above embodiments are denoted by the same reference numerals, and the description thereof is omitted.

Figure 48A:
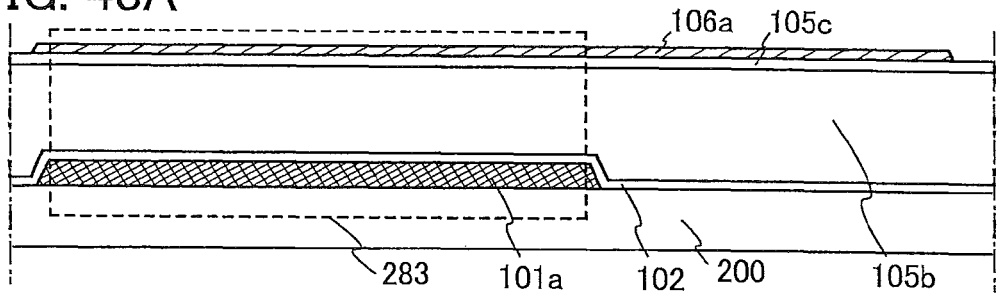
FIGS. 48A to 48E are cross-sectional views each illustrating the structure of a semiconductor device.
Figure 48B:
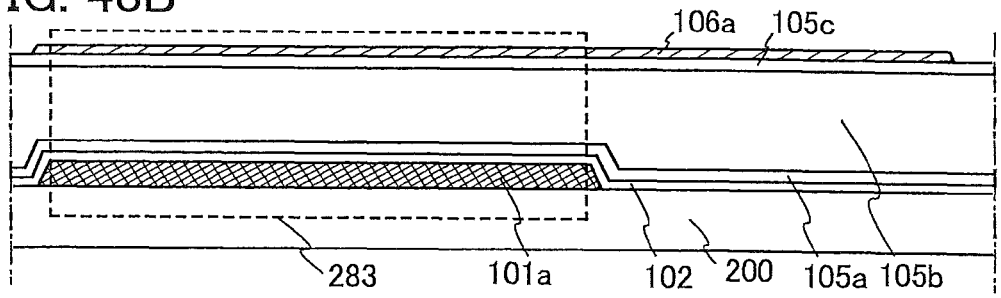
Figure 48C:
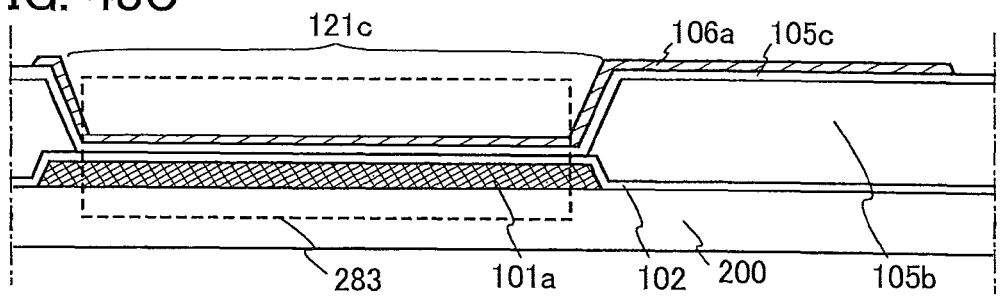
Figure 48D:
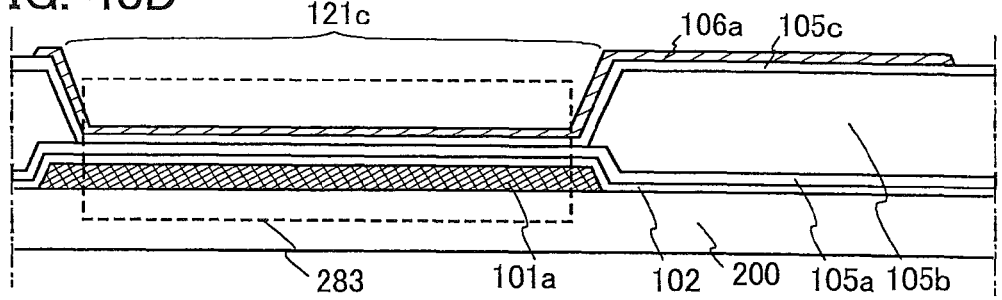
Figure 48E:
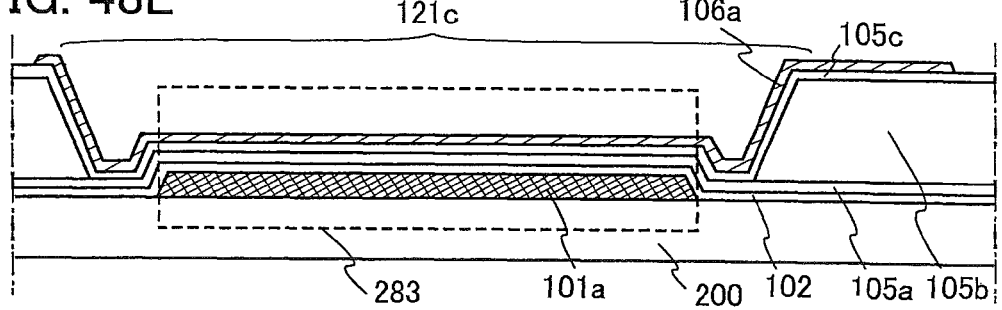
Figure 49A:
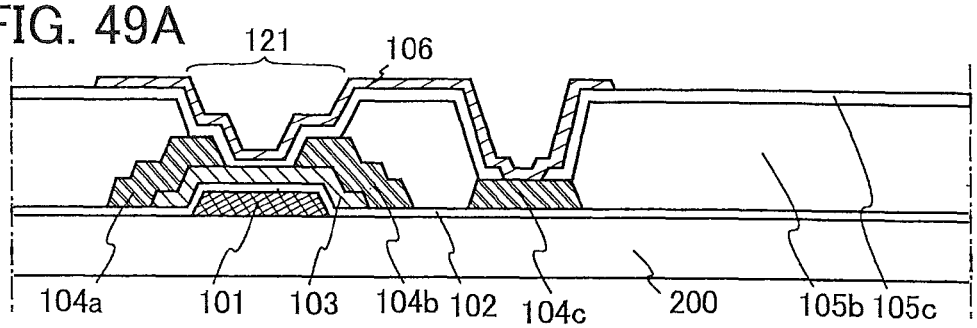
FIGS. 49A to 49E are cross-sectional views each illustrating the structure of a semiconductor device.
Figure 49B:
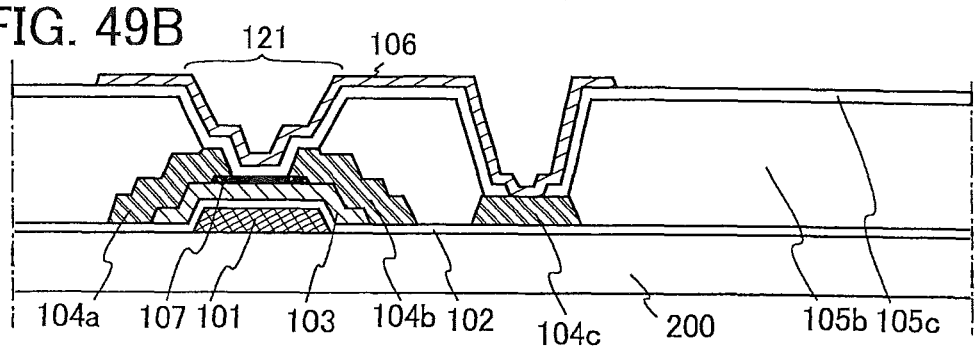
Figure 49C:
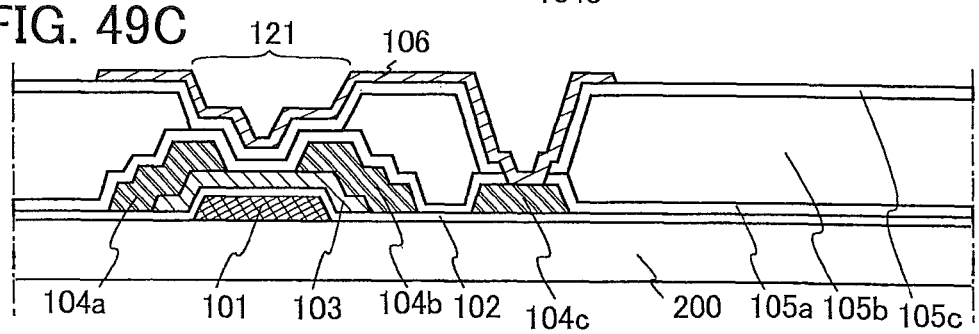
Figure 49D:
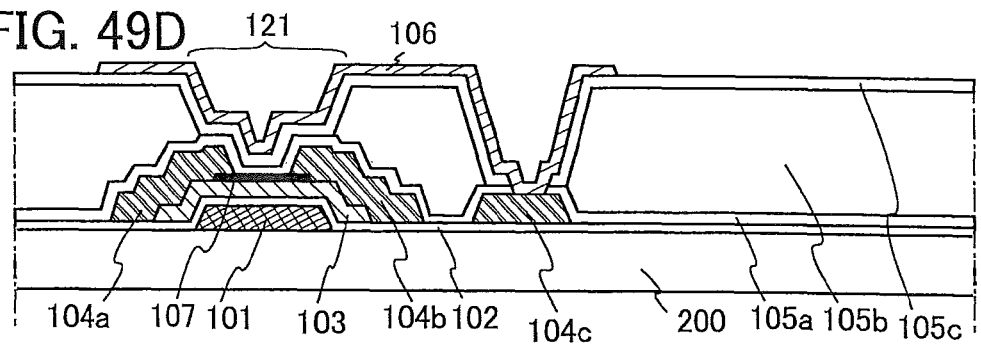
Figure 49E:
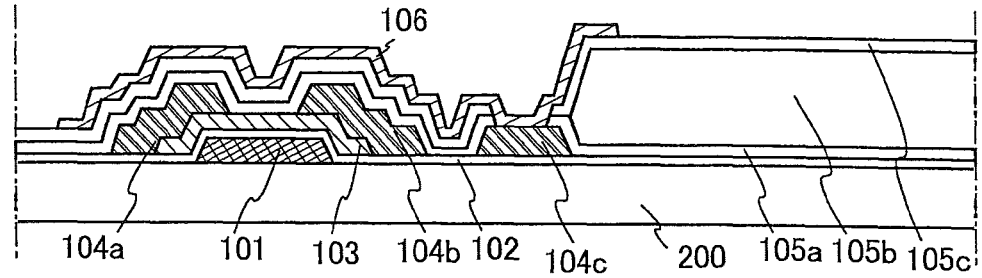
Figure 50A:
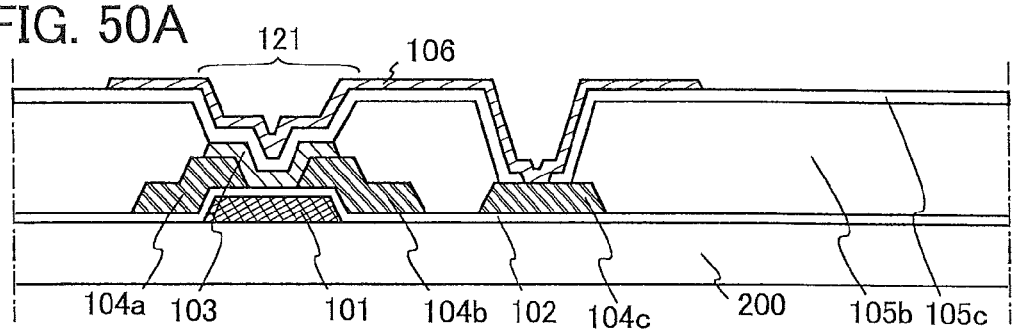
FIGS. 50A to 50E are cross-sectional views each illustrating the structure of a semiconductor device.
Figure 50B:
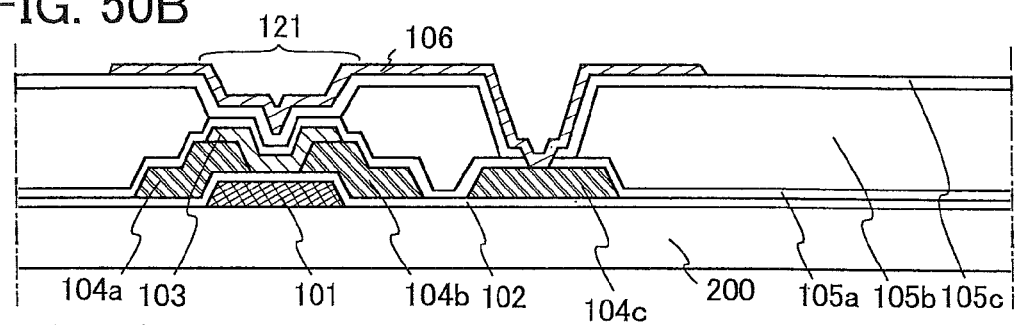
Figure 50C:
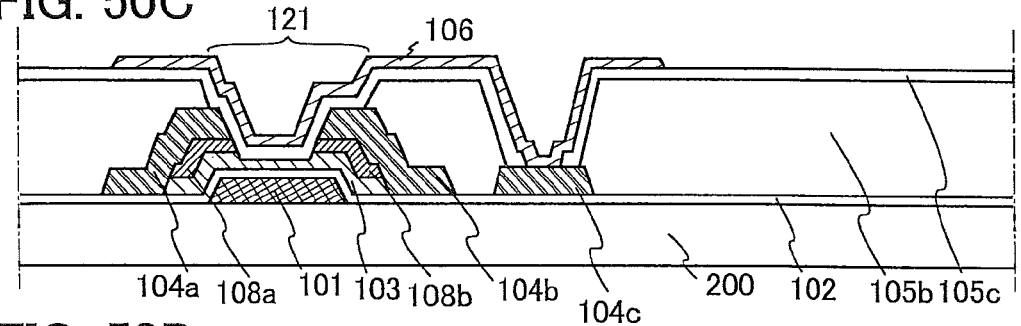
Figure 50D:
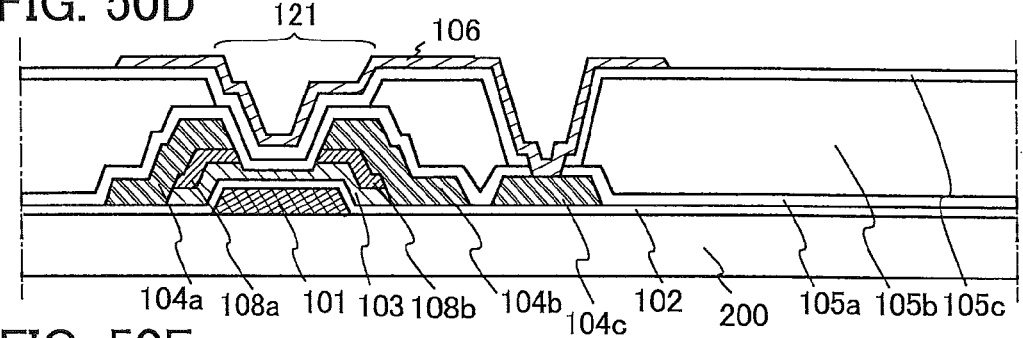
Figure 50E:
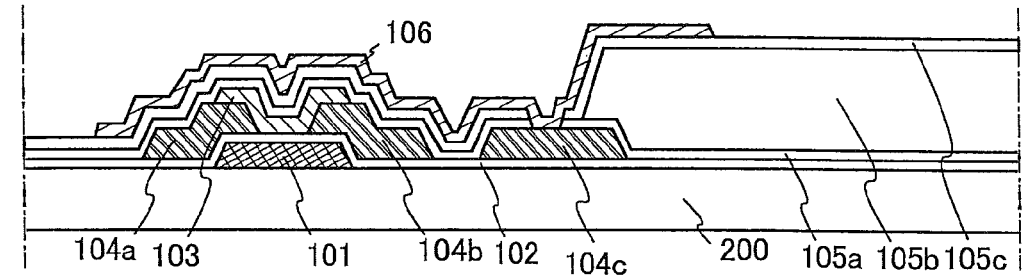
Figure 51A:
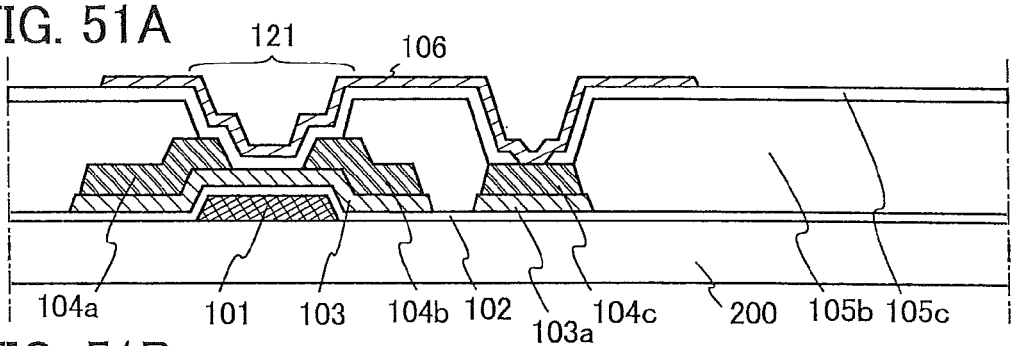
FIGS. 51A to 51E are cross-sectional views each illustrating the structure of a semiconductor device.
Figure 51B:
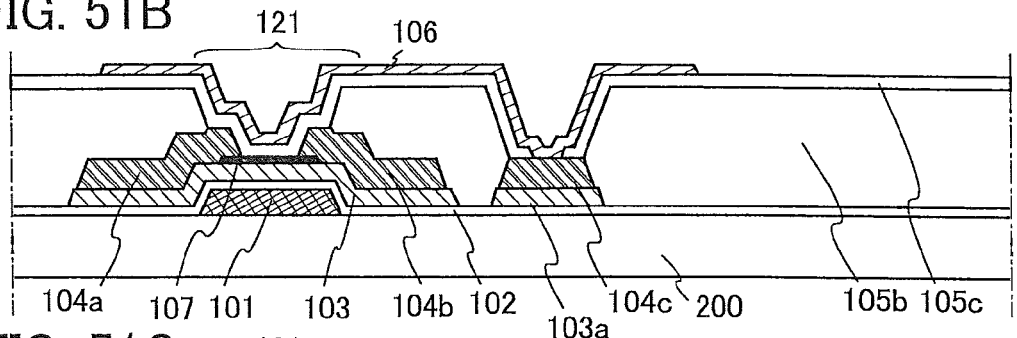
Figure 51C:
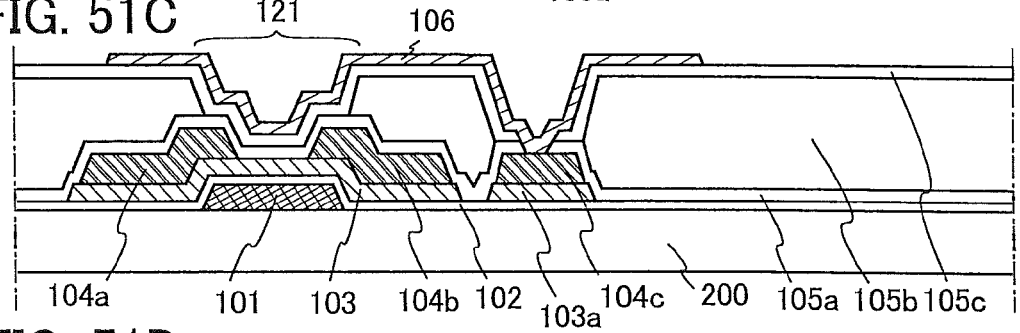
Figure 51D:
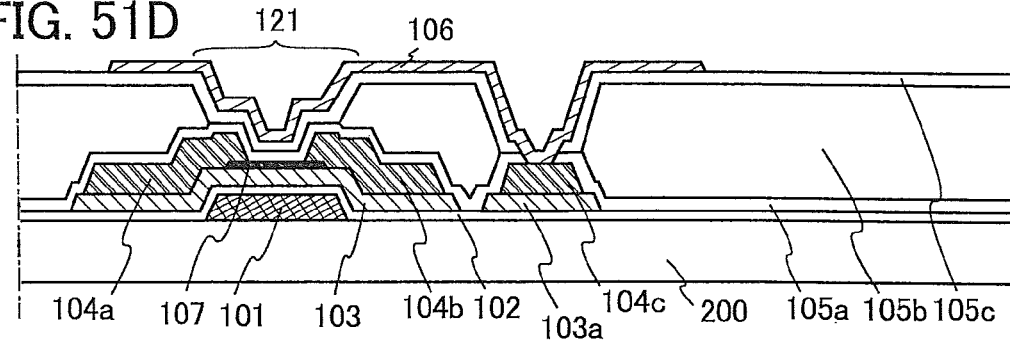
Figure 51E:
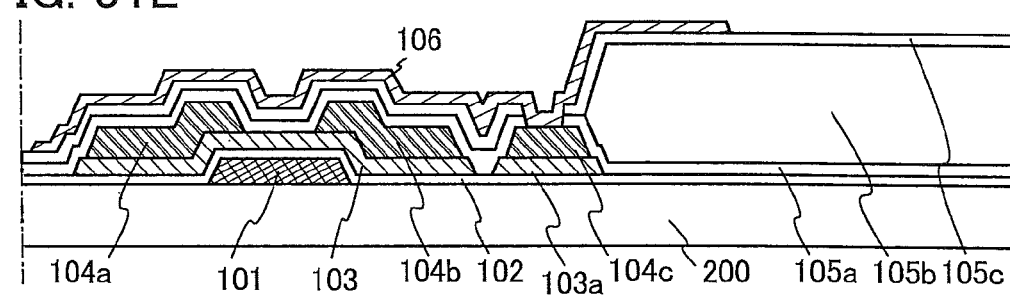

Note that FIGS. 22A to 22E each illustrate an example in which a stack of the layers 105a and 105b is used as the insulating layer 105. FIGS. 48A and 48C each illustrate an example in which a stack of the layers 105b and 105c is used as the insulating layer 105. FIGS. 48B, 48D, and 48E each illustrate an example in which a stack of the layers 105a, 105b, and 105c is used as the insulating layer 105.

Figure 22A:
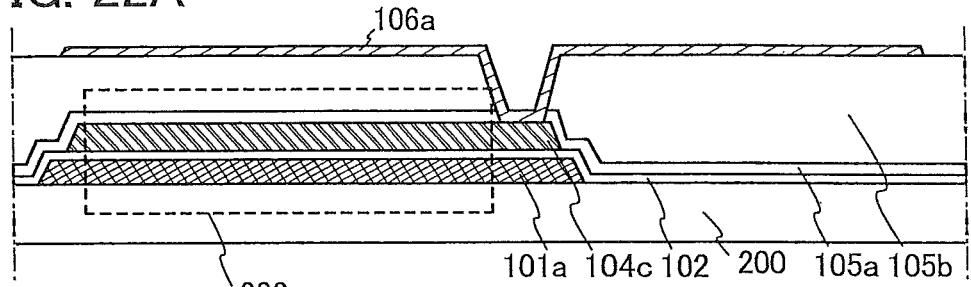
FIGS. 22A to 22E are cross-sectional views each illustrating the structure of a semiconductor device.
Figure 22B:
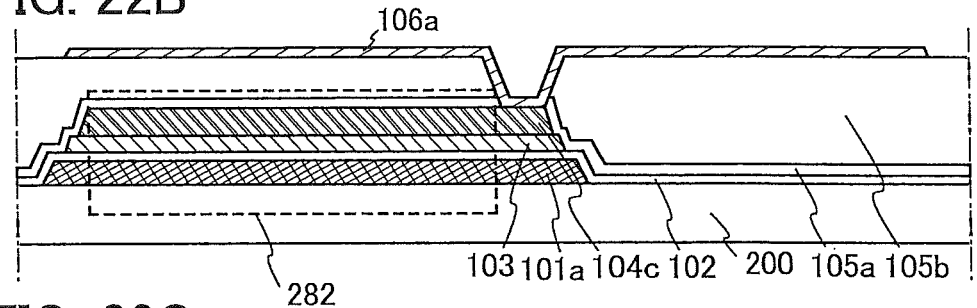

It is possible to form a capacitor that has the electrode 101a formed using the same layer as the electrode 101 as one electrode and has the electrode 104c formed using the same layer as the electrode 104a as the other electrode. FIGS. 22A and 22B each illustrate such an example. In FIGS. 22A and 22B, for example, a capacitor is formed in a portion 282 surrounded by a dashed line. Note that an electrode 106a is formed using the same layer as the electrode 106. Although FIGS. 22A and 22B each illustrate an example in which the electrode 106a is electrically connected to the electrode 104c, one aspect of an embodiment of the present invention is not limited thereto. The electrode 106a is not necessarily electrically connected to the electrode 104c. The electrode 106a may be electrically connected to the electrode 101a or both the electrodes 101a and 104c. Alternatively, the electrode 106a is not necessarily provided over the portion 282.

It is possible to form a capacitor that has the electrode 101a formed using the same layer as the electrode 101 as one electrode and has the electrode 106a as the other electrode. FIGS. 22C to 22E and FIGS. 48A to 48E each illustrate such an example. In FIGS. 22C to 22E and FIGS. 48A to 48E, for example, a capacitor is formed in a portion 283 surrounded by a dashed line.

Figure 22C:
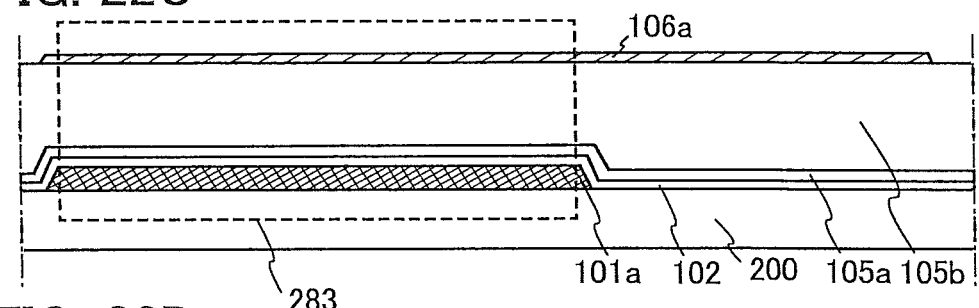
Figure 22D:
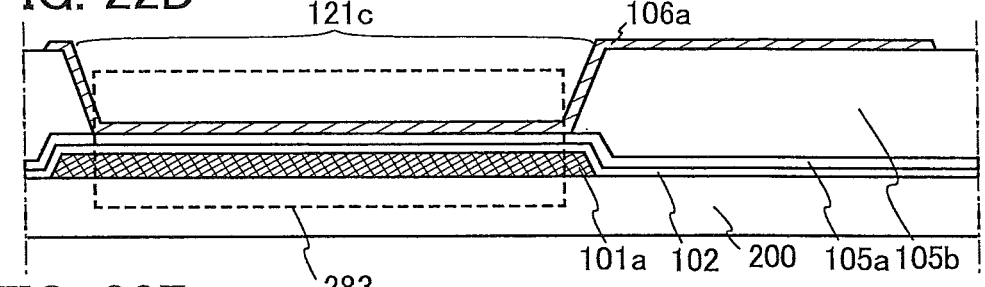
Figure 22E:
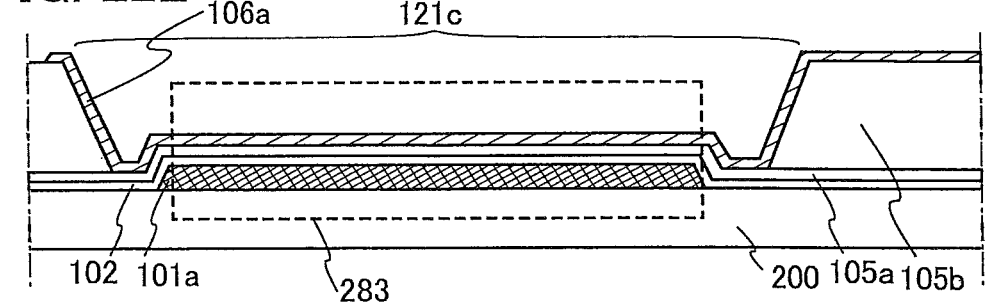
Figure 23A:
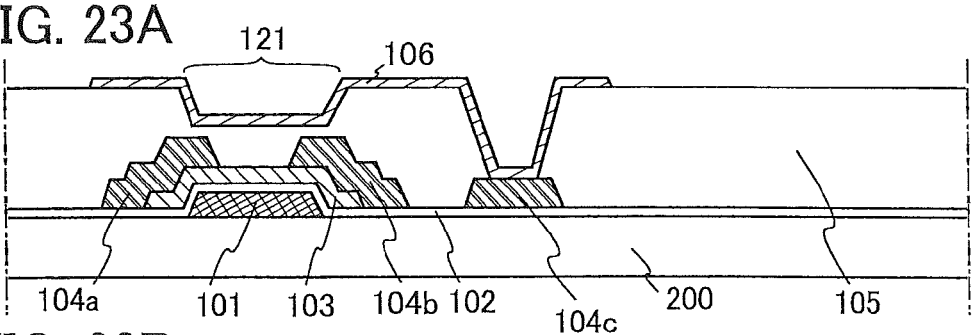
FIGS. 23A to 23E are cross-sectional views each illustrating the structure of a semiconductor device.
Figure 23B:
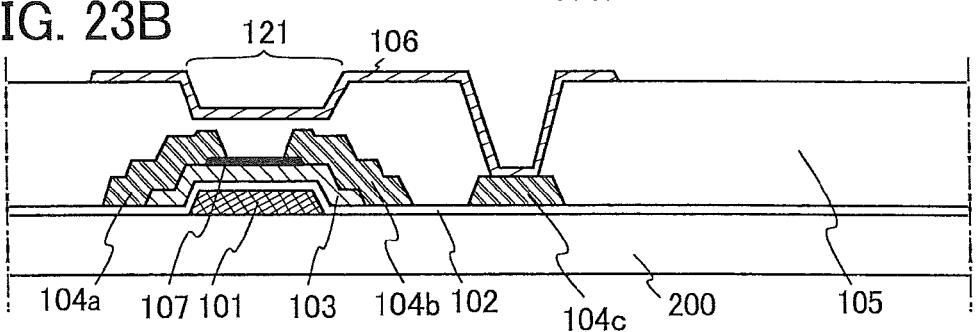
Figure 23C:
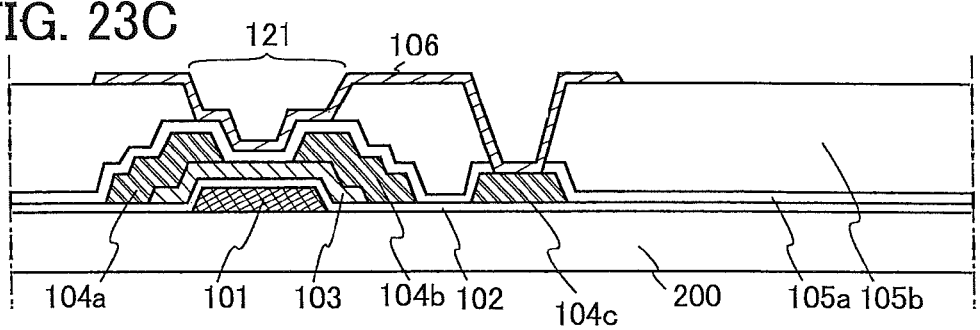
Figure 23D:
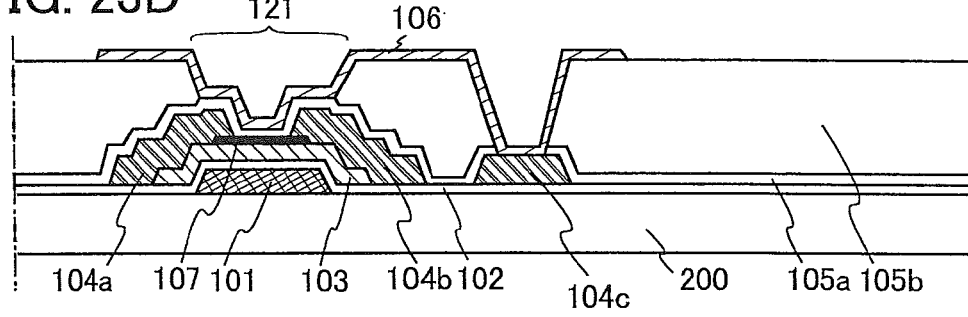
Figure 23E:
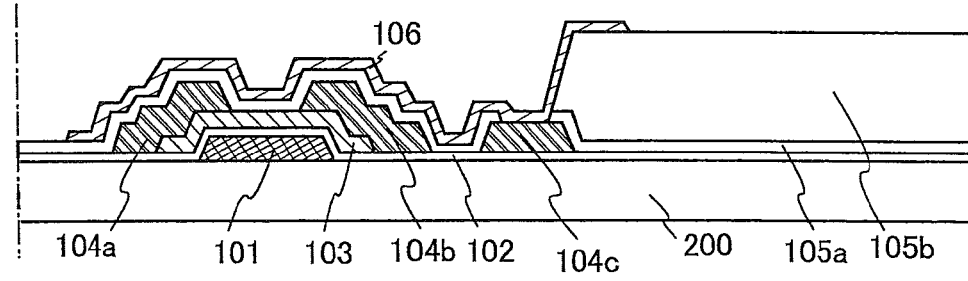
Figure 24A:
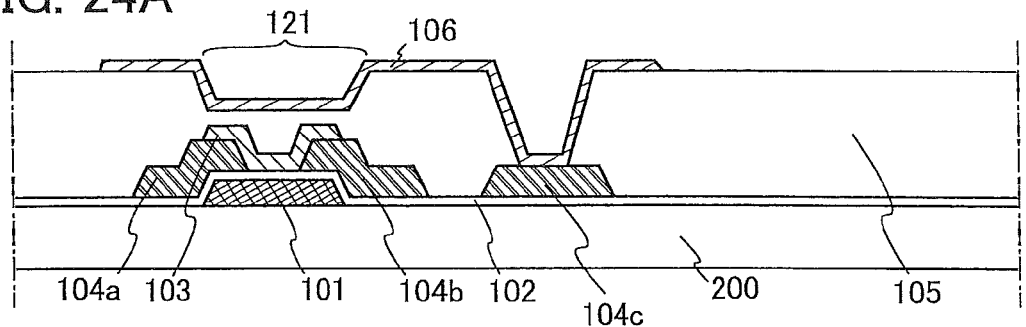
FIGS. 24A to 24E are cross-sectional views each illustrating the structure of a semiconductor device.
Figure 24B:
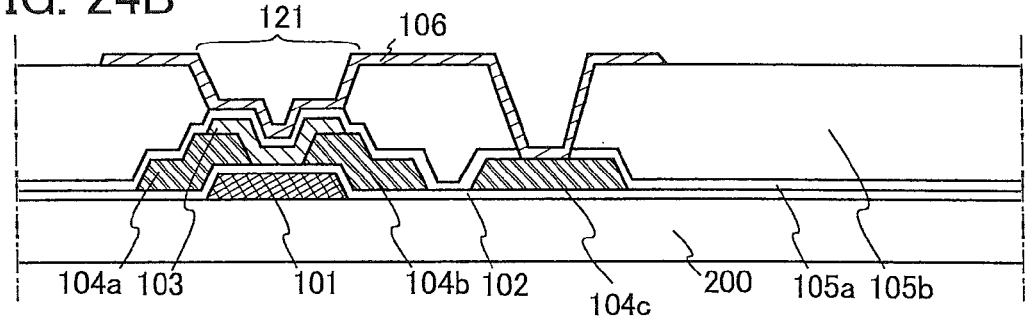
Figure 24C:
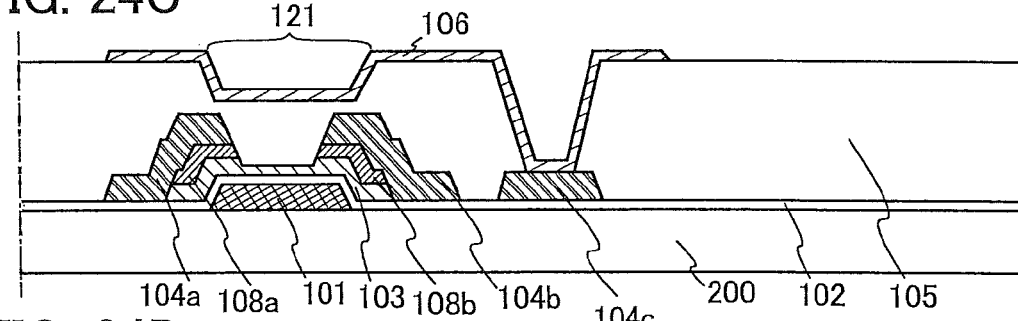
Figure 24D:
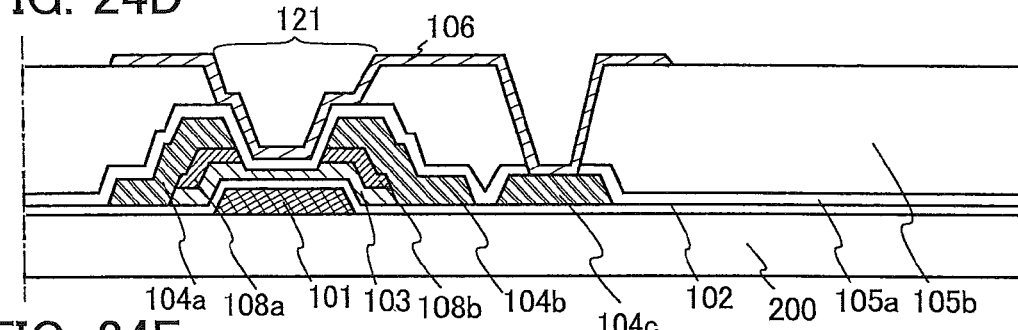
Figure 24E:
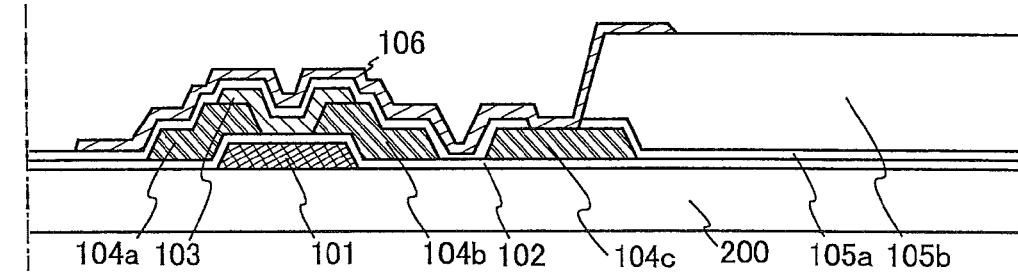
Figure 25A:
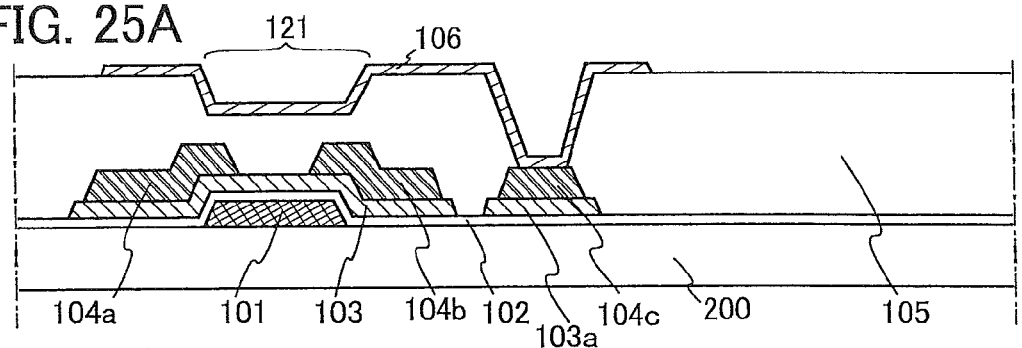
FIGS. 25A to 25E are cross-sectional views each illustrating the structure of a semiconductor device.
Figure 25B:
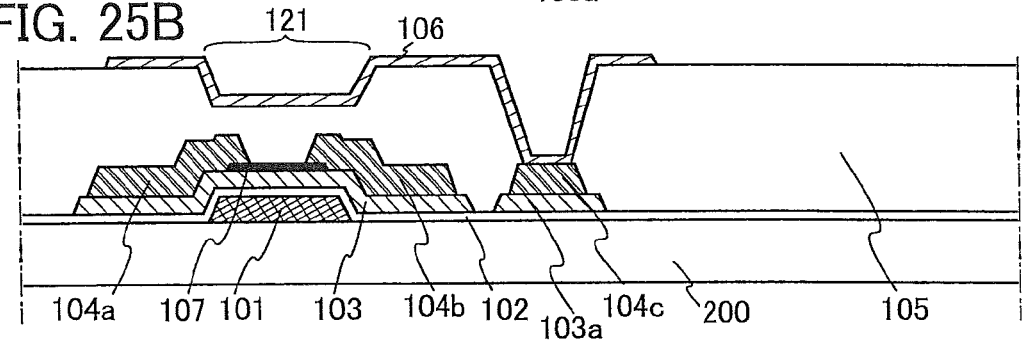
Figure 25C:
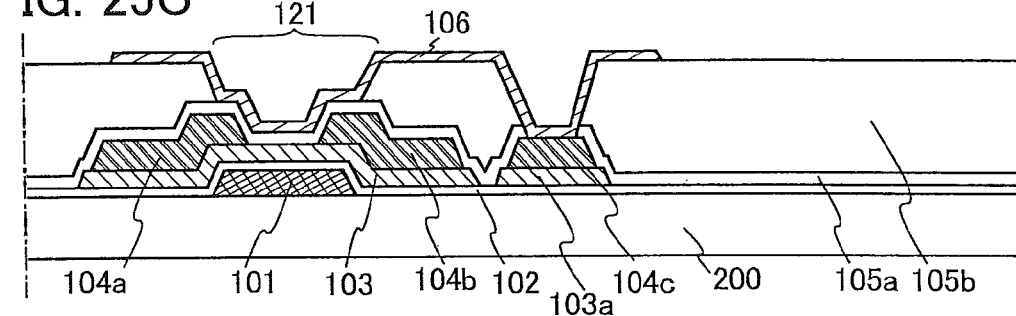
Figure 25D:
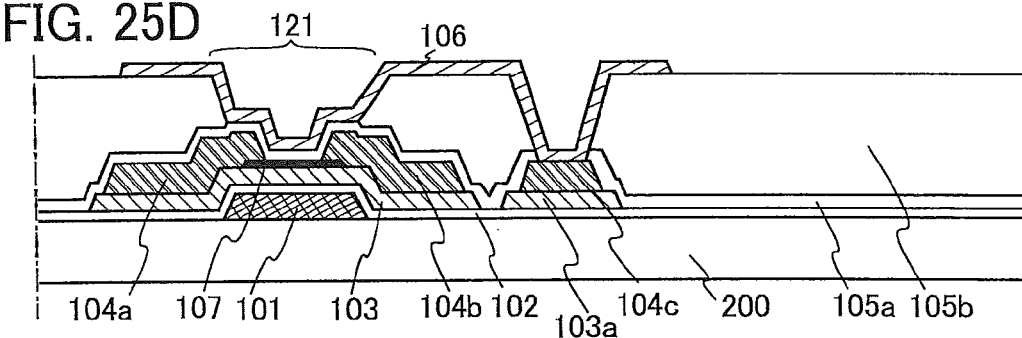
Figure 25E:
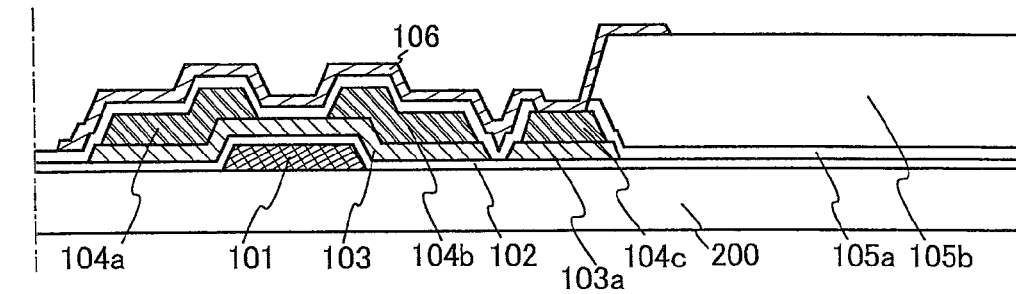

Note that FIG. 22D corresponds to a structure where part of the layer 105b is removed from FIG. 22C. In the structure illustrated in FIG. 22D, the layer 105b in a region 121c is not provided. Further, FIG. 22E corresponds to a structure where the layer 105b is removed in a wider width than the width of the electrode 101a (in a horizontal direction in the diagram) in FIG. 22D. Furthermore, FIGS. 48C and 48D each illustrate a structure in which part of the layer 105b is removed from FIG. 48A or FIG. 48B. In each of the structures illustrated in FIGS. 48C and 48D, the layer 105b in the region 121c is not provided. FIG. 48E corresponds to a structure where the layer 105b is removed in a wider width than the width of the electrode 101a (in a horizontal direction in the diagram) in FIG. 48D.

Note that in FIGS. 22A to 22E and FIGS. 48A to 48E, the electrode 106a may be the electrode 106, the electrode 110, or an electrode formed using the same layer as the electrode 110. The electrode 101a may be the electrode 101. The electrode 104c may be the electrode 104.

Note that each of the capacitors illustrated in FIGS. 22A to 22E and FIGS. 48A to 48E can be used as the capacitor provided between the gate and the source of the transistor 100. Alternatively, for example, each of the capacitors illustrated in FIGS. 22A to 22E and FIGS. 48A to 48E can be used as a storage capacitor provided in a pixel. Alternatively, each of the capacitors illustrated in FIGS. 22A to 22E and FIGS. 48A to 48E can be used as a capacitor for holding a signal in a driver circuit.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, or part or all of Embodiment 7. Thus, this embodiment can be freely combined or replaced with another embodiment (e.g., any one of Embodiments 1 to 7).

(Embodiment 9)

In this embodiment, examples of materials of the insulating layers, the electrodes, the semiconductor layers, and the like in Embodiments 1 to 8 are described.

The material of the semiconductor layer 103 in the transistor 100 is described below. Note that a similar material can be used for a semiconductor layer formed using the same layer as the semiconductor layer 103.

The semiconductor layer 103 in the transistor 100 may include a layer containing an oxide semiconductor (an oxide semiconductor layer). For example, a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a unary metal oxide such as an In—O-based oxide semiconductor, a Sn—O-based oxide semiconductor, or a Zn—O-based oxide semiconductor can be used as the oxide semiconductor. In addition, the oxide semiconductor may contain an element other than In, Ga, Sn, and Zn, for example, $SiO_2$.

For example, an In—Sn—Zn—O-based oxide semiconductor means an oxide semiconductor containing indium (In), tin (Sn), and zinc (Zn), and there is no limitation on the composition ratio. For example, an In—Ga—Zn—O-based oxide semiconductor means an oxide semiconductor containing indium (In), gallium (Ga), and zinc (Zn), and there is no limitation on the composition ratio. An In—Ga—Zn—O-based oxide semiconductor can be referred to as IGZO.

The oxide semiconductor layer can be formed using an oxide semiconductor film. In the case where an In—Sn—Zn—O-based oxide semiconductor film is formed by sputtering, a target which has a composition ratio of In:Sn:Zn=1:2:2, 2:1:3, 1:1:1, 20:45:35, or the like in an atomic ratio is used.

In the case where an In—Zn—O-based oxide semiconductor film is formed by sputtering, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when the target has an atomic ratio of In:Zn:O=X:Y:Z, Z>1.5X+Y.

In the case where an In—Ga—Zn—O-based oxide semiconductor film is formed by sputtering, a target can have a composition ratio of In:Ga:Zn=1:1:0.5, 1:1:1, or 1:1:2 in an atomic ratio.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of alkali metal such as lithium, sodium, or potassium can be reduced in the oxide semiconductor film.

Note that it has been pointed out that an oxide semiconductor is insensitive to impurities, there is no problem when a considerable amount of metal impurities is contained in the film, and soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, degradation of characteristics of a transistor, such as a normally-on state of the transistor due to a shift in the threshold voltage in a negative direction, or a decrease in mobility, occurs. A variation in characteristics also occurs. Such degradation of characteristics of the transistor and a variation in characteristics due to the impurity are outstanding when the concentration of hydrogen in the oxide semiconductor layer is sufficiently low. Thus, when the concentration of hydrogen in the oxide semiconductor layer is $1\times10^{18}/cm^3$ or lower, preferably $1\times10^{17}/cm^3$ or lower, the concentration of the impurity is preferably lowered. Specifically, the measurement value of a Na concentration by secondary ion mass spectrometry is preferably $5\times10^{16}/cm^3$ or less, more preferably $1\times10^{16}/cm^3$ or less, still more preferably $1\times10^{15}/cm^3$ or less. Similarly, the measurement value of a Li concentration is preferably $5\times10^{15}/cm^3$ or less, more preferably $1\times10^{15}/cm^3$ or less. Similarly, the measurement value of a K concentration is preferably $5\times10^{15}/cm^3$ or less, more preferably $1\times10^{15}/cm^3$ or less.

Note that the oxide semiconductor layer may be either amorphous or crystalline. The oxide semiconductor layer may be either single crystal or non-single-crystal. In the case of non-single-crystal, the oxide semiconductor layer may be either amorphous or polycrystalline. Further, the oxide semiconductor may have an amorphous structure including a crystalline portion or may be non-amorphous. For the oxide semiconductor layer, it is possible to use an oxide including a crystal with c-axis alignment (also referred to as c-axis aligned crystal (CAAC)) that has a phase having triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

CAAC is described in detail with reference to FIGS. 69A to 69E, FIGS. 70A to 70C, and FIGS. 71A to 71C. Note that in FIGS. 69A to 69E, FIGS. 70A to 70C, and FIGS. 71A to 71C, the vertical direction corresponds to the c-axis direction and a plane perpendicular to the c-axis direction corresponds to the a-b plane, unless otherwise specified. When terms "upper half" and "lower half" are simply used, they refer to an upper half above the a-b plane and a lower half below the a-b plane (an upper half and a lower half with respect to the a-b plane). Further, in FIGS. 69A to 69E, an O atom surrounded by a circle represents a tetracoordinate O atom and an O atom surrounded by a double circle represents a tricoordinate O atom.

Figure 69A:
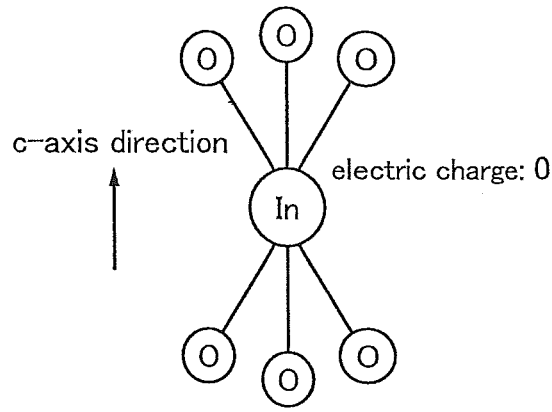
FIGS. 69A to 69E each illustrate the structure of an oxide semiconductor layer.

FIG. 69A illustrates a structure including one hexacoordinate In atom and six tetracoordinate oxygen atoms (hereinafter referred to as tetracoordinate O atoms) close to the In atom. A structure in which one In atom and oxygen atoms close to the In atom are only illustrated is called a subunit here. The structure in FIG. 69A is actually an octahedral structure, but is illustrated as a planar structure for simplicity. Note that three tetracoordinate O atoms exist in each of an upper half and a lower half in FIG. 69A. In the subunit illustrated in FIG. 69A, electric charge is 0.

Figure 69D:
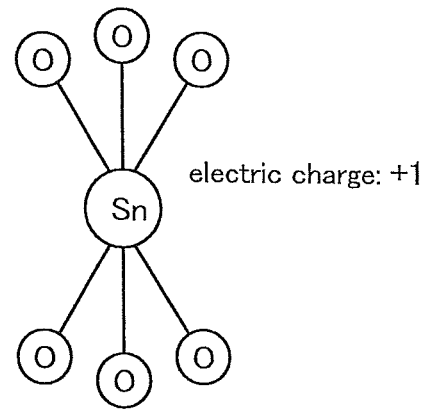
Figure 69B:
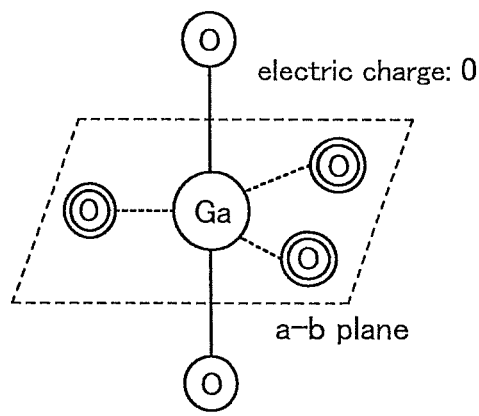

FIG. 69B illustrates a structure including one pentacoordinate Ga atom, three tricoordinate oxygen atoms (hereinafter referred to as tricoordinate O atoms) close to the Ga atom, and two tetracoordinate O atoms close to the Ga atom. All the tricoordinate O atoms exist in the a-b plane. One tetracoordinate O atom exists in each of an upper half and a lower half in FIG. 69B. An In atom can have the structure illustrated in FIG. 69B because the In atom can have five ligands. In a subunit illustrated in FIG. 69B, electric charge is 0.

Figure 69E:
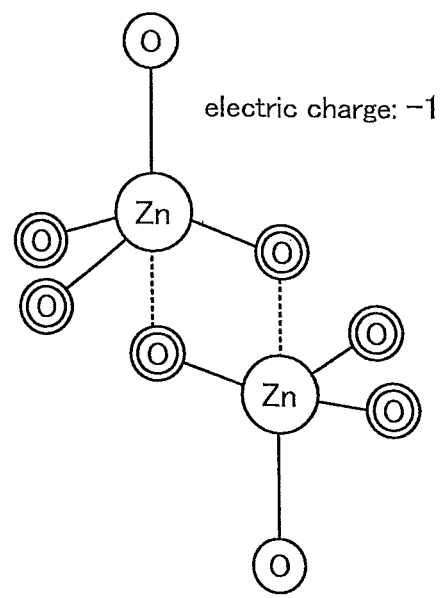
Figure 69C:
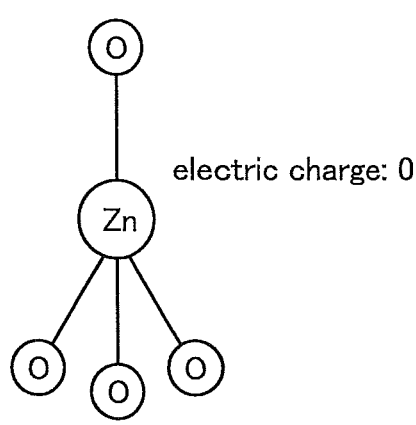

FIG. 69C illustrates a structure including one tetracoordinate Zn atom and four tetracoordinate O atoms close to the Zn atom. In FIG. 69C, one tetracoordinate O atom exists in an upper half and three tetracoordinate O atoms exists in a lower half.

Alternatively, three tetracoordinate O atoms may exist in the upper half and one tetracoordinate O atom may exist in the lower half in FIG. 69C. In a subunit illustrated in FIG. 69C, electric charge is 0.

FIG. 69D illustrates a structure including one hexacoordinate Sn atom and six tetracoordinate O atoms close to the Sn atom. In FIG. 69D, three tetracoordinate 0 atoms exists in each of an upper half and a lower half In a subunit illustrated in FIG. 69D, electric charge is +1.

FIG. 69E illustrates a subunit including two Zn atoms. In FIG. 69E, one tetracoordinate O atom exists in each of an upper half and a lower half. In the subunit illustrated in FIG. 69E, electric charge is −1.

Here, a group of some of the subunits are referred to as one group, and some of the groups are referred to as one unit.

Here, a rule of bonding the subunits to each other is described. The three 0 atoms in the upper half with respect to the hexacoordinate In atom in FIG. 69A each have three proximity In atoms in the downward direction, and the three O atoms in the lower half each have three proximity In atoms in the upward direction. The one O atom in the upper half with respect to the pentacoordinate Ga atom in FIG. 69B has one proximity Ga atom in the downward direction, and the one O atom in the lower half has one proximity Ga atom in the upward direction. The one O atom in the upper half with respect to the tetracoordinate Zn atom in FIG. 69C has one proximity Zn atom in the downward direction, and the three O atoms in the lower half each have three proximity Zn atoms in the upward direction. In this manner, the number of the tetracoordinate O atoms above the metal atom is equal to the number of the proximity metal atoms below the tetracoordinate O atoms. Similarly, the number of the tetracoordinate O atoms below the metal atom is equal to the number of the proximity metal atoms above the tetracoordinate O atoms. Since the coordination number of the O atom is 4, the sum of the number of the proximity metal atoms below the O atom and the number of the proximity metal atoms above the O atom is 4. Accordingly, when the sum of the number of the tetracoordinate O atoms above the metal atom and the number of the tetracoordinate O atoms below another metal atom is 4, the two kinds of subunits including the metal atoms can be bonded to each other. For example, in the case where a hexacoordinate metal (In or Sn) atom is bonded through three tetracoordinate O atoms in the upper half, the hexacoordinate metal atom is bonded to a pentacoordinate metal (Ga or In) atom or a tetracoordinate metal (Zn) atom.

A metal atom having the above coordination number is bonded to another metal atom through a tetracoordinate O atom in the c-axis direction. Further, subunits are bonded to each other so that the total electric charge in a layer structure is 0. Thus, one group is constituted.

Figure 70A:
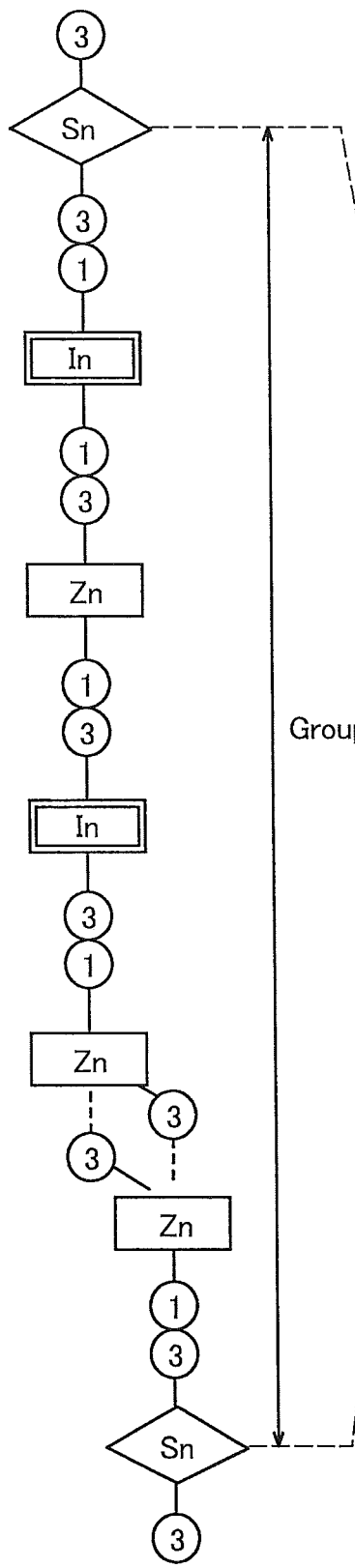
FIGS. 70A to 70C illustrate the structure of an oxide semiconductor layer.
Figure 70B:
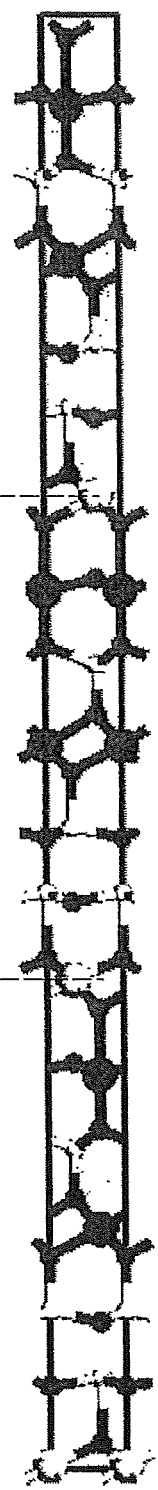
Figure 70C:
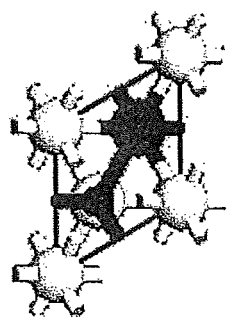

FIG. 70A illustrates a model of one group included in a layer structure of an In—Sn—Zn—O-based material. FIG. 70B illustrates a unit including three groups. Note that FIG. 70C illustrates atomic order in the case of the layer structure in FIG. 70B observed from the c-axis direction.

In FIG. 70A, for simplicity, a tricoordinate O atom is not illustrated and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 70A, one tetracoordinate O atom existing in each of an upper half and a lower half with respect to an In atom is denoted by circled 1. FIG. 70A also illustrates a Zn atom close to one tetracoordinate O atom in a lower half and three tetracoordinate O atoms in an upper half, and a Zn atom close to one tetracoordinate O atom in an upper half and three tetracoordinate O atoms in a lower half.

In the group included in the layer structure of the In—Sn—Zn—O-based material in FIG. 70A, in the order starting from the top, a Sn atom close to three tetracoordinate O atoms in each of an upper half and a lower half is bonded to an In atom close to one tetracoordinate O atom in each of an upper half and a lower half, the In atom is bonded to a Zn atom close to three tetracoordinate O atoms in an upper half, the Zn atom is bonded to an In atom close to three tetracoordinate O atoms in each of an upper half and a lower half through one tetracoordinate O atom in a lower half with respect to the Zn atom, the In atom is bonded to a subunit that includes two Zn atoms and is close to one tetracoordinate O atom in an upper half, and the subunit is bonded to a Sn atom close to three tetracoordinate O atoms in each of an upper half and a lower half through one tetracoordinate O atom in a lower half with respect to the subunit. Some of the groups are bonded to each other so that one unit is constituted.

Here, electric charge for one bond of a tricoordinate O atom and electric charge for one bond of a tetracoordinate O atom can be assumed to be −0.667 and −0.5; respectively. For example, electric charge of a hexacoordinate or pentacoordinate In atom, electric charge of a tetracoordinate Zn atom, and electric charge of a pentacoordinate or hexacoordinate Sn atom are +3, +2, and +4, respectively. Thus, electric charge of a subunit including a Sn atom is +1. Consequently, an electric charge of −1, which cancels an electric charge of +1, is needed to form a layer structure including a Sn atom. As a structure having an electric charge of −1, the subunit including two Zn atoms as illustrated in FIG. 69E can be given. For example, when one subunit including two Zn atoms is provided for one subunit including a Sn atom, electric charge is canceled, so that the total electric charge in the layer structure can be 0.

An In atom can have either five ligands or six ligands. Specifically, when a unit illustrated in FIG. 70B is formed, an In—Sn—Zn—O-based crystal ($In_2SnZn_3O_8$) can be obtained. Note that the layer structure of the obtained In—Sn—Zn—O-based crystal can be expressed as a composition formula, $In_2SnZn_2O_7(ZnO)_m$ (m is 0 or a natural number).

The above rule also applies to the following oxides: a quaternary metal oxide such as an In—Sn—Ga—Zn—O-based oxide; a ternary metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, or a Sn—Al—Zn—O-based oxide; a binary metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; or a unary metal oxide such as an In—O-based oxide, a Sn—O-based oxide, or a Zn—O-based oxide.

Figure 71A:
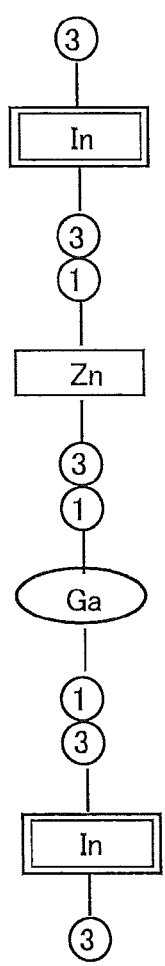
FIGS. 71A to 71C illustrate the structure of an oxide semiconductor layer.

For example, FIG. 71A illustrates a model of one group included in a layer structure of an In—Ga—Zn—O-based material.

In the group included in the layer structure of the In—Ga—Zn—O-based material in FIG. 71A, in the order starting from the top, an In atom close to three tetracoordinate O atoms in each of an upper half and a lower half is bonded to a Zn atom close to one tetracoordinate O atom in an upper half, the Zn atom is bonded to a Ga atom close to one tetracoordinate O atom in each of an upper half and a lower half through three tetracoordinate O atoms in a lower half with respect to the Zn atom, and the Ga atom is bonded to an In atom close to three tetracoordinate O atoms in each of an upper half and a lower half through one tetracoordinate O atom in a lower half with respect to the Ga atom. Some of the groups are bonded to each other so that one unit is constituted.

Figure 71B:
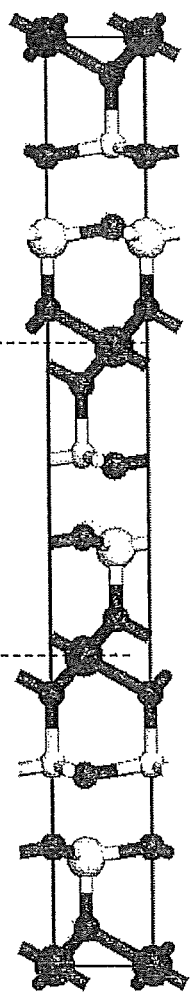
Figure 71C:
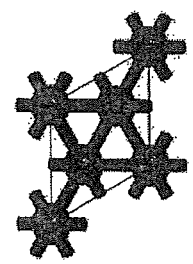

FIG. 71B illustrates a unit including three groups. Note that FIG. 71C illustrates atomic order in the case of the layer structure in FIG. 71B observed from the c-axis direction.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a subunit including an In atom, a Zn atom, and a Ga atom is 0. Thus, the total electric charge of a layer structure having a combination of such subunits is always 0.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a subunit including any of an In atom, a Zn atom, and a Ga atom is 0. Thus, the total electric charge of a group having a combination of such subunits is always 0.

An oxide semiconductor film including CAAC (hereinafter also referred to as a CAAC film) can be formed by sputtering. The above material can be used as a target material. In the case where the CAAC film is formed by sputtering, the proportion of an oxygen gas in an atmosphere is preferably high. In the case where sputtering is performed in a mixed gas of argon and oxygen, for example, the proportion of an oxygen gas is preferably 30% or higher, more preferably 40% or higher because supply of oxygen from the atmosphere promotes crystallization of CAAC.

In the case where the CAAC film is foil red by sputtering, a substrate over which the CAAC film is formed is heated preferably to 150° C. or higher, more preferably to 170° C. or higher. This is because the higher the substrate temperature becomes, the more crystallization of CAAC is promoted.

After heat treatment is performed on the CAAC film in a nitrogen atmosphere or in vacuum, heat treatment is preferably performed in an oxygen atmosphere or a mixed gas of oxygen and another gas. This is because oxygen deficiency due to the former heat treatment can be corrected by supply of oxygen from the atmosphere in the latter heat treatment.

A film surface on which the CAAC film is formed (a deposition surface) is preferably flat. This is because the c-axis approximately perpendicular to the deposition surface exists in the CAAC film, so that deposition surface irregularities induce generation of grain boundaries in the CAAC film. Thus, planarization treatment such as chemical mechanical polishing (CMP) is preferably performed on the deposition surface before the CAAC film is formed. The average roughness of the deposition surface is preferably 0.5 nm or less, more preferably 0.3 nm or less.

Note that an oxide semiconductor film for red by sputtering or the like contains moisture or hydrogen (including a hydroxyl group) as an impurity in some cases. In one embodiment of the present invention, in order to reduce impurities such as moisture or hydrogen in the oxide semiconductor film (or an oxide semiconductor layer formed using an oxide semiconductor film) (in order to perform dehydration or dehydrogenation), heat treatment is performed on the oxide semiconductor film (the oxide semiconductor layer) in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor film (the oxide semiconductor layer), moisture or hydrogen in the oxide semiconductor film (the oxide semiconductor layer) can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for 3 to 6 minutes. When RTA is used for the heat treatment, dehydration or dehydrogenation can be performed in a short time; thus, treatment can be performed even at a temperature higher than the strain point of a glass substrate.

After moisture or hydrogen in the oxide semiconductor film (the oxide semiconductor layer) is eliminated in this manner, oxygen is added. Thus, oxygen defects, for example, in the oxide semiconductor film (the oxide semiconductor layer) can be reduced, so that the oxide semiconductor film (the oxide semiconductor layer) can be intrinsic (i-type) or substantially intrinsic.

Oxygen can be added in such a manner that, for example, an insulating film including a region where the proportion of oxygen is higher than the stoichiometric proportion is formed in contact with the oxide semiconductor film (the oxide semiconductor layer), and then heat treatment is performed. In this manner, excessive oxygen in the insulating film can be supplied to the oxide semiconductor film (the oxide semiconductor layer). Thus, the oxide semiconductor film (the oxide semiconductor layer) can contain oxygen excessively. Oxygen contained excessively exists, for example, between lattices of a crystal included in the oxide semiconductor film (the oxide semiconductor layer).

Note that the insulating film including a region where the proportion of oxygen is higher than the stoichiometric proportion may be applied to either the insulating film placed on an upper side of the oxide semiconductor film (the oxide semiconductor layer) or the insulating film placed on a lower side of the oxide semiconductor film (the oxide semiconductor layer) of the insulating films which are in contact with the oxide semiconductor film (the oxide semiconductor layer); however, it is preferable to apply such an insulating film to both the insulating films which are in contact with the oxide semiconductor film (the oxide semiconductor layer). The above effect can be enhanced with a structure where the oxide semiconductor film (the oxide semiconductor layer) is provided between the insulating films each including a region where the proportion of oxygen is higher than the stoichiometric proportion, which are used as the insulating films in contact with the oxide semiconductor film (the oxide semiconductor layer) and positioned on the upper side and the lower side of the oxide semiconductor film (the oxide semiconductor layer).

Here, the insulating film including a region where the proportion of oxygen is higher than the stoichiometric proportion may be a single-layer insulating film or a plurality of insulating films stacked. Note that the insulating film preferably includes impurities such as moisture or hydrogen as little as possible. When hydrogen is contained in the insulating film, hydrogen enters the oxide semiconductor film (the oxide semiconductor layer) or oxygen in the oxide semiconductor film (the oxide semiconductor layer) is extracted by hydrogen, whereby the oxide semiconductor film has lower resistance (n-type conductivity); thus, a parasitic channel might be formed. Thus, it is important that a deposition method in which hydrogen is not used be employed in order to form the insulating film containing hydrogen as little as possible. A material having a high barrier property is preferably used for the insulating film. As the insulating film having a high barrier property, a silicon nitride film, a silicon nitride oxide film, an aluminum nitride film, an aluminum oxide film, an aluminum nitride oxide film, or the like can be used, for example. When a plurality of insulating films stacked are used, an insulating film having a low proportion of nitrogen, such as a silicon oxide film or a silicon oxynitride film, is formed on a side which is closer to the oxide semiconductor film (the oxide semiconductor layer) than the insulating film having a high barrier property. Then, the insulating film having a high barrier property is formed to overlap with the oxide semiconductor film (the oxide semiconductor layer) with the insulating film having a low proportion of nitrogen sandwiched therebetween. When the insulating film having a high barrier property is used, impurities such as moisture or hydrogen can be prevented from entering the oxide semiconductor film (the oxide semiconductor layer) or the interface between the oxide semiconductor film (the oxide semiconductor layer) and another insulating film and the vicinity thereof. In addition, the insulating film having a low proportion of nitrogen, such as a silicon oxide film or a silicon oxynitride film, is formed to be in contact with the oxide semiconductor film (the oxide semiconductor layer), so that the insulating film having a high barrier property can be prevented from being in direct contact with the oxide semiconductor film (the oxide semiconductor layer).

Alternatively, addition of oxygen after moisture or hydrogen in the oxide semiconductor film (the oxide semiconductor layer) is eliminated may be performed by performing heat treatment on the oxide semiconductor film (the oxide semiconductor layer) in an oxygen atmosphere. The heat treatment is performed at, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into a heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, addition of oxygen after moisture or hydrogen in the oxide semiconductor film (the oxide semiconductor layer) is eliminated may be performed by ion implantation, ion doping, or the like. For example, oxygen made to be plasma with a microwave of 2.45 GHz may be added to the oxide semiconductor film (the oxide semiconductor layer).

The thus formed oxide semiconductor layer can be used as the semiconductor layer 103 of the transistor 100. In this manner, the transistor 100 with extremely low off-state current can be obtained.

The semiconductor layer 103 of the transistor 100 may include microcrystalline silicon. Microcrystalline silicon is a semiconductor having an intermediate structure between amorphous and crystalline structures (including a single crystal structure and a polycrystalline structure). In microcrystalline silicon, columnar or needle-like crystals having a grain size of 2 to 200 nm, preferably 10 to 80 nm, more preferably 20 to 50 nm, still more preferably 25 to 33 nm have grown in a direction normal to a substrate surface. Thus, grain boundaries are formed at the interface of the columnar or needle-like crystals in some cases.

The Raman spectrum of microcrystalline silicon, which is a typical example, shifts to a lower wavenumber side than 520 cm$^{-1}$ which represents single crystal silicon. That is, the peak of the Raman spectrum of microcrystalline silicon is between 520 cm$^{-1}$ which represents single crystal silicon and 480 cm$^{-1}$ which represents amorphous silicon. Further, microcrystalline silicon contains hydrogen or halogen at a concentration of at least 1 atomic % to terminate a dangling bond. Furthermore, microcrystalline silicon contains a rare gas element such as helium, argon, krypton, or neon to further promote lattice distortion, so that stability is increased and favorable microcrystalline silicon can be obtained. Such microcrystalline silicon is disclosed in, for example, U.S. Pat. No. 4,409,134.

The semiconductor layer 103 of the transistor 100 may include amorphous silicon. The semiconductor layer 103 of the transistor 100 may include polycrystalline silicon. Alternatively, the semiconductor layer 103 of the transistor 100 may include an organic semiconductor, a carbon nanotube, or the like.

The material of the electrode 110 is described below. Note that a similar material can be used for an electrode formed using the same layer as the electrode 110.

The electrode 110 can be formed using a light-transmissive conductive material. As the light-transmissive conductive material, indium tin oxide (ITO), indium tin oxide containing silicon oxide (ITSO), organoindium, organotin, zinc oxide, indium zinc oxide, or the like can be used. Note that the electrode 110 may have both a light-transmissive region and a reflective region. Thus, a transflective display device can be obtained. Alternatively, the electrode 110 may be formed using a reflective conductive material. Thus, a reflective display device can be obtained. Alternatively, a top-emission light-emitting device can be obtained in which light is emitted to a side opposite to a side in which a pixel is formed.

In particular, in the case where a reflective conductive material is used for the electrode 110, the aperture ratio can be increased when the electrode 110 is provided above the transistor 100 to overlap with the transistor 100.

The material of the electrode 106 is described below. Note that a similar material can be used for an electrode formed using the same layer as the electrode 106.

The electrode 106 can be formed using a light-transmissive conductive material. As the light-transmissive conductive material, indium tin oxide (ITO), indium tin oxide containing silicon oxide (ITSO), organoindium, organotin, zinc oxide, indium zinc oxide, or the like can be used.

The material of the insulating layer 105 is described below.

The insulating layer 105 may include an organic insulating layer. The insulating layer 105 may include an inorganic insulating layer. The insulating layer 105 may include a stack of an inorganic insulating layer and an organic insulating layer. For example, the layers 105a and 105c can be inorganic insulating layers. The layer 105b can be an organic insulating layer.

In the case where the insulating layer 105 or the layer 105b is a color filter, a green organic insulating layer, a blue organic insulating layer, a red organic insulating layer, or the like can be used as the insulating layer 105 or the layer 105b. In the case where the insulating layer 105 or the layer 105b is a black matrix, a black organic insulating layer can be used as the insulating layer 105 or the layer 105b.

An acrylic resin, polyimide, polyimide, or the like can be used for the organic insulating layer. With the use of polyimide, degradation of a light-emitting element formed over the insulating layer 105 or the layer 105b can be reduced. Alternatively, a photosensitive material may be used for the organic insulating layer. A film including a photosensitive material can be etched without formation of a resist mask. The organic insulating layer may be formed by a droplet discharge method such as an inkjet method. Alternatively, a layer which is formed by a droplet discharge method such as an inkjet method and is etched may be used. For example, a layer which is formed by a droplet discharge method such as an inkjet method and is etched using a resist mask may be used.

A silicon oxide film, a silicon nitride film, a silicon oxynitride film, or the like can be used for the inorganic insulating layer.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, or part or all of Embodiment 8. Thus, this embodiment can be freely combined or replaced with another embodiment (e.g., any one of Embodiments 1 to 8).

(Embodiment 10)

In this embodiment, one aspect of a method for manufacturing a semiconductor device is described.

FIGS. 59A to 59E illustrate an example of a method for manufacturing a semiconductor device with the structure illustrated in FIG. 1A.

Figure 59A:
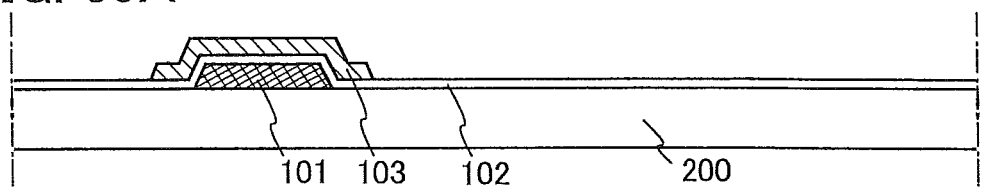
FIGS. 59A to 59E illustrate a method for manufacturing a semiconductor device.

The electrode 101 is formed over the insulating surface 200, the insulating layer 102 is formed over the electrode 101, and the semiconductor layer 103 which at least partly overlaps with at least part of the electrode 101 with the insulating layer 102 provided therebetween is formed (FIG. 59A).

Figure 59B:
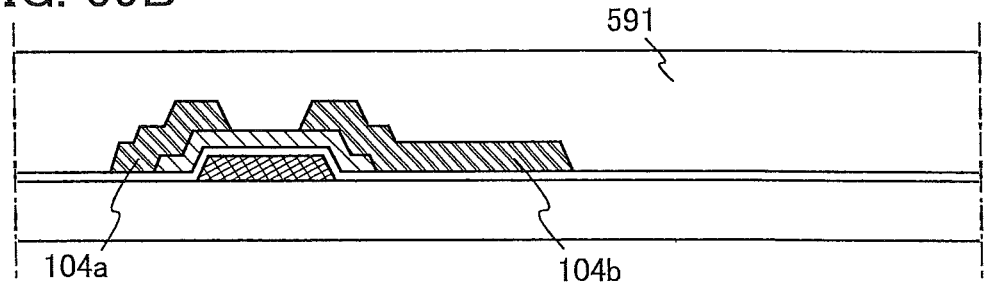

The electrodes 104a and 104b are formed over the semiconductor layer 103. An insulating film 591 is formed over the electrodes 104a and 104b. The insulating film 591 is formed using a positive photosensitive material (FIG. 59B).

Figure 59C:
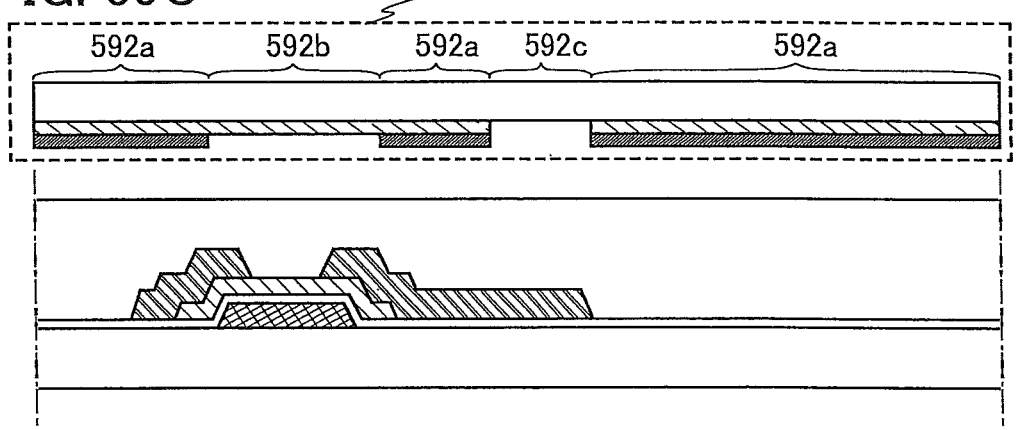

Then, the insulating film 591 is subjected to exposure with the use of a half-tone mask 592. The half-tone mask 592 has regions 592a, 592b, and 592c, and these regions have different transmittances of light used for exposure. Here, (transmittance of the region 592c)>(transmittance of the region 592b)>(transmittance of the region 592a) (FIG. 59C).

Figure 59D:
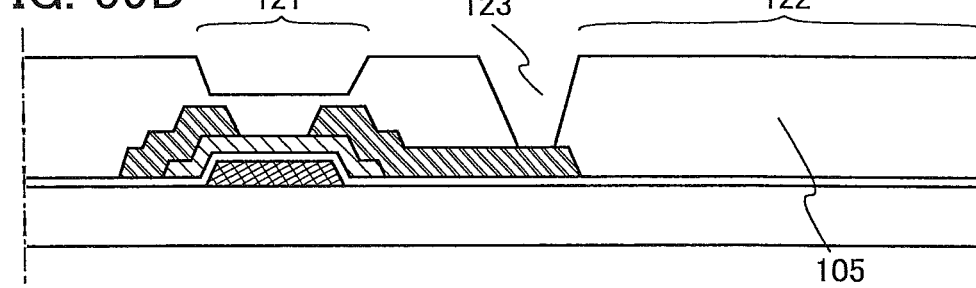

When the insulating film 591 is subjected to exposure with the use of the half-tone mask 592, it is possible to form the insulating layer 105 that has the regions 121 and 122 and a through hole 123. The region 121 is thinner than the region 122 (FIG. 59D).

Figure 59E:
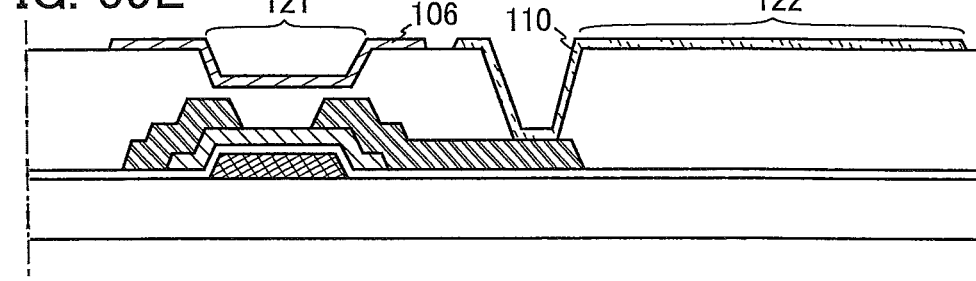

After that, the electrode 106 which at least partly overlaps with at least part of the semiconductor layer 103 with the region 121 provided therebetween is formed over the insulating layer 105, and at least part of the electrode 110 is formed over at least part of the region 122 (FIG. 59E).

In this manner, the semiconductor device can be manufactured.

Note that although the insulating film 591 is formed using a positive photosensitive material, this embodiment is not limited thereto. The insulating film 591 may be formed using a negative photosensitive material. Alternatively, the insulating layer 105 may be formed in such a manner that the insulating film 591 is faulted without the use of a photosensitive material, a resist is formed over the insulating film 591, the resist is subjected to exposure with the use of a half-tone mask so that a resist mask is formed, and the insulating film 591 is etched with the use of the resist mask.

FIGS. 60A to 60E illustrate an example of a method for manufacturing a semiconductor device with the structure illustrated in FIG. 1C.

Figure 60A:
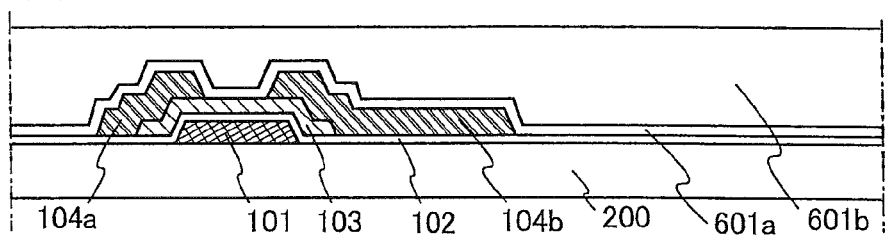
FIGS. 60A to 60E illustrate a method for manufacturing a semiconductor device.

The electrode 101 is formed over the insulating surface 200, and the insulating layer 102, the semiconductor layer 103, and the electrodes 104a and 104b are formed. The manufacturing steps up to this stage are similar to those in FIGS. 59A and 59B. An insulating film 601a is formed over the electrodes 104a and 104b, and an insulating film 601b is formed over the insulating film 601a (FIG. 60A).

Figure 60B:
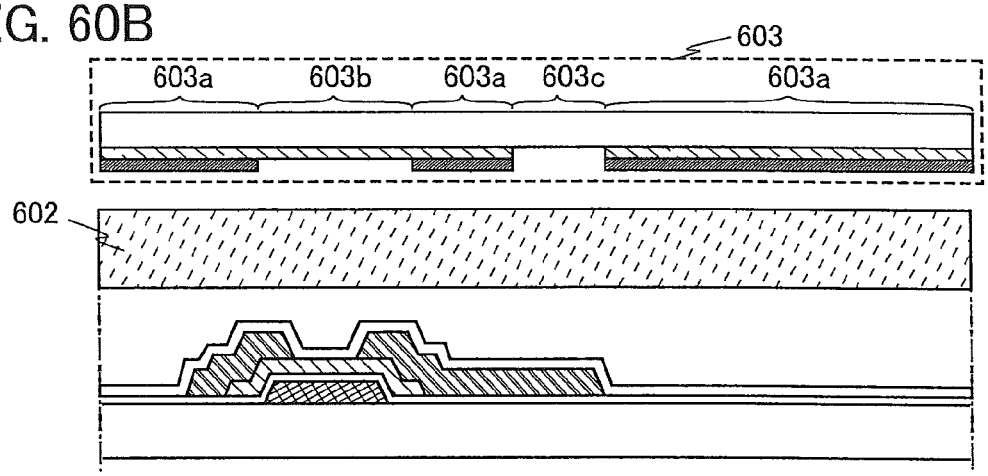

Then, a resist 602 is formed over the insulating film 601b. The resist 602 is a positive resist. The resist 602 is subjected to exposure with the use of a half-tone mask 603. The half-tone mask 603 has regions 603a, 603b, and 603c, and these regions have different transmittances of light used for exposure. Here, (transmittance of the region 603c)>(transmittance of the region 603b)>(transmittance of the region 603a) (FIG. 60B).

Figure 60C:
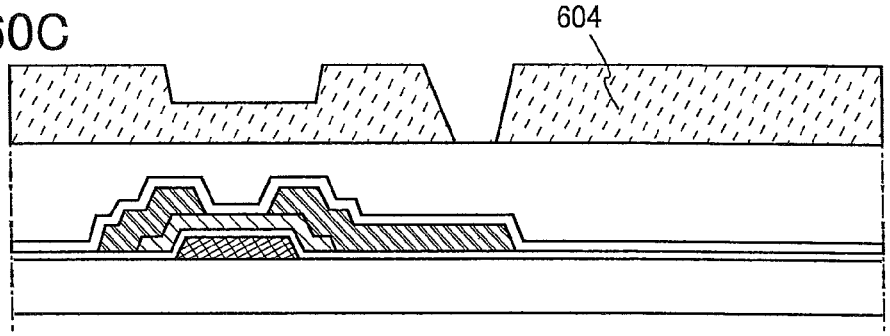

When the resist 602 is subjected to exposure with the use of the half-tone mask 603, a resist mask 604 having three regions with different thicknesses is formed (FIG. 60C).

Figure 60D:
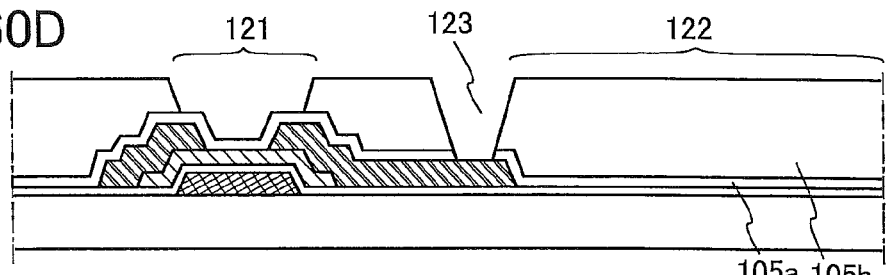

When the insulating films 601a and 601b are etched using the resist mask 604, it is possible to form an insulating layer (a stack of the layers 105a and 105b) that has the regions 121 and 122 and the through hole 123. The region 121 is thinner than the region 122 (FIG. 60D).

Figure 60E:
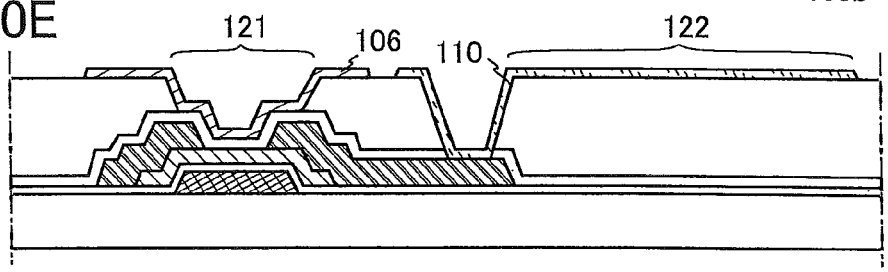

After that, the electrode 106 which at least partly overlaps with at least part of the semiconductor layer 103 with the region 121 provided therebetween is fainted over the layer 105b, and at least part of the electrode 110 is formed over at least part of the region 122 (FIG. 60E).

In this manner, the semiconductor device can be manufactured.

Note that although the resist 602 is a positive resist in the manufacturing steps in FIGS. 60A to 60E, this embodiment is not limited thereto. The resist 602 may be formed using a negative photosensitive material. Alternatively, the insulating layer (the stack of the layers 105a and 105b) may be formed in such a manner that the resist 602 is not used, the insulating film 601b is formed using a photosensitive material, and the insulating film 601b is subjected to exposure with the use of a half-tone mask.

Although a half-tone mask is used in the manufacturing steps in FIGS. 60A to 60E, this embodiment is not limited thereto. For example, manufacturing steps as illustrated in FIGS. 61A to 61D can be employed.

Figure 61A:
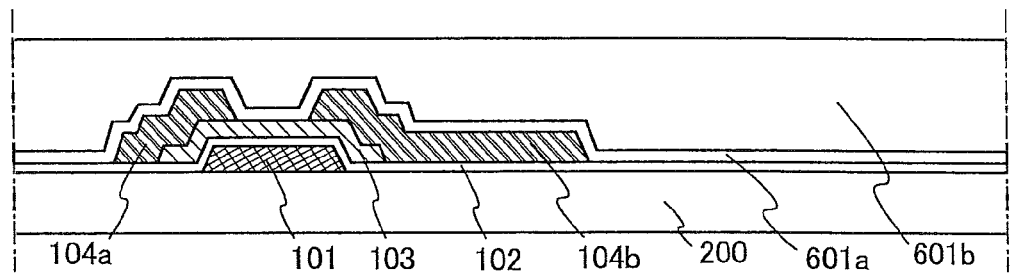
FIGS. 61A to 61D illustrate a method for manufacturing a semiconductor device.

The manufacturing step up to the step in FIG. 61A is similar to that in FIG. 60A.

Figure 61B:
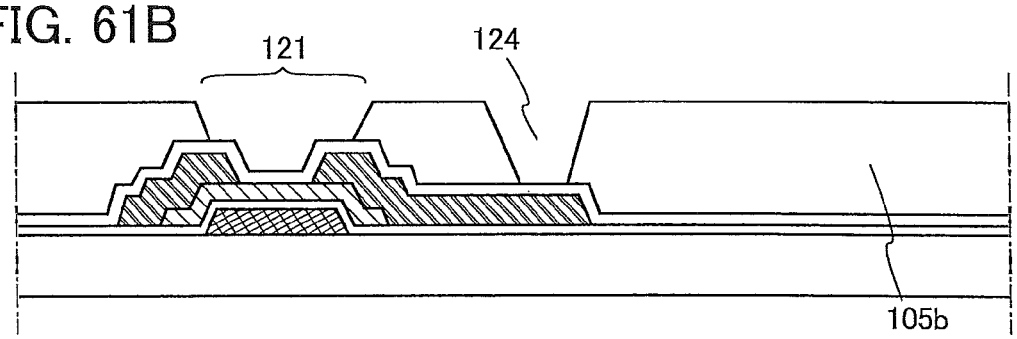

In the manufacturing steps in FIGS. 61A to 61D, the insulating film 601b is etched so that the region 121 and an opening 124 are formed. In this manner, the layer 105b is formed (FIG. 61B).

Figure 61C:
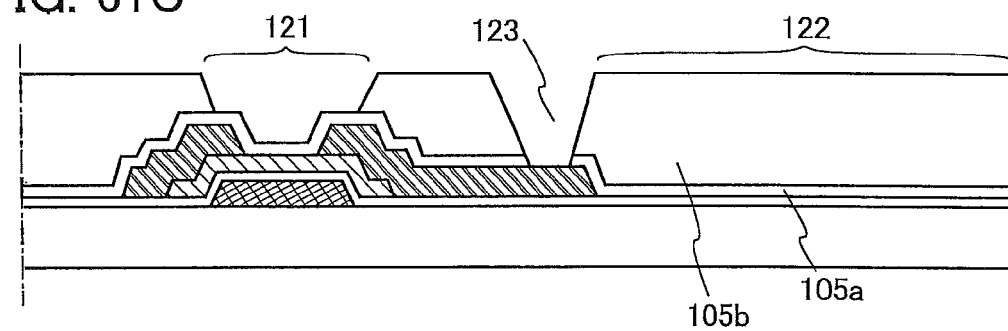

After that, the insulating film 601a which is exposed through the opening 124 is etched so that the through hole 123 is formed. In that case, part of the layer 105b may be further etched. Thus, it is possible to form an insulating layer (a stack of the layers 105a and 105b) that has the regions 121 and 122 and the through hole 123. The region 121 is thinner than the region 122 (FIG. 61C).

Figure 61D:
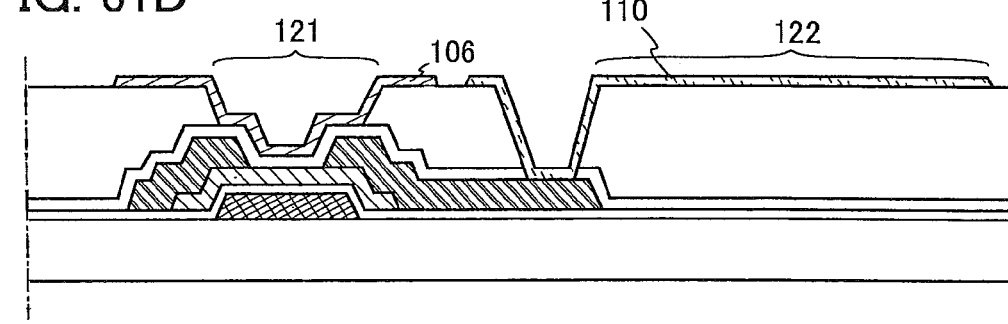

After that, the electrode 106 which at least partly overlaps with at least part of the semiconductor layer 103 with the region 121 provided therebetween is formed over the layer 105b, and at least part of the electrode 110 is formed over at least part of the region 122 (FIG. 61D).

In this manner, the semiconductor device can be manufactured.

Note that although the insulating films 601a and 601b are stacked and then etched in the manufacturing steps in FIGS. 61A to 61D, this embodiment is not limited thereto. For example, manufacturing steps as illustrated in FIGS. 62A to 62E can be employed.

The step up to the step of forming the insulating film 601a (FIG. 62A) is similar to the manufacturing step in FIG. 61A.

Figure 62A:
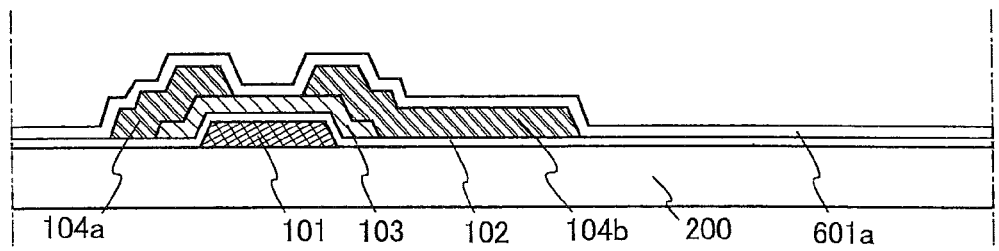
FIGS. 62A to 62E illustrate a method for manufacturing a semiconductor device.
Figure 62B:
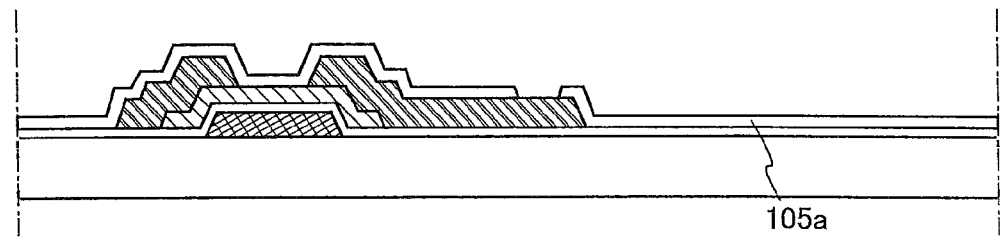

After the insulating film 601a is formed, the insulating film 601a is etched so that the layer 105a having an opening 125 is formed (FIG. 62B).

Figure 62C:
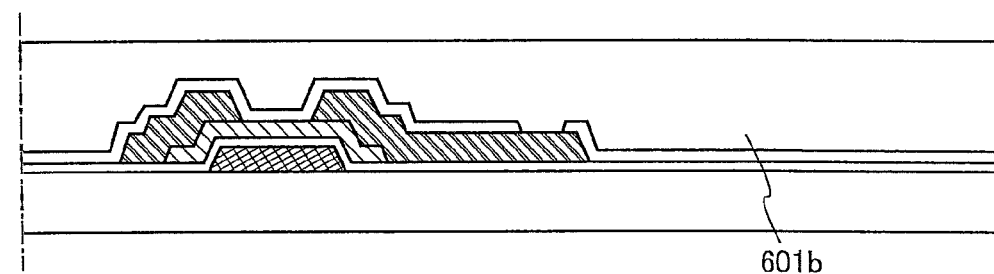

Then, the insulating film 601b is formed to cover the layer 105a (FIG. 62C).

Figure 62D:
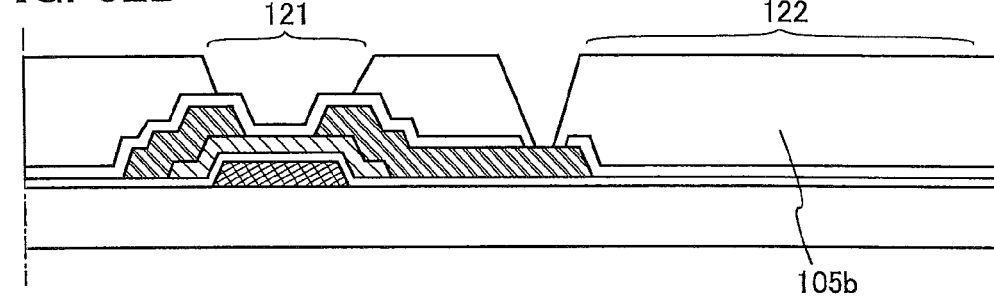

Then, the insulating film 601b is etched. In that case, part of the layer 105a may be further etched. Thus, it is possible to form an insulating layer (a stack of the layers 105a and 105b) that has the regions 121 and 122 and the through hole 123. The region 121 is thinner than the region 122 (FIG. 62D).

Figure 62E:
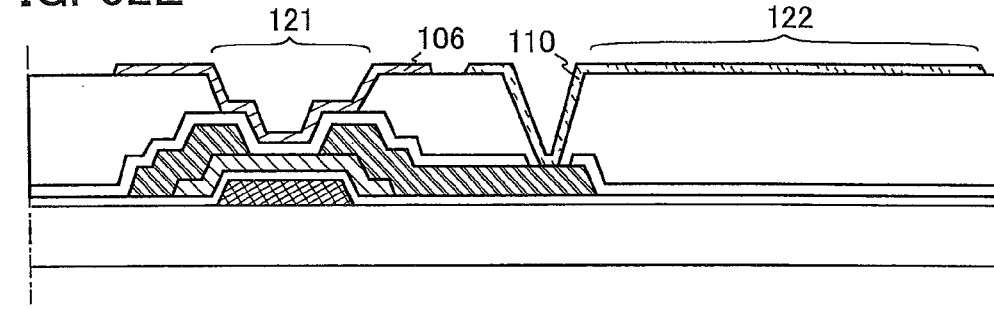

After that, the electrode 106 which at least partly overlaps with at least part of the semiconductor layer 103 with the region 121 provided therebetween is formed over the layer 105b, and at least part of the electrode 110 is formed over at least part of the region 122 (FIG. 62E).

In this manner, the semiconductor device can be manufactured.

Note that in the manufacturing steps in FIGS. 60A to 60E, FIGS. 61A to 61D, and FIGS. 62A to 62E, the insulating layer 105 is constituted of two films (the insulating films 601a and 601b), and only one of the films is selectively removed so that the regions 121 and 122 are formed. However, this embodiment is not limited thereto. The insulating layer 105 may be constituted of in (in is a natural number) films, and only n (n is a natural number smaller than in) films among in films may be selectively removed so that the regions 121 and 122 are formed.

For example, FIGS. 63A to 63E illustrate steps of forming the insulating layer 105 using three films. The steps in FIGS. 63A to 63E correspond to steps of manufacturing a semiconductor device with the structure illustrated in FIG. 26C.

Figure 63A:
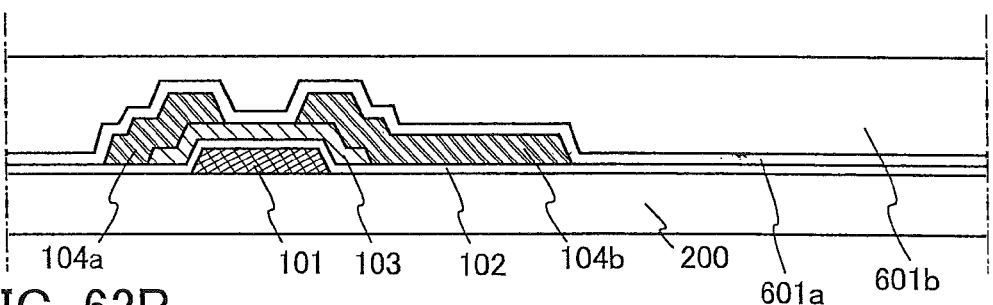
FIGS. 63A to 63E illustrate a method for manufacturing a semiconductor device.

The step up to the step in FIG. 63A are similar to the manufacturing step in FIG. 60A.

Figure 63B:
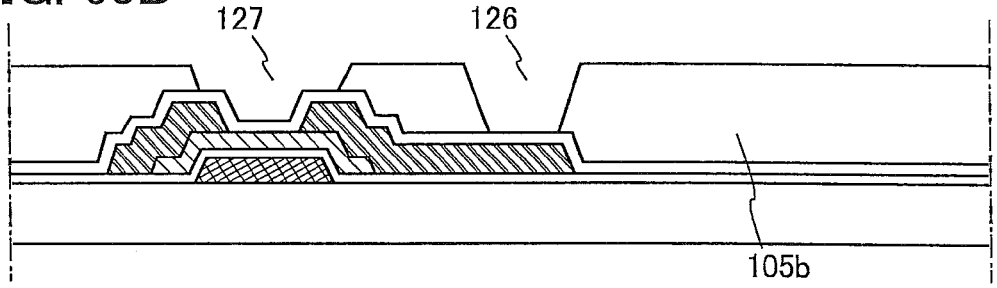

After the insulating film 601b is formed, the insulating film 601b is etched so that the layer 105b having openings 126 and 127 is formed (FIG. 63B).

Figure 63C:
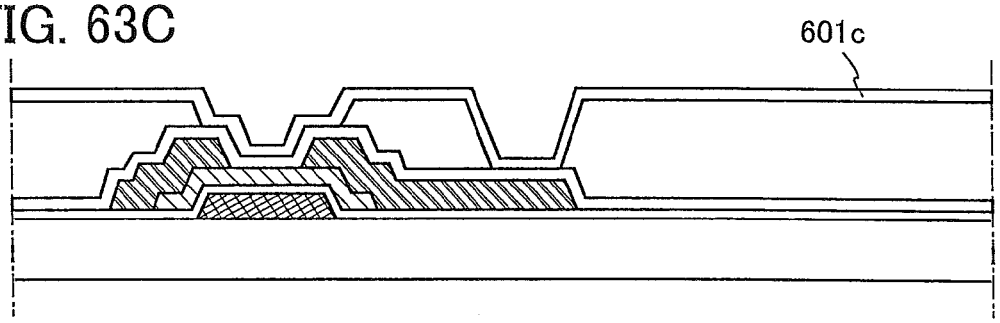

Then, an insulating film 601c is formed to cover the layer 105b (FIG. 63C).

Figure 63D:
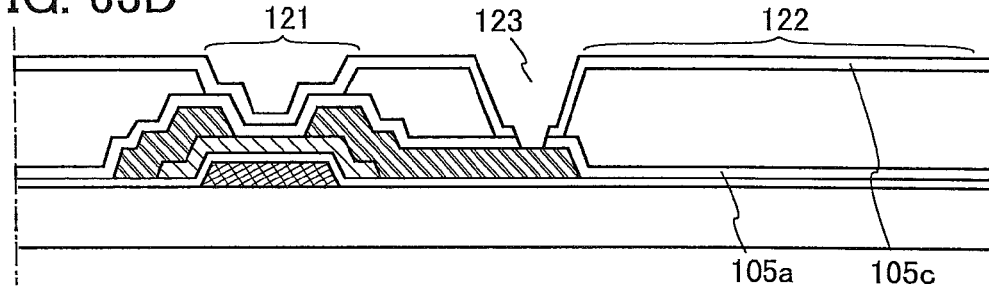

Then, the insulating films 601a and 601c are etched so that the through hole 123 is formed. Thus, it is possible to form an insulating layer (a stack of the layers 105a, 105b, and 105c) that has the regions 121 and 122 and the through hole 123. The region 121 is thinner than the region 122 (FIG. 63D).

Figure 63E:
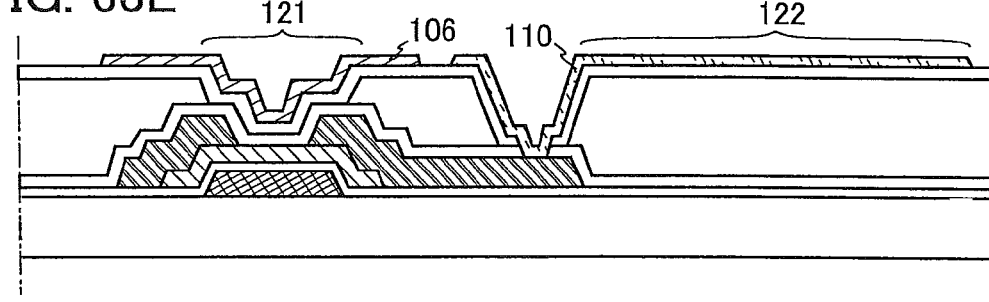

After that, the electrode 106 which at least partly overlaps with at least part of the semiconductor layer 103 with the region 121 provided therebetween is formed over the layer 105c, and at least part of the electrode 110 is formed over at least part of the region 122 (FIG. 63E).

In this manner, the semiconductor device can be manufactured.

Note that FIGS. 64A to 64E illustrate steps of forming the insulating layer 105 using three films. These steps are different from the steps in FIGS. 63A to 63E. The steps in FIGS. 64A to 64E correspond to steps of manufacturing a semiconductor device in the case of the layer 105b covering an end of the layer 105a in the structure illustrated in FIG. 26C.

Figure 64A:
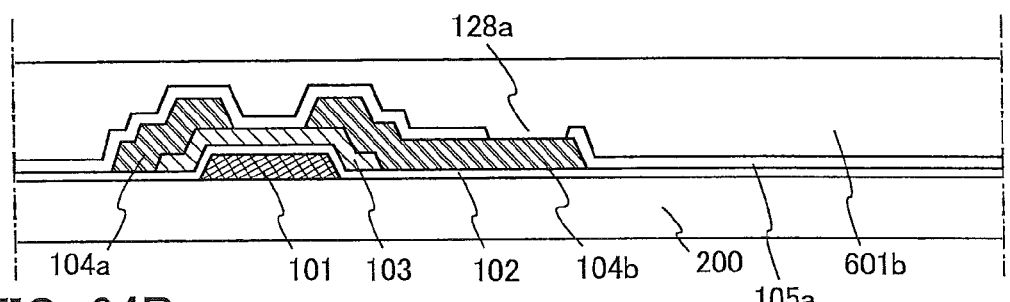
FIGS. 64A to 64E illustrate a method for manufacturing a semiconductor device.

First, an insulating film is etched so that the layer 105a having an opening 128a is formed, and then, the insulating film 601b is formed (FIG. 64A).

Figure 64B:
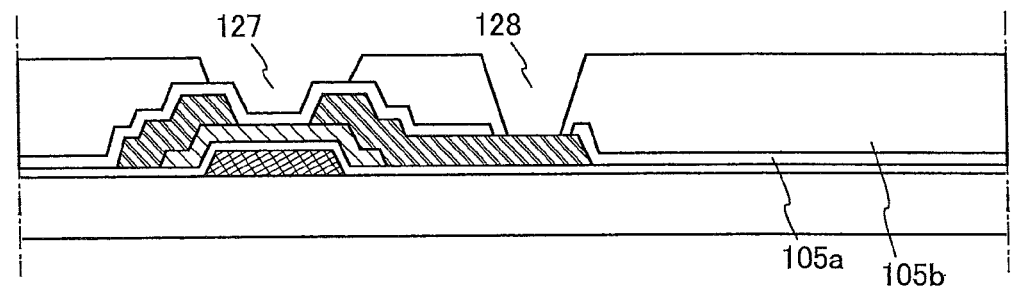

The insulating film 601b is etched so that the layer 105b having the opening 127 and an opening 128 is formed (FIG. 64B). Here, the opening 128 is formed in the opening 128a and has a smaller diameter than the opening 128a.

Figure 64C:
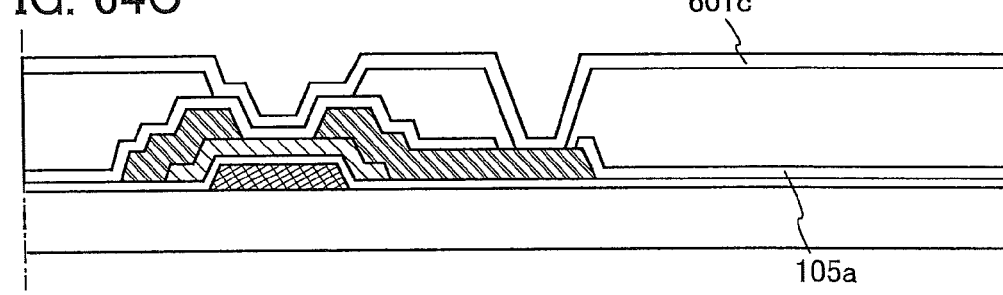

Then, the insulating film 601c is formed to cover the layer 105b (FIG. 64C).

Figure 64D:
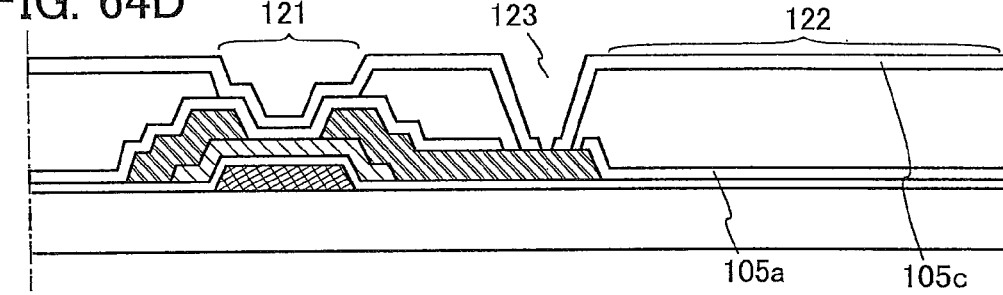

Then, the insulating film 601c is etched so that the through hole 123 is formed. Thus, it is possible to form an insulating layer (a stack of the layers 105a, 105b, and 105c) that has the regions 121 and 122 and the through hole 123. The region 121 is thinner than the region 122 (FIG. 64D).

Figure 64E:
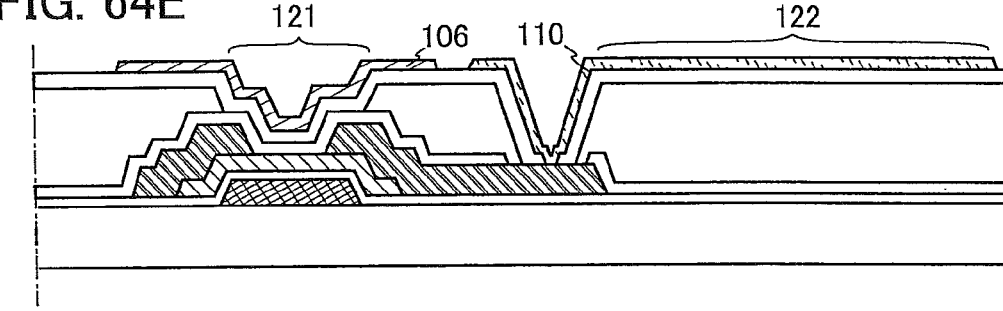

After that, the electrode 106 which at least partly overlaps with at least part of the semiconductor layer 103 with the region 121 provided therebetween is formed over the layer 105c, and at least part of the electrode 110 is formed over at least part of the region 122 (FIG. 64E).

In this manner, the semiconductor device can be manufactured.

Note that FIGS. 59A to 59E, FIGS. 60A to 60E, FIGS. 61A to 61D, FIGS. 62A to 62E, FIGS. 63A to 63E, and FIGS. 64A to 64E illustrate steps of manufacturing semiconductor devices obtained by some modifications of the semiconductor device in FIG. 1A, FIG. 1C, or FIG. 26C; however, the semiconductor devices with the other structures in the above embodiments can be manufactured similarly.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, part or all of Embodiment 8, or part or all of Embodiment 9. Thus, this embodiment can be freely combined or replaced with another embodiment (e.g., any one of Embodiments 1 to 9).

(Embodiment 11)

In this embodiment, an example in which any of the semiconductor devices in Embodiments 1 to 10 is applied to a display device is described.

Any of the semiconductor devices in Embodiments 1 to 10 can be used for a pixel in a liquid crystal display device or the like.

Figure 52A:
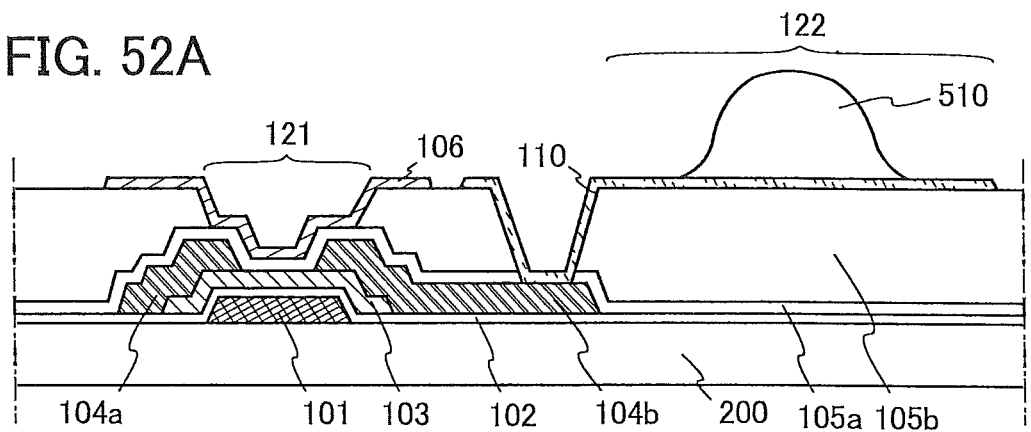
FIGS. 52A and 52B are cross-sectional views each illustrating the structure of a semiconductor device.
Figure 52B:
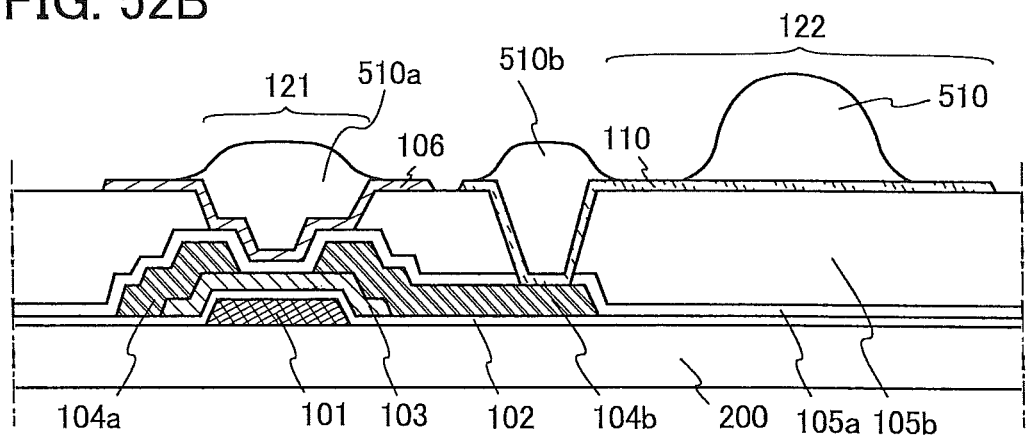

FIGS. 52A and 52B are examples of a cross-sectional view of a pixel in a liquid crystal display device. FIGS. 52A and 52B are cross-sectional views in the case of the semiconductor device with the structure illustrated in FIG. 1C applied to a liquid crystal display device. Note that in FIGS. 52A and 52B, the same portions as those in FIGS. 1A to 1E are denoted by the same reference numerals, and the description thereof is omitted.

In FIGS. 52A and 52B, the transistor 100 can be provided in a pixel. The electrode 110 can be a pixel electrode. The layer 105b can be a color filter and/or a black matrix.

In FIG. 52A, a protrusion 510 is provided in the region 122. The protrusion 510 can function as a spacer. Thus, a gap between a substrate over which the transistor 100 is formed (hereinafter referred to as a pixel substrate) and a substrate for sealing a liquid crystal layer (hereinafter referred to as a counter substrate) can be controlled with the protrusion 510. Note that a black matrix may be formed using the protrusion 510. Alternatively, the protrusion 510 can function as a rib for controlling alignment of liquid crystal molecules. With the protrusion 510, a direction in which liquid crystal molecules are aligned can be controlled.

Note that FIGS. 52A and 52B do not illustrate the liquid crystal layer, an electrode (hereinafter referred to as a counter electrode) which forms a pair with the pixel electrode, and the counter substrate. The counter electrode may be provided using either the pixel substrate or the counter substrate. Although an alignment film is not illustrated, the alignment film may or may not be provided.

In the structure illustrated in FIG. 52A, as illustrated in FIG. 52B, layers 510a and 510b may be provided to fill regions where the insulating layer 105 is thin or the insulating layer 105 is not provided (for example, regions where the layer 105*b* is removed). Thus, unevenness of portions over the pixel substrate that face the liquid crystal layer can be reduced. The layers 510*a* and 510*b* may be formed using a material that is different from or the same as the material of the protrusion 510. A black matrix may be formed using any one of or all of the layer 510*a*, the layer 510*b*, and the protrusion 510. Note that in FIG. 52B, one of the layers 510*a* and 510*b* is not necessarily provided. For example, only the layer 510*a* may be provided.

Note that in FIGS. 52A and 52B, the protrusion 510 and the layers 510*a* and 510*b* can be obtained by processing of an insulating layer by photolithography. Alternatively, the protrusion 510 and the layers 510*a* and 510*b* can be formed using a photosensitive material. Note that the protrusion 510 and the layers 510*a* and 510*b* can be formed by a droplet discharge method such as an inkjet method. Although FIGS. 52A and 52B each illustrate an example in which the protrusion 510 is provided over the pixel substrate, this embodiment is not limited thereto. The protrusion 510 may be provided on the counter substrate.

Although FIGS. 52A and 52B each illustrate an example in which the protrusion 510 is provided to overlap with the electrode 110, this embodiment is not limited thereto. The protrusion 510 can be provided so as not to overlap with the electrode 110. Alternatively, the protrusion 510 can be provided so as to overlap with the electrode 110 and so as not to overlap with another part of the electrode 110. Further, the protrusion 510 may be provided for each pixel or each plurality of pixels. The protrusion 510 may be provided to partly overlap with a wiring of the pixel or may be provided to partly overlap with the black matrix.

Although FIGS. 52A and 52B each illustrate an example in which the semiconductor device in FIG. 1C is applied to a liquid crystal display device, this embodiment is not limited thereto. Any of the semiconductor devices in Embodiments 1 to 10 can be applied to a liquid crystal display device. For example, any of the semiconductor devices in Embodiments 1 to 10 can be applied to a liquid crystal display device, and any of the protrusion 510, the layer 510*a*, and the layer 510*b* can be provided, as in FIGS. 52A and 52B.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, part or all of Embodiment 8, part or all of Embodiment 9, or part or all of Embodiment 10. Thus, this embodiment can be freely combined or replaced with another embodiment (e.g., any one of Embodiments 1 to 10).

(Embodiment 12)

In this embodiment, an example in which any of the semiconductor devices in Embodiments 1 to 10 is applied to a display device is described.

Any of the semiconductor devices in Embodiments 1 to 10 can be used for a pixel in a liquid crystal display device or the like, for example.

FIGS. 55A to 55F are examples of a circuit diagram of one pixel in a pixel portion of a liquid crystal display device. The pixel includes a transistor, a capacitor, and a liquid crystal element. The pixel further includes a gate signal line 551, a source signal line 552, a capacitor line 553, and the like. The source signal line 552 can also be referred to as a video signal line. Note that one pixel illustrated in each of FIGS. 55A to 55F includes a subpixel. The transistor 100 in any of Embodiments 1 to 10 can be used as the transistor. FIG. 55G shows the symbols of the transistor used in FIGS. 55A to 55F. FIG. 55G shows the symbols of the transistor and a correspondence between the symbols of the transistor and the transistor 100 in any of Embodiments 1 to 10.

FIG. 55H excerpts the liquid crystal element from FIGS. 55A to 55F. As illustrated in FIG. 55H, the liquid crystal element includes the electrode 110 (corresponding to a pixel electrode) and an electrode 550 (corresponding to a counter electrode). A liquid crystal layer is provided between the electrode 110 and the electrode 550.

Further, the parasitic capacitance or the capacitor in Embodiment 7 or Embodiment 8 can be used as the capacitor in FIGS. 55A to 55F.

Any of the semiconductor devices in Embodiments 1 to 10 can be used for a pixel in a display device including an EL element (e.g., an organic light-emitting element) (hereinafter referred to as an EL display device) or a light-emitting device.

Figure 56A:
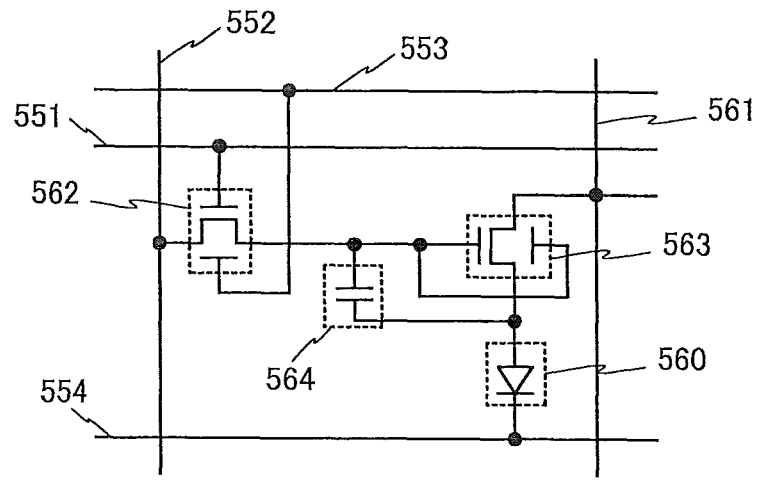
FIGS. 56A to 56C are circuit diagrams each illustrating the structure of a semiconductor device.
Figure 56B:
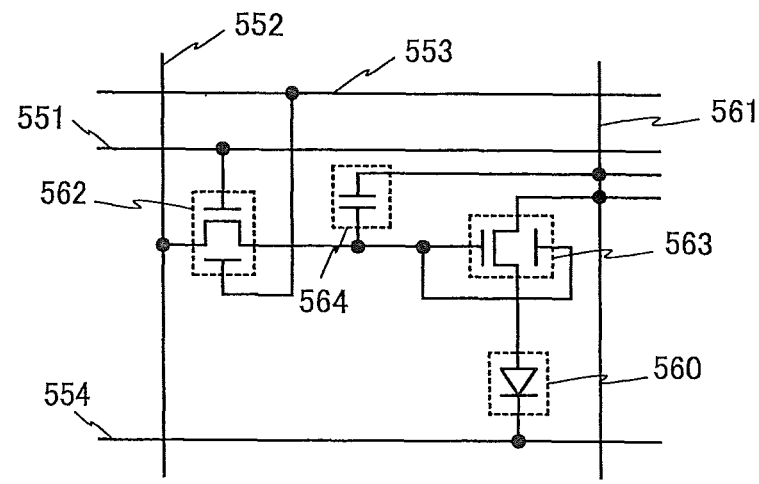
Figure 56C:
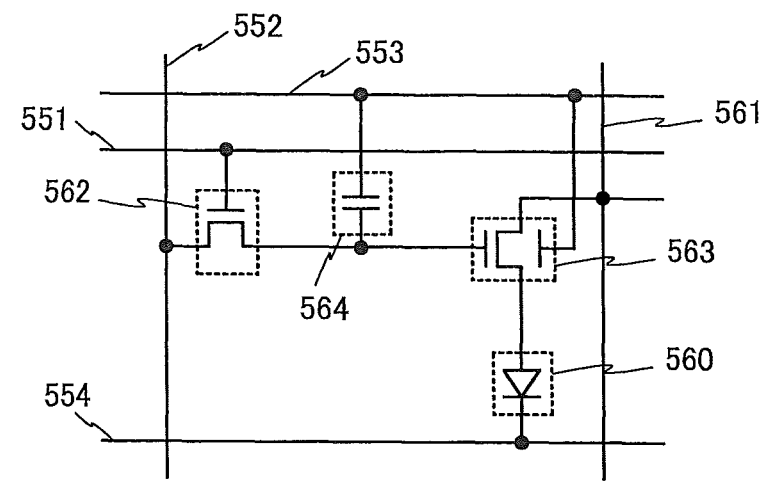

FIGS. 56A to 56C are examples of a circuit diagram of a pixel in an EL display device. The pixel in FIGS. 56A to 56C includes an EL element 560, a transistor 562, a transistor 563, and a capacitor 564. The pixel further includes the gate signal line 551, the source signal line 552, the capacitor line 553, a power supply line 561, and the like. The source signal line 552 is also referred to as a video signal line. The transistor 562 has a function of controlling whether to supply a video signal to a gate of the transistor 563. The transistor 563 has a function of controlling current to be supplied to the EL element 560. The transistor 100 in any of Embodiments 1 to 10 can be used as the transistor. The symbols of the transistor and a correspondence between the symbols of the transistor and the transistor 100 in any of Embodiments 1 to 10 are as shown in FIG. 55G.

Figure 57A:
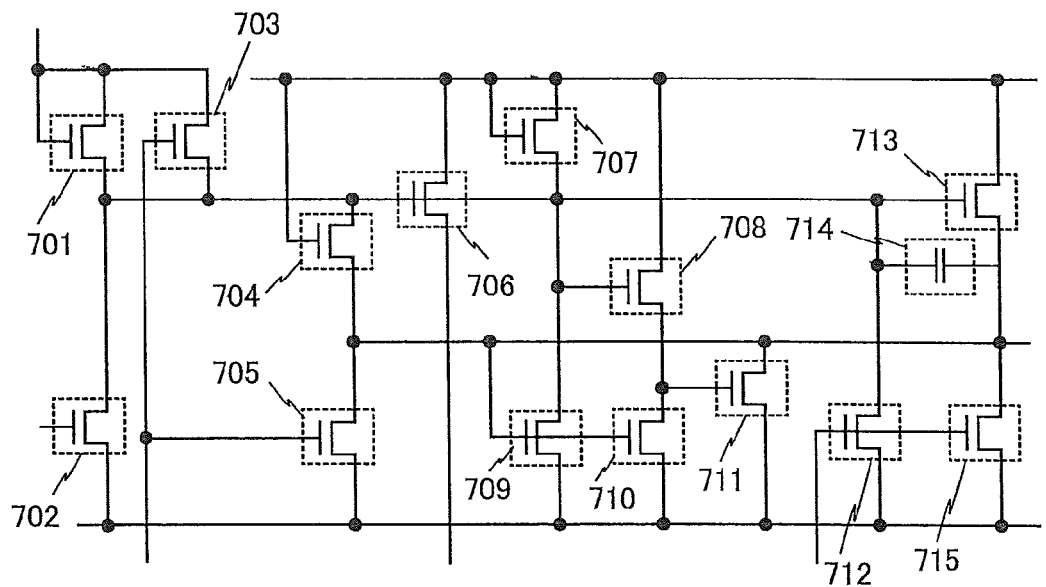
FIGS. 57A and 57B are circuit diagrams each illustrating the structure of a semiconductor device.
Figure 57B:
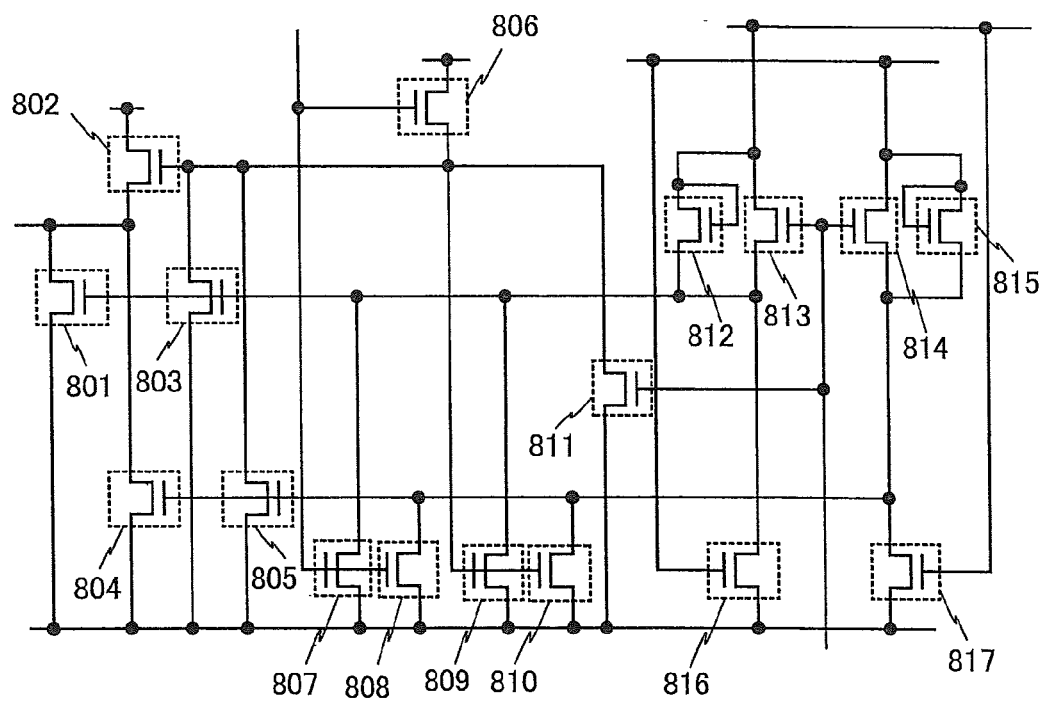

Further, any of the semiconductor devices in Embodiments 1 to 10 can be used for a driver circuit in a liquid crystal display device, an EL display device, or the like. For example, any of the semiconductor devices in Embodiments 1 to 10 can be used for a driver circuit such as a scan line driver circuit or a signal line driver circuit for outputting a signal to a pixel. FIGS. 57A and 57B illustrate examples of part of the driver circuit. The transistor 100 in any of Embodiments 1 to 10 can be used as some or all of transistors (transistors 701, 702, 703, 704, 705, 706, 707, 708, 709, 710, 711, 712, 713, 715, 801, 802, 803, 804, 805, 806, 807, 808, 809, 810, 811, 812, 813, 814, 815, 816, and 817) included in the driver circuit.

Further, the parasitic capacitance or the capacitor in Embodiment 7 or Embodiment 8 can be used as a capacitor 714 in FIG. 57A.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, part or all of Embodiment 8, part or all of Embodiment 9, part or all of Embodiment 10, or part or all of Embodiment 11. Thus, this embodiment can be freely combined or replaced with another embodiment (e.g., any one of Embodiments 1 to 11).

(Embodiment 13)

In this embodiment, an example in which any of the semiconductor devices in Embodiments 1 to 10 is applied to a display device such as a liquid crystal display device is described.

Figure 53:
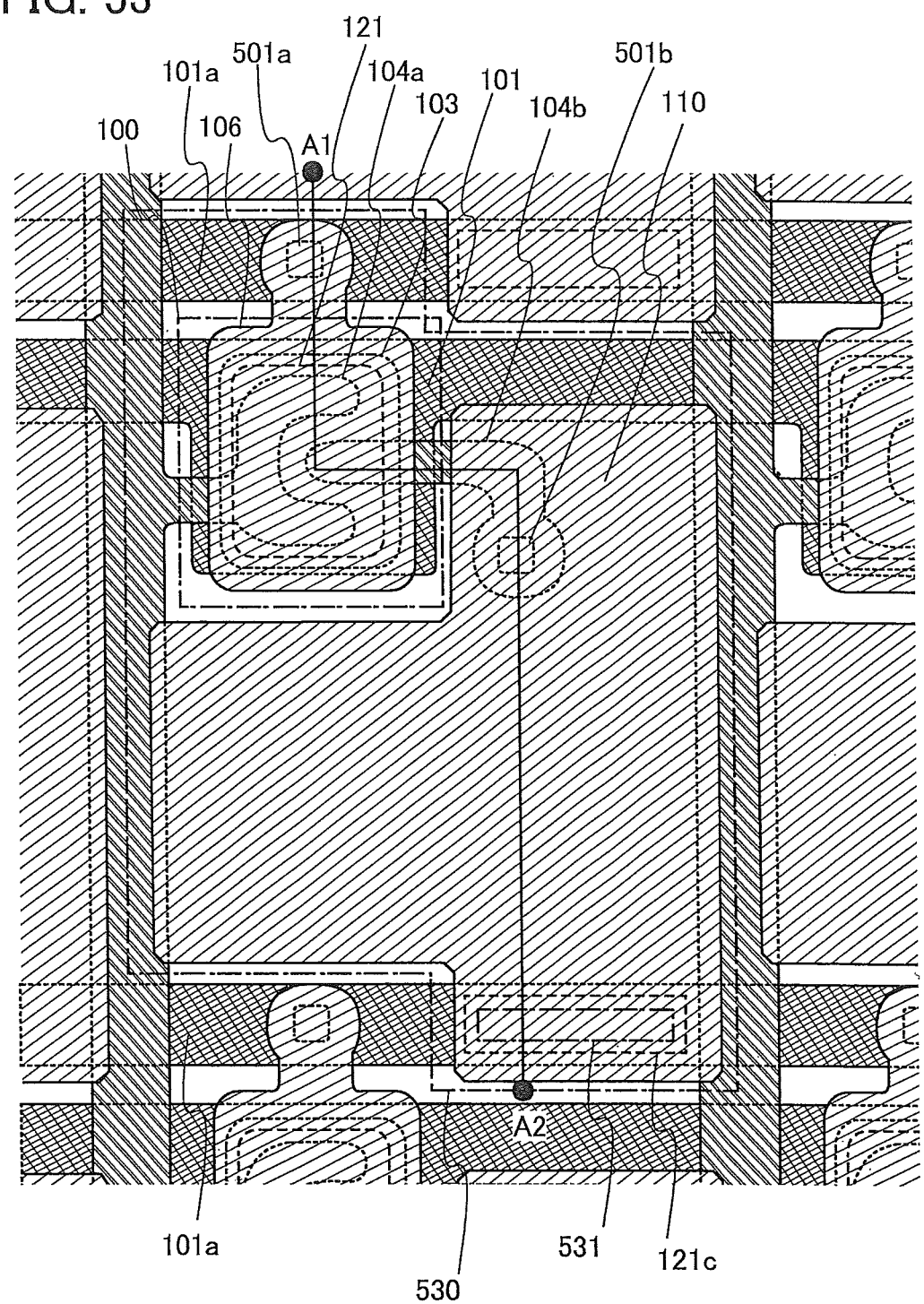
FIG. 53 is a top view illustrating the structure of a semiconductor device.
Figure 58A:
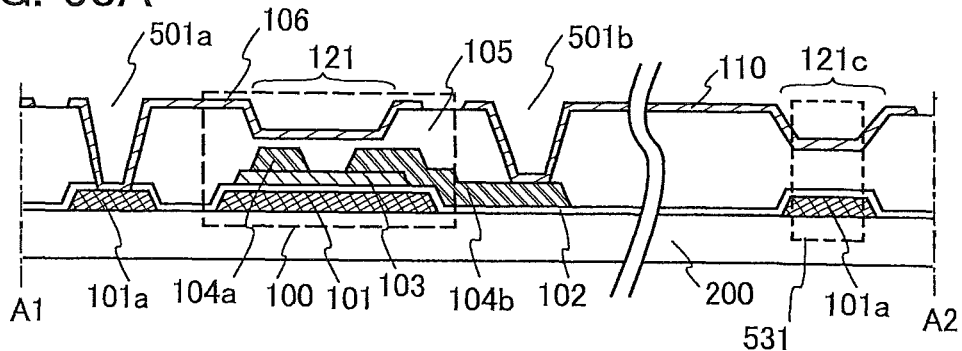
FIGS. 58A to 58D are cross-sectional views each illustrating the structure of a semiconductor device.
Figure 58B:
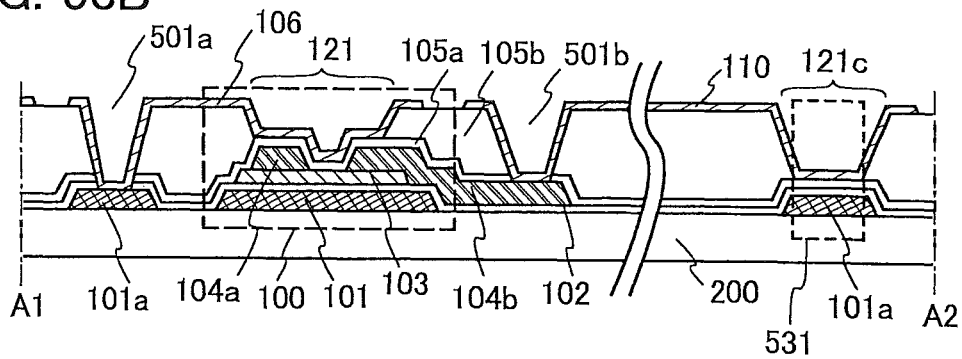

FIG. 53 and FIGS. 58A and 58B illustrate one aspect of the structure of a pixel in a liquid crystal display device. A cross-sectional view taken along line A1-A2 in a top view of FIG. 53 corresponds to FIG. 58A or 58B.

In FIG. 53 and FIGS. 58A and 58B, a pixel 530 includes the transistor 100, a capacitor 531, and a liquid crystal element (or a display element). Note that the pixel 530 may be a subpixel. FIG. 53 and FIGS. 58A to 58D illustrate only the electrode 110 corresponding to a pixel electrode of the liquid crystal element (or the display element), and do not illustrate a counter electrode (a common electrode).

Any of the variety of structures in Embodiments 1 to 10 can be used as the structure of the transistor 100. Thus, the structure of the transistor 100 is similar to any of the structures in Embodiments 1 to 10. Accordingly, the same portions as those in any of the structures in Embodiments 1 to 10 are denoted by the same reference numerals, and the description thereof is omitted. Note that FIG. 58A illustrates an example in which the transistor 100 with the structure in FIG. 1A is used. FIG. 58B illustrates an example in which the transistor 100 with the structure in FIG. 1C is used.

Further, the parasitic capacitance or the capacitor in Embodiment 7 or Embodiment 8 can be used as the capacitor 531. Note that FIG. 58A illustrates an example in which the capacitor 531 is formed in the region 121c where the insulating layer 105 is made thin. FIG. 58B illustrates an example in which the capacitor 531 is formed in the region 121c from which the layer 105b is removed. The structure of the capacitor 531 in FIG. 58B corresponds to the structure of the capacitor in FIG. 22D.

The electrode 106 of the transistor 100 is electrically connected to the electrode 101a through an opening 501a. The electrode 101 of the transistor 100 functions as both a gate electrode of the transistor and a gate line. The electrode 101a is provided in parallel with the electrode 101. The electrode 101a functions as both a wiring for applying a potential to the electrode 106 of the transistor 100 and a capacitor line in pixels (or subpixels) in an adjacent row. The electrode 104a of the transistor 100 functions as both one of a source electrode and a drain electrode and a source line. The source line is provided to intersect with the gate line. The electrode 104b of the transistor 100 functions as the other of the source electrode and the drain electrode, and is electrically connected to the electrode 110 through an opening 501b. One of a pair of electrodes of the capacitor 531 is the electrode 110, and the other electrode of the capacitor 531 is the electrode 101a.

Note that the electrode 101a can be formed using, for example, the same layer and the same material as the electrode 101. Note that the electrodes 101a and 101 may be formed using different materials.

Figure 54:
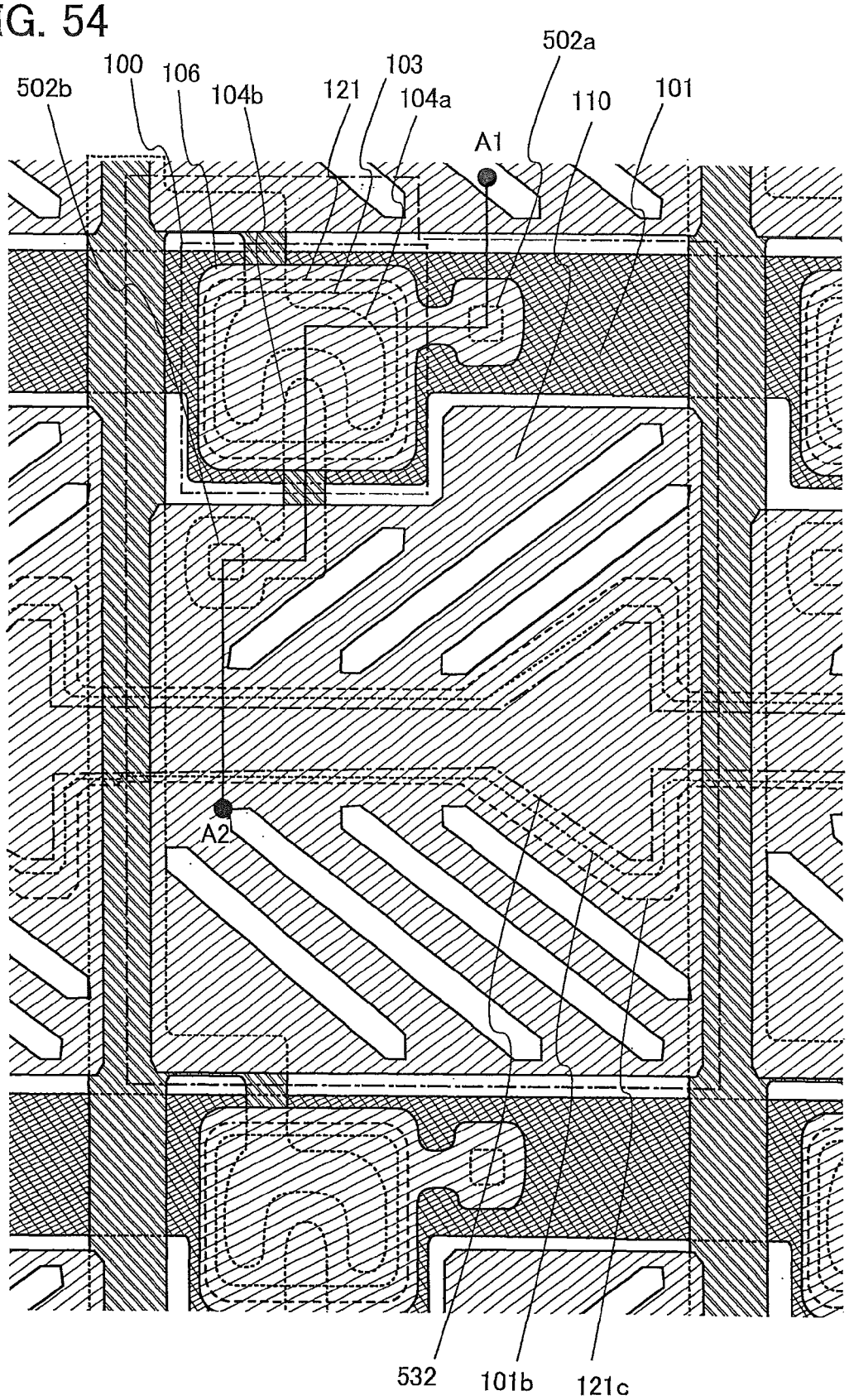
FIG. 54 is a top view illustrating the structure of a semiconductor device.
Figure 58C:
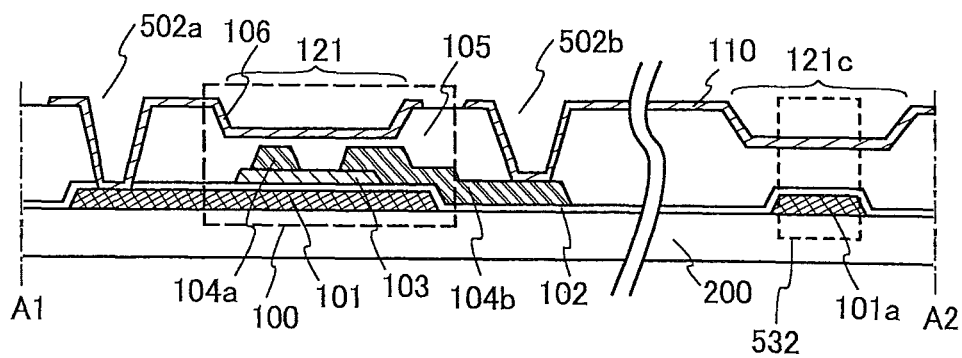
Figure 58D:
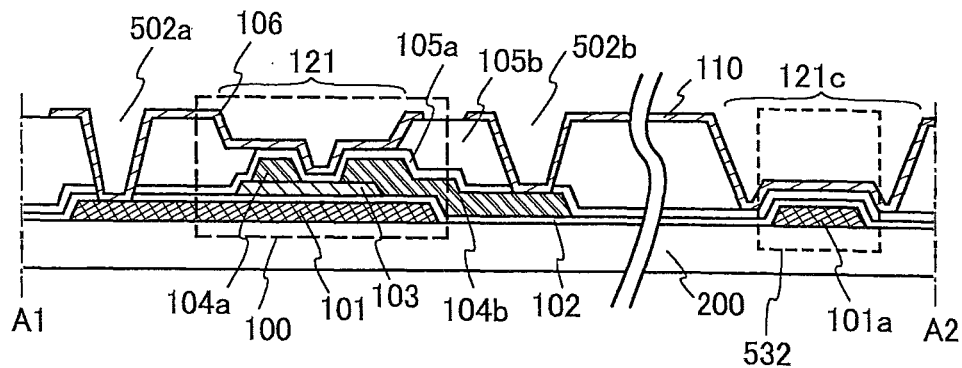

FIG. 54 and FIGS. 58C and 58D illustrate another aspect of the structure of a pixel in a liquid crystal display device. A cross-sectional view taken along line A1-A2 in a top view of FIG. 54 corresponds to FIG. 58C or 58D.

In FIG. 54 and FIGS. 58C and 58D, the pixel 530 includes the transistor 100, a capacitor 532, and a liquid crystal element (or a display element). Note that the pixel 530 may be a subpixel.

The structure of the transistor 100 is similar to any of the structures in Embodiments 1 to 10. Accordingly, the same portions as those in any of the structures in Embodiments 1 to 10 are denoted by the same reference numerals, and the description thereof is omitted. Note that FIG. 58C illustrates an example in which the transistor 100 with the structure in FIG. 1A is used. FIG. 58D illustrates an example in which the transistor 100 with the structure in FIG. 1C is used. In this manner, any of the variety of structures in Embodiments 1 to 10 can be used as the structure of the transistor 100.

Further, the parasitic capacitance or the capacitor in Embodiment 7 or Embodiment 8 can be used as the capacitor 532. Note that FIG. 58C illustrates an example in which the capacitor 532 is formed in the region 121c where the insulating layer 105 is made thin. FIG. 58D illustrates an example in which the capacitor 532 is formed in the region 121c from which the layer 105b is removed. The structure of the capacitor 532 in FIG. 58D corresponds to the structure of the capacitor in FIG. 22E.

The electrode 106 of the transistor 100 is electrically connected to the electrode 101a through an opening 502a. The electrode 101 of the transistor 100 functions as both a gate electrode of the transistor and a gate line. An electrode 101b is provided in parallel with the electrode 101. The electrode 101b functions as a capacitor line. The electrode 104a of the transistor 100 functions as both one of a source electrode and a drain electrode and a source line. The source line is provided to intersect with the gate line. The electrode 104b of the transistor 100 functions as the other of the source electrode and the drain electrode, and is electrically connected to the electrode 110 through an opening 502b. One of a pair of electrodes of the capacitor 532 is the electrode 110, and the other electrode of the capacitor 532 is the electrode 101b.

Note that the electrode 101b can be formed using, for example, the same layer and the same material as the electrode 101. Note that the electrodes 101b and 101 may be formed using different materials.

Note that FIG. 54 illustrates an example in which the electrode 110 has a plurality of openings; however, this embodiment is not limited thereto. Further, the structure illustrated in FIG. 53 may be a structure in which the electrode 110 has a plurality of openings. The electrode 110 can have a given shape.

In FIG. 53, FIG. 54, and FIGS. 58A to 58D, the electrode 110 can be a light-transmissive electrode. Alternatively, the electrode 110 can be an electrode having both a reflective region and a light-transmissive region. When the electrode 110 is an electrode having both a reflective region and a light-transmissive region, the liquid crystal display device can be transflective.

In the case where the electrode 110 is an electrode having both a reflective region and a light-transmissive region, the electrode 106 can be formed using the same layer and the same material as a layer provided with a reflective electrode included in the reflective region. Thus, the semiconductor layer 103 of the transistor 100 can be shielded from light. The electrode having both the reflective region and the light-transmissive region can be formed by etching of a stack of a light-transmissive film and a reflective film with the use of a half-tone mask.

Note that a display element, a display device which is a device including a display element, a light-emitting element, and a light-emitting device which is a device including a light-emitting element can employ various modes and can include various elements. For example, a display medium whose contrast, luminance, reflectivity, transmittance, or the like is changed by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light in accordance with current), an electron emitter, a liquid crystal element, electronic ink, an electrophoretic element, an electrowetting element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Display devices having EL elements include an EL display and the like. Display devices having electron emitters include a field emission display (FED), an SED-type flat panel display (SED: surface-conduction electron-emitter display), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper and the like.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, part or all of Embodiment 8, part or all of Embodiment 9, part or all of Embodiment 10, part or all of Embodiment 11, or part or all of Embodiment 12. Thus, this embodiment can be freely combined or replaced with another embodiment (e.g., any one of Embodiments 1 to 12).

(Embodiment 14)

In this embodiment, an example in which a display device is applied to a display module is described.

Figure 72:
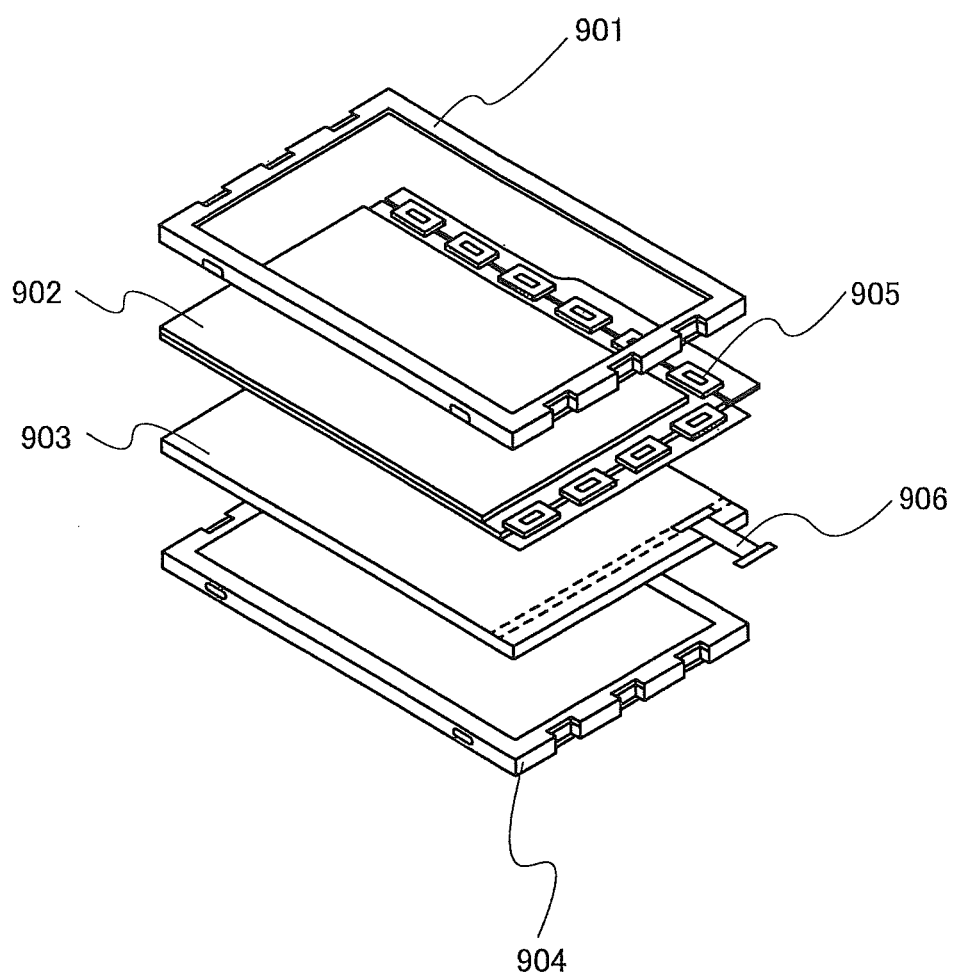
FIG. 72 illustrates a display module.

FIG. 72 illustrates a display module. The display module in FIG. 72 includes a housing 901, a display device 902, a backlight unit 903, and a housing 904. The display device 902 is electrically connected to a driver IC 905. Power source voltage or a signal is supplied to the backlight unit 903 through a terminal 906.

Note that this embodiment is not limited to the display module in FIG. 72, and a display module having a touch panel may be used. The display module may have a flexible printed circuit (FPC). In FIG. 72, the driver IC 905 may be electrically connected to the display device 902 through a flexible printed circuit (FPC). Further, the display module may have an optical film such as a polarizing plate or a retardation film.

This embodiment is obtained by performing change, addition, modification, removal, application, superordinate conceptualization, or subordinate conceptualization on part or all of Embodiment 1, part or all of Embodiment 2, part or all of Embodiment 3, part or all of Embodiment 4, part or all of Embodiment 5, part or all of Embodiment 6, part or all of Embodiment 7, part or all of Embodiment 8, part or all of Embodiment 9, part or all of Embodiment 10, part or all of Embodiment 11, part or all of Embodiment 12, or part or all of Embodiment 13. Thus, this embodiment can be freely combined or replaced with another embodiment (e.g., any one of Embodiments 1 to 13).

(Embodiment 15)

In this embodiment, examples of electronic devices are described.

FIGS. 67A to 67H and FIGS. 68A to 68D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 67A:
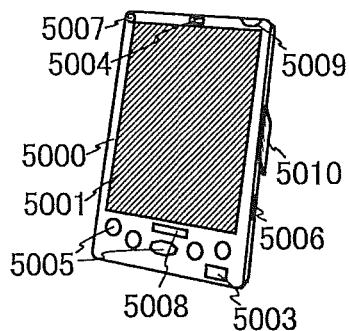
FIGS. 67A to 67H illustrate electronic devices.
Figure 67B:
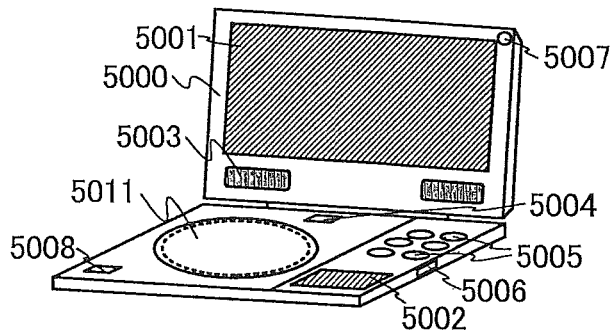
Figure 67C:
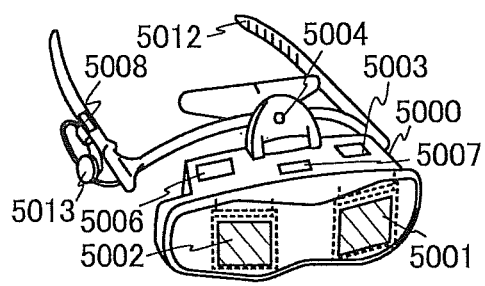
Figure 67D:
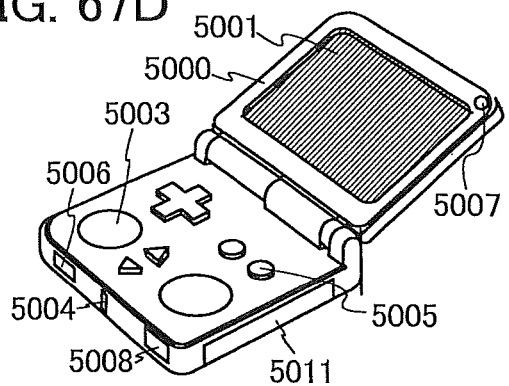
Figure 67E:
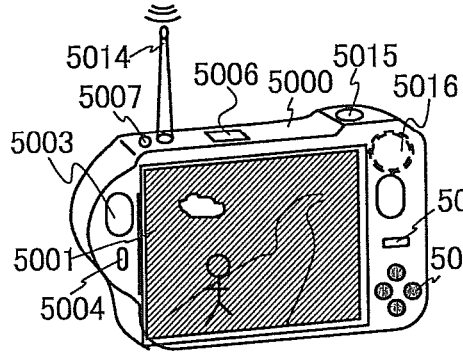
Figure 67F:
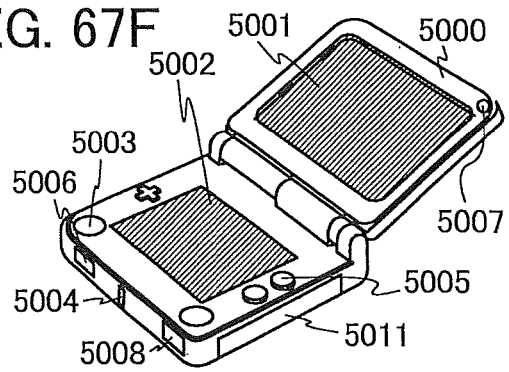
Figure 67G:
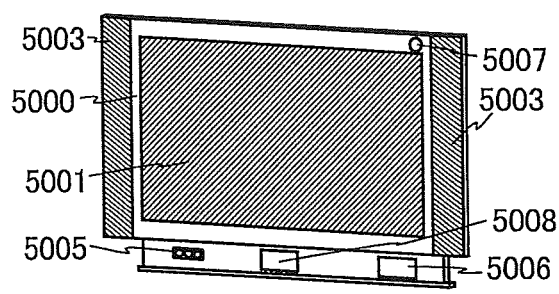
Figure 67H:
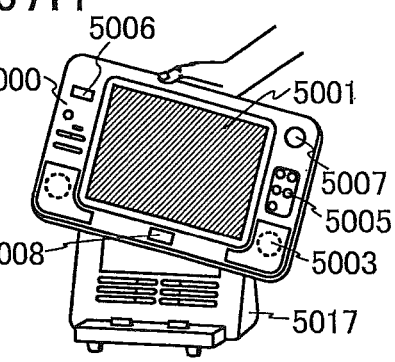
Figure 68A:
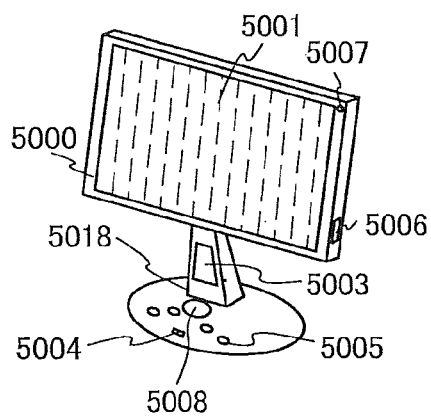
FIGS. 68A to 68H illustrate electronic devices.
Figure 68B:
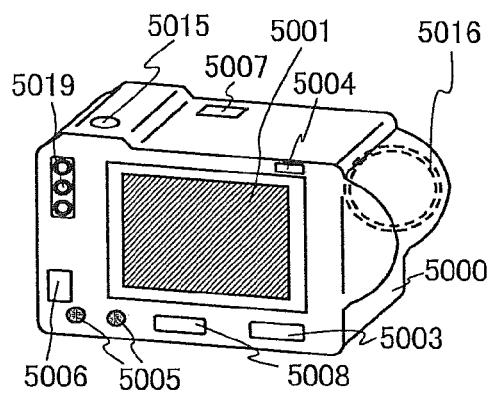
Figure 68C:
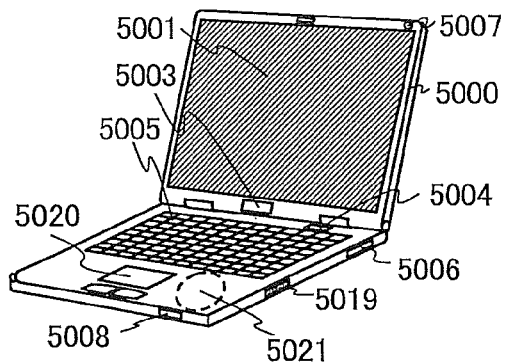
Figure 68D:
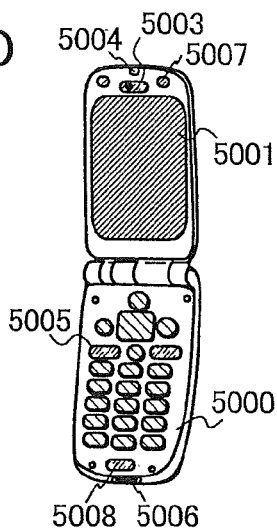

FIG. 67A illustrates a portable computer, which can include a switch 5009, an infrared port 5010, and the like in addition to the above objects. FIG. 67B illustrates a portable image reproducing device provided with a memory medium (e.g., a DVD reproducing device), which can include a second display portion 5002, a memory medium read portion 5011, and the like in addition to the above objects. FIG. 67C illustrates a goggle-type display, which can include the second display portion 5002, a support 5012, an earphone 5013, and the like in addition to the above objects. FIG. 67D illustrates a portable game machine, which can include the memory medium read portion 5011 and the like in addition to the above objects. FIG. 67E illustrates a digital camera with a television reception function, which can include an antenna 5014, a shutter button 5015, an image reception portion 5016, and the like in addition to the above objects. FIG. 67F illustrates a portable game machine, which can include the second display portion 5002, the memory medium read portion 5011, and the like in addition to the above objects. FIG. 67G illustrates a television receiver, which can include a tuner, an image processing portion, and the like in addition to the above objects. FIG. 67H illustrates a portable television receiver, which can include a charger 5017 capable of transmitting and receiving signals and the like in addition to the above objects. FIG. 68A illustrates a display, which can include a support base 5018 and the like in addition to the above objects. FIG. 68B illustrates a camera, which can include an external connection port 5019, a shutter button 5015, an image reception portion 5016, and the like in addition to the above objects. FIG. 68C illustrates a computer, which can include a pointing device 5020, the external connection port 5019, a reader/writer 5021, and the like in addition to the above objects. FIG. 68D illustrates a mobile phone, which can include a transmitter, a receiver, a tuner of 1 seg partial reception service for mobile phones and mobile terminals, and the like in addition to the above objects.

The electronic devices illustrated in FIGS. 67A to 67H and FIGS. 68A to 68D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 67A to 67H and FIGS. 68A to 68D are not limited them, and the electronic devices can have a variety of functions.

The electronic devices in this embodiment each include a display portion for displaying some kind of information.

Next, application examples of semiconductor devices are described.

Figure 68E:
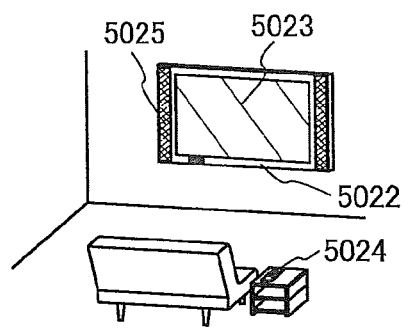

FIG. 68E illustrates an example in which a semiconductor device is incorporated in a building structure. FIG. 68E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 68F:
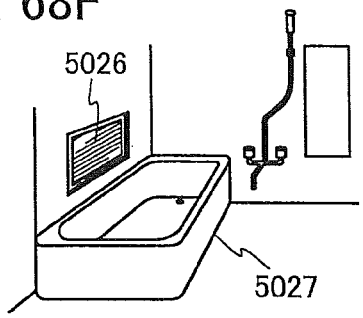

FIG. 68F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath unit as examples of the building structures, this embodiment is not limited thereto. The semiconductor devices can be provided in a variety of building structures.

Next, examples in which semiconductor devices are incorporated in moving objects are described.

Figure 68G:
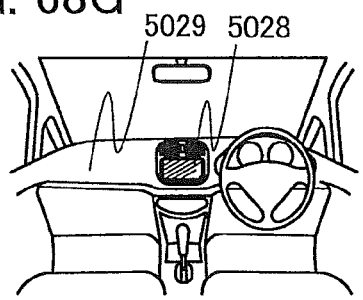

FIG. 68G illustrates an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 68H:
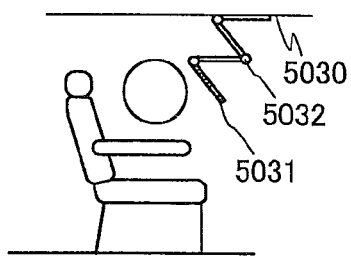

FIG. 68H illustrates an example in which a semiconductor device is incorporated in a passenger airplane. FIG. 68H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted.

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (or may be part of the diagram) is disclosed as one embodiment of the invention, and one embodiment of the invention can be constituted. Thus, when a certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted.

This application is based on Japanese Patent Application serial no. 2011-103344 filed with Japan Patent Office on May 5, 2011, the entire contents of which are hereby incorporated by reference.

What is claimed is:

1. A semiconductor device comprising:
  a transistor over a substrate, the transistor including a gate electrode, a first conductive layer, a second conductive layer, and an oxide semiconductor layer, wherein the gate electrode overlaps with the oxide semiconductor layer;
  a third conductive layer over the substrate;
  a first insulating layer over the oxide semiconductor layer, the first conductive layer, the second conductive layer, and the third conductive layer;
  a second insulating layer over the first insulating layer, the second insulating layer including an opening;
  a pixel electrode over the first insulating layer and the second insulating layer, the pixel electrode electrically connected to one of the first conductive layer and the second conductive layer; and
  a color filter between the first insulating layer and the pixel electrode,
  wherein the pixel electrode includes a first region and a second region,
  wherein the first region is overlapping with the opening,
  wherein the pixel electrode is in contact with a top surface of the first insulating layer in the first region, and
  wherein the pixel electrode is in contact with a top surface of the second insulating layer in the second region,
  wherein the pixel electrode in the first region overlaps with the third conductive layer with the first insulating layer interposed between the pixel electrode and the third conductive layer.

2. The semiconductor device according to claim 1, further comprising:

a fourth conductive layer over the first insulating layer, the fourth conductive layer overlapping with the oxide semiconductor layer.

3. A semiconductor device according to claim 1, further comprising:
a third insulating layer between the oxide semiconductor layer and each of the first conductive layer and the second conductive layer.

4. The semiconductor device according to claim 1, further comprising:
a third insulating layer over the gate electrode,
wherein the oxide semiconductor layer is positioned over the third insulating layer.

5. The semiconductor device according to claim 1, wherein a material of the third conductive layer is the same with a material of the gate electrode.

6. The semiconductor device according to claim 1, wherein the oxide semiconductor layer comprises at least one of indium, gallium, and zinc.

7. The semiconductor device according to claim 1, wherein the oxide semiconductor layer includes a crystal with c-axis alignment.

8. A semiconductor device comprising:
a transistor over a substrate, the transistor including a first gate electrode, a second gate electrode, a first conductive layer, a second conductive layer, and an oxide semiconductor layer, wherein the first gate electrode and the second gate electrode each overlap with the oxide semiconductor layer;
a third conductive layer over the substrate;
a first insulating layer over the oxide semiconductor layer, the first conductive layer, the second conductive layer, and the third conductive layer;
a second insulating layer over the first insulating layer, the second insulating layer including an opening;
a pixel electrode over the first insulating layer and the second insulating layer, wherein the pixel electrode is electrically connected to one of the first conductive layer and the second conductive layer, and wherein the pixel electrode is electrically connected to one of the first gate electrode and the second gate electrode; and
a color filter between the first insulating layer and the pixel electrode,
wherein the second gate electrode is positioned over the oxide semiconductor layer,
wherein the pixel electrode includes a first region and a second region,
wherein the first region is overlapping with the opening,
wherein the pixel electrode is in contact with a top surface of the first insulating layer in the first region,
wherein the pixel electrode is in contact with a top surface of the second insulating layer in the second region, and
wherein the pixel electrode in the first region overlaps with the third conductive layer with the first insulating layer interposed between the pixel electrode and the third conductive layer.

9. The semiconductor device according to claim 8, wherein the pixel electrode is electrically connected to the second gate electrode.

10. A semiconductor device according to claim 8, further comprising:
a third insulating layer between the oxide semiconductor layer and each of the first conductive layer and the second conductive layer.

11. The semiconductor device according to claim 8, further comprising:
a third insulating layer over the first gate electrode,
wherein the oxide semiconductor layer is positioned over the third insulating layer.

12. The semiconductor device according to claim 8, wherein a material of the third conductive layer is the same with a material of the first gate electrode.

13. The semiconductor device according to claim 8, wherein the oxide semiconductor layer comprises at least one of indium, gallium, and zinc.

14. The semiconductor device according to claim 8, wherein the oxide semiconductor layer includes a crystal with c-axis alignment.

* * * * *

UNITED STATES PATENT AND TRADEMARK OFFICE
CERTIFICATE OF CORRECTION

PATENT NO. : 9,508,862 B2
APPLICATION NO. : 14/718333
DATED : November 29, 2016
INVENTOR(S) : Hajime Kimura It is certified that error appears in the above-identified patent and that said Letters Patent is hereby corrected as shown below:

In the Specification

Column 11, Line 58; Change "in (in" to --m (m--.

Column 15, Line 20; Change "channel For" to --channel. For--.

Column 30, Line 55; Change "tetracoordinate 0 atoms" to --tetracoordinate O atoms--.

Column 30, Line 56; Change "half In" to --half. In--.

Column 30, Line 65; Change "three 0 atoms" to --three O atoms--.

Column 32, Line 6; Change "-0.5; respectively." to -- -0.5, respectively.--.

Column 32, Lines 44 thru 45; Change "tetracoordinate atoms" to --tetracoordinate O atoms--.

Column 33, Line 17; Change "foil red" to --formed--.

Column 33, Line 41; Change "for red" to --formed--.

Column 36, Line 54; Change "polyimide," to --polyamide,--.

Column 37, Line 53; Change "faulted" to --formed--.

Column 38, Line 20; Change "fainted" to --formed--.

Column 39, Line 22; Change "in (in" to --m (m--.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,508,862 B2

Column 39, Line 24; Change "in) films" to --m) films--.

Column 39, Line 24; Change "among in films" to --among m films--.